(12) United States Patent
Yamamoto et al.

(10) Patent No.: US 11,024,658 B2
(45) Date of Patent: Jun. 1, 2021

(54) IMAGE SENSOR INCLUDING GROOVES

(71) Applicant: SONY CORPORATION, Tokyo (JP)

(72) Inventors: Atsushi Yamamoto, Kanagawa (JP); Shinji Miyazawa, Kanagawa (JP); Yutaka Ooka, Kanagawa (JP); Kensaku Maeda, Kanagawa (JP); Yusuke Moriya, Kanagawa (JP); Naoki Ogawa, Kumamoto (JP); Nobutoshi Fujii, Kanagawa (JP); Shunsuke Furuse, Kanagawa (JP); Masaya Nagata, Kanagawa (JP); Yuichi Yamamoto, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/807,049

(22) Filed: Mar. 2, 2020

(65) Prior Publication Data
US 2020/0273897 A1    Aug. 27, 2020

Related U.S. Application Data

(63) Continuation of application No. 16/045,973, filed on Jul. 26, 2018, now Pat. No. 10,608,028, which is a
(Continued)

(30) Foreign Application Priority Data

Jan. 27, 2014  (JP) .................................. 2014-012628
Dec. 22, 2014  (JP) .................................. 2014-258939

(51) Int. Cl.
*H01L 27/00*     (2006.01)
*H01L 31/00*     (2006.01)
(Continued)

(52) U.S. Cl.
CPC .... *H01L 27/14618* (2013.01); *H01L 27/1462* (2013.01); *H01L 27/1464* (2013.01);
(Continued)

(58) Field of Classification Search
CPC ......... H01L 27/14645; H01L 27/14685; H01L 27/14623; H01L 27/14627;
(Continued)

(56) References Cited

U.S. PATENT DOCUMENTS 6,949,407 B2   9/2005  Jeung et al.
7,265,402 B2   9/2007  Koyanagi et al.
(Continued)

FOREIGN PATENT DOCUMENTS

JP   2012-129797   7/2012
JP   2013-021533   1/2013
TW     201322434   6/2013

*Primary Examiner* — Nikolay K Yushin
(74) *Attorney, Agent, or Firm* — Sheridan Ross P.C.

(57) ABSTRACT

The present technology relates to techniques of preventing intrusion of moisture into a chip.
Various illustrative embodiments include image sensors that include: a substrate; a plurality of layers stacked on the substrate; the plurality of layers including a photodiode layer having a plurality of photodiodes formed on a surface of the photodiode layer; the plurality of layers including at least one layer having a groove formed such that a portion of the at least one layer is excavated; and a transparent resin layer formed above the photodiode layer and formed in the groove. The present technology can be applied to, for example, an image sensor.

20 Claims, 108 Drawing Sheets

Related U.S. Application Data continuation of application No. 15/476,629, filed on Mar. 31, 2017, now Pat. No. 10,038,021, which is a continuation of application No. 15/111,003, filed as application No. PCT/JP2015/000329 on Jan. 26, 2015, now Pat. No. 9,991,301.

(51) Int. Cl.
*H01L 27/146* (2006.01)
*H01L 31/0203* (2014.01)

(52) U.S. Cl.
CPC .. *H01L 27/14621* (2013.01); *H01L 27/14623* (2013.01); *H01L 27/14627* (2013.01); *H01L 27/14632* (2013.01); *H01L 27/14636* (2013.01); *H01L 27/14645* (2013.01); *H01L 27/14685* (2013.01); *H01L 27/14687* (2013.01); *H01L 31/0203* (2013.01); *H01L 2224/11* (2013.01)

(58) Field of Classification Search
CPC ......... H01L 27/14687; H01L 27/14621; H01L 27/14636; H01L 27/1464; H01L 27/14632; H01L 27/1462; H01L 2224/11; H01L 2224/97; H01L 2224/48227; H01L 2224/73265; H01L 31/0203; H01L 31/18; H01L 31/02162; H01L 31/1804
See application file for complete search history.

(56) References Cited

U.S. PATENT DOCUMENTS

| | | |
|---|---|---|
| 7,265,916 B2 | 9/2007 | Kimura |
| 7,541,212 B2 | 6/2009 | Oh |
| 8,164,191 B2 | 4/2012 | Nakamura |
| 8,228,426 B2 | 7/2012 | Matsuo et al. |
| 2005/0029643 A1 | 2/2005 | Koyanagi |
| 2005/0163016 A1 | 7/2005 | Kimura |
| 2005/0275746 A1 | 12/2005 | Nishida et al. |
| 2006/0220025 A1 | 10/2006 | Oh |
| 2009/0211793 A1 | 8/2009 | Nakano |
| 2009/0256260 A1 | 10/2009 | Nakamura |

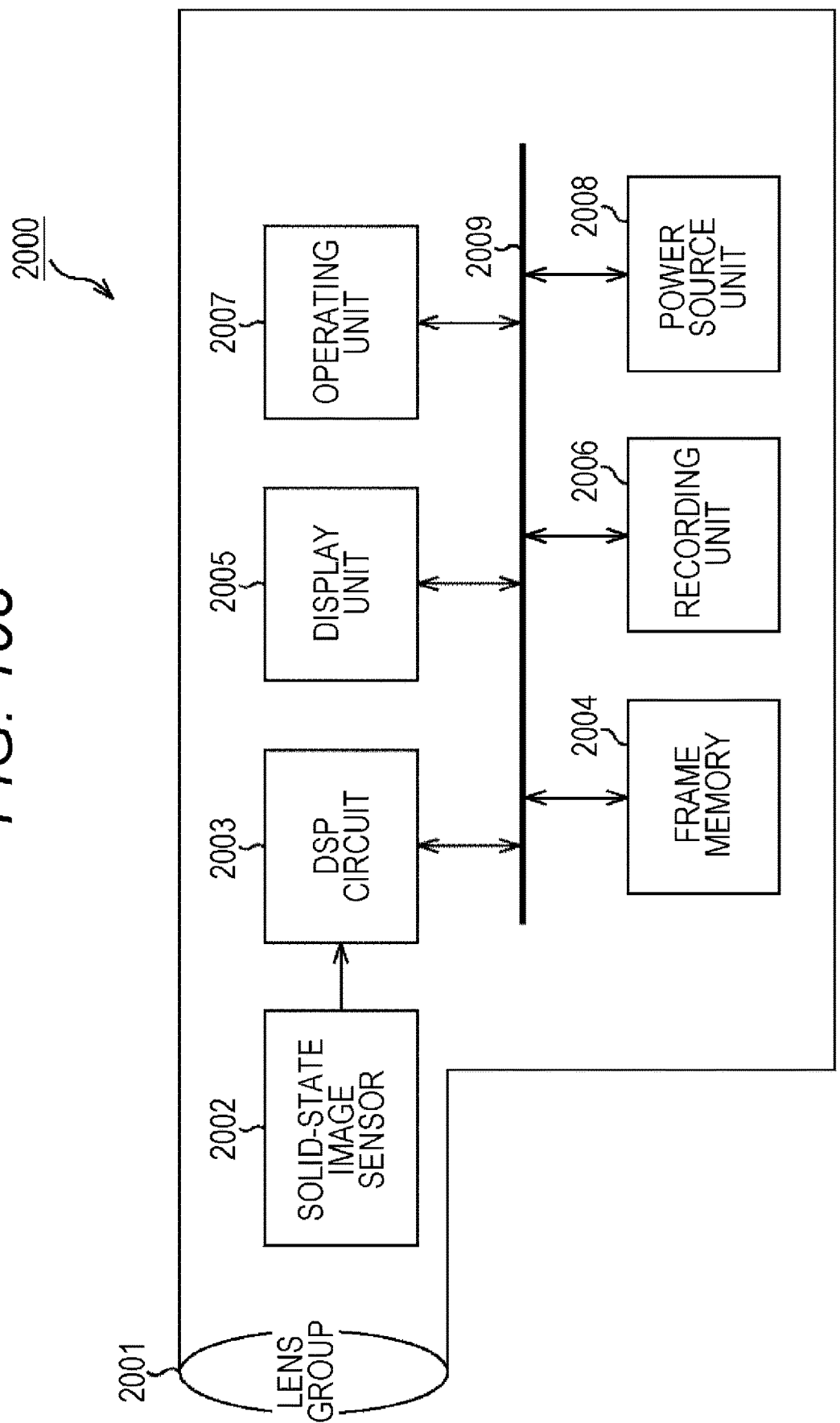

IMAGE SENSOR INCLUDING GROOVES

CROSS REFERENCE TO RELATED APPLICATIONS

The present application is a continuation of U.S. patent application Ser. No. 16/045,973 filed Jul. 26, 2018 which is a continuation of U.S. patent application Ser. No. 15/476,629, filed Mar. 31, 2017, now U.S. Pat. No. 10,038,021, which is a continuation of U.S. patent application Ser. No. 15/111,003, filed Jul. 12, 2016, now U.S. Pat. No. 9,991,301, which is a national stage application under 35 U.S.C. 371 and claims the benefit of PCT Application No. PCT/JP2015/000329 having an international filing date of Jan. 26, 2015, which designated the United States, which PCT application claimed the benefit of Japanese Patent Application No. 2014-012628 filed Jan. 27, 2014, and Japanese Patent Application No. 2014-258939 filed Dec. 22, 2014, the entire disclosures of which are hereby incorporated herein by reference in their entirety.

TECHNICAL FIELD

The present technology relates to an image sensor, a manufacturing apparatus, and a manufacturing method. More particularly, the present technology relates to an image sensor, a manufacturing apparatus, and a manufacturing method, which are capable of improving moisture-proof performance.

BACKGROUND ART

In recent years, imaging devices in which a plurality of charge coupled device (CCD) sensors or a plurality of complementary metal-oxide semiconductor (CMOS) sensors are arranged in a two-dimensional form have been used in digital video cameras, digital still cameras, or the like.

In a CMOS image sensor, a global shutter structure with a structure of temporarily holding signals in a memory is employed as one of methods of implementing simultaneous charge accumulation. The global shutter structure is configured such that a memory is arranged in a pixel, charges accumulated in light receiving units are collectively transferred to memories in all pixels, and the charges are held until a read operation is performed in units of rows, so that all pixels have the same light exposure time (see Patent Literatures 1 and 2).

CITATION LIST

Patent Literature

PTL 1: JP 2012-129797 A
PTL 2: JP 2013-21533 A

SUMMARY OF INVENTION

Technical Problem

Meanwhile, the image sensor is manufactured such that a plurality of image sensors are formed on a substrate and diced along the time of manufacturing. At the time of dicing, film peeling, a crack, or the like is likely to occur. Further, when film peeling, a crack, or the like occur, moisture intrudes into the image sensor, condensation occurs, and thus image quality deterioration is likely to occur.

It is desirable to maintain and improve moisture-proof performance when or after an image sensor is manufactured.

The present technology was made in light of the foregoing, and it is desirable to improve the moisture-proof performance.

Solution to Problem

Various illustrative embodiments include image sensors that include: a substrate; a plurality of layers stacked on the substrate; the plurality of layers including a photodiode layer having a plurality of photodiodes formed on a surface of the photodiode layer; the plurality of layers including at least one layer having a groove formed such that a portion of the at least one layer is excavated; and a transparent resin layer formed above the photodiode layer and formed in the groove.

Additional illustrative embodiments include image sensors that include: a plurality of layers that are stacked; the plurality of layers including a photodiode layer having a plurality of photodiodes formed on a surface of the photodiode layer; a transparent resin layer formed above the photodiode layer; a rib formed in the transparent resin layer; and a moisture resistant film formed between a bottom surface of the rib and the transparent resin.

Further illustrative embodiments include imaging devices that include an image sensor and support circuits, the image sensor including: a substrate; a plurality of layers stacked on the substrate; the plurality of layers including a photodiode layer having a plurality of photodiodes formed on a surface of the photodiode layer; the plurality of layers including at least one layer having a groove formed such that a portion of the at least one layer is excavated; and a transparent resin layer formed above the photodiode layer and formed in the groove.

A first image sensor according to an embodiment of the present technology includes a substrate on which a plurality of layers are stacked, the plurality of layers including a layer in which a plurality of photodiodes are formed on a surface and a groove formed such that at least one or more layers are excavated in a direction vertical to the surface.

A transparent resin layer may be formed on a layer above the layer in which the photodiodes are formed, and the transparent resin layer may be formed in the groove.

The groove may be a part of a groove that is formed in a region to be scribed to have a width larger than a width of a blade used at the time of scribing at a point in time before the scribing. The groove may be formed such that up to a part of a silicon substrate in which the photodiodes are formed is excavated. The groove may be formed such that up to a part of a support substrate among the plurality of layers is excavated.

A passivation film may be formed in the groove. The passivation film may be formed even on a microlens layer formed above the layer in which the photodiodes are formed.

A rib may be formed in the transparent resin layer.

A passivation film may be formed in the groove and the rib.

The groove may be formed by two processes of a process of forming a first through electrode and a process of forming a second through electrode. The groove may be filled with a material for forming the second through electrode in the process of forming the second through electrode.

A transparent resin layer may be formed on a layer above the layer in which the photodiodes are formed, a plate-like transparent member may be stacked on the transparent resin layer, the groove may be formed such that at least the transparent member layer is excavated, and a moisture resistant film may be formed in the groove.

A transparent resin layer may be formed on a layer above the layer in which the photodiodes are formed, a plate-like transparent member may be stacked on the transparent resin layer, the groove may be extended up to a bottom surface of the substrate, a side surface of the groove may be covered with the transparent member, and the transparent resin layer may be formed between the transparent member and a side surface of the substrate.

A hydrophobic film may be formed in the groove.

A second image sensor according to an embodiment of the present technology includes a plurality of layers being stacked and including a layer in which a plurality of photodiodes are formed on a surface, a transparent resin layer formed on a layer above the layer in which the photodiodes are formed, a rib formed in the transparent resin layer, and a moisture resistant film formed between a bottom surface of the rib and the transparent resin.

A plate-like transparent member may be stacked on the transparent resin layer, and the moisture resistant film may be formed even between the plate-like transparent member and the transparent resin.

The moisture resistant film may be a stacked film in which a plurality of films having different refractive indices are stacked.

The rib may be made of a material absorbing certain light.

Still further embodiments include methods that include forming a plurality of layers stacked on a substrate, the plurality of layers including a photodiode layer having a plurality of photodiodes formed on a surface of the photodiode layer; forming a groove in at least one layer in the plurality of layers, the groove being formed such that the at least one layer is excavated; and a transparent resin layer formed above the photodiode layer and formed in the groove.

An additional manufacturing apparatus according to embodiments of the present technology manufactures an image sensor including a substrate on which a plurality of layers are stacked, the plurality of layers including a layer in which a plurality of photodiodes are formed on a surface and a groove formed such that at least one or more layers are excavated in a direction vertical to the surface.

A manufacturing method according to an embodiment of the present technology includes steps of manufacturing a substrate on which a plurality of layers are stacked, the plurality of layers including a layer in which a plurality of photodiodes are formed on a surface and manufacturing a groove formed such that at least one or more layers are excavated in a direction vertical to the surface.

In the first image sensor according to an embodiment of the present technology, a groove is formed such that at least one or more layers are excavated in a direction vertical to a substrate on which a plurality of layers are stacked, the plurality of layers including a layer in which a plurality of photodiodes are formed on a surface.

In the second image sensor according to an embodiment of the present technology, a plurality of layers including a layer in which a plurality of photodiodes are formed on a surface are stacked, a transparent resin layer is formed on a layer above the layer in which the photodiodes are formed, a rib formed in the transparent resin layer, and a moisture resistant film is formed between a bottom surface of the rib and the transparent resin.

In the manufacturing apparatus and the manufacturing method according to an embodiment of the present technology, an image sensor in which a groove is formed such that at least one or more layers are excavated in a direction vertical to a substrate on which a plurality of layers are stacked, the plurality of layers including a layer in which a plurality of photodiodes are formed on a surface is manufactured.

Advantageous Effects of Invention

According to an embodiment of the present technology, it is possible to improve moisture-proof performance of an image sensor or the like.

The effects of the present technology are not necessarily limited to the effect described herein and may include effects described in the present disclosure.

BRIEF DESCRIPTION OF DRAWINGS

FIG. 108 is a diagram illustrating a configuration of an electronic device.

DESCRIPTION OF EMBODIMENTS

Hereinafter, modes (hereinafter, referred to as "embodiments") for carrying out the present technology will be described. The description will proceed in the following order.

1. Configuration of solid-state image sensor
2. Structure of chip
3. First Embodiment
4. Second Embodiment
5. Third Embodiment
6. Fourth Embodiment
7. Fifth Embodiment
8. Sixth Embodiment
9. Seventh Embodiment
10. Eighth Embodiment
11. Electronic device <Configuration of Solid-State Image Sensor>

Figure 1:
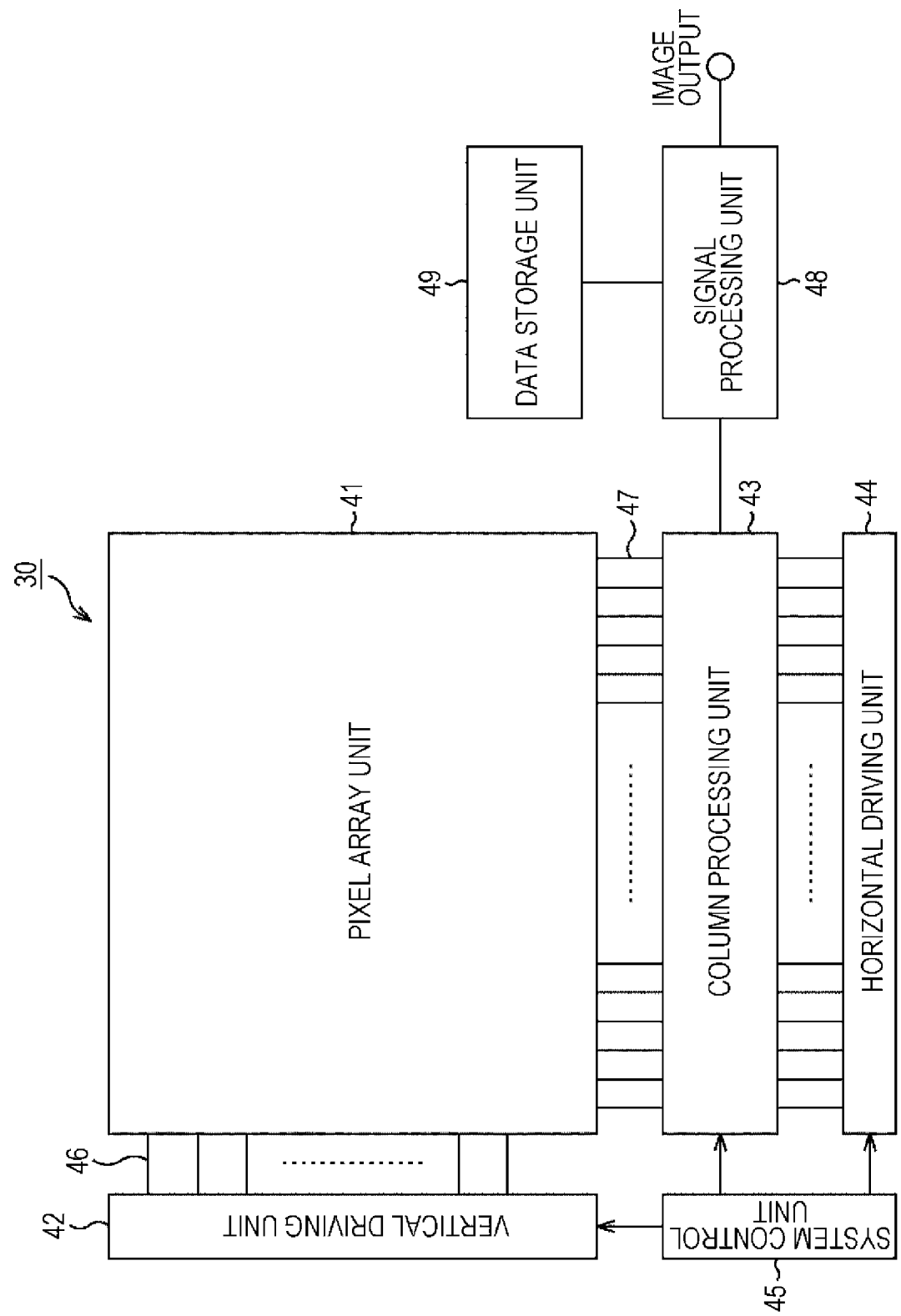
FIG. 1 is a block diagram illustrating an exemplary configuration of a CMOS image sensor.

FIG. 1 is a block diagram illustrating an exemplary configuration of a CMOS (Complementary Metal Oxide Semiconductor) image sensor as a solid-state image sensor according to an embodiment of the present technology.

A CMOS image sensor 30 includes a pixel array unit 41, a vertical driving unit 42, a column processing unit 43, a horizontal driving unit 44, and a system control unit 45. The pixel array unit 41, the vertical driving unit 42, the column processing unit 43, the horizontal driving unit 44, and the system control unit 45 are formed on a semiconductor substrate (chip) (not illustrated).

In the pixel array unit 41, unit pixels each of which includes a photoelectric conversion element that generates and accumulates light charges of a charge amount corresponding to a quantity of incident light herein are two-dimensionally arranged in a matrix form. Hereinafter, light charges of a charge amount according to a quantity of incident light are also referred to as simply as "charges," and a unit pixel is also referred to as a "pixel."

Further, in the pixel array unit 41, in the pixel array of the matrix form, a pixel driving line 46 is formed for each row in a horizontal direction (a direction in which a row of pixels are arranged) in FIG. 1, and a vertical signal line 47 is formed for each column in a vertical direction (a direction in which a column of pixels are arranged) in FIG. 1. One end of the pixel driving line 46 is connected to an output terminal corresponding to each row of the vertical driving unit 42.

The CMOS image sensor 30 further includes a signal processing unit 48 and a data storage unit 49. The signal processing unit 48 and the data storage unit 49 may be implemented by an external signal processing unit such as a digital signal processor (DSP) formed on a substrate different from the CMOS image sensor 30 or software, and may be mounted on the same substrate as the CMOS image sensor 30.

The vertical driving unit 42 is a pixel driving unit that is configured with a shift register, an address decoder, or the like, and drives the pixels of the pixel array unit 41 at the same time or in units of rows. Although a concrete configuration is not illustrated, the vertical driving unit 42 is configured to include a read scanning system and a discharge scanning system or collective discharge and collective transfer.

The read scanning system selectively scans the unit pixels of the pixel array unit 41 in order in units of rows in order to read signals from the unit pixels. In the case of row driving (a rolling shutter operation), for discharging, discharge scanning is performed on reading rows on which read scanning is performed by the read scanning system prior to read scanning by a time of a shutter speed. Further, in the case of global exposure (a global shutter operation), collective discharge is performed prior to collective transfer by a time of a shutter speed.

Through the discharging, unnecessary charges are discharged (reset) from photoelectric conversion elements of unit pixels in reading rows. Further, a so-called electronic shutter operation is performed by discharging (resetting) of unnecessary charges. Here, the electronic shutter operation refers to an operation for discarding light charges of the photoelectric conversion elements and newly starting light exposure (starting light charge accumulation).

A signal read by a read operation performed by the read scanning system corresponds to a quantity of light incident after an immediately previous read operation or electronic shutter operation. In the case of row driving, a period of time from a read timing by an immediately previous read operation or a discharge timing by the electronic shutter operation to a read timing by a current read operation is an accumulation period of time (an exposure period of time) of light charges in the unit pixels. In the case of global exposure, a period of time from the collective discharge to collective transfer is an accumulation period of time (an exposure period of time).

Pixel signals output from the unit pixels of the pixel row selectively scanned by the vertical driving unit 42 are supplied to the column processing unit 43 through each of the vertical signal lines 47. The column processing unit 43 performs certain signal processing on the pixel signals output from the unit pixels of the selected row through the vertical signal line 47 for each pixel row of the pixel array unit 41, and temporarily holds the pixel signals that have been subjected to signal processing.

Specifically, the column processing unit 43 performs at least a noise reduction process such as a correlated double sampling (CDS) as signal processing. Through the CDS performed by the column processing unit 43, a reset noise or a fixed pattern noise specific to a pixel such as a variation in a threshold value of an amplifying transistor is removed. Further, in addition to the noise reduction process, for example, the column processing unit 43 may have an analog-to-digital (AD) conversion function and output a signal level using a digital signal as well.

The horizontal driving unit 44 is configured with a shift register, an address decoder, or the like, and sequentially selects unit circuits corresponding to pixel columns of the column processing unit 43. Through the selective scanning by the horizontal driving unit 44, the pixel signals that have been subjected to signal processing by the column processing unit 43 are sequentially output to the signal processing unit 48.

The system control unit 45 is configured with a timing generator that generates various kinds of timing signals or the like, and performs drive control on the vertical driving unit 42, the column processing unit 43, and the horizontal driving unit 44 based on various kinds of timing signals generated by the timing generator.

The signal processing unit 48 has at least an addition process function, and performs various kinds of signal processing such as an addition process on the pixel signals output from the column processing unit 43. The data storage unit 49 temporarily stores data necessary for signal processing when signal processing is performed by the signal processing unit 48.

<Structure of Chip>

Next, a concrete structure of unit pixels arranged in the pixel array unit 41 of FIG. 1 in the matrix form will be described. Through a pixel to which the present technology is applied, it is possible to improve the moisture-proof performance and sensor performance. In order to describe that there are the above effects, a pixel to which the present technology is not applied is first described before a pixel to which the present technology is applied.

Figure 2:
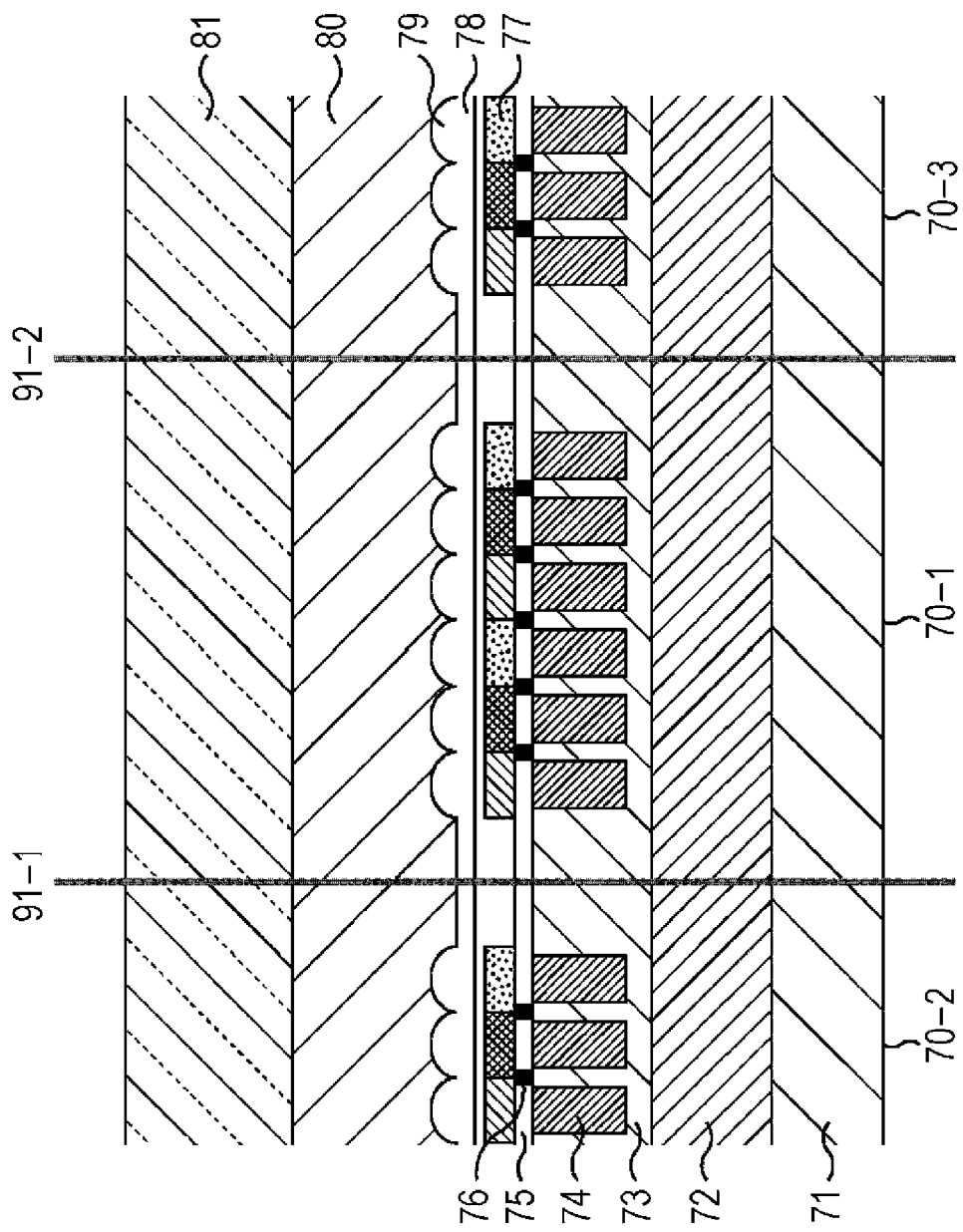
FIG. 2 is a diagram illustrating a configuration of a unit pixel.

FIG. 2 illustrates an exemplary configuration of a chip in which a plurality of unit pixels are arranged. The chip of FIG. 2 configures a backside-illumination type CMOS image sensor before dicing is performed.

A configuration illustrated in FIG. 2 described below is an example, and the present technology described below can be applied even to any other configuration such as a configuration in which another layer is added in addition to layers described below or a configuration in which any one of layers described below is deleted.

In a chip 70 illustrated in FIG. 2, an insulating layer and an interconnection layer 72 made of metal are arranged on a support substrate 71, and a silicon substrate 73 is arranged on the interconnection layer 72. The support substrate 71 is made of silicon, glass epoxy, glass, plastic, or the like. In the silicon substrate 73, a plurality of photodiodes 74 (optical elements) serving as photoelectric conversion units of pixels are formed at certain intervals.

A planarization film 75 made of an insulating material is formed on the silicon substrate 73 and the photodiode 74. In the planarization film 75, a light shielding film 76 for preventing light from leaking into a neighboring pixel is performed between the neighboring photodiodes 74.

A color filter layer 77 is formed on the planarization film 75 and the light shielding film 76. In the color filter layer 77, a plurality of color filters are formed in units of pixels, and, for example, colors of the color filters are arranged according to a Bayer array.

A planarization film 78 is formed on the color filter layer 77. A microlens layer 79 is formed on the planarization film 78. As described above, the microlens layer 79 is formed on the substrate including a plurality of layers having the photodiode 74. In the microlens layer 79, a microlens layer for collecting light onto the photodiode 74 of each pixel is formed for each pixel. The microlens layer 79 is an inorganic material layer and made of SiN, SiO, or SiOxNy (here, $0<x\leq 1$, $0<y\leq 1$).

A cover glass 81 is bonded onto the microlens layer 79 through an adhesive layer 80. The cover glass 81 is not limited to glass, and a transparent plate made of resin or the like may be used. The adhesive layer 80 is made of an acrylic-based resin material, a styrene-based resin material, an epoxy-based resin material, or the like.

The chip 70 illustrated in FIG. 2 is a state in which there are a plurality of chips. FIG. 2 illustrates a state in which there are three chips in a horizontal direction, and a wafer is not diced yet. In the wafer illustrated in FIG. 2, a chip positioned at the center is referred to as a "chip 70-1," a chip positioned at the left is referred to as a "chip 70-2," and a chip positioned at the right is referred to as a "chip 70-3."

There is a scribe section 91-1 between the chip 70-1 and the chip 70-2, and there is a scribe section 91-2 between the chip 70-1 and the chip 70-3. The three chips illustrated in FIG. 2 are diced into three chips by dicing along the scribe section 91-1 and the scribe section 91-2.

Figure 3:
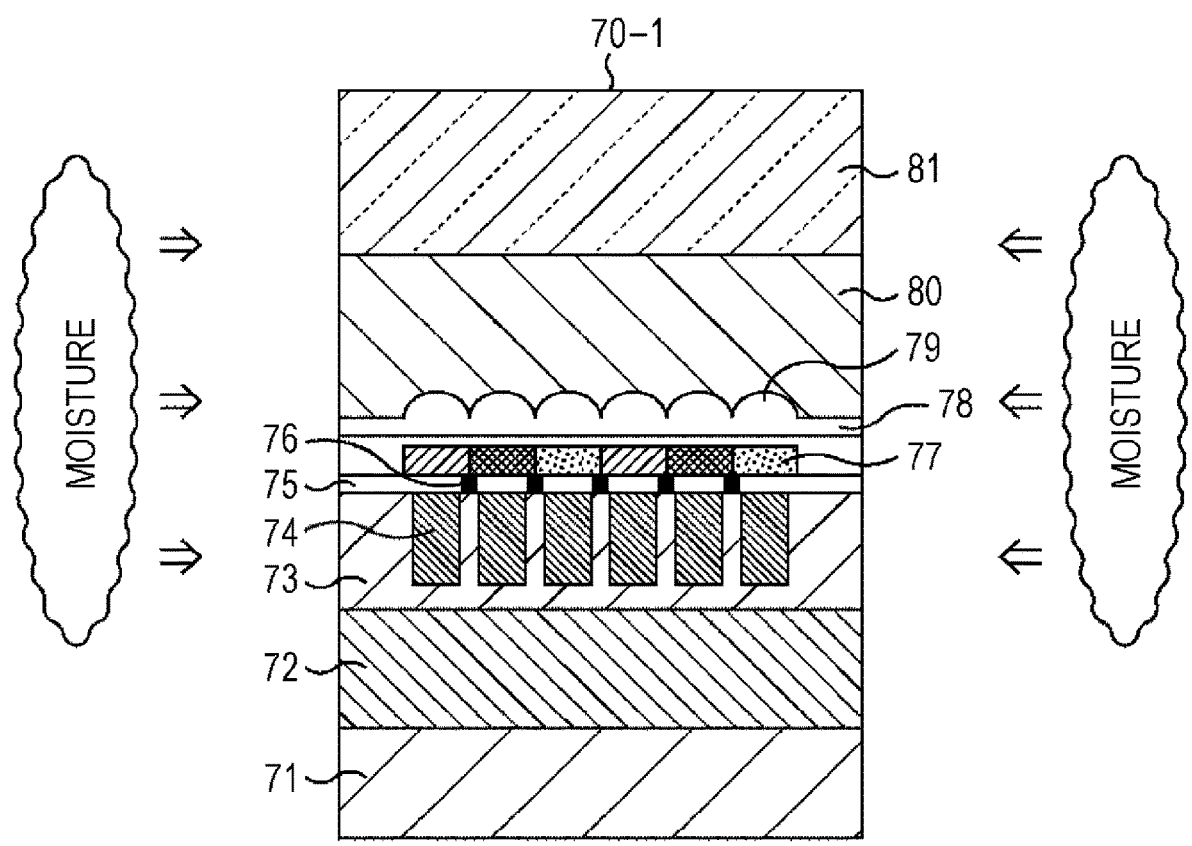
FIG. 3 is a diagram illustrating a configuration of a unit pixel.

FIG. 3 illustrates the diced chip 70-1. The chip 70-1 illustrated in FIG. 3 is a chip positioned at the center of the chip illustrated in FIG. 2, and indicates the chip 70-1 obtained as a result of dicing along the scribe section 91-1 and the scribe section 91-2.

At the time of dicing, an edge portion is likely to be peeled off by physical force applied to the chip 70-1 at the time of dicing. Further, after dicing, moisture is likely to intrude into the side of the chip 70-1 or the like as illustrated in FIG. 3. For example, a seal resin portion is more likely to absorb moisture than any other portion. Further, moisture is likely to intrude into an interface portion between seal resin and glass or the like.

If moisture intrudes into the chip 70-1, depending on the intrusion location, a metallic material or a disconnection is likely to corrode, and thus a normal operation may not be performed. Further, an irregular image or a display defect may occur. Thus, it is necessary to perform dicing so that damage such as peeling does not occur at the time of dicing, or a mechanism of preventing moisture from intruding into the chip 70-1 is necessary.

Hereinafter, a structure and a manufacturing process of suppressing the occurrence of damage such as peeling at the time of dicing and preventing moisture from intruding into the chip 70 will be described as first to seventh embodiments. Further, in each embodiment, a chip basically has the configuration illustrated in FIGS. 2 and 3, and portions necessary for describing each embodiment are appropriately illustrated and described.

First Embodiment

In a first embodiment, a groove is formed in a certain layer in a chip to prevent damage at the time of dicing and intrusion of moisture into a chip.

(1-1)-St Embodiment

Figure 4:
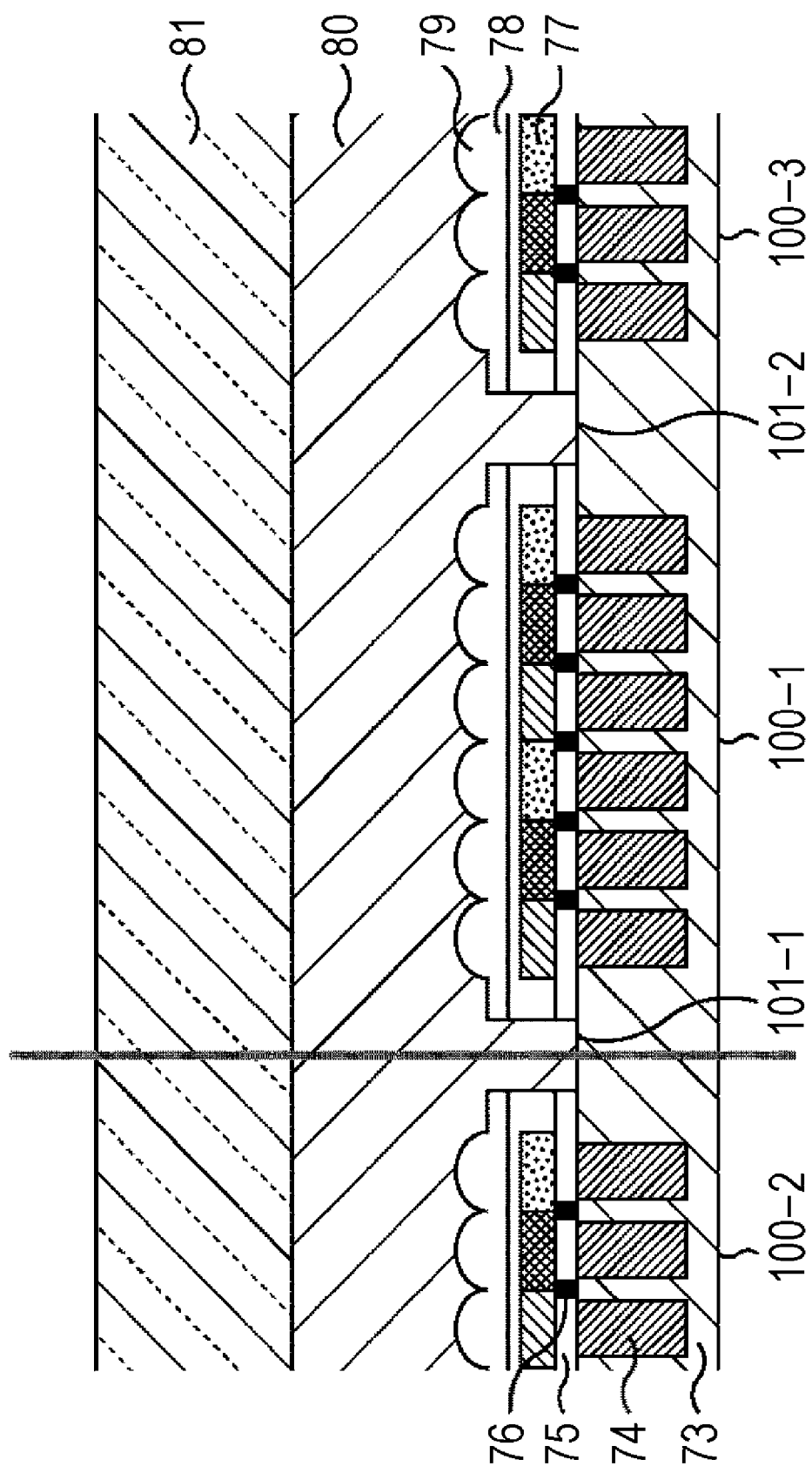
FIG. 4 is a diagram illustrating a configuration of a chip according to a first embodiment.

FIG. 4 illustrates a configuration of a chip according to the first embodiment. FIG. 4 illustrates a wafer that includes a plurality of chips (three chips in FIG. 4) and is not diced yet, similarly to FIG. 2.

Here, a chip positioned at the center is referred to as a "chip 100-1," a chip positioned at the left is referred to as a "chip 100-2," and a chip positioned at the right is referred to as a "chip 100-3." In the following description, when the chips 100-1 to 100-3 need not be distinguished from one another, the chips are referred to as simply a "chip 100."

Each chip 100 has the same configuration as the chip 70 described above with reference to FIGS. 2 and 3. In other words, the chip 100 is configured such that an interconnection layer 72 is arranged on a support substrate 71, and a silicon substrate 73 is arranged on the interconnection layer 72. In the silicon substrate 73, a plurality of photodiodes 74 (optical elements) serving as photoelectric conversion units of pixels are formed at certain intervals.

The planarization film 75 is formed on the silicon substrate 73, and a light shielding film 76 for preventing light from leaking into a neighboring pixel is formed in a portion of the planarization film 75 corresponding to a position between the photodiodes 74. A color filter layer 77 is formed on the planarization film 75. A planarization film 78 is formed on the color filter layer 77. A microlens layer 79 is formed on the planarization film 78. A cover glass 81 is bonded onto the microlens layer 79 through an adhesive layer 80.

The adhesive layer 80 is made of transparent resin, and is preferably a member capable of fixing the cover glass 81. The cover glass 81 may be a plate-like transparent member instead of glass.

In the wafer illustrated in FIG. 4, a groove 101 is formed between the chips 100. A groove 101-1 is formed between the chip 100-1 and the chip 100-2, and the groove 101-2 is formed between the chip 100-1 and the chip 100-3.

There is a scribe section 91-1 between the chip 100-1 and the chip 100-2, and the groove 101-1 is formed in the scribe section 91-1. Similarly, there is a scribe section 91-2 between the chip 100-1 and the chip 100-3, and the groove 101-2 is formed in the scribe section 91-2.

In the other drawings subsequent to FIG. 4, in order to help with viewing the groove 101-2, the description will proceed in a state in which the scribe section 91-2 is not illustrated.

In the chip 100 illustrated in FIG. 4, the groove 101 is formed such that the microlens layer 79, the planarization film 78, the color filter layer 77, and the planarization film 75 are excavated up to an upper portion of the silicon substrate 73.

As will be described later, at the time of manufacturing, since the groove 101 is formed before the adhesive layer 80 is formed, and the adhesive layer 80 is formed after the groove 101 is formed, the groove 101 is filled with the same material as the adhesive layer 80. Transparent resin may be used as a material for forming the adhesive layer 80. The groove 101 may be filled with the transparent resin.

Figure 5:
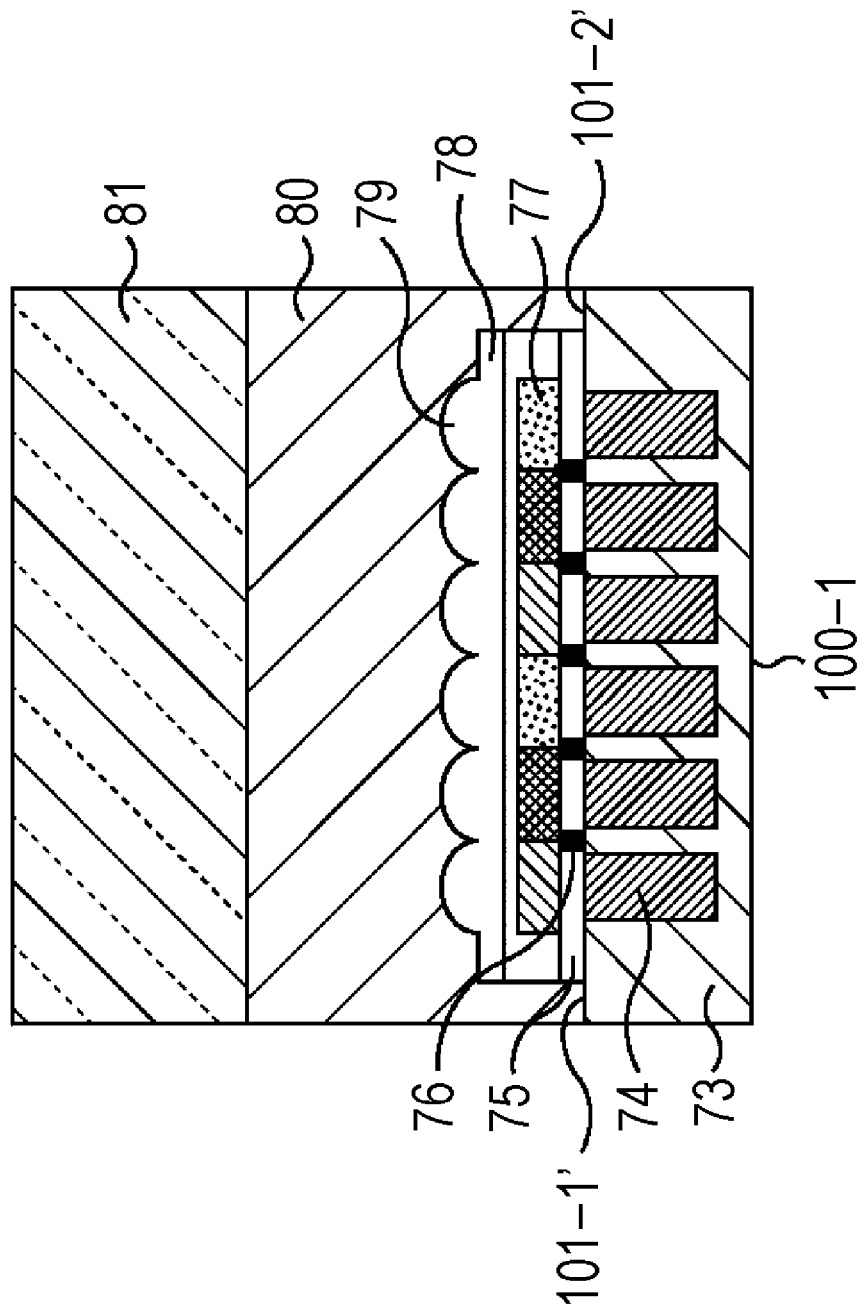
FIG. 5 is a diagram illustrating a configuration of a chip according to the first embodiment.

When the wafer in which the groove 101 is formed between the chips 100 is diced along the scribe section 91, the chip 100-1 illustrated in FIG. 5 is cut out. In the chip 100-1 illustrated in FIG. 5, the microlens layer 79, the planarization film 78, the color filter layer 77, and the planarization film 75 are surrounded by the adhesive layer 80 and thus not exposed on the surface.

In other words, the side surfaces of the microlens layer 79, the planarization film 78, the color filter layer 77, and the planarization film 75 are covered with the same material as the adhesive layer 80.

As described above, the diced chip 100-1 has a structure in which parts of the stacked layers of the chip 100 are covered with the groove 101-1' and the groove 101-2' (a dash is added to the grooves after dicing in order to be distinguished from the groove 101-1 and the groove 101-2 before dicing illustrated in FIG. 4).

Since the diced chip 100-1 is configured such that the groove 101-1' and the groove 101-2' remain, and the same material as the adhesive layer 80 remains in the portions of the groove 101-1' and the groove 101-2' as described above, a width of the groove 101-1 or the groove 101-2 between the chips 100 before dicing is preferably larger than a width of a blade used in the dicing process.

As the dicing is performed in a state in which the groove 101 is formed and filled with the same material as the adhesive layer 80 as described above, force applied to an interface between films at the time of dicing can be mitigated, and a possibility that film peeling or a crack will occur can be reduced. Further, since film peeling or a crack does not occur, the moisture-proof performance of the chip can be improved.

Figure 6:
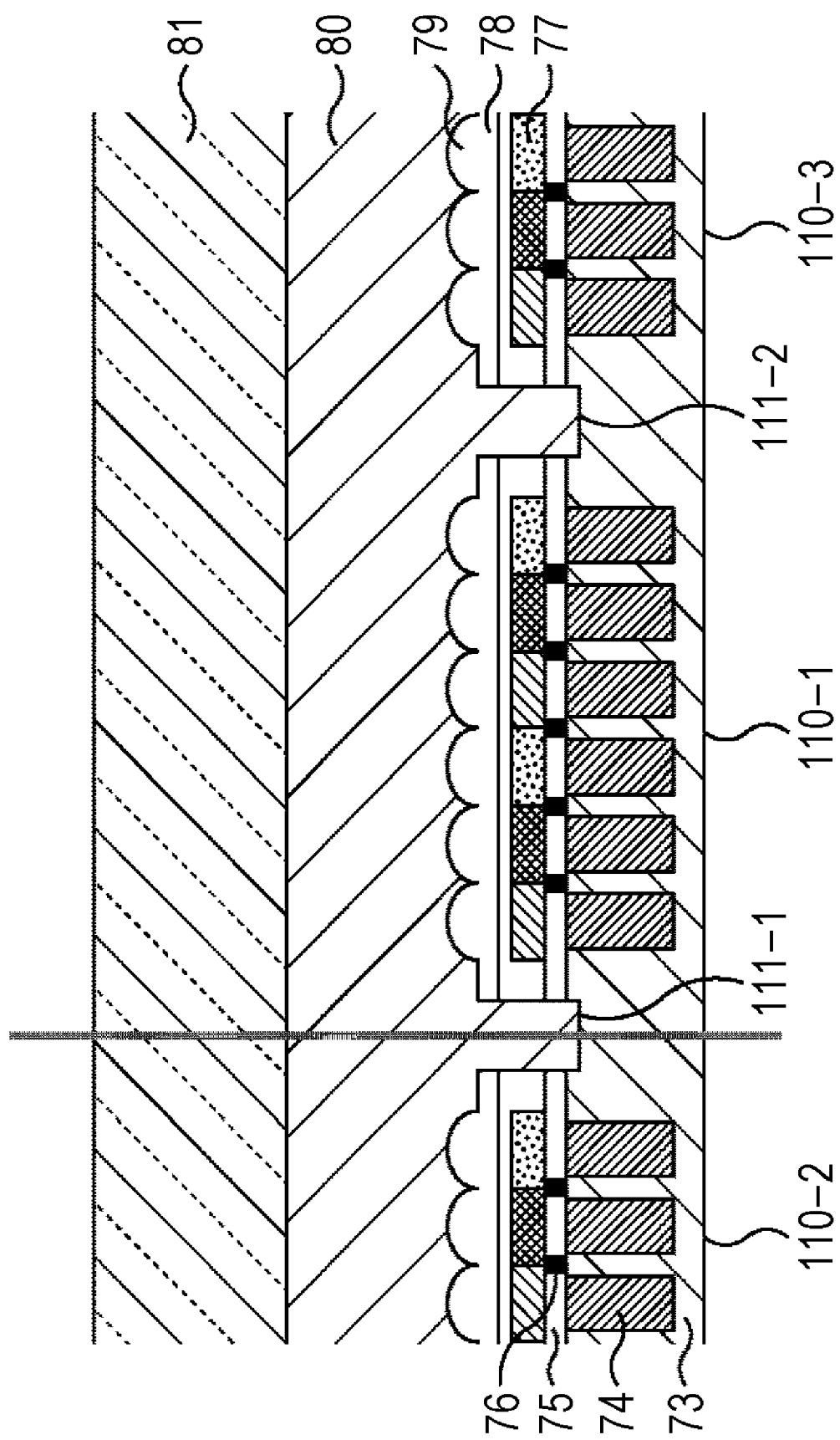
FIG. 6 is a diagram illustrating a configuration of a chip according to the first embodiment.

The groove 101 (the groove 101') illustrated in FIGS. 4 and 5 are illustrated to reach up to the upper portion of the silicon substrate 73, but may be formed such that the silicon substrate 73 is also excavated. In other words, a groove 111-1 and a groove 111-2 may be formed such that a part of the silicon substrate 73 is excavated as illustrated in FIG. 6.

As the groove 111 is formed as described above, the interface sides of the silicon substrate 73 and the planarization film 75 are covered with the same material as the adhesive layer 80, and thus force applied to an interface between films at the time of dicing can be mitigated, and a possibility that film peeling or a crack will occur can be reduced. Further, since film peeling or a crack does not occur, the moisture-proof performance of the chip can be improved.

The first embodiment has been described in connection with the example in which the groove is formed such that up to a part of a neighboring film (layer) is excavated as in the chip 110 illustrated in FIG. 6.

(1-2)-Nd Embodiment

Figure 7:
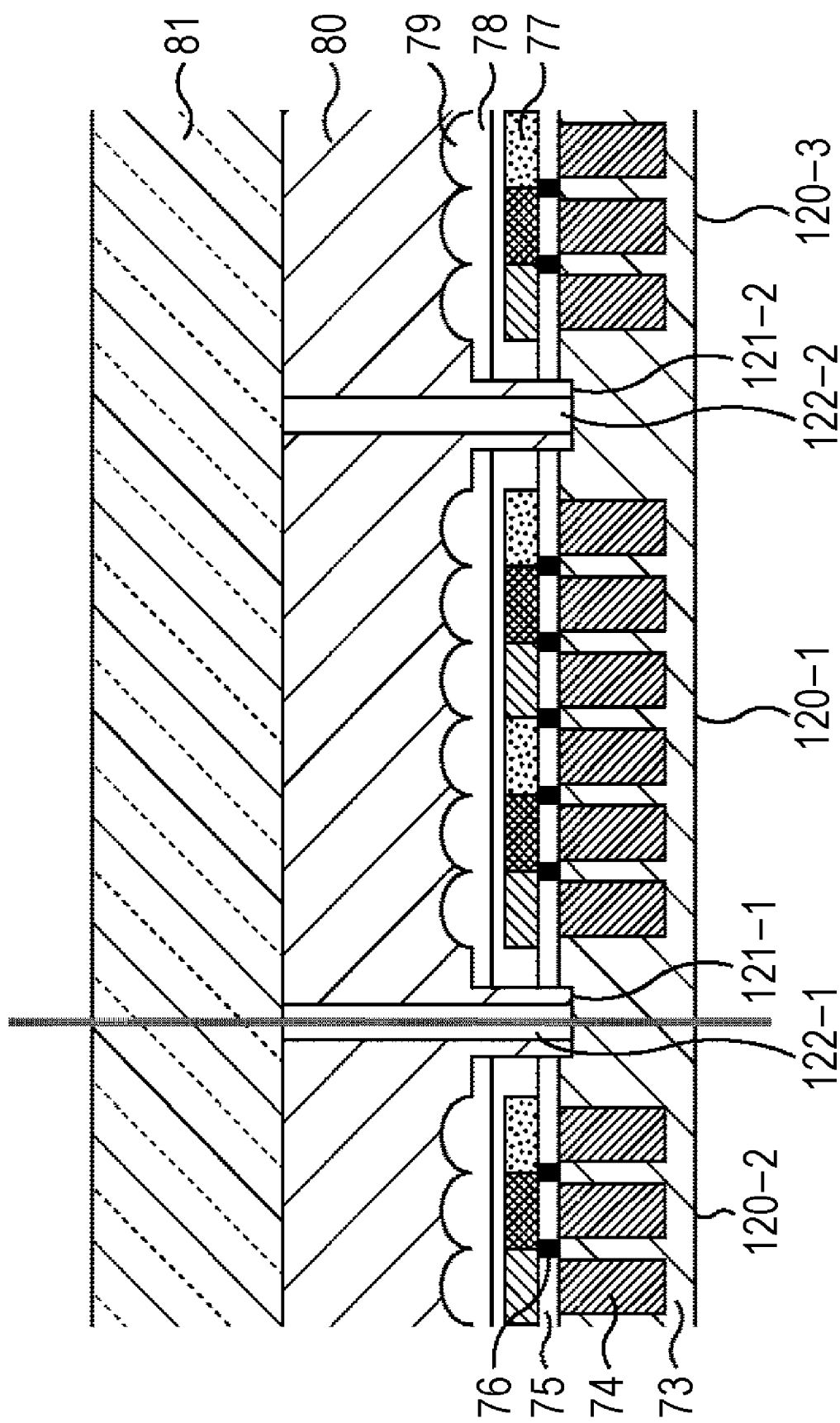
FIG. 7 is a diagram illustrating a configuration of a chip according to the first embodiment.

FIG. 7 illustrates another configuration of the chip in the first embodiment. FIG. 7 illustrates a wafer that includes a plurality of chips (three chips in FIG. 7) and is not diced yet, similarly to FIG. 4. The same parts as in FIG. 4 are denoted by the same reference numerals, and a description thereof is omitted.

In a wafer illustrated in FIG. 7, a chip positioned at the center is referred to as a "chip 120-1," a chip positioned at the left is referred to as a "chip 120-2," and a chip positioned at the right is referred to as a "chip 120-3."

In the wafer illustrated in FIG. 7, a groove 121 is formed between the chips 120. The groove 121-1 is formed between the chip 120-1 and the chip 120-2, and the groove 121-2 is formed between the chip 120-1 and the chip 120-3.

There is a scribe section 91-1 between the chip 120-1 and the chip 120-2, and the groove 121-1 is formed in the scribe section 91-1. Similarly, there is a scribe section 91-2 between the chip 120-1 and the chip 120-3, and the groove 121-2 is formed in the scribe section 91-2.

A method of forming the groove 121 is the same as in the chip 110 described above with reference to FIG. 6. In the chip 120 illustrated in FIG. 7, a space 122-1 and a space 122-2 are further formed. The space 122-1 is formed between the chip 120-1 and the chip 120-2, and the space 122-2 is formed between the chip 120-1 and the chip 120-3.

The chip 120 illustrated in FIG. 7 has a configuration in which the groove 121 is formed such that the microlens layer 79, the planarization film 78, the color filter layer 77, the planarization film 75, and a part of the silicon substrate 73 are excavated, and the space 122 is also formed in the adhesive layer 80.

As described above, the space 122 is formed to penetrate the adhesive layer 80 from the groove 121. Since the scribe section 91 is cut by dicing, when the scribe section 91 is positioned in the space 122 in advance, force applied to the layers of the chip 120 at the time of dicing can be reduced.

The groove 121 and the space 122 are formed, for example, such that the groove 121 is formed before the adhesive layer 80 is formed, the adhesive layer 80 is formed after the groove 121 is formed, and thereafter the space 122 is formed.

Alternatively, although not illustrated, the groove 121 and the space 122 may be formed to be integrated into each other. A configuration in which the same material as the adhesive layer 80 does not remain at the side of the groove 121 (the side of the groove 121 such as the color filter layer 77) may be provided, and the space 122 may be positioned at the side of the color filter layer 77 or the like to serve as the groove 121.

In this configuration, after up to the adhesive layer 80 is stacked, the space 122 is formed. In this case, since the space 122 is formed instead of the groove 121, a process of forming the space 122 may be performed instead of a process of forming the groove 121.

When the wafer illustrated in FIG. 7 in which the groove 121 and the space 122 are formed between the chips 120 is diced along the scribe section 91, the chip 120 having almost the same structure as the chip 100 illustrated in FIG. 5 is cut out.

In other words, the chip 120 in which the microlens layer 79, the planarization film 78, the color filter layer 77, the planarization film 75, and a part of the silicon substrate 73 are surrounded by the adhesive layer 80 and thus not exposed on the surface is cut out.

As dicing is performed in the state in which the groove 121 and the space 122 are formed, and the groove 121 is filled with the same material as the adhesive layer 80 as described above, force applied to an interface between films at the time of dicing can be mitigated, and a possibility that film peeling or a crack will occur can be reduced. Further, since film peeling or a crack does not occur, the moisture-proof performance of the chip can be improved.

The space 122 may remain as a space or may be filled with a material having high moisture-proof performance or a material different from a material for forming the adhesive layer 80.

(1-3)-Rd Embodiment

Figure 8:
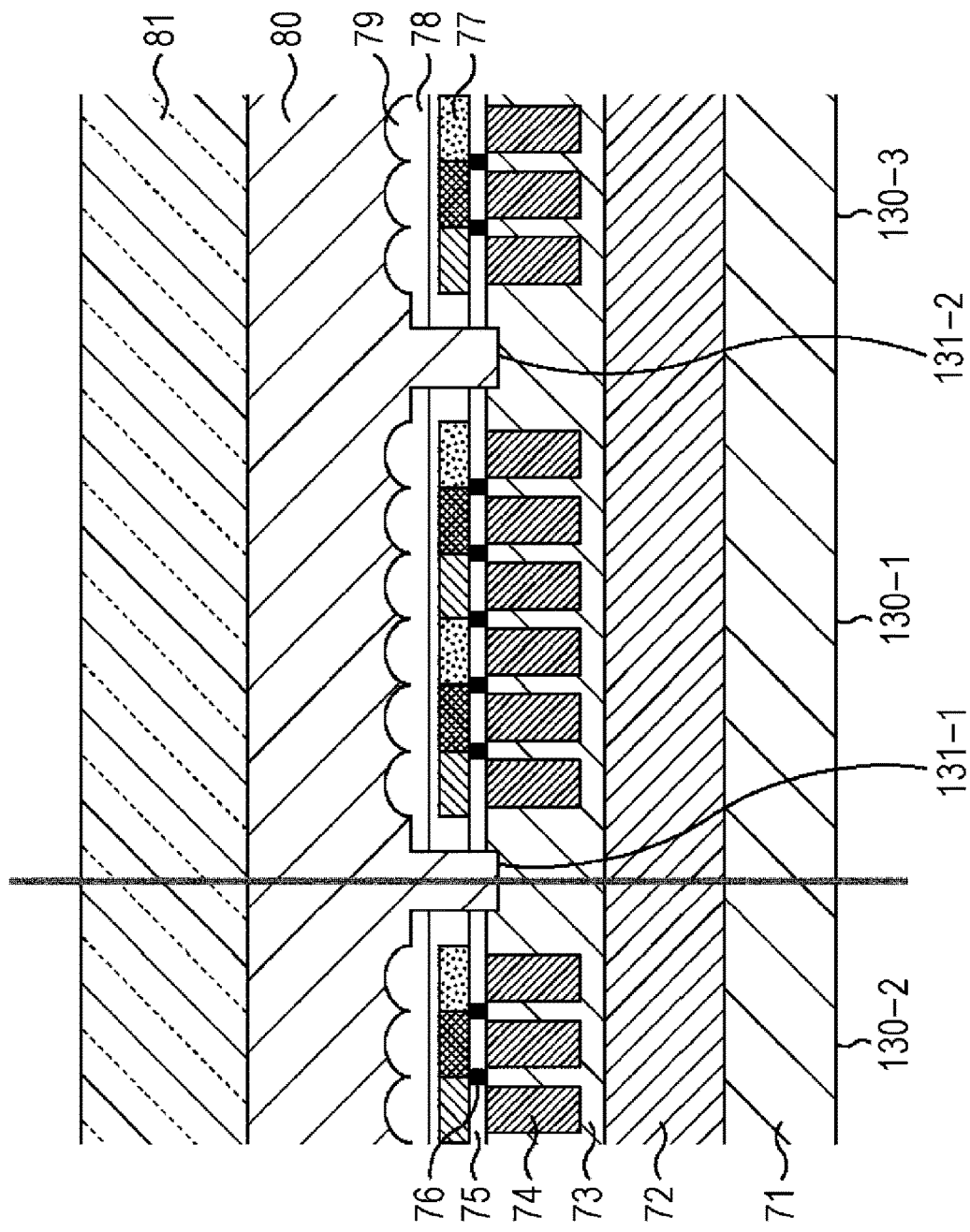
FIG. 8 is a diagram illustrating a configuration of a chip according to the first embodiment.

FIG. 8 illustrates another configuration of the chip in the first embodiment. FIG. 8 illustrates a wafer that includes a plurality of chips (three chips in FIG. 8) and is not diced yet, similarly to FIG. 6. The same parts as in FIG. 6 are denoted by the same reference numerals, and a description thereof is omitted.

In a wafer illustrated in FIG. 8, a chip positioned at the center is referred to as a "chip 130-1," a chip positioned at the left is referred to as a "chip 130-2," and a chip positioned at the right is referred to as a "chip 130-3."

In the wafer illustrated in FIG. 8, a groove 131 is formed between the chips 130. The groove 131-1 is formed between the chip 130-1 and the chip 130-2, and the groove 131-2 is formed between the chip 130-1 and the chip 130-3.

The chip 130 illustrated in FIG. 8 having the groove 131 is similar to the chip 110 illustrated in FIG. 6 except that an interconnection layer 72 and a support substrate 71 are added in a lower portion of the chip 110 illustrated in FIG. 6, and thus a description thereof is omitted. In other words, the present embodiment can be applied even to the chip 130 with a signal processing circuit substrate including the interconnection layer 72 and the support substrate 71 as illustrated in FIG. 8.

As dicing is performed in the state in which the groove 131 is formed and filled with the same material as the adhesive layer 80 as described above, force applied to an interface between films at the time of dicing can be mitigated, and a possibility that film peeling or a crack will occur can be reduced. Further, since film peeling or a crack does not occur, the moisture-proof performance of the chip can be improved.

Further, the (1-2)-nd embodiment may be applied to the (1-3)-rd embodiment such that the space 122 is formed in the adhesive layer 80 and the groove 131. When the space 122 is formed, the space 122 may be filled with transparent resin or a member having high moisture-proof performance.

(1-4)-Th Embodiment

Figure 9:
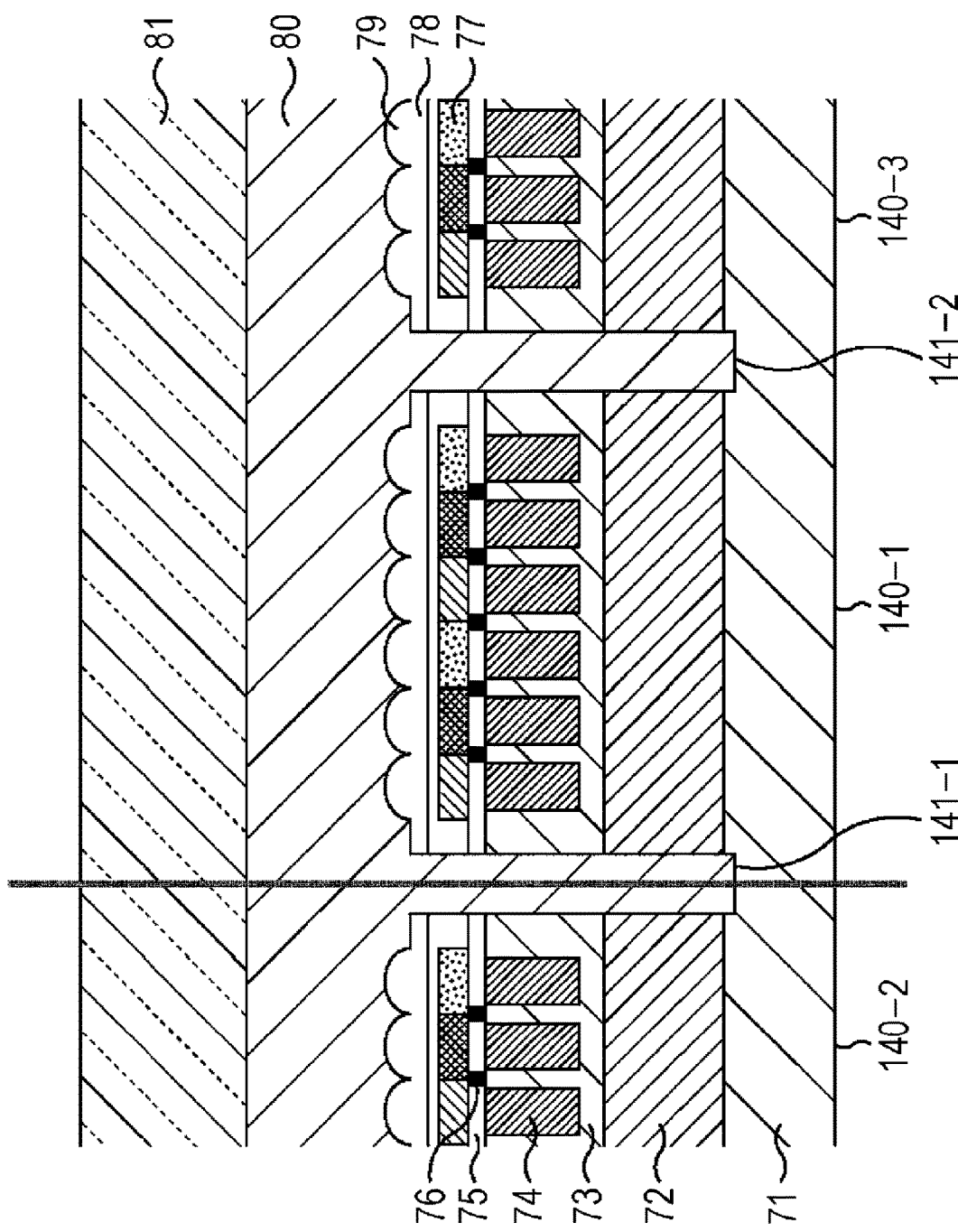
FIG. 9 is a diagram illustrating a configuration of a chip according to the first embodiment.

FIG. 9 illustrates another configuration of the chip in the first embodiment. FIG. 9 illustrates a wafer that includes a plurality of chips (three chips in FIG. 9) and is not diced yet, similarly to FIG. 8. The same parts as in FIG. 8 are denoted by the same reference numerals, and a description thereof is omitted.

In a wafer illustrated in FIG. 9, a chip positioned at the center is referred to as a "chip 140-1," a chip positioned at the left is referred to as a "chip 140-2," and a chip positioned at the right is referred to as a "chip 140-3."

In the wafer illustrated in FIG. 9, a groove 141 is formed between the chips 140. The groove 141-1 is formed between the chip 140-1 and the chip 140-2, and the groove 141-2 is formed between the chip 140-1 and the chip 140-3.

In the chip 140 illustrated in FIG. 9, similarly to the chip 130 illustrated in FIG. 8, a signal processing circuit substrate including an interconnection layer 72 and a support substrate 71 is stacked, and the groove 141 is formed up to the signal processing circuit substrate. In the example illustrated in FIG. 9, the groove 141 is formed such that up to the support substrate 71 is excavated.

In the chip 140 illustrated in FIG. 9, the groove 141 is formed such that the microlens layer 79, the planarization film 78, the color filter layer 77, the planarization film 75, the silicon substrate 73, the interconnection layer 72, and a part of the support substrate 71 are excavated.

As will be described later, at the time of manufacturing, the groove 141 is formed before the adhesive layer 80, and the adhesive layer 80 is formed after the groove 141 is formed, and thus the groove 141 is filled with the same adhesive as the adhesive layer 80.

Figure 10:
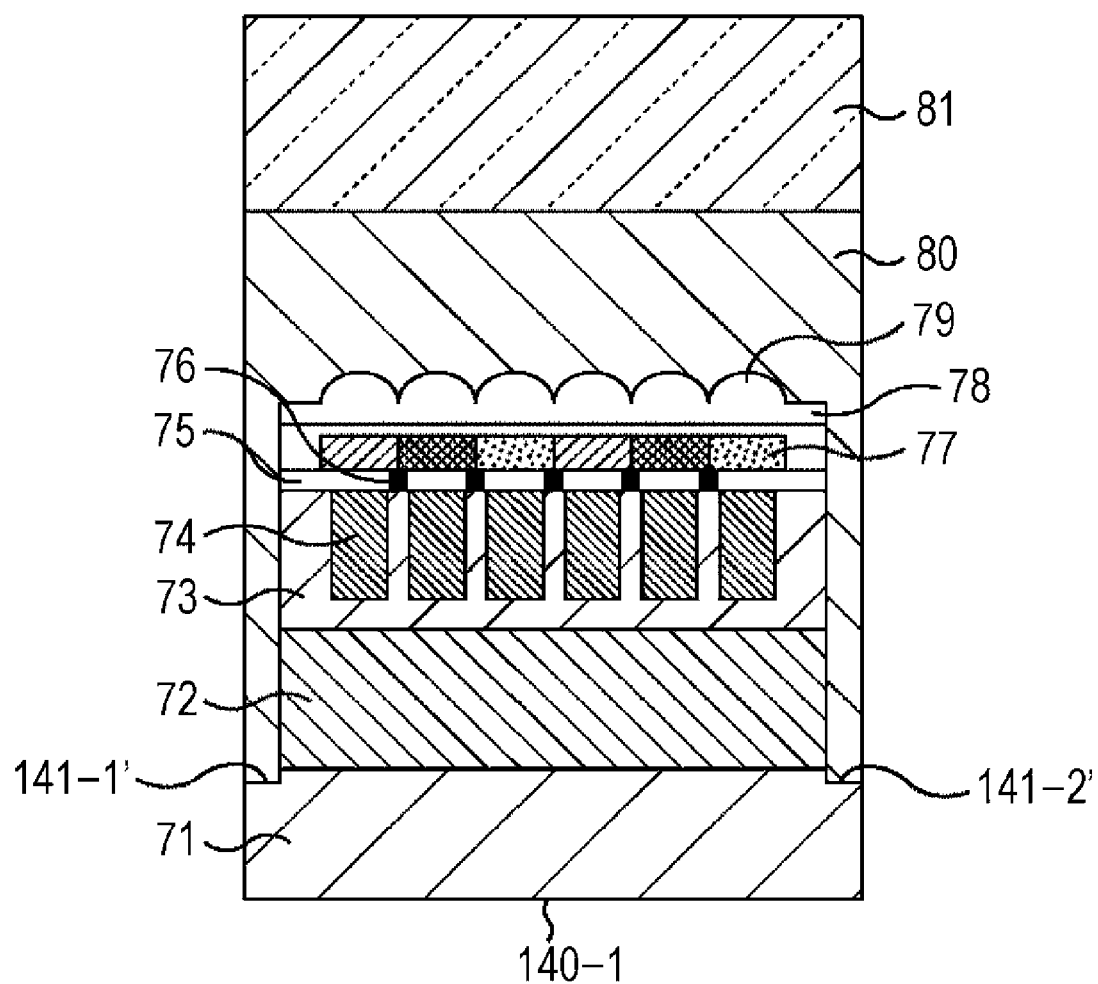
FIG. 10 is a diagram illustrating a configuration of a chip according to the first embodiment.

As the wafer in which the groove 141 is formed between the chips 140 is diced along the scribe section 91, the chip 140-1 illustrated in FIG. 10 is cut out. In the chip 140-1 illustrated in FIG. 10, the microlens layer 79, the planarization film 78, the color filter layer 77, the planarization film 75, the silicon substrate 73, the interconnection layer 72, and a part of the support substrate 71 are surrounded by the adhesive layer 80 and thus not to exposed on the surface.

In other words, the side surfaces of the microlens layer 79, the planarization film 78, the color filter layer 77, the planarization film 75, the silicon substrate 73, the interconnection layer 72, and a part of the support substrate 71 are covered with the same material as the adhesive layer 80. As described above, the diced chip 140-1 has the structure in which parts of the stacked layers of the chip 140-1 are covered with the groove 141-1' and the groove 141-2'.

As dicing is performed in the state in which the groove 141 is formed and filled with the same material as the adhesive layer 80 as described above, force applied to an interface between films at the time of dicing can be mitigated, and a possibility that film peeling or a crack will occur can be reduced. Further, since film peeling or a crack does not occur, the moisture-proof performance of the chip can be improved.

The (1-2)-nd embodiment may be applied to the (1-4)-th embodiment, and the space 122 may be formed in the adhesive layer 80 and the groove 141. When the space 122 is formed, the space 122 may be filled with transparent resin or a member having high moisture-proof performance.

(1-5)-Th Embodiment

Figure 11:
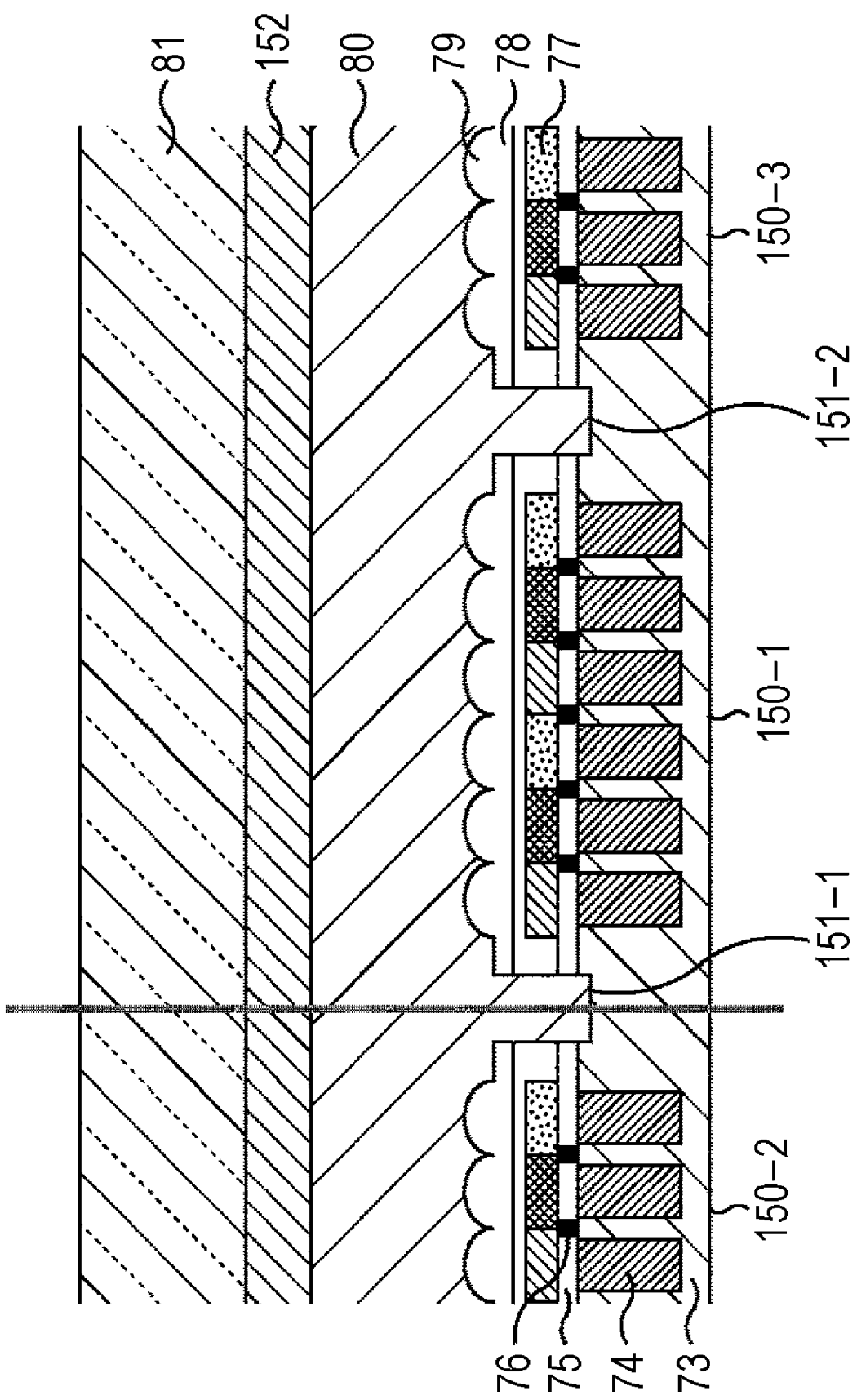
FIG. 11 is a diagram illustrating a configuration of a chip according to the first embodiment.

FIG. 11 illustrates another configuration of the chip in the first embodiment. FIG. 11 illustrates a wafer that includes a plurality of chips (three chips in FIG. 11) and is not diced yet, similarly to FIG. 6. The same parts as in FIG. 6 are denoted by the same reference numerals, and a description thereof is omitted.

In a wafer illustrated in FIG. 11, a chip positioned at the center is referred to as a "chip 150-1," a chip positioned at the left is referred to as a "chip 150-2," and a chip positioned at the right is referred to as a "chip 150-3."

In the wafer illustrated in FIG. 11, a groove 151 is formed between the chips 150. The groove 151-1 is formed between the chip 150-1 and the chip 150-2, and the groove 151-2 is formed between the chip 150-1 and the chip 150-3.

The chip 150 illustrated in FIG. 11 having the groove 151 is similar to the chip 110 illustrated in FIG. 6 except that a transparent resin layer 152 is formed between the adhesive layer 80 and the cover glass 81 of the chip 110 illustrated in FIG. 6, and thus a description thereof is omitted.

As dicing is performed in the state in which the groove 151 is formed and filled with the same material as the adhesive layer 80 as described above, force applied to an interface between films at the time of dicing can be mitigated, and a possibility that film peeling or a crack will occur can be reduced. Further, since film peeling or a crack does not occur, the moisture-proof performance of the chip can be improved.

Further, the (1-2)-nd embodiment may be applied to the (1-5)-th embodiment such that the space 122 is formed in the adhesive layer 80 and the groove 131. When the space 122 is formed, the space 122 may be filled with transparent resin or a member having high moisture-proof performance.

Further, the (1-3)-rd embodiment or the (1-4)-th embodiment may be applied to provide a configuration in which the signal processing circuit substrate including the interconnection layer 72 and the support substrate 71 is stacked.

(1-6)-Th Embodiment

Figure 12:
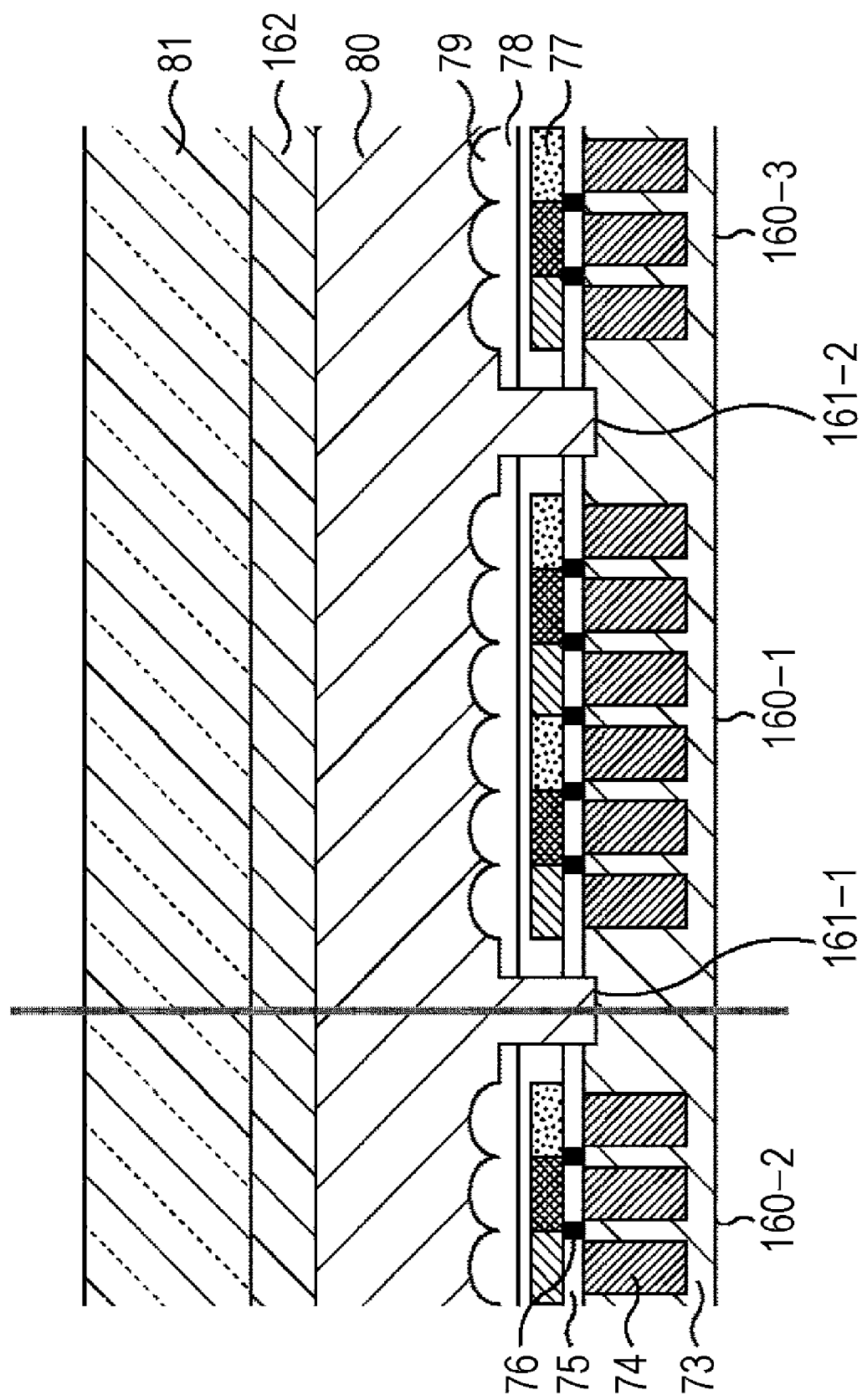
FIG. 12 is a diagram illustrating a configuration of a chip according to the first embodiment.

FIG. 12 illustrates another configuration of the chip in the first embodiment. FIG. 12 illustrates a wafer that includes a plurality of chips (three chips in FIG. 12) and is not diced yet, similarly to FIG. 6. The same parts as in FIG. 6 are denoted by the same reference numerals, and a description thereof is omitted.

In a wafer illustrated in FIG. 12, a chip positioned at the center is referred to as a "chip 160-1," a chip positioned at the left is referred to as a "chip 160-2," and a chip positioned at the right is referred to as a "chip 160-3."

In the wafer illustrated in FIG. 11, a groove 161 is formed between the chips 160. The groove 161-1 is formed between the chip 160-1 and the chip 160-2, and the groove 161-2 is formed between the chip 160-1 and the chip 160-3.

The chip 160 illustrated in FIG. 12 having the groove 161 is similar to the chip 110 illustrated in FIG. 6 except that an absorbing film 162 is formed between the adhesive layer 80 and the cover glass 81 of the chip 110 illustrated in FIG. 6, and thus a description thereof is omitted. The absorbing film 162 is a film made of a material absorbing light of a certain wavelength.

As dicing is performed in the state in which the groove 161 is formed and filled with the same material as the adhesive layer 80 as described above, force applied to an interface between films at the time of dicing can be mitigated, and a possibility that film peeling or a crack will occur can be reduced. Further, since film peeling or a crack does not occur, the moisture-proof performance of the chip can be improved.

Further, the (1-2)-nd embodiment may be applied to the (1-6)-th embodiment such that the space 122 is formed in the adhesive layer 80 and the groove 131. When the space 122 is formed, the space 122 may be filled with transparent resin or a member having high moisture-proof performance.

Further, the (1-3)-rd embodiment or the (1-4)-th embodiment may be applied to provide a configuration in which the signal processing circuit substrate including the interconnection layer 72 and the support substrate 71 is stacked.

(1-7)-Th Embodiment

Figure 13:
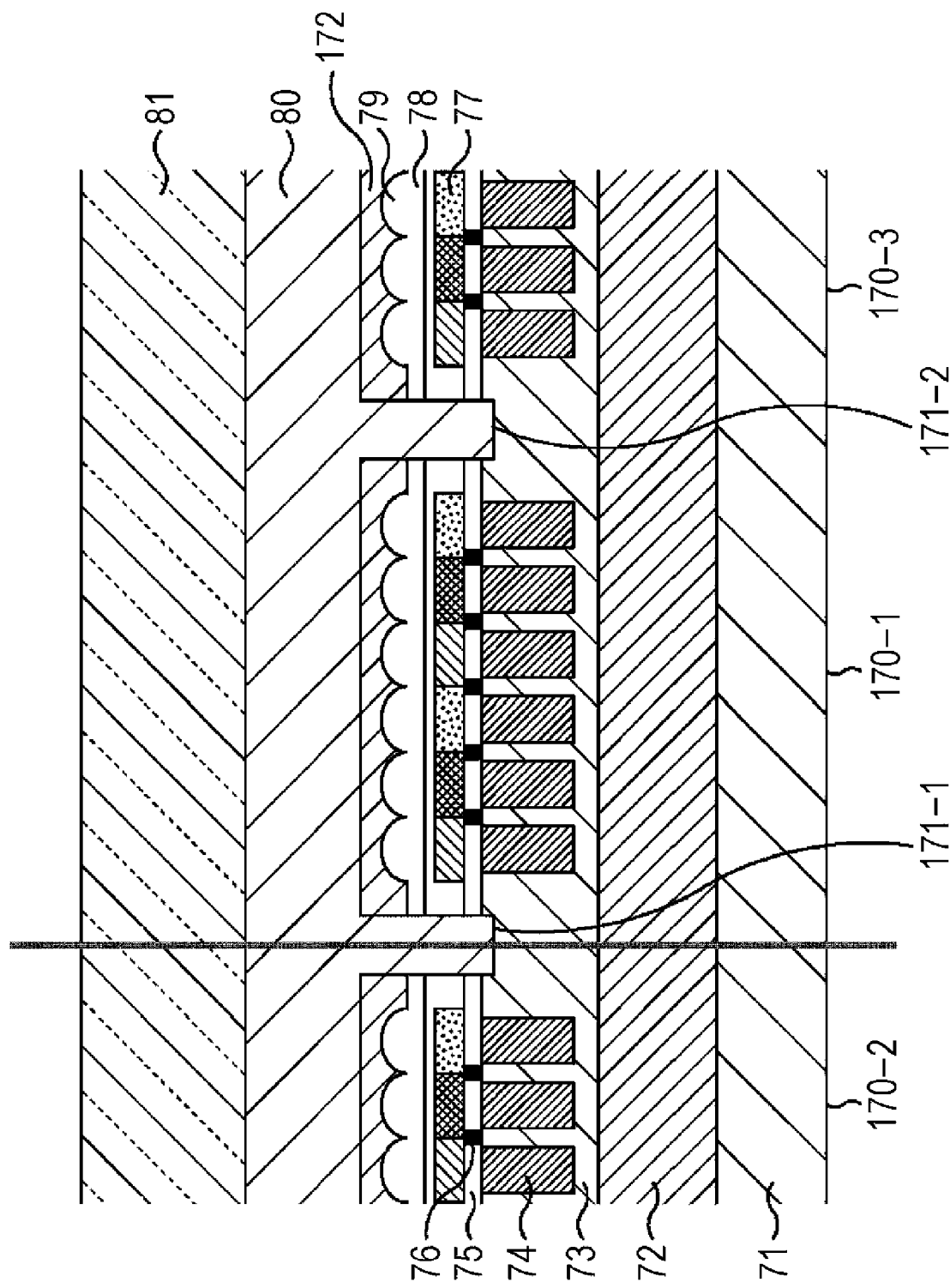
FIG. 13 is a diagram illustrating a configuration of a chip according to the first embodiment.

FIG. 13 illustrates another configuration of the chip in the first embodiment. FIG. 13 illustrates a wafer that includes a plurality of chips (three chips in FIG. 13) and a signal processing circuit substrate stacked thereon, and is not diced yet, similarly to FIG. 8. The same parts as in FIG. 8 are denoted by the same reference numerals, and a description thereof is omitted.

In a wafer illustrated in FIG. 13, a chip positioned at the center is referred to as a "chip 170-1," a chip positioned at the left is referred to as a "chip 170-2," and a chip positioned at the right is referred to as a "chip 170-3."

In the wafer illustrated in FIG. 13, a groove 171 is formed between the chips 170. The groove 171-1 is formed between the chip 170-1 and the chip 170-2, and the groove 171-2 is formed between the chip 170-1 and the chip 170-3.

The chip 170 illustrated in FIG. 13 having the groove 171 is similar to the chip 130 illustrated in FIG. 8 except that a low refractive index film 172 is formed between the adhesive layer 80 and the microlens layer 79 of the chip 130 illustrated in FIG. 8, and thus a description thereof is omitted. The low refractive index film 172 is a film that is formed on the microlens layer 79 and made of a material having a refractive index lower than a material for forming the microlens layer 79.

As dicing is performed in the state in which the groove 171 is formed and filled with the same material as the adhesive layer 80 as described above, force applied to an interface between films at the time of dicing can be mitigated, and a possibility that film peeling or a crack will occur can be reduced. Further, since film peeling or a crack does not occur, the moisture-proof performance of the chip can be improved.

Further, the (1-2)-nd embodiment may be applied to the (1-7)-th embodiment such that the space 122 is formed in the adhesive layer 80 and the groove 131. When the space 122 is formed, the space 122 may be filled with transparent resin or a member having high moisture-proof performance.

(1-8)-Th Embodiment

Figure 14:
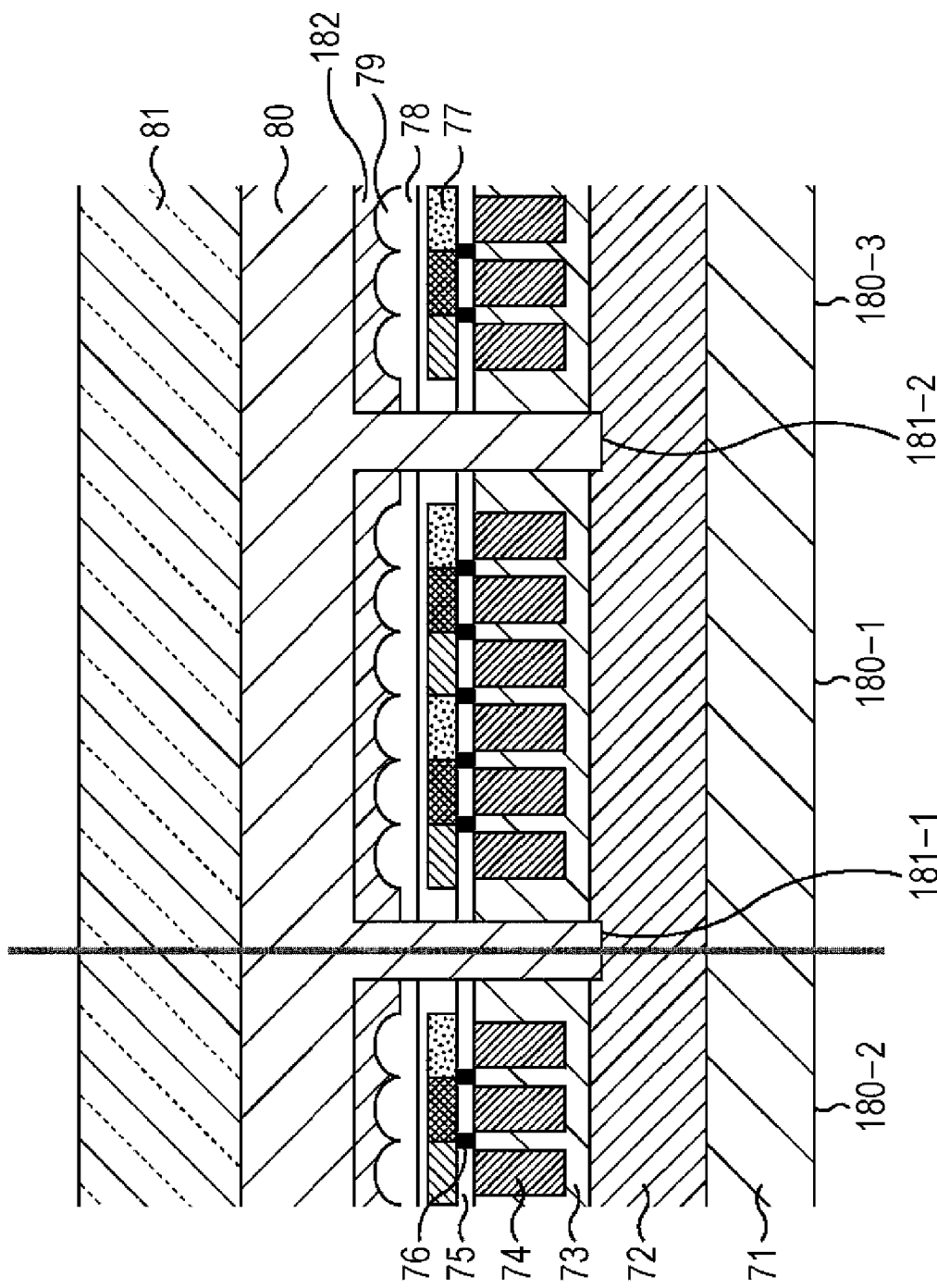
FIG. 14 is a diagram illustrating a configuration of a chip according to the first embodiment.

FIG. 14 illustrates another configuration of the chip in the first embodiment. FIG. 14 illustrates a wafer that includes a plurality of chips (three chips in FIG. 14) and a signal processing circuit substrate stacked thereon, and is not diced yet, similarly to FIG. 9. The same parts as in FIG. 9 are denoted by the same reference numerals, and a description thereof is omitted.

In a wafer illustrated in FIG. 14, a chip positioned at the center is referred to as a "chip 180-1," a chip positioned at the left is referred to as a "chip 180-2," and a chip positioned at the right is referred to as a "chip 180-3."

In the wafer illustrated in FIG. 14, a groove 181 is formed between the chips 180. The groove 181-1 is formed between the chip 180-1 and the chip 180-2, and the groove 181-2 is formed between the chip 180-1 and the chip 180-3.

The chip 180 illustrated in FIG. 14 having the groove 181 is similar to the chip 140 illustrated in FIG. 9 except that a low refractive index film 182 is formed between the adhesive layer 80 and the microlens layer 79 of the chip 140 illustrated in FIG. 9, and thus a description thereof is omitted. The low refractive index film 182 is a film that is formed on the microlens layer 79 and made of a material having a refractive index lower than a material for forming the microlens layer 79.

As dicing is performed in the state in which the groove 181 is formed and filled with the same material as the adhesive layer 80 as described above, force applied to an interface between films at the time of dicing can be mitigated, and a possibility that film peeling or a crack will occur can be reduced. Further, since film peeling or a crack does not occur, the moisture-proof performance of the chip can be improved.

Further, the (1-2)-nd embodiment may be applied to the (1-8)-th embodiment such that the space 122 is formed in the adhesive layer 80 and the groove 131. When the space 122 is formed, the space 122 may be filled with transparent resin or a member having high moisture-proof performance.

As described above with reference to the (1-1)-st to the (1-8)-th embodiments, as a groove is formed between chips in a wafer state before a chip is diced, force applied to an interface between films at the time of dicing can be mitigated, and a possibility that film peeling or a crack will occur can be reduced. Further, since film peeling or a crack does not occur, the moisture-proof performance of the chip can be improved.

Manufacturing of Chip According to First Embodiment

Figure 15:
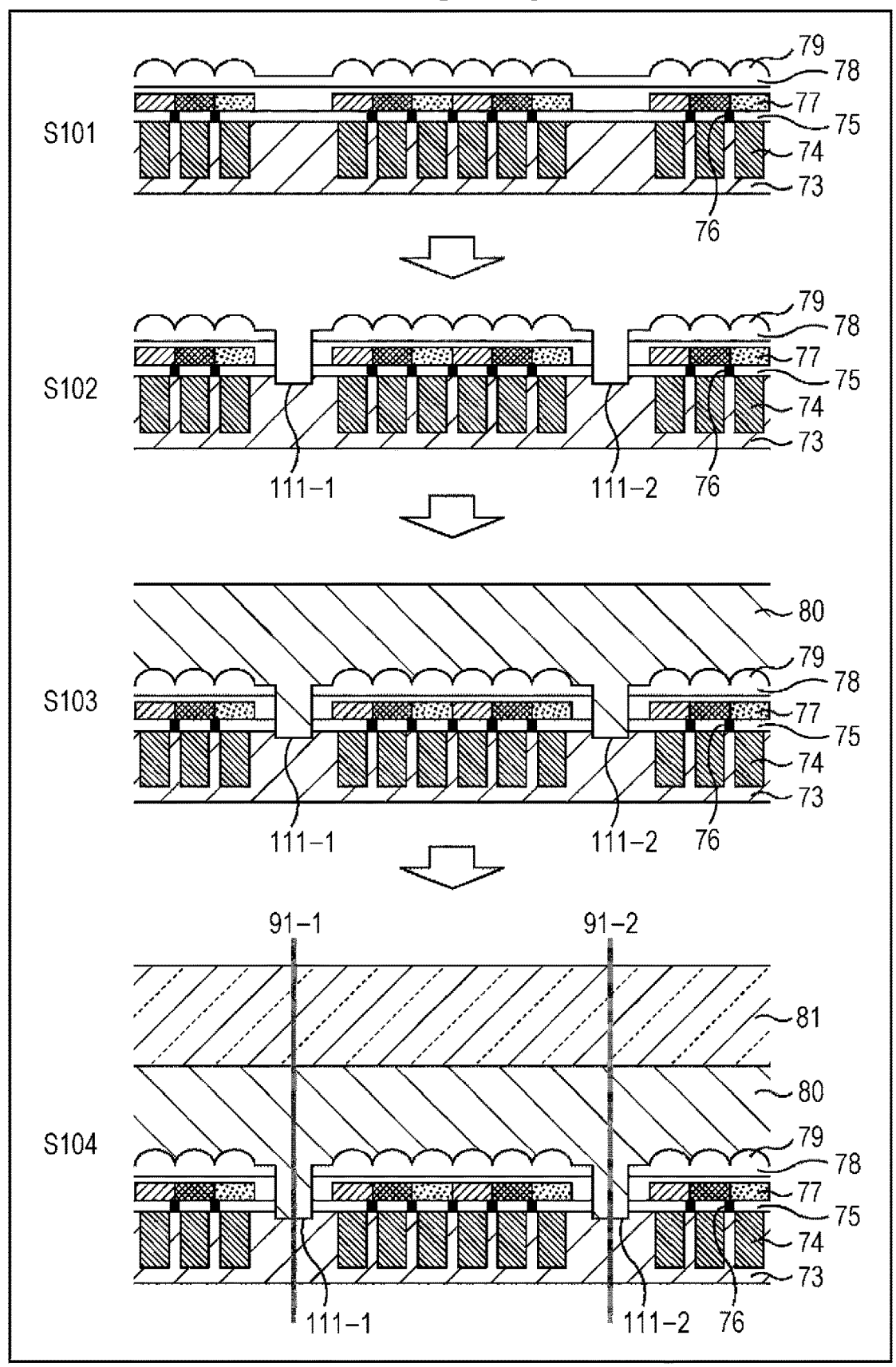
FIG. 15 is a diagram for describing a process of manufacturing a chip according to the first embodiment.

A process of manufacturing a chip (wafer) having such a groove will be described. FIG. 15 is a diagram for describing a process of manufacturing a chip prior to dicing.

The manufacturing process described with reference to FIG. 15 will focus on manufacturing of a groove serving as one of characteristic components of the present technology, and a manufacturing method of a related art can be applied to manufacturing of other parts such as forming of layers, and thus a description thereof will be appropriately omitted. Here, the description will proceed with an example in which the chip 110 of FIG. 6 according to the (1-1)-st embodiment is manufactured.

In step S101, a wafer in which a silicon substrate 73, a planarization film 75, a color filter layer 77, a planarization film 78, and a microlens layer 79 are stacked, a photodiode 74 is formed in the silicon substrate 73, and a light shielding film 76 is formed in the planarization film 75 is prepared. Further, although not illustrated, a wafer in which the interconnection layer 72 and the support substrate 71 are stacked may be prepared.

In step S102, a groove 111-1 and a groove 111-2 are formed. For example, the groove 111 is formed by performing dry etching after patterning. Further, when the groove 141 is formed such that up to the support substrate 71 is excavated as in the (1-4)-th embodiment illustrated in FIG. 9, in step S102, the groove 141 is formed to reach the support substrate 71 of the wafer in which the interconnection layer 72 and the support substrate 71 are stacked.

In step S103, the adhesive layer 80 is formed. When the adhesive layer 80 is formed, the groove 111 is filled with a transparent member for forming the adhesive layer 80. Further, when the space 122 is formed as in the (1-2)-nd embodiment illustrated in FIG. 7, in step S103, the adhesive layer 80 is formed, and then the space 122 is formed by performing dry-etching, for example, similarly to step S102.

Alternatively, in the case of a configuration in which there is only the space 122 without the same material as the adhesive layer 80 formed on the side of the groove 121, in step S103, the space 122 may be formed without performing a process of forming a groove in step S102.

In step S104, the cover glass 81 is stacked. After the cover glass 81 is stacked, dicing is performed along the scribe section 91-1 and the scribe section 91-2, and thus the diced chip 110 is manufactured.

As step S102 of forming a groove is performed as described above, force applied to an interface between films at the time of dicing can be mitigated, and a possibility that film peeling or a crack will occur can be reduced.

Second Embodiment

In the second embodiment, a groove is formed in a certain layer in a chip to prevent damage at the time of dicing and intrusion of moisture into a chip.

(2-1)-St Embodiment

Figure 16:
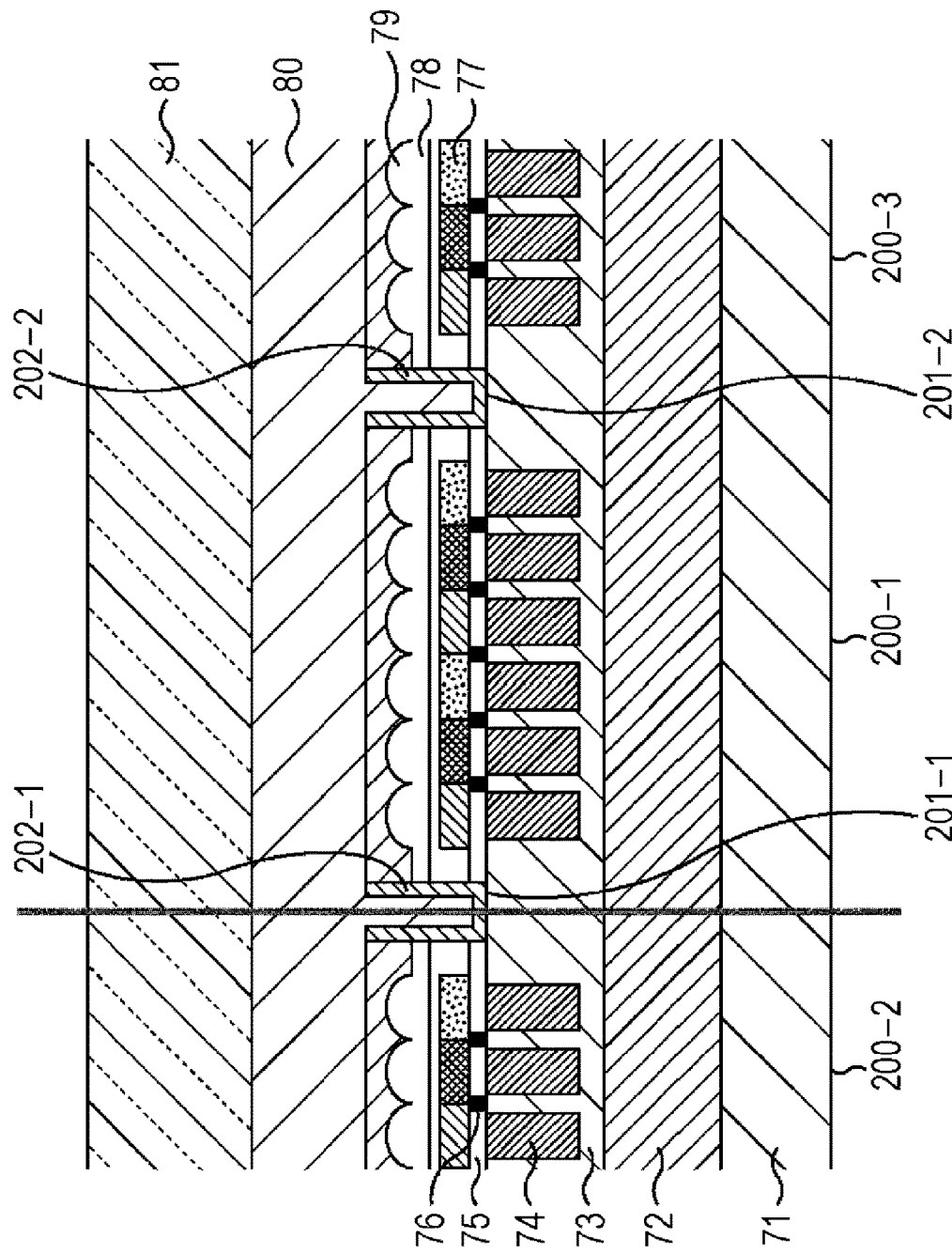
FIG. 16 is a diagram illustrating a configuration of a chip according to a second embodiment.

FIG. 16 illustrates a configuration of a chip according to the second embodiment. FIG. 16 illustrates a wafer that includes a plurality of chips (three chips in FIG. 16) and is not diced yet, similarly to FIG. 2.

Here, a chip positioned at the center is referred to as a "chip 200-1," a chip positioned at the left is referred to as a "chip 200-2," and a chip positioned at the right is referred to as a "chip 200-3." In the following description, when the chips 200-1 to 200-3 need not be distinguished from one another, the chips are referred to as simply a "chip 200."

Each chip 200 has the same configuration as the chip 70 described above with reference to FIGS. 2 and 3. In other words, the chip 200 is configured such that an interconnection layer 72 is arranged on a support substrate 71, and a silicon substrate 73 is arranged on the interconnection layer 72. In the silicon substrate 73, a plurality of photodiodes 74

(optical elements) serving as photoelectric conversion units of pixels are formed at certain intervals.

The planarization film 75 is formed on the silicon substrate 73, and a light shielding film 76 for preventing light from leaking into a neighboring pixel is formed in a portion of the planarization film 75 corresponding to a position between the photodiodes 74. A color filter layer 77 is formed on the planarization film 75. A planarization film 78 is formed on the color filter layer 77. A microlens layer 79 is formed on the planarization film 78. A cover glass 81 is bonded onto the microlens layer 79 through an adhesive layer 80.

In the wafer illustrated in FIG. 16, a groove 201 is formed between the chips 200. The groove 201-1 is formed between the chip 200-1 and the chip 200-2, and the groove 201-2 is formed between the chip 200-1 and the chip 200-3.

A passivation film 202-1 is formed in the groove 201-1, and a passivation film 202-2 is formed in the groove 201-2. The passivation film 202 is preferably a film with a high moisture-proof property made of an inorganic material such as a SiN film. Since moisture is likely to intrude into a light receiving device (chip) to cause a problem such as image quality deterioration depending on conditions of humidity, temperature, or the like, the passivation film 202 is formed to protect the end face of the light receiving device.

The passivation film 202 has a function of preventing moisture from intruding into the chip 200 and protecting the end face of the chip at the time of dicing as described above.

There is a scribe section 91-1 between the chip 200-1 and the chip 200-2, and the groove 201-1 is formed in the scribe section 91-1. Similarly, there is a scribe section 91-2 between the chip 200-1 and the chip 200-3, and the groove 201-2 is formed in the scribe section 91-2.

In the other drawings subsequent to FIG. 16, in order to help with viewing the groove 201-2, the description will proceed in a state in which the scribe section 91-2 is not illustrated.

In the chip 200 illustrated in FIG. 16, the groove 201 is formed such that the microlens layer 79, the planarization film 78, the color filter layer 77, and the planarization film 75 are excavated up to an upper portion of the silicon substrate 73.

Further, since the passivation film 202 is formed in the groove 201, the passivation film 202 is formed on the side surfaces of the microlens layer 79, the planarization film 78, the color filter layer 77, and the planarization film 75 and the upper portion of the silicon substrate 73.

As will be described later, at the time of manufacturing, since the groove 201 is formed before the adhesive layer 80 is formed, the passivation film 202 is formed after the groove 201 is formed, and the adhesive layer 80 is formed after the passivation film 202 is formed, the groove 201 (the inside of the rectangle formed by the passivation film 202) is filled with the same material as the adhesive layer 80. Transparent resin may be used as a material for forming the adhesive layer 80. The groove 201 may be filled with the transparent resin.

Here, the description proceeds with the example in which the passivation film 202 is formed, and the inside of the passivation film 202 is filled with the same material as the adhesive layer 80, but the groove 201 may be filled with only the material of the passivation film 202.

Figure 17:
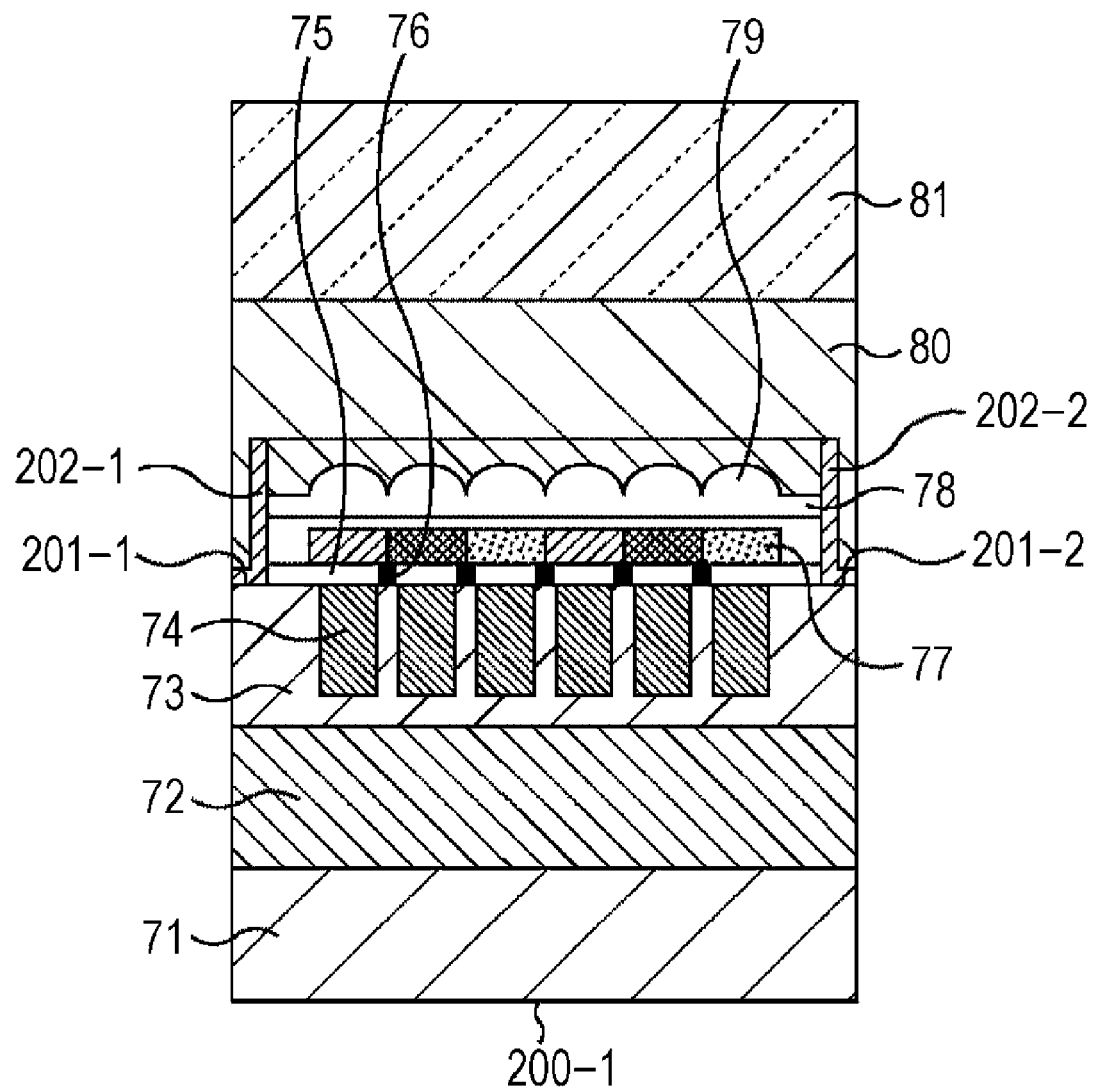
FIG. 17 is a diagram illustrating a configuration of a chip according to the second embodiment.

When the wafer in which the groove 201 is formed between the chips 200 is diced along the scribe section 91, the chip 200-1 illustrated in FIG. 17 is cut out. In the chip 200-1 illustrated in FIG. 17, the cross-sectional surfaces of the microlens layer 79, the planarization film 78, the color filter layer 77, and the planarization film 75 are covered with the passivation film 202 and thus not exposed on the surface. Further, the microlens layer 79, the planarization film 78, the color filter layer 77, and the planarization film 75 are covered with the same material as the adhesive layer 80.

As described above, the diced chip 200-1 has a structure in which parts of the stacked layers of the chip 200-1 are covered with the groove 201-1' and the groove 201-2' (a dash is added to the grooves after dicing in order to be distinguished from the groove 201-1 and the groove 201-2 before dicing illustrated in FIG. 16).

Since the diced chip 200-1 is configured such that the groove 201-1' and the groove 201-2' remain, and the passivation film 202 remains in the portions of the groove 201-1' and the groove 201-2' as described above, a width of the groove 201-1 or the groove 201-2 between the chips 200 before dicing is preferably larger than a width of a blade used in the dicing process.

As the dicing is performed in a state in which the groove 201 is formed, and the passivation film 202 is formed on the inner side of the groove 201 as described above, force applied to an interface between films at the time of dicing can be mitigated, and a possibility that film peeling or a crack will occur can be reduced. Further, since film peeling or a crack does not occur, the moisture-proof performance of the chip can be improved. Further, as the passivation film 202 is formed, the moisture-proof performance can be further improved.

(2-2)-Nd Embodiment

Figure 18:
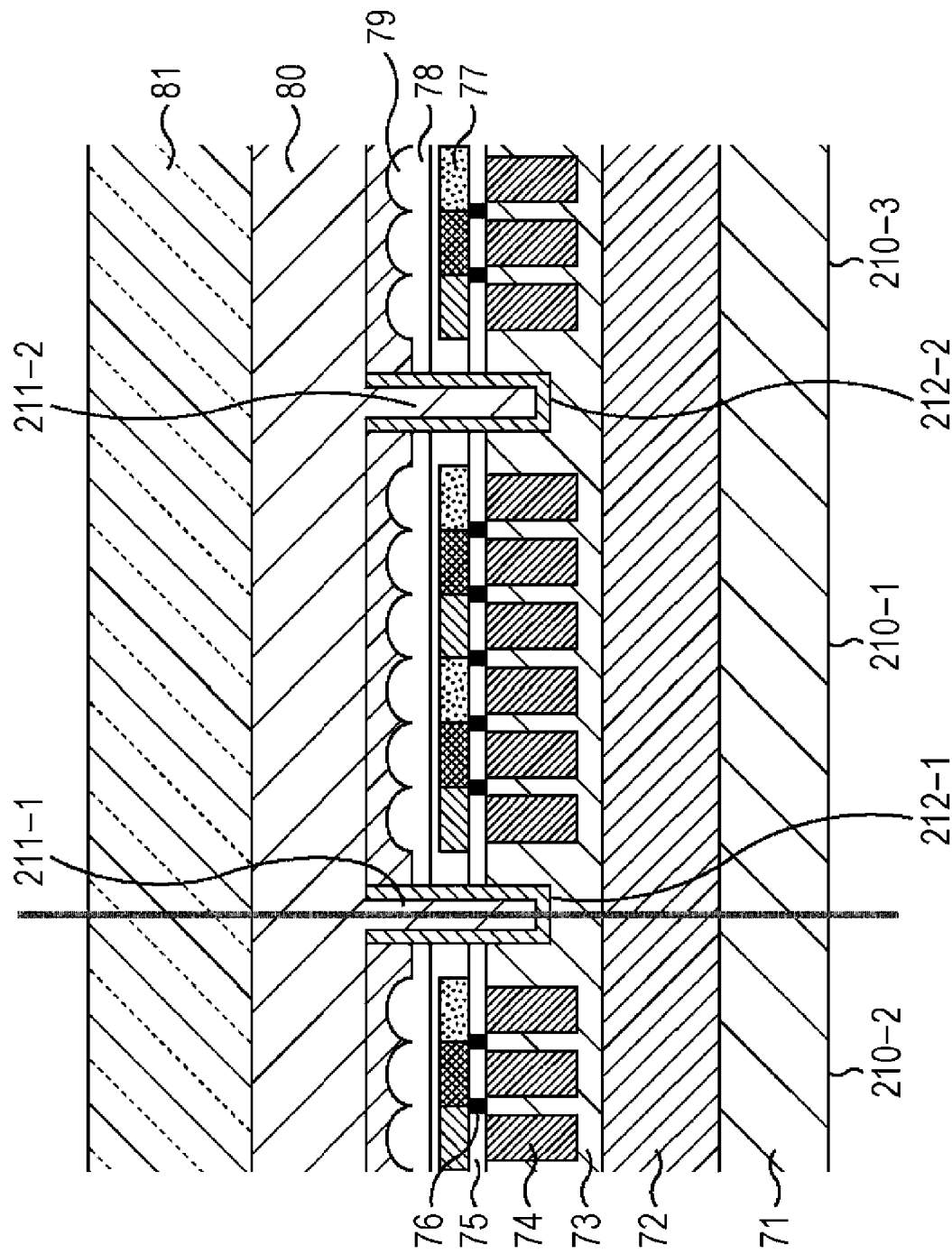
FIG. 18 is a diagram illustrating a configuration of a chip according to the second embodiment.

FIG. 18 illustrates another configuration of a chip according to the second embodiment. FIG. 18 illustrates a wafer that includes a plurality of chips (three chips in FIG. 18) and is not diced yet, similarly to FIG. 16. The same parts as in FIG. 16 are denoted by the same reference numerals, and a description thereof is omitted.

In a wafer illustrated in FIG. 18, a chip positioned at the center is referred to as a "chip 210-1," a chip positioned at the left is referred to as a "chip 210-2," and a chip positioned at the right is referred to as a "chip 210-3."

In the wafer illustrated in FIG. 18, a groove 211 is formed between the chips 210. The groove 211-1 is formed between the chip 210-1 and the chip 210-2, and the groove 211-2 is formed between the chip 210-1 and the chip 210-3.

In the wafer illustrated in FIG. 18, the groove 211 is formed such that up to a part of the silicon substrate 73 is excavated. In other words, in the chip 210 illustrated in FIG. 18, the groove 211 is formed such that the microlens layer 79, the planarization film 78, the color filter layer 77, the planarization film 75, and a part of the silicon substrate 73 are excavated.

Further, a passivation film 212 is formed in the groove 211, and thus the passivation film 212 is formed to cover the respective layers of the microlens layer 79, the planarization film 78, the color filter layer 77, the planarization film 75, and a part of the silicon substrate 73.

The groove 211 (the inside of the rectangle formed by the passivation film 212) is filled with the same material as the adhesive layer 80. Transparent resin may be used as a material for forming the adhesive layer 80. The groove 211 may be filled with the transparent resin.

Here, the description proceeds with the example in which the passivation film 212 is formed, and the inside of the passivation film 212 is filled with the same material as the adhesive layer 80, but the groove 211 may be filled with only the material of the passivation film 212.

When the wafer in which the groove 211 is formed between the chips 210 is diced along the scribe section 91, the cross-sectional surfaces of the microlens layer 79, the planarization film 78, the color filter layer 77, the planarization film 75, and the part of the silicon substrate 73 are covered with the passivation film 212 and thus not exposed on the surface. Further, the microlens layer 79, the planarization film 78, the color filter layer 77, the planarization film 75, and the part of the silicon substrate 73 are covered with the same material as the adhesive layer 80.

As the dicing is performed in a state in which the groove 211 is formed and the passivation film 212 is formed on the inner side of the groove 211 as described above, force applied to an interface between films at the time of dicing can be mitigated, and a possibility that film peeling or a crack will occur can be reduced. Further, since film peeling or a crack does not occur, the moisture-proof performance of the chip can be improved. Further, as the passivation film 212 is formed, the moisture-proof performance can be further improved.

(2-3)-Rd Embodiment

Figure 19:
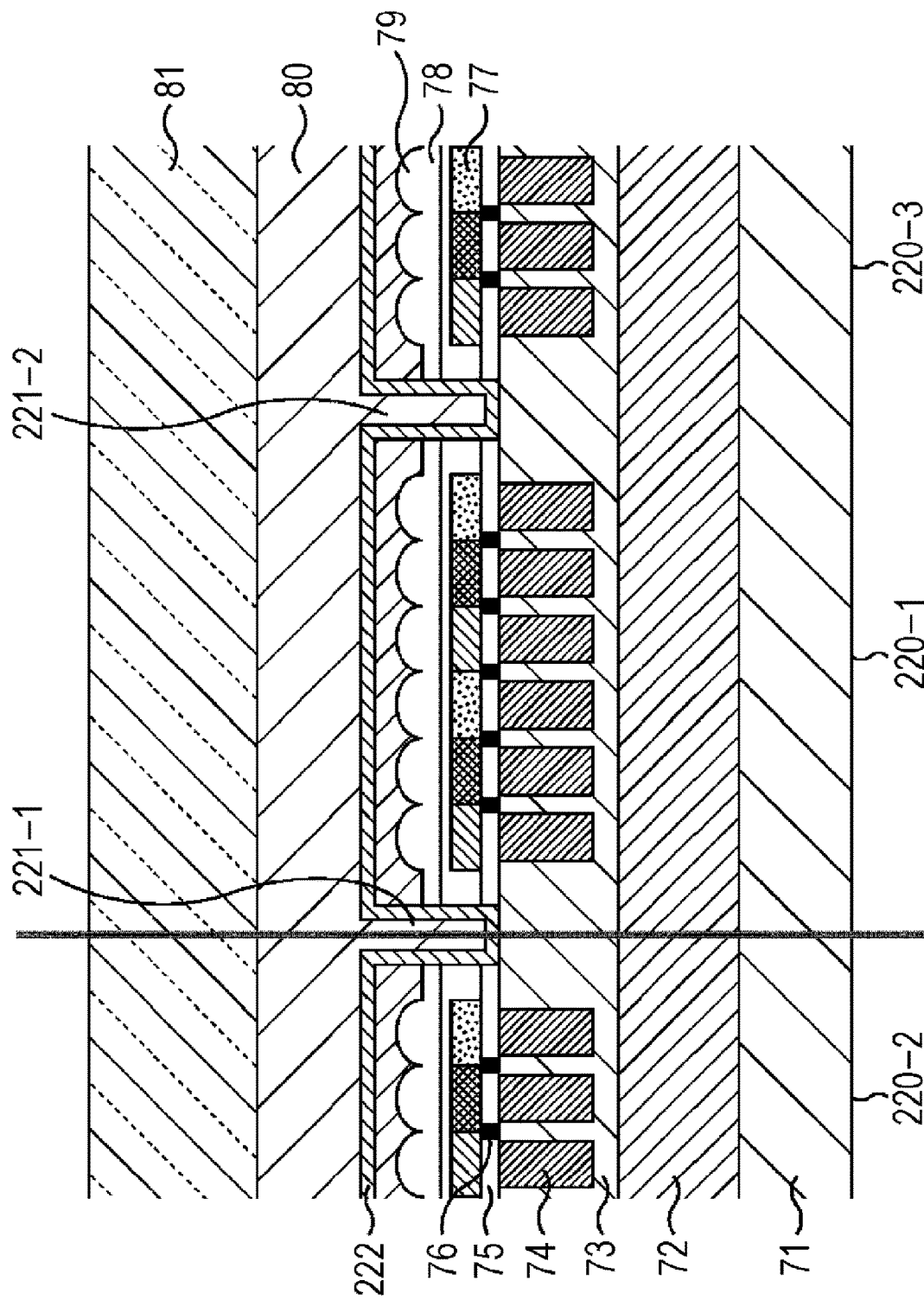
FIG. 19 is a diagram illustrating a configuration of a chip according to the second embodiment.

FIG. 19 illustrates another configuration of a chip according to the second embodiment. FIG. 19 illustrates a wafer that includes a plurality of chips (three chips in FIG. 19) and is not diced yet, similarly to FIG. 2.

Here, a chip positioned at the center is referred to as a "chip 220-1," a chip positioned at the left is referred to as a "chip 220-2," and a chip positioned at the right is referred to as a "chip 220-3."

In the wafer illustrated in FIG. 19, a groove 221 is formed between the chips 220. The groove 221-1 is formed between the chip 220-1 and the chip 220-2, and the groove 221-2 is formed between the chip 220-1 and the chip 220-3. A passivation film 222 is formed in the groove 221-1 and the groove 221-2, and the passivation film 222 is formed above the microlens layer 79 as well.

There is a scribe section 91-1 between the chip 220-1 and the chip 220-2, and the groove 221-1 is formed in the scribe section 91-1. Similarly, there is a scribe section 91-2 between the chip 220-1 and the chip 220-3, and the groove 221-2 is formed in the scribe section 91-2.

In the chip 220 illustrated in FIG. 19, the groove 221 is formed such that the microlens layer 79, the planarization film 78, the color filter layer 77, and the planarization film 75 are excavated up to an upper portion of the silicon substrate 73.

Further, since the passivation film 222 is formed in the groove 221, the passivation film 222 is formed on the side surfaces of the microlens layer 79, the planarization film 78, the color filter layer 77, and the planarization film 75 and above the silicon substrate 73 and the microlens layer 79.

Since the passivation film 222 is formed even above the microlens layer 79, a material having characteristic transparency N in a visible region is equal to or larger than 1.55 is preferably used. Alternatively, a material of absorbing a certain wavelength may be used.

The chip 220 illustrated in FIG. 19 is the same as the chip 200 illustrated in FIG. 16 according to the (2-1)-st embodiment except that the passivation film 222 is formed even above the microlens layer 79, and thus a description thereof is omitted.

When the wafer in which the groove 221 is formed between the chips 220 is diced along the scribe section 91, the cross-sectional surfaces of the microlens layer 79, the planarization film 78, the color filter layer 77, and the planarization film 75 are covered with the passivation film 222 and thus not exposed on the surface. Further, the microlens layer 79, the planarization film 78, the color filter layer 77, and the planarization film 75 are covered with the same material as the adhesive layer 80.

Further, since the passivation film 222 is formed even above the microlens layer 79, for example, even when moisture intrudes from the adhesive layer 80, the passivation film 222 can prevent moisture from intruding into the microlens layer 79 side. Thus, the moisture-proof performance of the chip 220 can be further improved.

As the dicing is performed in a state in which the groove 221 is formed and the passivation film 222 is formed on the inner side of the groove 221 as described above, force applied to an interface between films at the time of dicing can be mitigated, and a possibility that film peeling or a crack will occur can be reduced. Further, since film peeling or a crack does not occur, the moisture-proof performance of the chip can be improved. Further, as the passivation film 222 is formed, the moisture-proof performance can be further improved.

(2-4)-Th Embodiment

Figure 20:
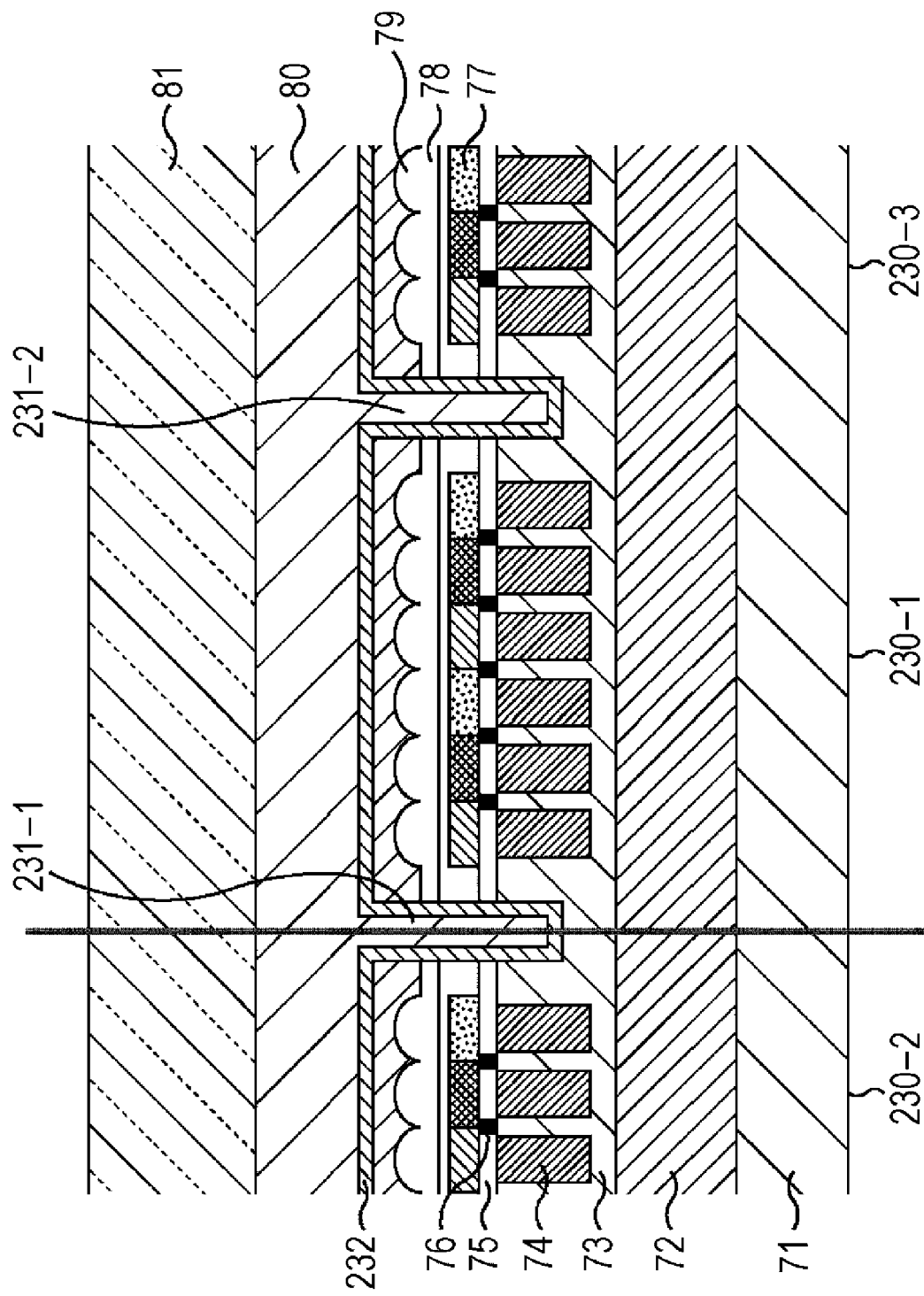
FIG. 20 is a diagram illustrating a configuration of a chip according to the second embodiment.

FIG. 20 illustrates another configuration of a chip according to the second embodiment. FIG. 20 illustrates a wafer that includes a plurality of chips (three chips in FIG. 20) and is not diced yet, similarly to FIG. 18. The same parts as in FIG. 18 are denoted by the same reference numerals, and a description thereof is omitted.

In a wafer illustrated in FIG. 20, a chip positioned at the center is referred to as a "chip 230-1," a chip positioned at the left is referred to as a "chip 230-2," and a chip positioned at the right is referred to as a "chip 230-3."

In the wafer illustrated in FIG. 20, a groove 231 is formed between the chips 230. The groove 231-1 is formed between the chip 230-1 and the chip 230-2, and the groove 231-2 is formed between the chip 230-1 and the chip 230-3.

In the wafer illustrated in FIG. 20, the groove 231 is formed such that up to a part of the silicon substrate 73 is excavated. In other words, in the chip 230 illustrated in FIG. 20, the groove 231 is formed such that the microlens layer 79, the planarization film 78, the color filter layer 77, the planarization film 75, and a part of the silicon substrate 73 are excavated.

Further, a passivation film 232 is formed in the groove 231, and the passivation film 232 is also formed to cover the respective layers of the microlens layer 79, the planarization film 78, the color filter layer 77, the planarization film 75, and a part of the silicon substrate 73.

This configuration is the same as that of the chip 210 illustrated in FIG. 18 according to the (2-2)-nd embodiment. Further, the chip 230 illustrated in FIG. 20 is different from the chip 210 illustrated in FIG. 18 the passivation film 232 is formed even above the microlens layer 79.

Since the passivation film 232 is formed even above the microlens layer 79, a material having characteristic transparency N in a visible region is equal to or larger than 1.55 is preferably used. Alternatively, a material of absorbing a certain wavelength may be used.

When the wafer in which the groove 231 is formed between the chips 230 is diced along the scribe section 91, the cross-sectional surfaces of the microlens layer 79, the planarization film 78, the color filter layer 77, the planarization film 75, and the part of the silicon substrate 73 are covered with the passivation film 232 and thus not exposed on the surface. Further, the microlens layer 79, the planarization film 78, the color filter layer 77, the planarization film 75, and the part of the silicon substrate 73 are covered with the same material as the adhesive layer 80.

Further, since the passivation film 232 is formed even on the microlens layer 79, for example, even when moisture intrudes from the adhesive layer 80, the passivation film 232 can prevent moisture from intruding into the microlens layer 79 side. Thus, the moisture-proof performance of the chip 230 can be further improved.

As the dicing is performed in a state in which the groove 231 is formed and the passivation film 232 is formed on the inner side of the groove 231 as described above, force applied to an interface between films at the time of dicing can be mitigated, and a possibility that film peeling or a crack will occur can be reduced. Further, since film peeling or a crack does not occur, the moisture-proof performance of the chip can be improved. Further, as the passivation film 232 is formed, the moisture-proof performance can be further improved.

(2-5)-Th Embodiment

Figure 21:
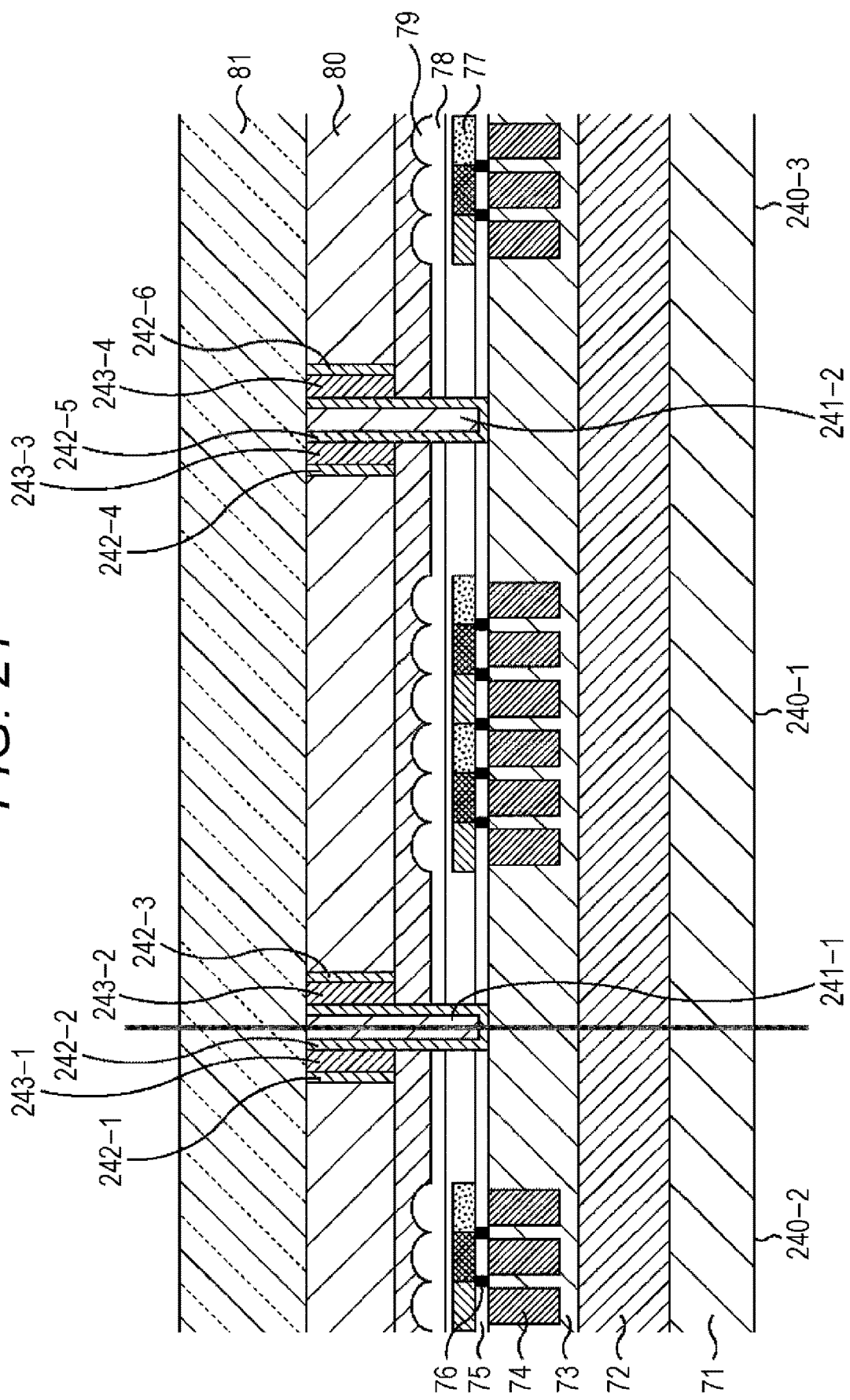
FIG. 21 is a diagram illustrating a configuration of a chip according to the second embodiment.

FIG. 21 illustrates another configuration of a chip according to the second embodiment. FIG. 21 illustrates a wafer that includes a plurality of chips (three chips in FIG. 21) and is not diced yet, similarly to FIG. 2.

Here, a chip positioned at the center is referred to as a "chip 240-1," a chip positioned at the left is referred to as a "chip 240-2," a chip positioned at the right is referred to as a "chip 240-3."

In a wafer illustrated in FIG. 21, a groove 241 is formed between the chips 240. The groove 241-1 is formed between the chip 240-1 and the chip 240-2, and the groove 241-2 is formed between the chip 240-1 and the chip 240-3.

There is a scribe section 91-1 between the chip 240-1 and the chip 240-2, and the groove 241-1 is formed in the scribe section 91-1. Similarly, there is a scribe section 91-2 between the chip 240-1 and the chip 240-3, and the groove 241-2 is formed in the scribe section 91-2.

In the chip 240 illustrated in FIG. 21, the groove 241 is formed such that the microlens layer 79, the planarization film 78, the color filter layer 77, and the planarization film 75 are excavated up to an upper portion of the silicon substrate 73. A passivation film 242 is formed on the side of the groove 241. The passivation film 242-2 is formed on the side of the groove 241-1, and the passivation film 242-5 is formed on the side of the groove 241-2.

A rib 243-1 is formed on at the left side of the passivation film 242-2 in FIG. 21, and the passivation film 242-1 is formed on the left side of the rib 243-1. The rib 243-1 is configured to include the passivation film 242 at the left and right sides thereof. Similarly, the rib 243-2 is formed on the right side of the passivation film 242-2 in FIG. 21, and the passivation film 242-3 is formed at the right side of the rib 243-2. The rib 243-2 is configured to include the passivation film 242 at the left and right sides thereof.

Further, similarly, the rib 243-2 is formed on the left side of the passivation film 242-5 in FIG. 21, and the passivation film 242-4 is formed at the left side of the rib 243-2. The rib 243-2 is configured to include the passivation film 242 at the left and right sides thereof. Similarly, the rib 243-4 is formed on the right side of the passivation film 242-5 in FIG. 21, and the passivation film 242-6 is formed at the right side of the rib 243-4. The rib 243-2 is configured to include the passivation film 242 at the left and right sides thereof.

As described above, the rib 243 is formed on a sensor substrate, for example, using a lithography technique, and the passivation film 242 is formed on the side of the rib 243.

Figure 22:
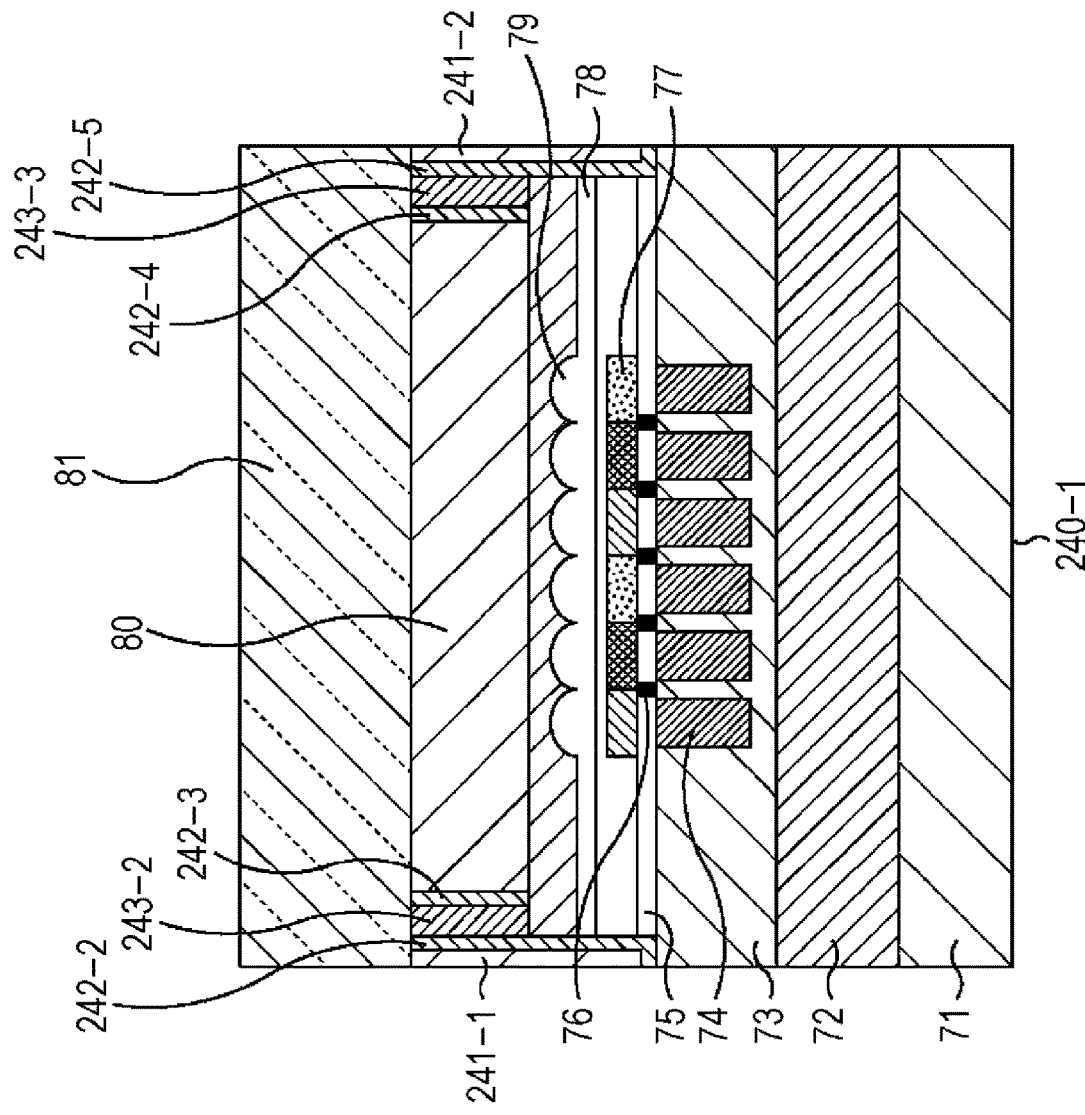
FIG. 22 is a diagram illustrating a configuration of a chip according to the second embodiment.

When the wafer in which the groove 241 is formed between the chips 240 is diced along the scribe section 91, the cross-sectional surfaces of the adhesive layer 80, the microlens layer 79, the planarization film 78, the color filter layer 77, and the planarization film 75 are covered with the passivation film 242 and thus not exposed on the surface as in the chip 240-1 illustrated in FIG. 22.

Further, the adhesive layer 80, the microlens layer 79, the planarization film 78, the color filter layer 77, and the planarization film 75 are covered with the same material as the adhesive layer 80. Further, the groove 241 is formed by filling it with the passivation film 242, the groove 241 is covered with only the passivation film 242.

Further, since the rib 243 is formed in the adhesive layer 80, and the passivation film 242 is formed in the rib 243, for example, the rib 243 and the passivation film 242 can prevent moisture from intruding into the adhesive layer 80. Thus, the moisture-proof performance of the chip 240 can be further improved.

As the dicing is performed in the state in which the groove 241 is formed, the passivation film 242 is formed in the inner side of the groove 241, the rib 243 is formed, and the passivation film 242 is formed even in the rib 243, force applied to an interface between films at the time of dicing can be mitigated, and a possibility that film peeling or a crack will occur can be reduced. Further, since film peeling or a crack does not occur, the moisture-proof performance of the chip can be improved.

Further, as the passivation film 242 and the rib 243 are formed, the moisture-proof performance can be further improved. Further, as the rib 243 is formed, it is possible to block or reduce a stray light component from the side of the chip 240, and there is an effect of preventing a flare or the like.

(2-6)-Th Embodiment

Figure 23:
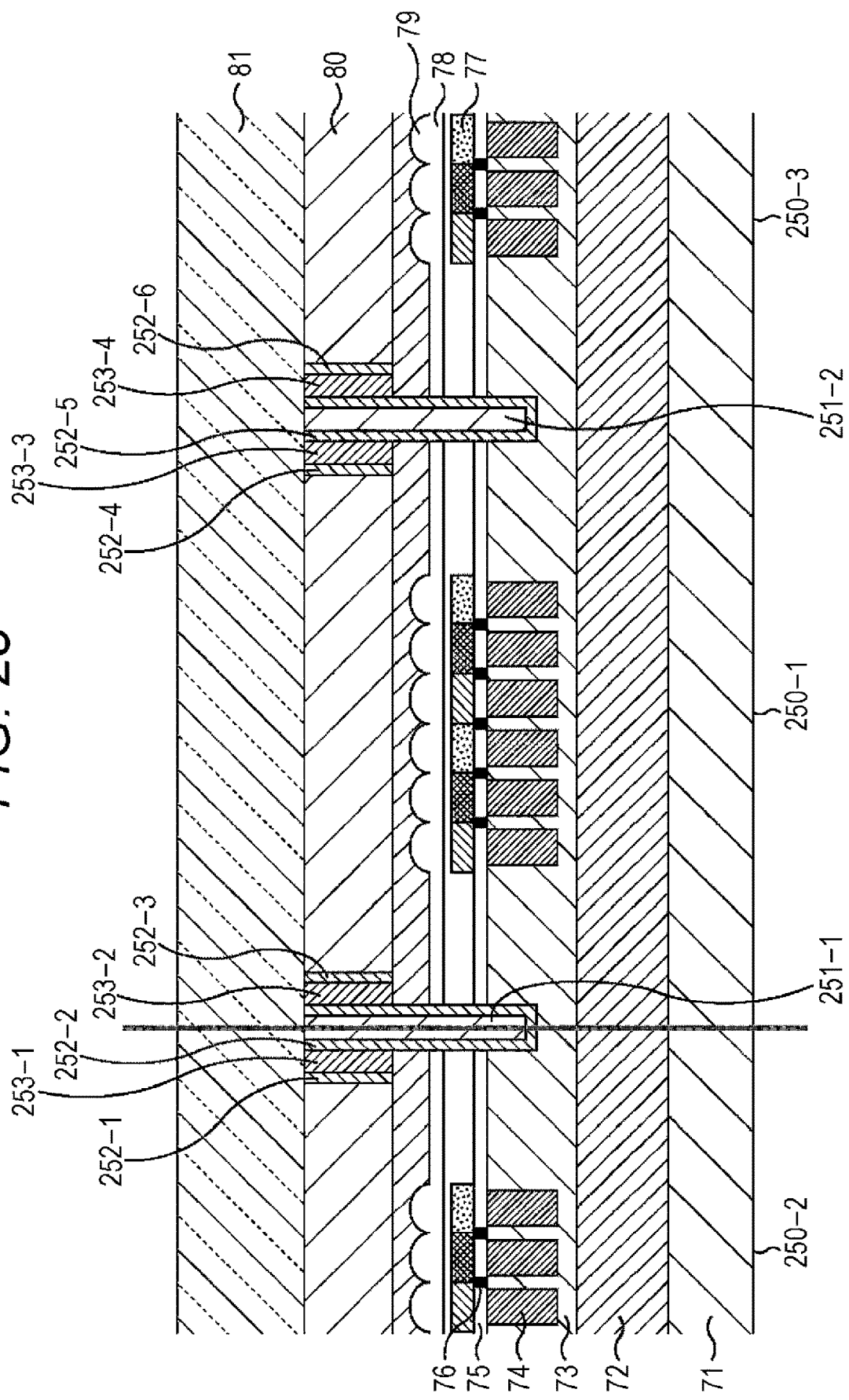
FIG. 23 is a diagram illustrating a configuration of a chip according to the second embodiment.

FIG. 23 illustrates another configuration of a chip according to the second embodiment. A chip 250 illustrated in FIG. 23 has a configuration in which the configuration of the chip 240 having the rib illustrated in FIG. 21 according to the (2-5)-th embodiment is applied to the chip 210 illustrated in FIG. 18 according to the (2-2)-nd embodiment.

A wafer illustrated in FIG. 23 is also a wafer that includes a plurality of chips (three chips in FIG. 23) and is not diced yet.

Here, a chip positioned at the center is referred to as a "chip 250-1," a chip positioned at the left is referred to as a "chip 250-2," and a chip positioned at the right is referred to as a "chip 250-3."

In the wafer illustrated in FIG. 23, a groove 251 is formed between the chips 250. The groove 251-1 is formed between the chip 250-1 and the chip 250-2, and the groove 251-2 is formed between the chip 250-1 and the chip 250-3.

There is a scribe section 91-1 between the chip 250-1 and the chip 250-2, and the groove 251-1 is formed in the scribe section 91-1. Similarly, there is a scribe section 91-2 between the chip 250-1 and the chip 250-3, and the groove 251-2 is formed in the scribe section 91-2.

In the wafer illustrated in FIG. 23, the groove 251 is formed such that up to a part of the silicon substrate 73 is excavated. In other words, in the chip 250 illustrated in FIG. 23, the groove 251 is formed such that the microlens layer 79, the planarization film 78, the color filter layer 77, the planarization film 75, and a part of the silicon substrate 73 are excavated.

A passivation film 252 is formed on the side of the groove 251. The passivation film 252-2 is formed on the side of the groove 251-1, and the passivation film 252-5 is formed on the side of the groove 251-2. A rib 253-1 is formed on the left side of the passivation film 252-2 in FIG. 23, and the passivation film 252-1 is formed on the side of the rib 253-1. The rib 253-1 is configured to include the passivation film 252 at the left and right side thereof.

Similarly, a rib 253-2 is formed on the right side of the passivation film 252-2 in FIG. 23, and the passivation film 252-3 is formed on the right side of the rib 253-2. The rib 253-2 is configured to include the passivation film 252 at the left and right side thereof.

Further, similarly, the rib 253-3 is formed on the left side of the passivation film 252-5 in FIG. 23, and the passivation film 252-4 is formed on the left side of the rib 253-3. The rib 253-3 is configured to include the passivation film 252 at the left and right side thereof. Similarly, a rib 253-4 is formed on the right side of the passivation film 252-5 in FIG. 23, and the passivation film 252-6 is formed on the right side of the rib 253-4. The rib 253-4 is configured to include the passivation film 252 at the left and right side thereof.

As described above, the rib 253 is formed on a sensor substrate, for example, using a lithography technique, and the passivation film 252 is formed on the side of the rib 253.

When the wafer in which the groove 251 is formed between the chips 250 is diced along the scribe section 91, the cross-sectional surfaces of the adhesive layer 80, the microlens layer 79, the planarization film 78, the color filter layer 77, the planarization film 75, and the part of the silicon substrate 73 are covered with the passivation film 252 and thus not exposed on the surface.

Further, the adhesive layer 80, the microlens layer 79, the planarization film 78, the color filter layer 77, the planarization film 75, and the part of the silicon substrate 73 are covered with the same material as the adhesive layer 80. Further, when the groove 251 is filled with the passivation film 252, the groove 251 is covered with only the passivation film 252.

Further, since the rib 253 is formed in the adhesive layer 80, and the passivation film 252 is formed in the rib 253, for example, the rib 253 and the passivation film 252 can prevent moisture from intruding into the adhesive layer 80. Thus, the moisture-proof performance of the chip 250 can be further improved.

As the dicing is performed in the state in which the groove 251 is formed, the passivation film 252 is formed in the inner side of the groove 251, the rib 253 is formed, and the passivation film 252 is formed even in the rib 253, force applied to an interface between films at the time of dicing can be mitigated, and a possibility that film peeling or a crack will occur can be reduced. Further, since film peeling or a crack does not occur, the moisture-proof performance of the chip can be improved.

Further, as the passivation film 252 and the rib 253 are formed, the moisture-proof performance can be further improved. Further, as the rib 253 is formed, it is possible to block or reduce a stray light component from the side of the chip 250, and there is an effect of preventing a flare or the like.

(2-7)-Th Embodiment

Figure 24:
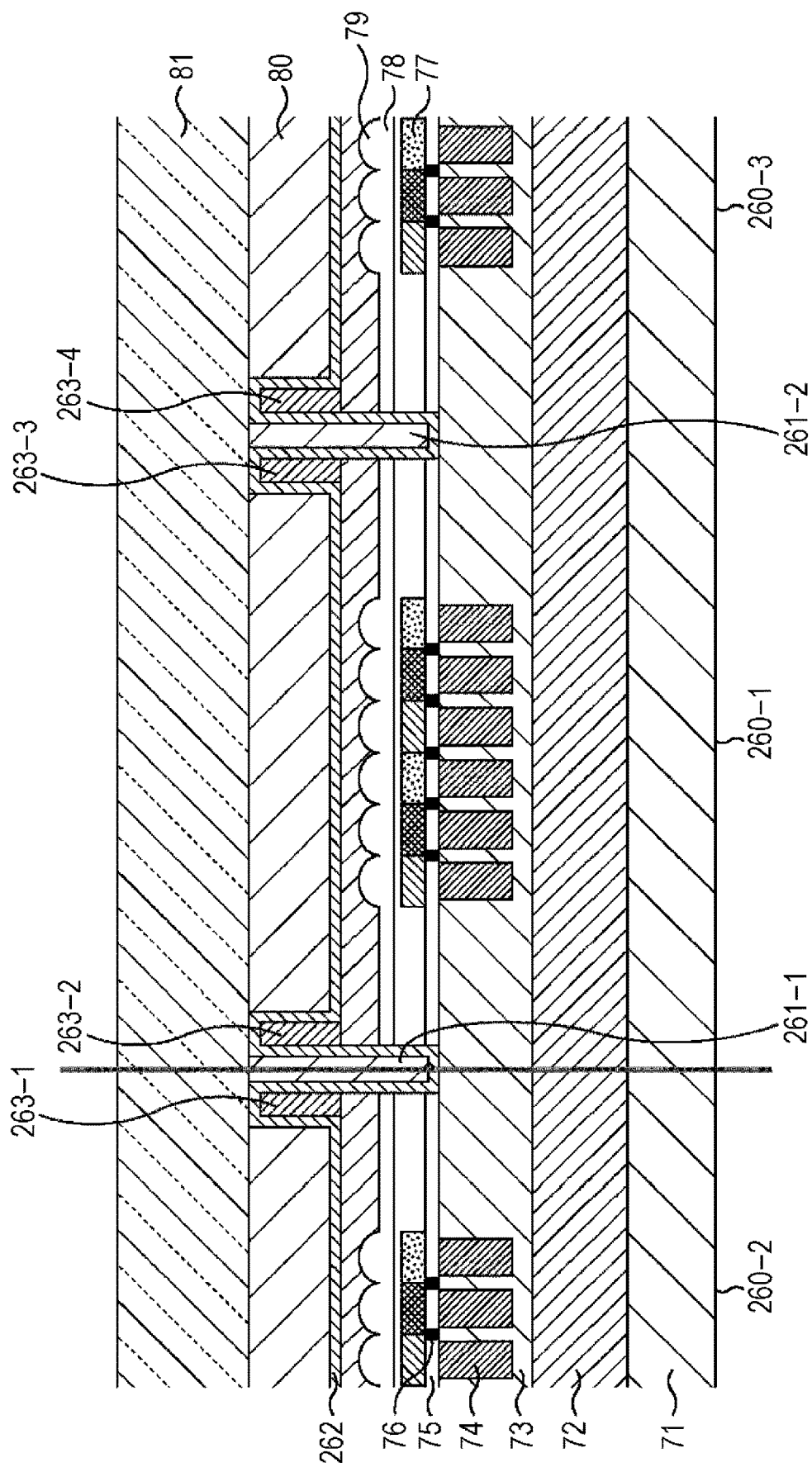
FIG. 24 is a diagram illustrating a configuration of a chip according to the second embodiment.

FIG. 24 illustrates another configuration of a chip according to the second embodiment. A chip 260 illustrated in FIG. 24 has a configuration in which the configuration of the chip 240 having the rib illustrated in FIG. 21 according to the (2-5)-th embodiment is applied to the chip 220 illustrated in FIG. 19 according to the (2-3)-rd embodiment.

A wafer illustrated in FIG. 24 is also a wafer that includes a plurality of chips (three chips in FIG. 24) and is not diced yet.

Here, a chip positioned at the center is referred to as a "chip 260-1," a chip positioned at the left is referred to as a "chip 260-2," and a chip positioned at the right is referred to as a "chip 260-3."

In the wafer illustrated in FIG. 24, a groove 261 is formed between the chips 260. The groove 261-1 is formed between the chip 260-1 and the chip 260-2, and the groove 261-2 is formed between the chip 260-1 and the chip 260-3.

There is a scribe section 91-1 between the chip 260-1 and the chip 260-2, and the groove 261-1 is formed in the scribe section 91-1. Similarly, there is a scribe section 91-2 between the chip 260-1 and the chip 260-3, and the groove 261-2 is formed in the scribe section 91-2.

In the chip 260 illustrated in FIG. 24, the groove 261 is formed such that the microlens layer 79, the planarization film 78, the color filter layer 77, and the planarization film 75 are excavated up to the upper portion of the silicon substrate 73. Further, since a passivation film 262 is formed in the groove 261, the passivation film 262 is also formed on the side surfaces of the microlens layer 79, the planarization film 78, the color filter layer 77, and the planarization film 75 and above the silicon substrate 73 and the microlens layer 79.

Since the passivation film 262 is also formed even above the microlens layer 79, a material having characteristic transparency N in a visible region is equal to or larger than 1.55 is preferably used. Alternatively, a material of absorbing a certain wavelength may be used.

Further, a rib 263 is also formed in each chip 260 of the wafer illustrated in FIG. 24. The rib 263-1 is formed on the left side of the groove 261-1, and the rib 263-2 is formed on the right side of the groove 261-1. Further, the rib 263-3 is formed on the left side of the groove 261-2, and the rib 263-4 is formed on the right side of the groove 261-2. The sides and the upper portion of the rib 263 are also covered with the passivation film 262 as illustrated in FIG. 24.

When the wafer in which the groove 261 is formed between the chips 260 is diced along the scribe section 91, the cross-sectional surfaces of the adhesive layer 80, the microlens layer 79, the planarization film 78, the color filter layer 77, and the planarization film 75 are covered with the passivation film 262 and thus not exposed on the surface.

Further, the adhesive layer 80, the microlens layer 79, the planarization film 78, the color filter layer 77, and the planarization film 75 are covered with the same material as the adhesive layer 80. Further, when the groove 261 is formed by filling it with the passivation film 262, the groove 261 is covered with only the passivation film 262.

Further, since the rib 263 is formed in the adhesive layer 80, and the passivation film 262 is formed in the rib 263, for example, the rib 263 and the passivation film 262 can prevent moisture from intruding into the adhesive layer 80. Thus, the moisture-proof performance of the chip 260 can be further improved.

As the dicing is performed in a state in which the groove 261 is formed, the passivation film 262 is formed on the inner side of the groove 261, the rib 263 is formed, and the passivation film 262 is formed even in the rib 263 as described above, force applied to an interface between films at the time of dicing can be mitigated, and a possibility that film peeling or a crack will occur can be reduced. Further, since film peeling or a crack does not occur, the moisture-proof performance of the chip can be improved.

Further, as the passivation film 262 and the rib 263 are formed, the moisture-proof performance can be further improved. Further, as the rib 263 is formed, it is possible to block or reduce a stray light component from the side of the chip 260, and there is an effect of preventing a flare or the like.

(2-8)-Th Embodiment

Figure 25:
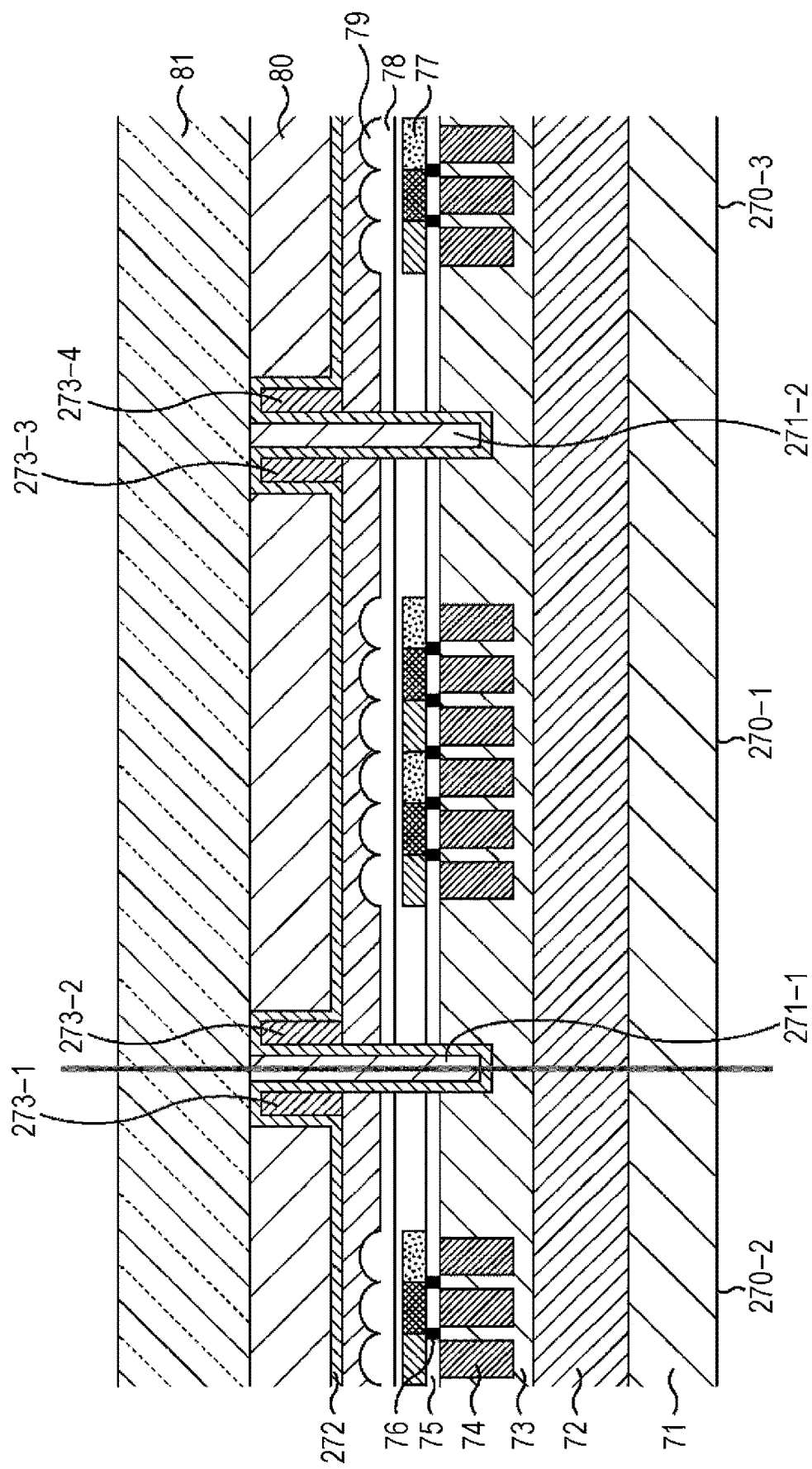
FIG. 25 is a diagram illustrating a configuration of a chip according to the second embodiment.

FIG. 25 illustrates another configuration of a chip according to the second embodiment. A chip 270 illustrated in FIG. 25 has a configuration in which the configuration of the chip 240 having the rib illustrated in FIG. 21 according to the (2-5)-th embodiment is applied to the chip 230 illustrated in FIG. 20 according to the (2-4)-th embodiment.

A wafer illustrated in FIG. 25 is also a wafer that includes a plurality of chips (three chips in FIG. 25) and is not diced yet.

Here, a chip positioned at the center is referred to as a "chip 270-1," a chip positioned at the left is referred to as a "chip 270-2," and a chip positioned at the right is referred to as a "chip 270-3."

In the wafer illustrated in FIG. 25, a groove 271 is formed between the chips 270. The groove 271-1 is formed between the chip 270-1 and the chip 270-2, and the groove 271-2 is formed between the chip 270-1 and the chip 270-3.

In the wafer illustrated in FIG. 25, the groove 271 is formed such that up to a part of the silicon substrate 73 is excavated. In other words, in the chip 270 illustrated in FIG. 25, the groove 271 is formed such that the microlens layer 79, the planarization film 78, the color filter layer 77, the planarization film 75, and a part of the silicon substrate 73 are excavated.

Further, since a passivation film 272 is formed in the groove 271, the passivation film 272 is also formed to cover the microlens layer 79, the planarization film 78, the color filter layer 77, the planarization film 75, and the part of the silicon substrate 73.

Further, in the chip 270 illustrated in FIG. 25, the passivation film 272 is formed even above the microlens layer 79. Since the passivation film 272 is formed even above the microlens layer 79, a material having characteristic transparency N in a visible region is equal to or larger than 1.55 is preferably used. Alternatively, a material of absorbing a certain wavelength may be used.

Further, a rib 273 is also formed in each chip 270 of the wafer illustrated in FIG. 25. The rib 273-1 is formed on the left side of the groove 271-1, and the rib 273-2 is formed on the right side of the groove 271-1. Further, the rib 273-3 is formed on the left side of the groove 271-2, and the rib 273-4 is formed on the right side of the groove 271-2. The sides and the upper portion of the rib 273 are also covered with the passivation film 272 as illustrated in FIG. 25.

When the wafer in which the groove 271 is formed between the chips 270 is diced along the scribe section 91, the cross-sectional surfaces of the adhesive layer 80, the microlens layer 79, the planarization film 78, the color filter layer 77, the planarization film 75, and the part of the silicon substrate 73 are covered with the passivation film 272 and thus not exposed on the surface.

Further, the adhesive layer 80, the microlens layer 79, the planarization film 78, the color filter layer 77, the planarization film 75, and the part of the silicon substrate 73 are covered with the same material as the adhesive layer 80.

Further, when the groove 271 is formed by filling it with the passivation film 272, the groove 271 is covered with only the passivation film 272.

Further, since the rib 273 is formed in the adhesive layer 80, and the passivation film 272 is formed in the rib 273, for example, the rib 273 and the passivation film 272 can prevent moisture from intruding into the adhesive layer 80. Thus, the moisture-proof performance of the chip 270 can be further improved.

As the dicing is performed in a state in which the groove 271 is formed the passivation film 272 is formed on the inner side of the groove 271, the rib 273 is formed, and the passivation film 272 is formed even in the rib 273 as described above, force applied to an interface between films at the time of dicing can be mitigated, and a possibility that film peeling or a crack will occur can be reduced. Further, since film peeling or a crack does not occur, the moisture-proof performance of the chip can be improved.

Further, as the passivation film 272 and the rib 273 are formed, the moisture-proof performance can be further improved. Further, as the rib 273 is formed, it is possible to block or reduce a stray light component from the side of the chip 270, and there is an effect of preventing a flare or the like.

Manufacturing of Chip According to Second Embodiment

Figure 26:
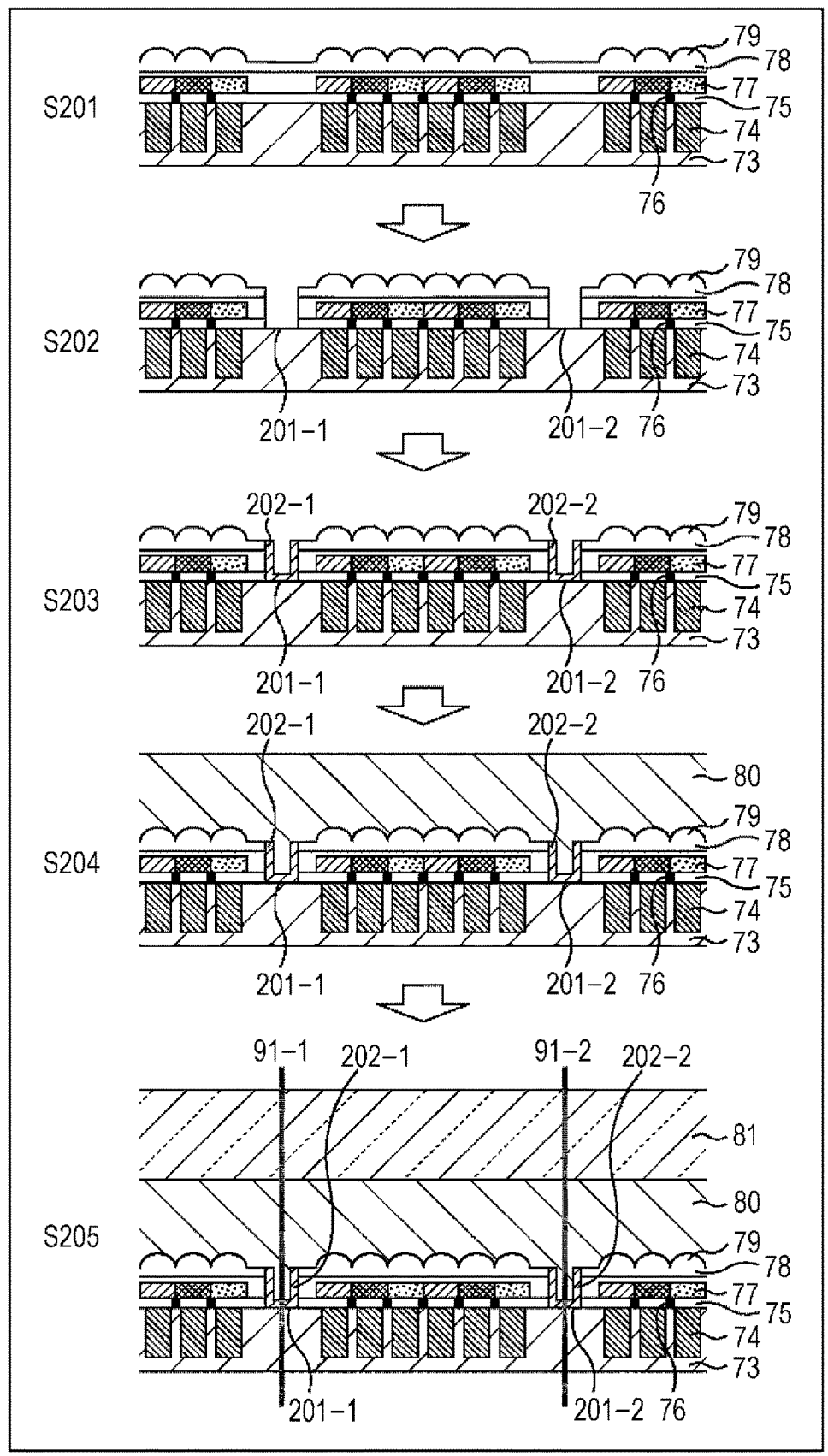
FIG. 26 is a diagram for describing a process of manufacturing a chip according to the second embodiment.

A process of manufacturing a chip (wafer) having such a groove will be described. FIG. 26 is a diagram for describing a process of manufacturing a chip prior to dicing.

The manufacturing process described with reference to FIG. 26 will focus on manufacturing of a groove serving as one of characteristic components of the present technology, and a manufacturing method of a related art can be applied to manufacturing of other parts such as forming of layers, and thus a description thereof will be appropriately omitted. Here, the description will proceed with an example in which the chip 200 of FIG. 16 according to the (2-1)-st embodiment is manufactured.

In step S201, a wafer in which a silicon substrate 73, a planarization film 75, a color filter layer 77, a planarization film 78, and a microlens layer 79 are stacked, a photodiode 74 is formed in the silicon substrate 73, and a light shielding film 76 is formed in the planarization film 75 is prepared. Further, although not illustrated, a wafer in which the interconnection layer 72 and the support substrate 71 are stacked may be prepared.

In step S202, a groove 201-1 and a groove 201-2 are formed. For example, the groove 201 is formed by performing dry etching after patterning. Further, when the groove 141 is formed such that up to the silicon substrate 73 is excavated as in the (2-2)-nd embodiment illustrated in FIG. 18, in step S202, the groove 141 is formed to reach the silicon substrate 73.

In step S203, a passivation film 202-1 and a passivation film 202-2 are formed. The passivation film 202 of the chip 200 illustrated in FIG. 16 is formed by forming the passivation film 202 and removing the passivation film on the microlens layer 79. When a subsequent process is performed without removing the passivation film on the microlens layer 79 after the passivation film 202 is formed in step S203, for example, the passivation film 222 of the chip 220 illustrated in FIG. 19 can be formed.

For example, when the rib 243 is formed in order to provide the configuration of the chip 240 illustrated in FIG.

21, in a process between step S202 and step S203, the rib 243 is formed, and thereafter the passivation film 242 is formed.

In step S204, the adhesive layer 80 is formed. When the adhesive layer 80 is formed, the groove 201 (the inner side of the passivation film 202) is also filled with a transparent member configuring the adhesive layer 80.

In step S205, the cover glass 81 is stacked. After the cover glass 81 is stacked, dicing is performed along the scribe section 91-1 and the scribe section 91-2, and thus the diced chip 200 is manufactured.

As step S202 of forming the groove or step S203 of forming the passivation film is performed as described above, force applied to an interface between films at the time of dicing can be mitigated, and a possibility that film peeling or a crack will occur can be reduced.

Third Embodiment

In the third embodiment, intrusion of moisture into a chip is prevented such that a rib is formed in a certain layer in a chip, and a moisture resistant film is formed around the rib.

(3-1)-St Embodiment

Figure 27:
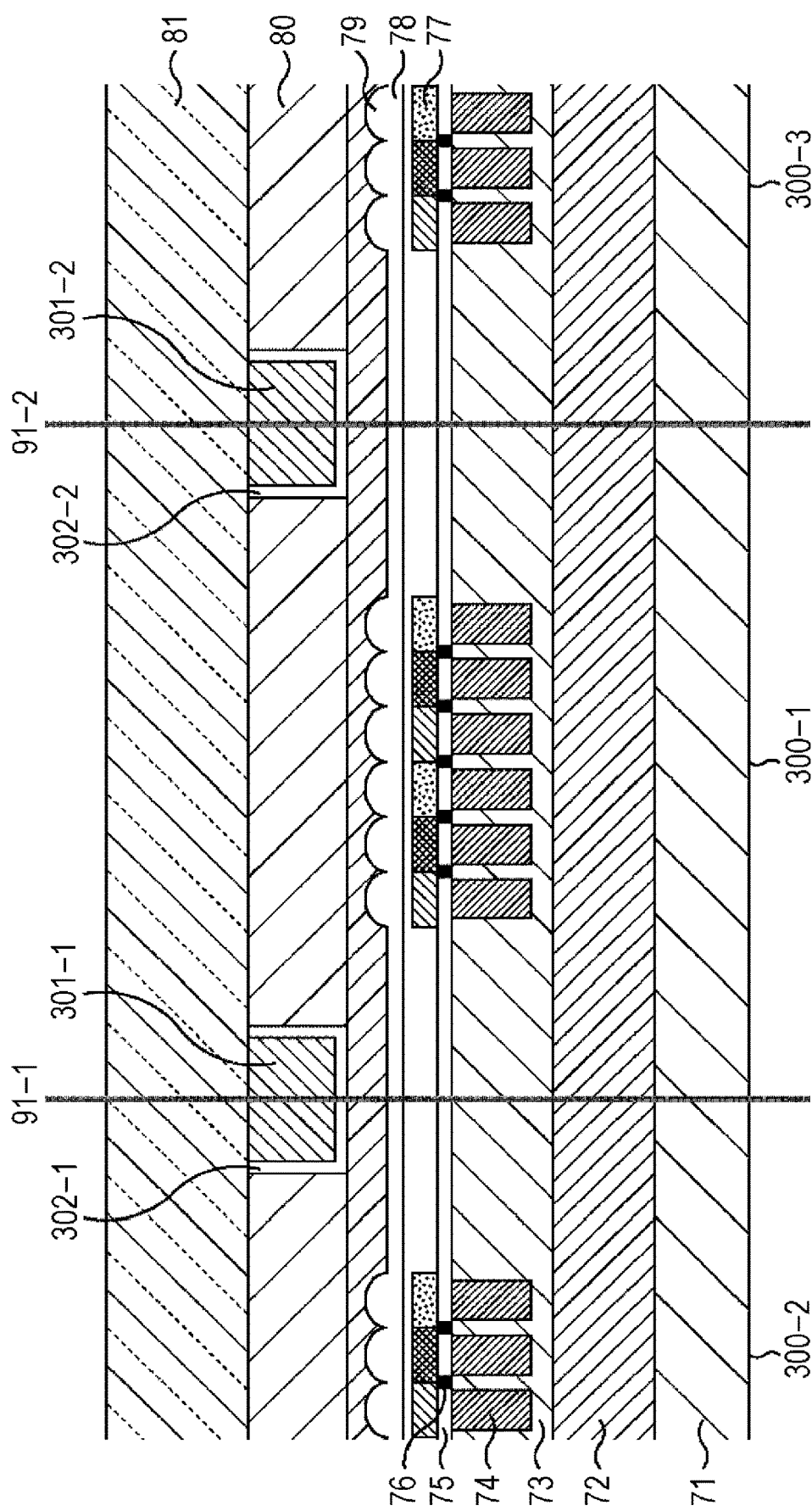
FIG. 27 is a diagram illustrating a configuration of a chip according to a third embodiment.

FIG. 27 illustrates a configuration of a chip according to the third embodiment. FIG. 27 illustrates a wafer that includes a plurality of chips (three chips in FIG. 27) and is not diced yet, similarly to FIG. 2.

Here, a chip positioned at the center is referred to as a "chip 300-1," a chip positioned at the left is referred to as a "chip 300-2," and a chip positioned at the right is referred to as a "chip 300-3." In the following description, when the chips 300-1 to 300-3 need not be distinguished from one another, the chips are referred to as simply a "chip 300."

Each chip 300 has the same configuration as the chip 70 described above with reference to FIGS. 2 and 3. In other words, the chip 300 is configured such that an interconnection layer 72 is arranged on a support substrate 71, and a silicon substrate 73 is arranged on the interconnection layer 72. In the silicon substrate 73, a plurality of photodiodes 74 (optical elements) serving as photoelectric conversion units of pixels are formed at certain intervals.

The planarization film 75 is formed on the silicon substrate 73, and a light shielding film 76 for preventing light from leaking into a neighboring pixel is formed in a portion of the planarization film 75 corresponding to a position between the photodiodes 74. A color filter layer 77 is formed on the planarization film 75. A planarization film 78 is formed on the color filter layer 77. A microlens layer 79 is formed on the planarization film 78. A cover glass 81 is bonded onto the microlens layer 79 through an adhesive layer 80.

In the wafer illustrated in FIG. 27, a rib 301 is formed between the chips 300. The rib 301-1 is formed between the chip 300-1 and the chip 300-2, and the rib 301-2 is formed between the chip 300-1 and the chip 300-3. The rib 301 is formed in a square form.

There is a scribe section 91-1 between the chip 300-1 and the chip 300-2, and the rib 301-1 is formed in the scribe section 91-1. Similarly, there is a scribe section 91-2 between the chip 300-1 and the chip 300-3, and the rib 301-2 is formed in the scribe section 91-2.

The rib 301 is preferably made of a photosensitive resin material that has tolerance such as heat resistance, is used to form a patterning or the like, and has low in elastic modulus.

A side and a lower portion of the rib 301 are surrounded by the moisture resistant film 302. The moisture resistant film 302-1 is formed on the side of the rib 301-1 at the adhesive layer 80 side and the bottom face of the rib 301-1 at the microlens layer 79 side. The moisture resistant film 302-2 is formed on the side of the rib 301-2 at the adhesive layer 80 side and the bottom face of the rib 301-2 at the microlens layer 79 side.

For example, the moisture resistant film 302 is a film that is made of a material having a function of preventing moisture from intruding into the chip 300 such as a silicon nitride film. Here, the moisture resistant film 302 is described not to be formed on the top surface of the rib 301 at the cover glass 81 side, but the moisture resistant film 302 may be formed on the top surface of the rib 301 at the cover glass 81 side.

Figure 28:
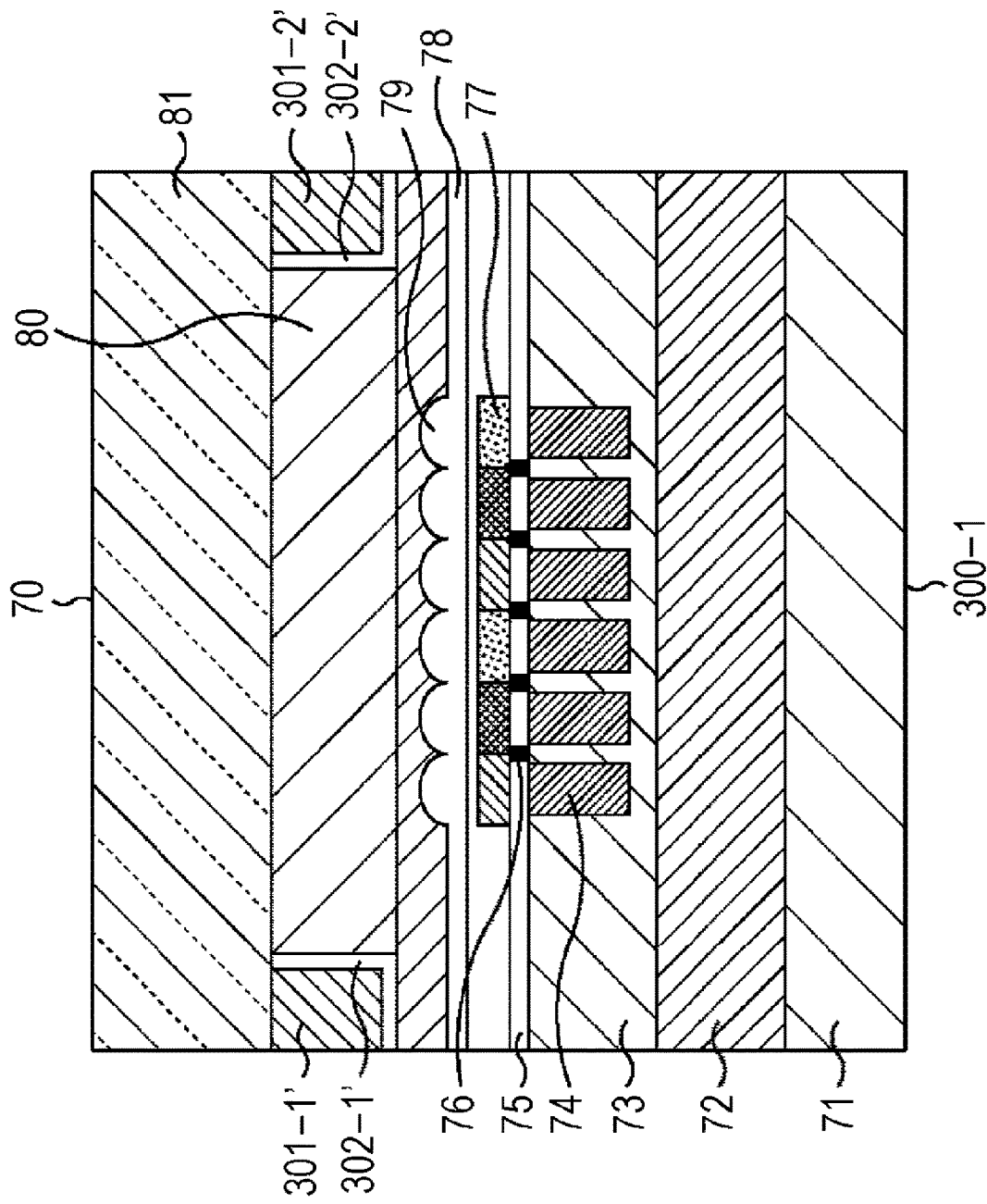
FIG. 28 is a diagram illustrating a configuration of a chip according to the third embodiment.

When the wafer in which the rib 301 is formed between the chips 300 is diced along the scribe section 91, the chip 300 illustrated in FIG. 28 is cut out. Here, the description proceeds with the example in which the chip 300-1 is cut out.

In the chip 300-1 illustrated in FIG. 28, the rib 301-1' and the rib 301-2' (a dash is added to the rib after dicing in order to be distinguished from the rib 301-1 and the rib 301-2 before dicing illustrated in FIG. 27) are formed on the cross-sectional surface of the adhesive layer 80, and thus the adhesive layer 80 does not come into contact with the outside.

Further, the moisture resistant film 302-1' is formed between the rib 301-1' and the microlens layer 79, the moisture resistant film 302-1' is formed even between the rib 301-1' and the adhesive layer 80, and the adhesive layer 80 does not come into contact with the outside.

Similarly, the moisture resistant film 302-2' is formed between the rib 301-2' and the microlens layer 79, the moisture resistant film 302-2' is formed even between the rib 301-2' and the adhesive layer 80, and the adhesive layer 80 does not come into contact with the outside.

As the rib 301 and the moisture resistant film 302 are formed at both ends of the adhesive layer 80 of the chip 300 as described above, moisture can be prevented from intruding into the adhesive layer 80. Further, as the rib 301 is formed, tolerance to an external shock or the like is enhanced.

In other words, when force is applied to the chip 300, the rib 301 can serve as a shock absorber and absorb a shock, and thus tolerance to an external shock on the chip 300 or the like can be enhanced.

Further, even when a crack or the like occurs, the crack can be stopped by the rib 301, and it is possible to prevent the moisture resistant film 302 from being broken. The moisture resistant film 302 can be maintained without being broken, and thus improve moisture-resistance performance can be improved. Further, the moisture resistant film 302 can be formed at a thin thickness, film stress-induced influence can be reduced, and thus sufficient moisture-resistance performance can be obtained.

(3-2)-Nd Embodiment

Figure 29:
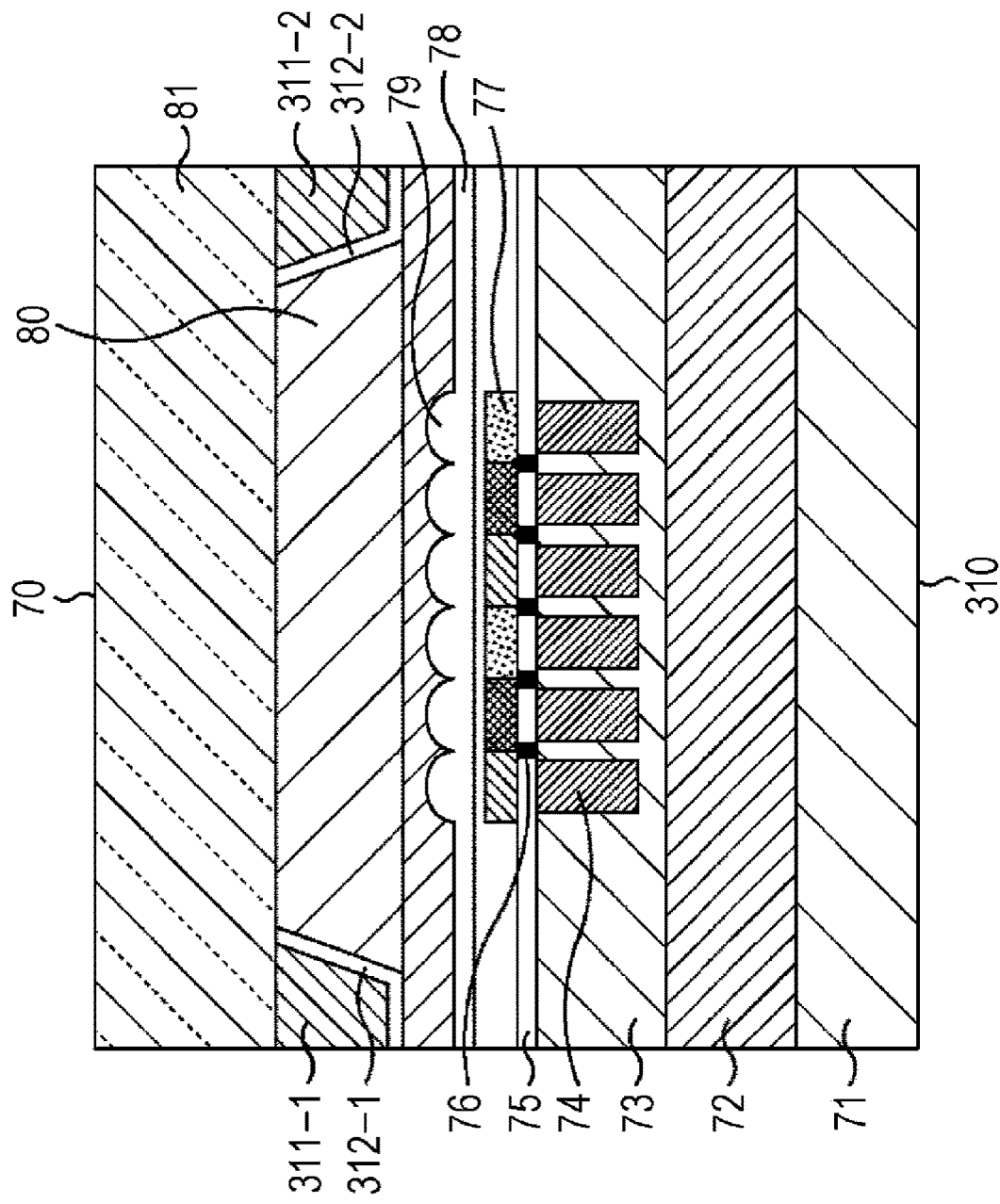
FIG. 29 is a diagram illustrating a configuration of a chip according to the third embodiment.

FIG. 29 illustrates another configuration of a chip according to the third embodiment. FIG. 29 illustrates a state of a diced chip after dicing, similarly to FIG. 28. A configuration of a chip 310 illustrated in FIG. 29 is basically the same as the configuration of the chip 300 illustrated in FIG. 28 except a shape of a rib.

In the chip 310 illustrated in FIG. 29, a rib 311-1 and a rib 311-2 are formed on the cross-sectional surface of the adhesive layer 80, and the adhesive layer 80 does not come into contact with the outside. Further, a moisture resistant film 312-1 is formed between the rib 311-1 and the microlens layer 79, the moisture resistant film 312-1 is formed even between the rib 311-1 and the adhesive layer 80, and the adhesive layer 80 does not come into contact with the outside.

Similarly, a moisture resistant film 312-2 is formed between the rib 311-2 and the microlens layer 79, the moisture resistant film 312-2 is formed even between the rib 311-2 and the adhesive layer 80, and the adhesive layer 80 does not come into contact with the outside.

The rib 311 has a shape obtained by cutting a trapezoidal shape in half. Although not illustrated, in a wafer state before dicing, a chip positioned at the center is referred to as a "chip 310-1," a chip positioned at the left is referred to as a "chip 310-2," and a chip positioned at the right is referred to as a "chip 310-3," and the rib 311 is formed in the wafer state as follows.

The rib 311-1 of the trapezoidal shape is formed between the chip 310-1 and the chip 310-2, and the rib 311-2 of the trapezoidal shape is formed between the chip 310-1 and the chip 310-3. A moisture resistant film 312 is formed on the surface of the rib 311 of the trapezoidal shape at the adhesive layer 80 side and the surface of the rib 311 at the microlens layer 79 side.

A portion in which there is the rib 311 of the trapezoidal shape, that is, a portion between the chip 310-1 and the chip 310-2 and a portion between the chip 310-1 and the chip 310-3 serve as a scribe section, and the chip 310 illustrated in FIG. 29 is cut out as dicing is performed along the scribe sections.

The rib 311 is preferably made of a photosensitive resin material that has tolerance such as heat resistance, is used to form a patterning or the like, and has low in elastic modulus. For example, the moisture resistant film 312 is a film that is made of a material having a function of preventing moisture from intruding into the chip 310 such as a silicon nitride film. Here, the moisture resistant film 312 is described not to be formed on the top surface of the rib 311 at the cover glass 81 side, but the moisture resistant film 312 may be formed on the top surface of the rib 311 at the cover glass 81 side.

For example, when the moisture resistant film 312 is formed of a silicon nitride film or the like, a silicon nitride film or the like can form a film having a good coverage characteristic in a film forming process, and thus the rib 311 having an inclined surface illustrated in FIG. 29 can be formed.

As the rib 311 and the moisture resistant film 312 are formed at both ends of the adhesive layer 80 of the chip 310 as described above, moisture can be prevented from intruding into the adhesive layer 80. Further, as the rib 311 is formed, tolerance to an external shock or the like is enhanced.

In other words, when force is applied to the chip 310, the rib 311 can serve as a shock absorber and absorb a shock, and thus tolerance to an external shock on the chip 310 or the like can be enhanced.

Further, even when a crack or the like occurs, the crack can be stopped by the rib 311, and it is possible to prevent the moisture resistant film 312 from being broken. The moisture resistant film 312 can be maintained without being broken, and thus improve moisture-resistance performance can be improved. Further, the moisture resistant film 312 can be formed at a thin thickness, film stress-induced influence can be reduced, and thus sufficient moisture-resistance performance can be obtained.

(3-3)-Rd Embodiment

Figure 30:
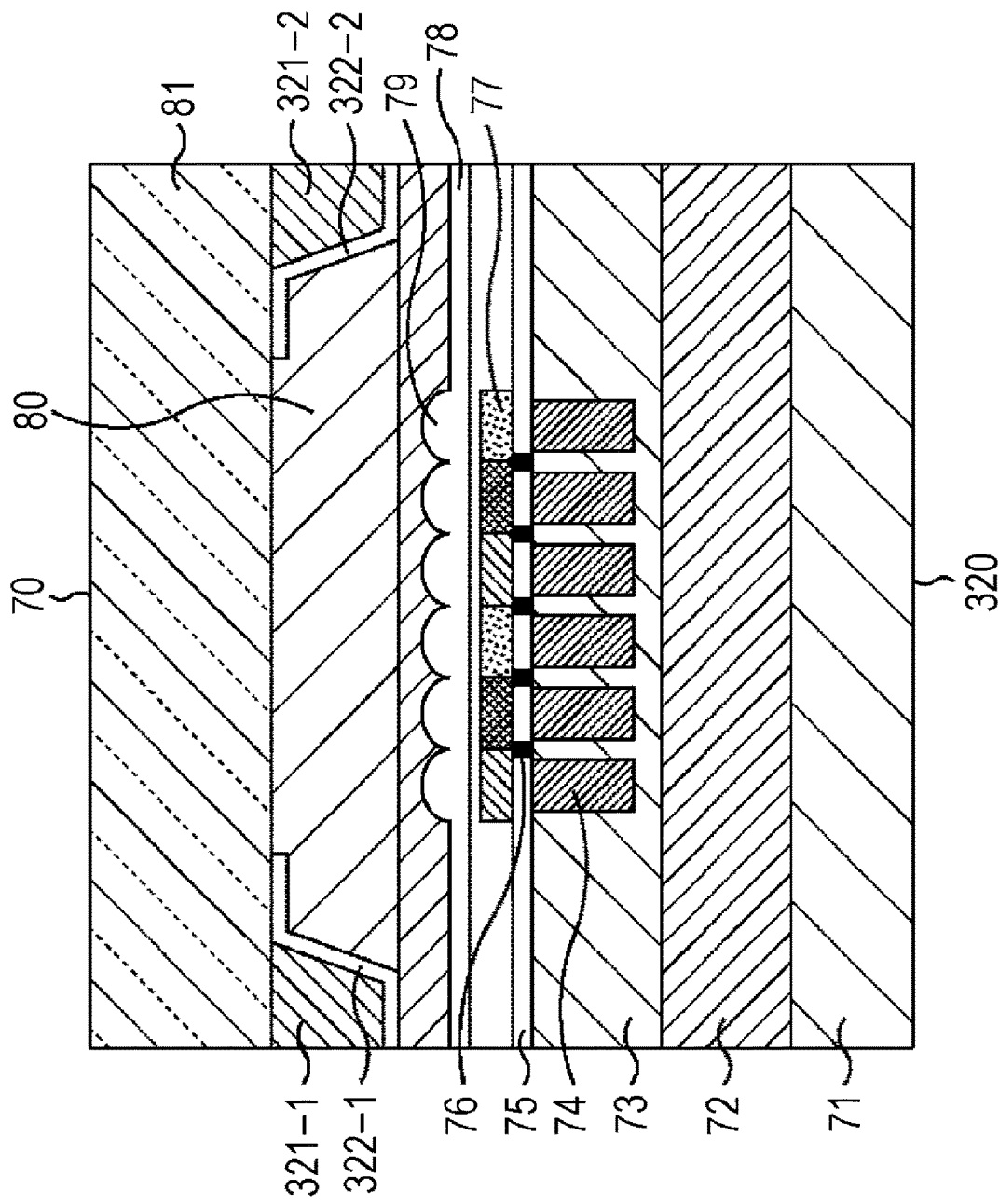
FIG. 30 is a diagram illustrating a configuration of a chip according to the third embodiment.

FIG. 30 illustrates another configuration of a chip according to the third embodiment. FIG. 30 illustrates a state of a diced chip after dicing, similarly to FIGS. 28 and 29. A configuration of a chip 320 illustrated in FIG. 30 is basically the same as the configuration of the chip 310 illustrated in FIG. 29 except a shape of a moisture resistant film.

In a rib 321 of the chip 320 illustrated in FIG. 30, a rib 321-1 and a rib 321-2 are formed on the cross-sectional surface of the adhesive layer 80, and the adhesive layer 80 does not come into contact with the outside. Further, a moisture resistant film 322-1 is formed between the rib 321-1 and the microlens layer 79, the moisture resistant film 322-1 is formed even between the rib 321-1 and the adhesive layer 80, and the adhesive layer 80 does not come into contact with the outside.

Similarly, a moisture resistant film 322-2 is formed between the rib 321-2 and the microlens layer 79, the moisture resistant film 322-2 is formed even between the rib 321-2 and the adhesive layer 80, and the adhesive layer 80 does not come into contact with the outside.

The rib 321 has a shape obtained by cutting a trapezoidal shape in half. The rib 321 is similar to the rib 311 illustrated in FIG. 29.

Figure 31:
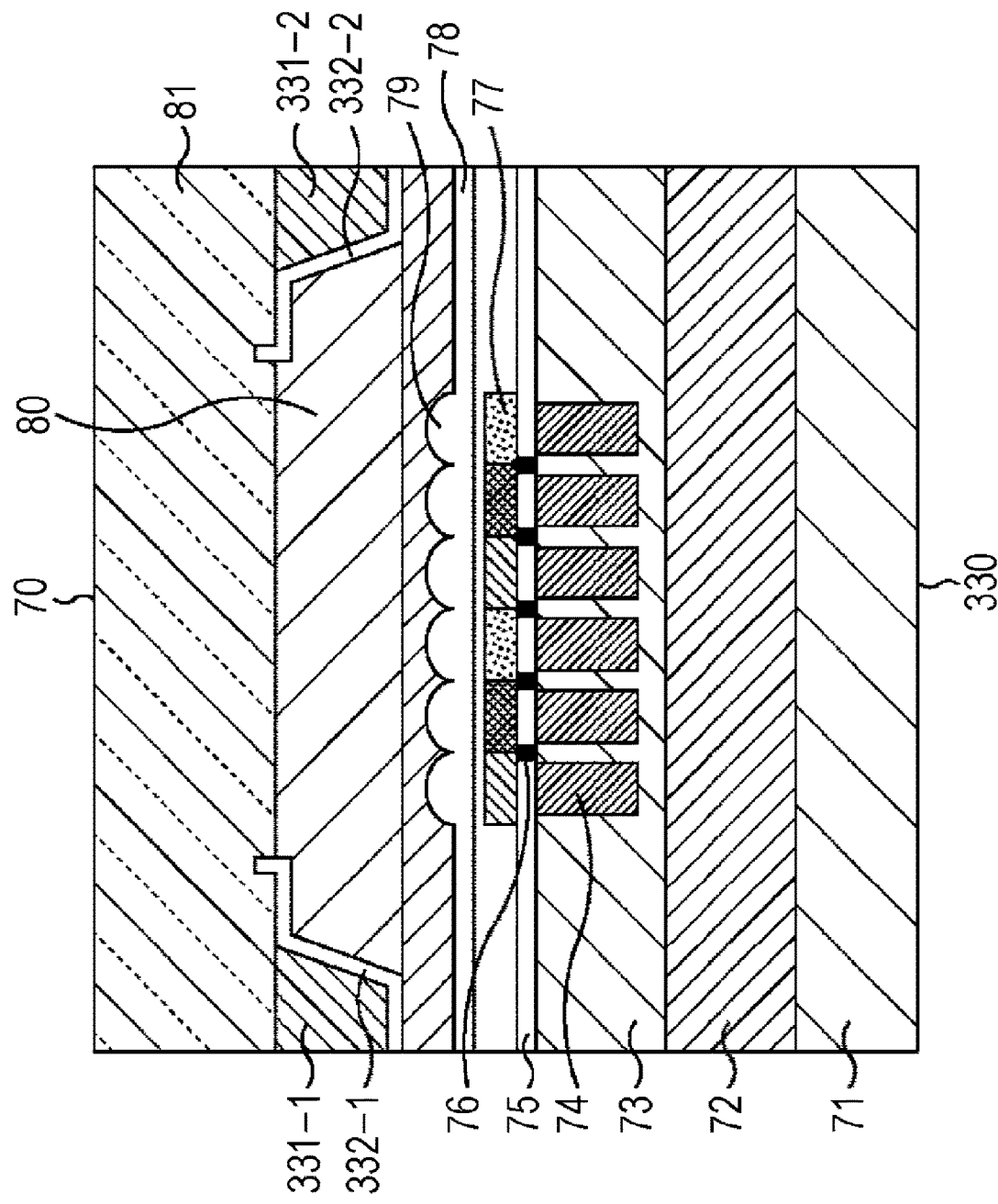
FIG. 31 is a diagram illustrating a configuration of a chip according to the third embodiment.

Further, in the chip 320 illustrated in FIG. 30, the moisture resistant film 322 is formed even between the adhesive layer 80 and the cover glass 81. Referring to FIG. 31, the moisture resistant film 322-1 is formed to extend from the surface of the rib 321-1 at the microlens layer 79 side to the surface of the rib 321-1 at the adhesive layer 80 side, and further formed between the cover glass 81 and the adhesive layer 80 along the cover glass 81.

Similarly, the moisture resistant film 322-2 is formed to extend from the surface of the rib 321-2 at the microlens layer 79 side to the surface of the rib 321-2 at the adhesive layer 80 side, and further formed between the cover glass 81 and the adhesive layer 80 along the cover glass 81.

The moisture resistant film 322 formed between the cover glass 81 and the adhesive layer 80 is formed not to extend up to the position corresponding to the portion in which the microlens of the microlens layer 79 is formed.

As the moisture resistant film 322 is formed even between the cover glass 81 and the adhesive layer 80 as described above, a structure in which an adhesive area between the cover glass 81 and the moisture resistant film 322 is large and adhesive strength is large can be provided, and thus it is possible to prevent the moisture resistant film 322 from being peeled off.

As the rib 321 and the moisture resistant film 322 are formed at both ends of the adhesive layer 80 of the chip 320 as described above, moisture can be prevented from intruding into the adhesive layer 80. Further, as the rib 321 is formed, tolerance to an external shock or the like is enhanced.

In other words, when force is applied to the chip 320, the rib 321 can serve as a shock absorber and absorb a shock, and thus tolerance to an external shock on the chip 320 or the like can be enhanced.

Further, even when a crack or the like occurs, the crack can be stopped by the rib 321, and it is possible to prevent the moisture resistant film 322 from being broken.

Further, the moisture resistant film 322 can be formed at a thin thickness, and thus moisture-resistance performance can be improved. Further, the moisture resistant film 322 can be formed at a thin thickness, film stress-induced influence can be reduced, and thus sufficient moisture-resistance performance can be obtained.

(3-4)-Th Embodiment

FIG. 31 illustrates another configuration of a chip according to the third embodiment. FIG. 31 illustrates a state of a diced chip after dicing, similarly to FIGS. 28 to 30. A configuration of a chip 330 illustrated in FIG. 31 is basically the same as the configuration of the chip 320 illustrated in FIG. 30 except a shape of a moisture resistant film.

In a rib 331 of the chip 330 illustrated in FIG. 31, a rib 331-1 and a rib 331-2 are formed on the cross-sectional surface of the adhesive layer 80, and the adhesive layer 80 does not come into contact with the outside.

The rib 331 has a shape obtained by cutting a trapezoidal shape in half. The rib 331 is similar to the rib 311 illustrated in FIG. 29.

A moisture resistant film 332-1 is formed between the rib 331-1 and the microlens layer 79, the moisture resistant film 332-1 is formed even between the rib 331-1 and the adhesive layer 80, and the adhesive layer 80 does not come into contact with the outside.

Similarly, a moisture resistant film 332-2 is formed between the rib 331-2 and the microlens layer 79, the moisture resistant film 332-2 is formed even between the rib 331-2 and the adhesive layer 80, and the adhesive layer 80 does not come into contact with the outside.

Further, in the chip 330 illustrated in FIG. 31, the moisture resistant film 332 is formed even between the adhesive layer 80 and the cover glass 81. Referring to FIG. 30, the moisture resistant film 332-1 is formed to extend from the surface of the rib 331-1 at the microlens layer 79 side to the surface of the rib 331-1 at the adhesive layer 80 side, and further formed between the cover glass 81 and the adhesive layer 80 along the cover glass 81.

Similarly, the moisture resistant film 332-2 is formed to extend from the surface of the rib 331-2 at the microlens layer 79 side to the surface of the rib 331-2 at the adhesive layer 80 side, and further formed between the cover glass 81 and the adhesive layer 80 along the cover glass 81.

The moisture resistant film 332 formed between the cover glass 81 and the adhesive layer 80 is formed not to extend up to the position corresponding to the portion in which the microlens of the microlens layer 79 is formed. The moisture resistant film 332 has a similar shape to that of the moisture resistant film 322 illustrated in FIG. 30. Further, in the chip 330 illustrated in FIG. 31, the moisture resistant film 332 is shaped to include a wedge in order to prevent peeling.

In other words, referring to FIG. 31, among portions of the moisture resistant film 332-1 formed between the cover glass 81 and the adhesive layer 80, a portion of the moisture resistant film 332-1 at the side opposite to the rib 331-1 is formed to be inserted into the cover glass 81. The moisture resistant film 332-1 is formed in a part of the cover glass 81.

Similarly, among portions of the moisture resistant film 332-2 formed between the cover glass 81 and the adhesive layer 80, a portion of the moisture resistant film 332-2 at the side opposite to the rib 331-2 is formed to be inserted into the cover glass 81. The moisture resistant film 332-2 is formed in a part of the cover glass 81.

As the moisture resistant film 332 is formed even between the cover glass 81 and the adhesive layer 80 and formed to include the wedge as described above, an adhesive area between the cover glass 81 and the moisture resistant film 332 can be increased, and adhesive strength can be increased, and thus it is possible to prevent the moisture resistant film 332 from being peeled off.

As the rib 331 and the moisture resistant film 332 are formed at both ends of the adhesive layer 80 of the chip 330 as described above, moisture can be prevented from intruding into the adhesive layer 80. Further, as the rib 331 is formed, tolerance to an external shock or the like is enhanced.

In other words, when force is applied to the chip 330, the rib 331 can serve as a shock absorber and absorb a shock, and thus tolerance to an external shock on the chip 330 or the like can be enhanced.

Further, even when a crack or the like occurs, the crack can be stopped by the rib 331, and it is possible to prevent the moisture resistant film 332 from being broken. Furthermore, the moisture resistant film 332 can be formed at a thin thickness, and thus moisture-resistance performance can be improved. Moreover, the moisture resistant film 332 can be formed at a thin thickness, film stress-induced influence can be reduced, and thus sufficient moisture-resistance performance can be obtained.

(3-5)-Th Embodiment

Figure 32:
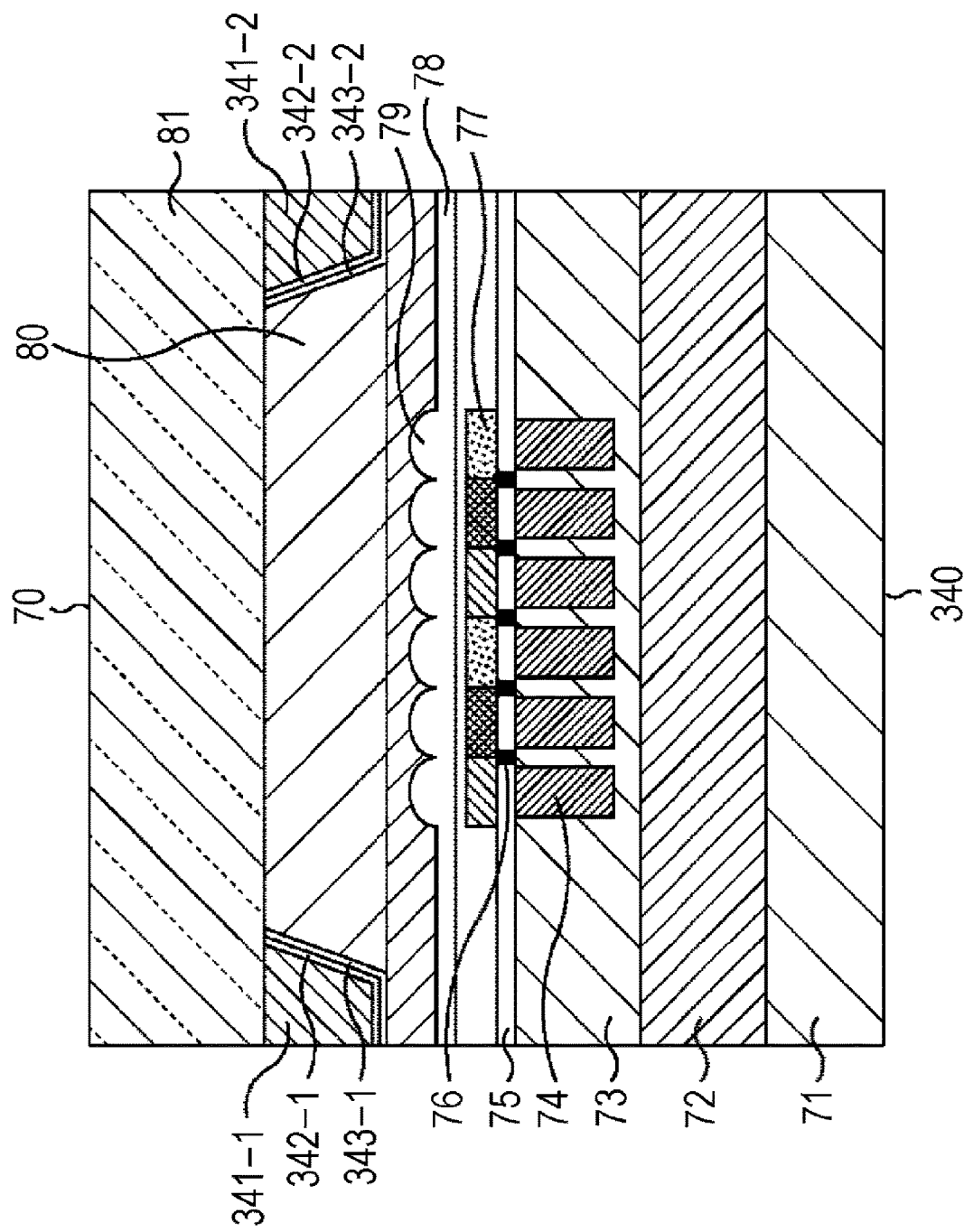
FIG. 32 is a diagram illustrating a configuration of a chip according to the third embodiment.

FIG. 32 illustrates another configuration of a chip according to the third embodiment. FIG. 32 illustrates a state of a diced chip after dicing, similarly to FIG. 29. A configuration of a chip 340 illustrated in FIG. 32 is basically the same as the configuration of the chip 310 illustrated in FIG. 29 except a shape of a moisture resistant film.

In the chip 340 illustrated in FIG. 32, a rib 341-1 and a rib 341-2 are formed on the cross-sectional surface of the adhesive layer 80, and the adhesive layer 80 does not come into contact with the outside. The rib 341 is preferably made of a photosensitive resin material that has tolerance such as heat resistance, is used to form a patterning or the like, and has low in elastic modulus.

A first moisture resistant film 342-1 and a second moisture resistant film 343-1 are formed between the rib 341-1 and the microlens layer 79, the first moisture resistant film 342-1 and the second moisture resistant film 343-1 are formed even between the rib 341-1 and the adhesive layer 80, and the adhesive layer 80 does not come into contact with the outside.

Similarly, a first moisture resistant film 342-2 and a second moisture resistant film 343-2 are formed between the rib 341-2 and the microlens layer 79, the first moisture resistant film 342-2 and the second moisture resistant film 343-2 are formed even between the rib 341-2 and the adhesive layer 80, and the adhesive layer 80 does not come into contact with the outside.

As described above, the chip 340 according to the (3-5)-th embodiment has the configuration in which the moisture resistant films are stacked. In the chip 340 illustrated in FIG. 32, two moisture resistant films are stacked as an example, and a configuration in which more moisture resistant films are stacked can be provided.

Further, the first moisture resistant film 342-2 and the second moisture resistant film 343-2 are moisture resistant films made of different materials. For example, one of the first moisture resistant film 342-2 and the second moisture resistant film 343-2 may be formed of a silicon nitride film, and the other may be formed of a silicon oxide film.

The silicon nitride film and the silicon oxide film have different refractive indices. As a plurality of films having different refractive indices are stacked and formed, it is possible to induce optical interference and reflect incident light having an arbitrary wavelength, it is possible to prevent light from being incident on pixels which will be described later with reference to FIGS. 34A and 34B, and it is possible to reduce a flare or the like.

As the rib 341 and the moisture resistant film in which the first moisture resistant film 342 and the second moisture resistant film 343 are stacked are formed at both ends of the adhesive layer 80 of the chip 340 as described above, moisture can be prevented from intruding into the adhesive layer 80. Further, as the moisture resistant films are stacked, it is possible to absorb and reflect unnecessary incident light to thus reduce a flare or the like.

Further, as the rib 341 is formed, tolerance to an external shock or the like is enhanced. In other words, when force is applied to the chip 340, the rib 341 can serve as a shock absorber and absorb a shock, and thus tolerance to an external shock on the chip 340 or the like can be enhanced.

Further, even when a crack or the like occurs, the crack can be stopped by the rib 341, and it is possible to prevent the moisture resistant film in which the first moisture resistant film 342 and the second moisture resistant film 343 are stacked from being broken. Furthermore, the moisture resistant film in which the first moisture resistant film 342 and the second moisture resistant film 343 are stacked can be maintained without being broken, and thus moisture-resistance performance can be improved.

Further, the moisture resistant film in which the first moisture resistant film 342 and the second moisture resistant film 343 are stacked can be formed at a thin thickness, film stress-induced influence can be reduced, and thus sufficient moisture-resistance performance can be obtained.

In addition, the shape of the moisture resistant film 322 of the chip 320 illustrated in FIG. 30 according to the (3-3)-rd embodiment may be applied to the chip 330 illustrated in FIG. 32 according to the (3-5)-th embodiment such that the moisture resistant film in which the first moisture resistant film 342 and the second moisture resistant film 343 are stacked is formed even between the cover glass 81 and the adhesive layer 80.

Further, the shape of the moisture resistant film 322 of the chip 330 illustrated in FIG. 31 according to the (3-4)-th embodiment may be applied to the chip 330 illustrated in FIG. 32 according to the (3-5)-th embodiment such that the moisture resistant film in which the first moisture resistant film 342 and the second moisture resistant film 343 are stacked is formed even between the cover glass 81 and the adhesive layer 80, and the moisture resistant film is shaped to include the wedge being fitted into a part of the cover glass 81.

(3-6)-Th Embodiment

Figure 33:
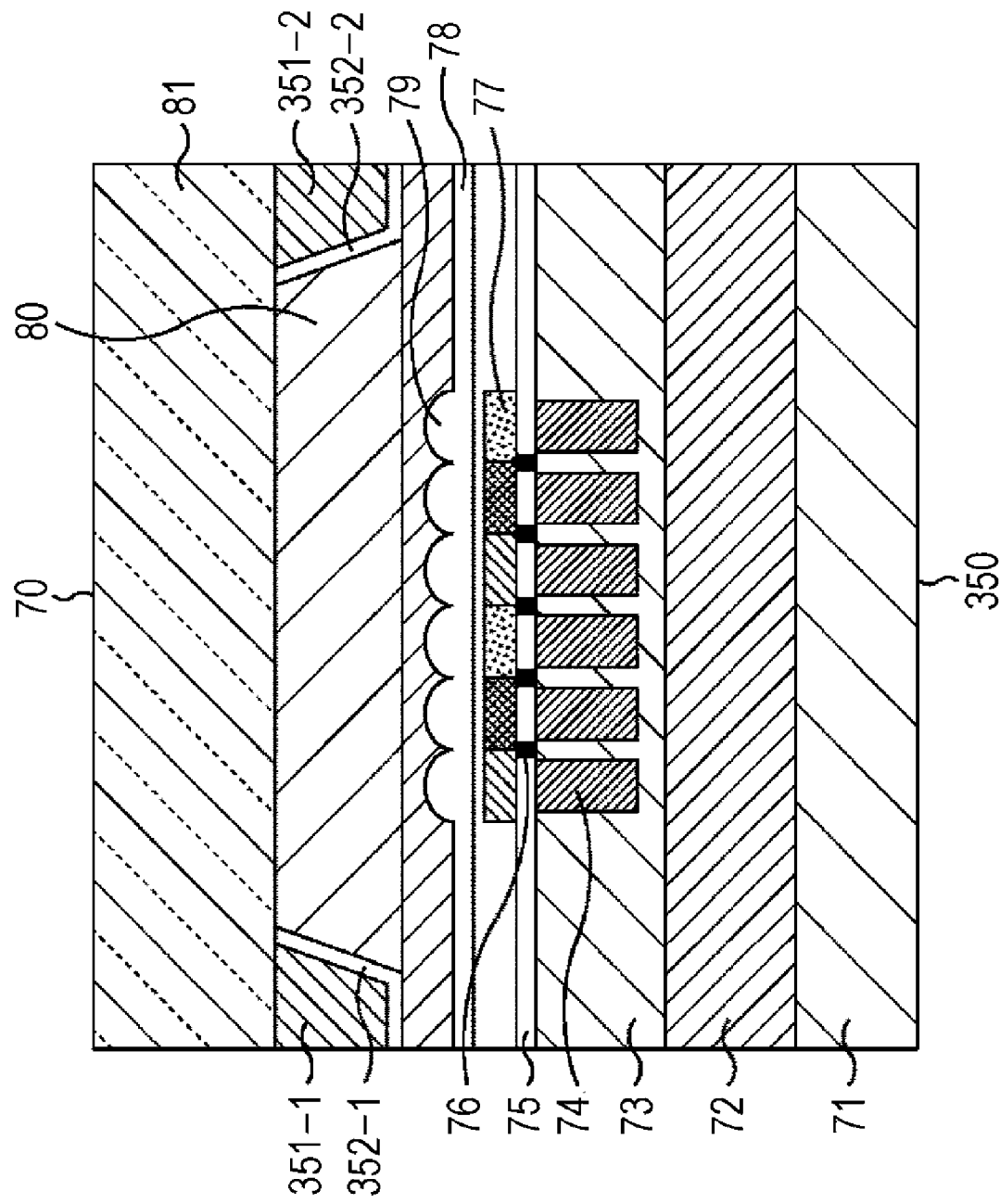
FIG. 33 is a diagram illustrating a configuration of a chip according to the third embodiment.

FIG. 33 illustrates another configuration of a chip according to the third embodiment. FIG. 33 illustrates a state of a diced chip after dicing, similarly to FIG. 29. A configuration of a chip 350 illustrated in FIG. 33 is basically the same as the configuration of the chip 310 illustrated in FIG. 29 except a material of a rib.

In the chip 350 illustrated in FIG. 33, a rib 351-1 and a rib 351-2 are formed on the side surfaces of the adhesive layer 80, and the adhesive layer 80 does not come into contact with the outside. Further, a moisture resistant film 352-1 is formed between the rib 351-1 and the microlens layer 79, the moisture resistant film 352-1 is formed even between the rib 351-1 and the adhesive layer 80, and the adhesive layer 80 does not come into contact with the outside.

Similarly, a moisture resistant film 352-2 is formed between the rib 351-2 and the microlens layer 79, the moisture resistant film 352-2 is formed even between the rib 351-2 and the adhesive layer 80, and the adhesive layer 80 does not come into contact with the outside.

The rib 351 is made of a material of absorbing light of an arbitrary wavelength as in a black filter. As the rib 351 is made of a material of absorbing light of a certain wavelength, a flare or the like can be reduced.

Similarly to the above embodiment, the rib 351 is preferably made of a photosensitive resin material that has tolerance such as heat resistance, is used to form a patterning or the like, and has low in elastic modulus. For example, the moisture resistant film 352 is a film that is made of a material having a function of preventing moisture from intruding into the chip 350 such as a silicon nitride film.

As the rib 351 and the moisture resistant film 352 are formed at both ends of the adhesive layer 80 of the chip 350 as described above, moisture can be prevented from intruding into the adhesive layer 80. Further, as the rib 351 is formed, tolerance to an external shock or the like is enhanced.

In other words, when force is applied to the chip 350, the rib 351 can serve as a shock absorber and absorb a shock, and thus tolerance to an external shock on the chip 350 or the like can be enhanced.

Further, even when a crack or the like occurs, the crack can be stopped by the rib 351, and it is possible to prevent the moisture resistant film 352 from being broken. The moisture resistant film 352 can be maintained without being broken, and thus improve moisture-resistance performance can be improved. Further, the moisture resistant film 352 can be formed at a thin thickness, film stress-induced influence can be reduced, and thus sufficient moisture-resistance performance can be obtained.

Further, as the rib 351 is made of a material of absorbing light of a certain wavelength, a flare or the like can be reduced.

Further, the shape of the moisture resistant film 322 of the chip 320 illustrated in FIG. 30 according to the (3-3)-rd embodiment may be applied to the chip 350 illustrated in FIG. 33 according to the (3-6)-th embodiment such that the moisture resistant film 352 is formed even between the cover glass 81 and the adhesive layer 80.

Further, the shape of the moisture resistant film 332 of the chip 330 illustrated in FIG. 31 according to the (3-4)-th embodiment may be applied to the chip 350 illustrated in FIG. 33 according to the (3-6)-th embodiment such that the moisture resistant film 352 is formed even between the cover glass 81 and the adhesive layer 80, and the moisture resistant film 352 is shaped to include the wedge being fitted into a part of the cover glass 81.

Further, the moisture resistant film of the chip 340 illustrated in FIG. 32 according to the (3-5)-th embodiment may be applied to the chip 350 illustrated in FIG. 33 according to the (3-6)-th embodiment such that the moisture resistant film 352 is formed as the moisture resistant film in which the first moisture resistant film 342 and the second moisture resistant film 343 having different refractive indices are stacked.

<Absorption of Light>

The configuration of the chip 340 illustrated in FIG. 32 according to the (3-5)-th embodiment in which the moisture resistant films are stacked to absorb light of a certain wavelength will be described with reference to FIGS. 34A and 34B. Further, similarly, the configuration of the chip 350 illustrated in FIG. 33 according to the (3-6)-th embodiment in which the rib 351 is made of a material of absorbing light of a certain wavelength and absorbs light of a certain wavelength will be described with reference to FIGS. 34A and 34B.

Figure 34A:
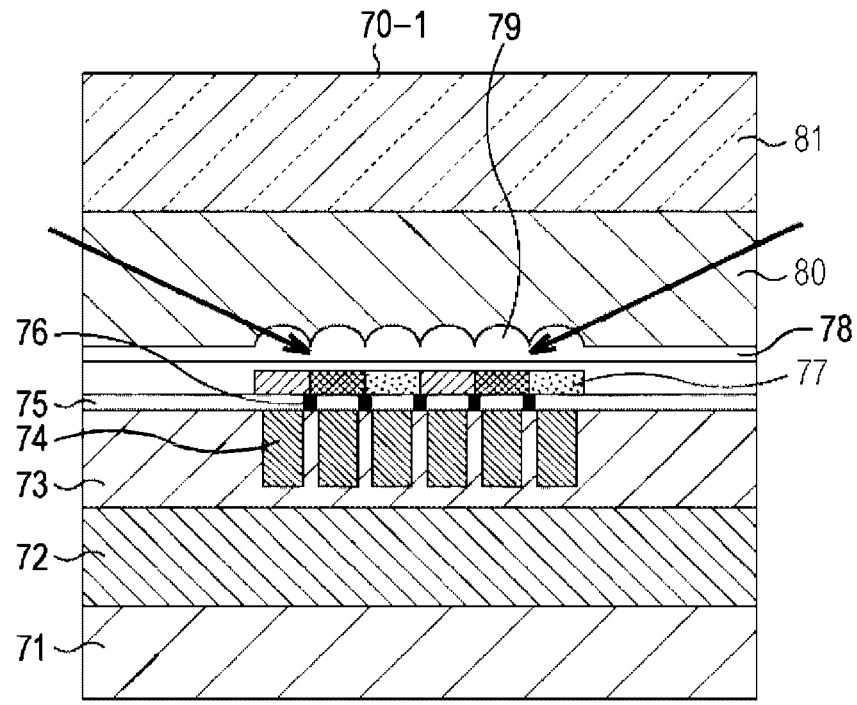
FIGS. 34A and 34B are diagrams illustrating a configuration of a chip according to the third embodiment.

FIG. 34A illustrates the chip 70-1 illustrated in FIG. 3 (hereinafter, referred to as the "chip 70") for a comparison. FIG. 34B illustrates the chip 350 illustrated in FIG. 33. The chip 70 illustrated in FIG. 34A and the chip 350 illustrated in FIG. 34B are mounted in, for example, a camera system. In the camera system, there are various stray light components, and problems causing image quality deterioration such as a flare are likely to occur due to the stray light components.

For example, as indicated by thick arrows in FIG. 34A, when light is incident in the lateral direction of the chip 70, the light is likely to be incident on the photodiode 74. Since there is no mechanism of blocking light incident from the side in the chip 70, the light incident from the side is likely to be incident on the photodiode 74 while maintaining its intensity. As described above, when stray light is incident on pixels, a flare image is generated, and thus an image quality deteriorates.

Figure 34B:
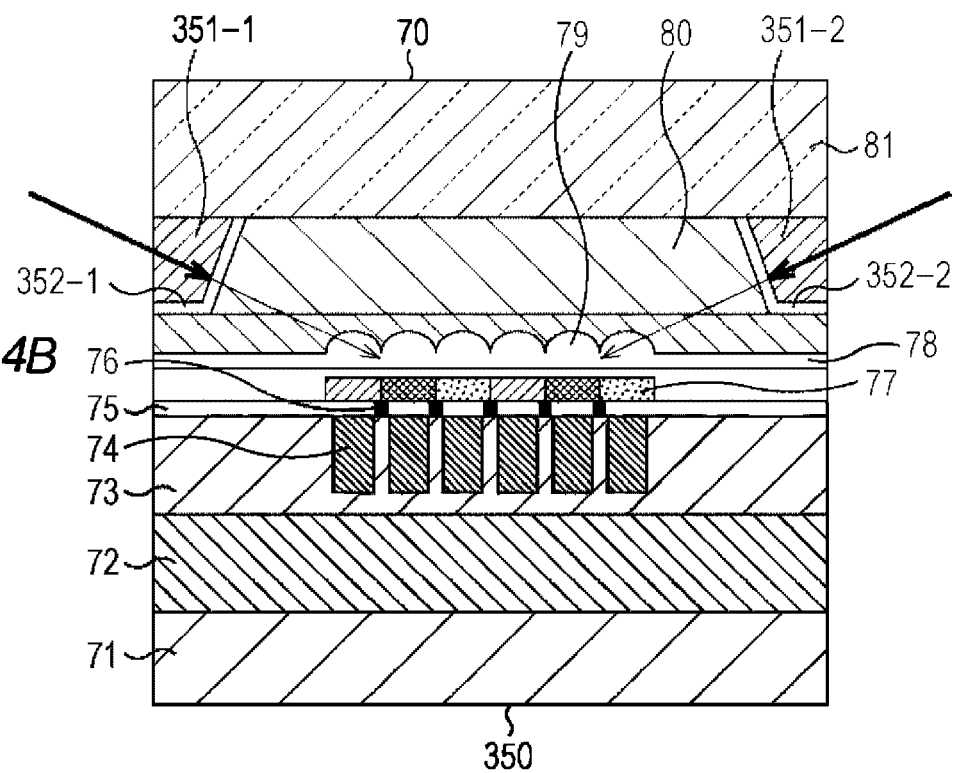

On the other hand, when the rib 351 is formed, and the rib 351 is made of a material of absorbing light of a certain wavelength as in a black filter as illustrated in FIG. 34B, for example, the rib 351 can absorb light incident from the side of the chip 350.

In other words, since the chip 350 has a mechanism of blocking light incident form the side, intensity of the light is reduced, and thus even when light is incident on the photodiode 74 from the side, a possibility of a flare image can be reduced, and image quality deterioration can be suppressed. As described above, as the rib 351 is formed, it is possible to block or reduce the stray light component and suppress image quality deterioration.

Even when the first moisture resistant film 342 and the second moisture resistant film 343 having different refractive indices are stacked as in the chip 340 illustrated in FIG. 32, optical interference can be induced, and it is consequently possible to reflect and reduce incident light of an arbitrary wavelength, and thus it is possible to block or reduce light incident from the side of the chip 340. Thus, in the case of the chip 340, it is possible to block or reduce the stray light component and suppress image quality deterioration.

Manufacturing of Chip According to Third Embodiment

Figure 35:
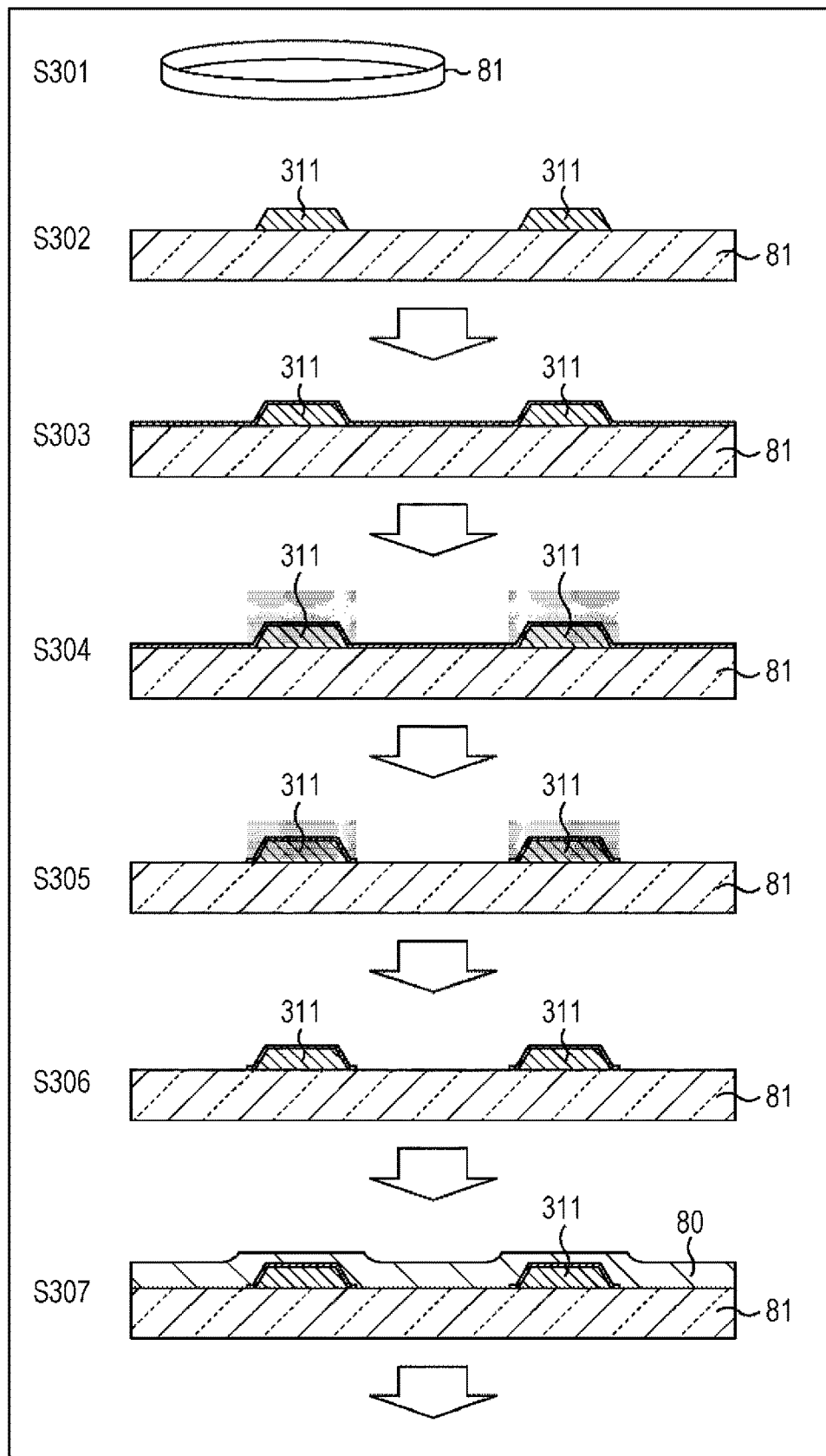
FIG. 35 is a diagram for describing a process of manufacturing a chip according to the third embodiment.
Figure 36:
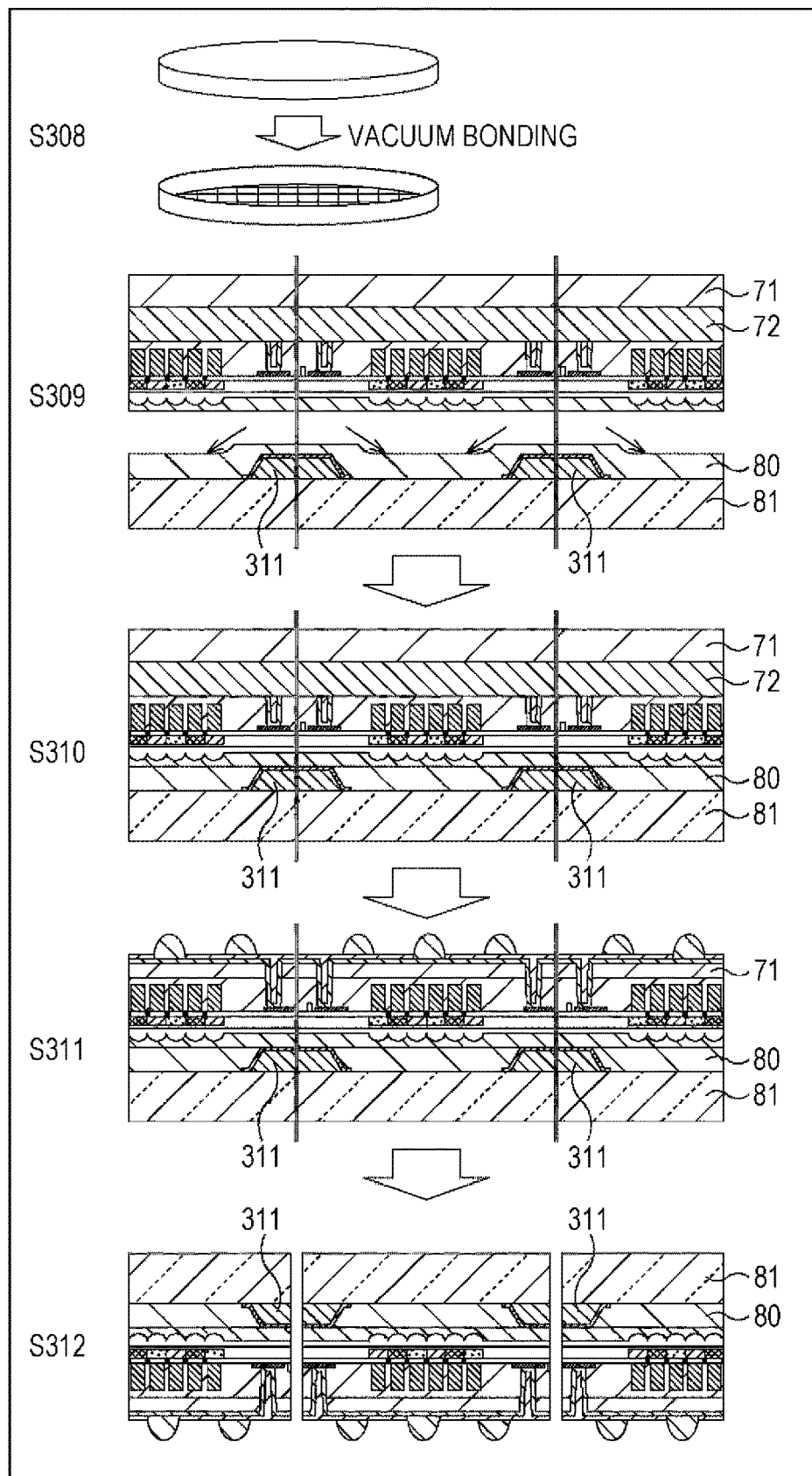
FIG. 36 is a diagram for describing a process of manufacturing a chip according to the third embodiment.

A process of manufacturing a chip (wafer) having such a groove will be described. FIGS. 35 and 36 are diagrams for describing a process of manufacturing a chip prior to dicing.

A manufacturing process which will be described with reference to FIGS. 35 and 36 will focus on a process of manufacturing a rib and a moisture resistant film that are characteristic components of the present technology, and a process of manufacturing the other portion, for example, a process of forming a layer can be performed using a manufacturing method of a related art, and thus a description thereof will be omitted. Here, the description will proceed with an example of manufacturing the chip 320 illustrated in FIG. 29 according to the (3-3)-rd embodiment.

In step S301, the cover glass 81 is set up.

In step S302, the rib 321 is formed on the cover glass 81. The rib 321 is formed on a glass wafer of the cover glass 81 using the lithography process. For example, a material containing polyimide resin as a main solid component is dropped onto a glass wafer, a film is formed at a thickness of 50 micrometers by a spin coating technique, and then a warming process is performed at a temperature of 120 degrees Celsius during 60 seconds to dry a solvent.

Then, light exposure is performed by an i-line exposure device, a development process is performed using a water solution of TMAH of 2.38 wt %, and a warming process is performed at a temperature of 200 degrees Celsius during 300 seconds, so that a film is sufficiently cured.

In step S302, a rib of a square form is formed when a rib of a square form is formed such as the rib 301 of the chip 300 illustrated in FIG. 27, and a rib of a trapezoidal shape is formed when a rib of a trapezoidal shape is formed such as the rib 321 of the chip 320 illustrated in FIG. 30.

In step S303, when the film is cured, film forming is performed. In step S303, a waterproof film, that is, a moisture resistant film 322 is formed. For example, the silicon nitride film serving as the moisture resistant film 322 is formed on the glass wafer with the pattern of the rib 321. The film forming method can be performed, for example, by a plasma chemical vapor deposition (CVD) using a mixed gas species of $SiH_4$, $NH_3$, and $N_2$ under the condition in which an atmosphere temperature is 400 degrees Celsius, and HF power is 800 W.

In step S304, a pattern for protecting the pattern of the rib 321 is formed using the lithography process. For example, the forming method can be performed such that a resist material containing novolac resin as a main solid component is dropped onto the wafer, a film is formed at a thickness of 100 micrometers by the spin coating technique, and a warming process is performed at a temperature of 100 degrees Celsius during 180 seconds to dry a solvent. Then, light exposure is performed by an i-line exposure device, a development process is performed using a water solution of TMAH of 2.38 wt %, and a warming process is performed at a temperature of 100 degrees Celsius during 180 seconds to dry a solvent.

In step S305, a dry etching process is performed to remove a portion of silicon nitride film excluding a portion on the pattern of the rib 321. For example, the etching process is performed using a mixed gas of $CF_4/O_2$ under an etching condition in which bias power is 150 W, and source power is 1000 W.

In step S306, the resist remaining on the pattern of the rib 321 is removed, and thus a waterproof film structure is formed on the rib 321. For example, the removing of the resist may be performed such that a thinner containing propylene glycol methyl ether as a main solvent component is dropped onto the wafer, then the wafer is rotated during 120 seconds while dropping the thinner, and a warming process is performed at 100 degrees Celsius during 120 seconds to dry a solvent.

The process of steps S304 to S306 is a process suitable for the shape of a moisture resistant film 322. For example, when the moisture resistant film 322 is formed even between the cover glass 81 and the adhesive layer 80 as in the chip 320 (FIG. 30), a portion on which the moisture resistant film 322 is desired to be formed is coated with a resist.

In step S307, an adhesive layer 80 is formed by coating the glass wafer including the moisture resistant film 322 (waterproof film) structure on the rib 321 with seal resin (an adhesive). For example, the forming of the adhesive layer 80 may be performed such that a material containing polysiloxane resin as a main solid component is dropped onto the wafer, a film is formed at a thickness of 50 micrometers by the spin coating technique, and thereafter a warming process is performed at 120 degrees Celsius during 1200 seconds to dry a solvent.

In step S308 (FIG. 36), a wafer in which the support substrate 71, the interconnection layer 72, the silicon substrate 73, the planarization film 75, the color filter layer 77, the planarization film 78, and the microlens layer 79 are stacked, the photodiode 74 is formed in the silicon substrate 73, and the light shielding film 76 is formed in the planarization film 75 and a glass wafer in which the rib 321 and the moisture resistant film 322 are formed, and the adhesive layer 80 is formed are prepared.

In step S309, the wafer in which the elements are formed is bonded to the glass wafer. For example, a vacuum bonding apparatus is used for the bonding, and the bonding is performed such that processing is performed during 5 minutes under the condition in which a degree of vacuum is 1 Pa, a load is 6.8 kN, and a temperature is 70 degrees Celsius, and bonding is performed without a void.

As illustrated in step S307 (FIG. 35) and step S309 (FIG. 36), the adhesive layer 80 is formed in a raised shape according to the shape of the rib 321. As the adhesive layer 80 is formed on the top surface of the rib 321 (the side serving as the microlens layer 79 side at the time of bonding) as described above, an adhesive leaks into both ends of the rib 321 at the time of bonding as indicated by arrows in step S309.

As the adhesive leaks into both ends of the rib 321, a space between the glass wafer in which the rib 321 is formed and the wafer in which the elements are formed is filled with the adhesive, and thus an adhesion degree between the wafers can be increased.

Thus, it is possible to reduce a possibility that the moisture resistant film 322 will be peeled off, for example.

In step S310, in order to cure the seal resin, for example, the adhesive layer 80, the curing process is performed at 200 degrees Celsius for 4 hours at an air atmosphere, and thus film curing is sufficiently performed.

In step S311, rear through interconnections are formed. The rear through interconnections may be performed using a method of a related art.

In step S312, dicing is performed, so that a chip is diced. As a result, the chip 320 including the rib 321 and the moisture resistant film 322 are manufactured.

In the chip according to the third embodiment, since the moisture resistant film can be formed at a thin thickness on the inner side of the outer periphery portion of the chip, it is possible to prevent the occurrence of a crack or the like that is caused by an external shock or film stress applied when a chip is handled or mounted in a substrate, and thus it is possible to improve moisture resistance.

Further, since a structure and a material having light reflection or absorption properties are used to form the moisture resistant film and the rib, in addition to an improvement in moisture resistance, it is possible to reduce a problem of a flare that passes through the sidewall portion of the chip in the horizontal direction and is incident on pixels, and thus an image quality can be improved.

Fourth Embodiment

In the fourth embodiment, intrusion of moisture into a chip is prevented such that a wall having moisture resistance made of metal is formed in a certain layer in a chip.

Figure 37:
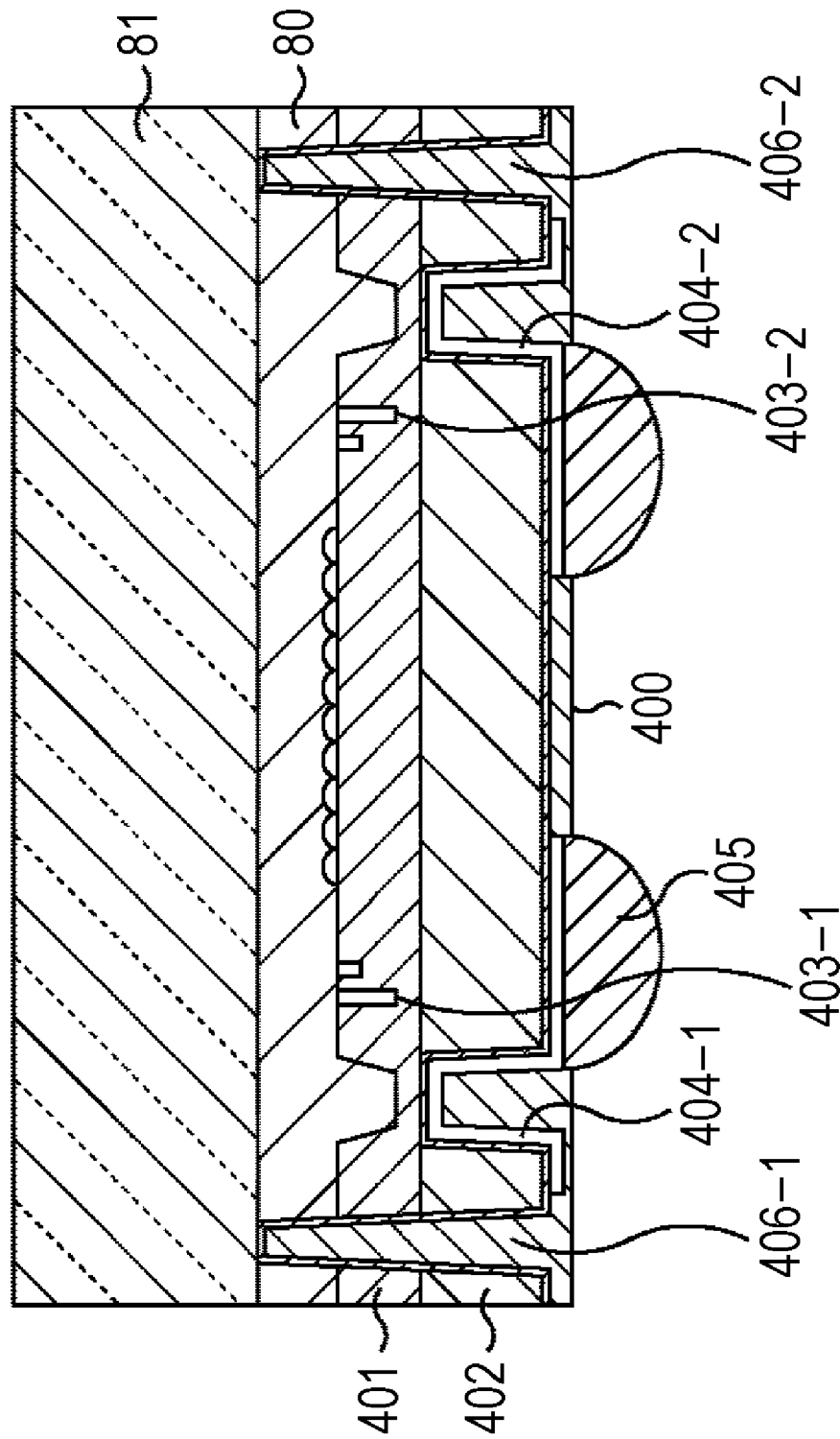
FIG. 37 is a diagram illustrating a configuration of a chip according to a fourth embodiment.

FIG. 37 illustrates a configuration of a chip according to the fourth embodiment.

Similarly to the chip 70 illustrated in FIG. 3, a chip 400 illustrated in FIG. 37 has a structure in which certain layers are stacked and includes the same layers, but since the fourth embodiment relates to an interconnection, an electrode, and the like formed in the support substrate 71 or the interconnection layer 72, a drawing different from that of the chip 70 illustrated in FIG. 3 is illustrated, and the same layers are denoted by the same reference numerals, and thus a description thereof is appropriately omitted.

The fourth embodiment will be described with an example in which the chip 400 is divided into 4 layers. In FIG. 37, a cover glass 81, an adhesive layer 80, a first layer 401, and a second layer 402 are stacked in order from the top. The first layer 401 includes a microlens layer 79, a color filter layer 77, a photodiode 74, and the like, and the second layer 402 includes an interconnection layer 72 or a support substrate 71.

The first layer 401 includes a through-CIS-via (TCV) 403-1 and a TCV 403-2. Signal lines and power lines of a (1-1)-st layer and a (1-2)-nd layer that are stacked are electrically connected by the TCV 403.

The second layer 402 includes a through silicon via (TSV) 404-1 and a TSV 404-2. Signal lines and power lines of the first layer 401 and the second layer 402 that are stacked are electrically connected by the TSV 404. The connection terminal 405 for a connection with an external circuit is formed below the second layer 402.

Figure 38:
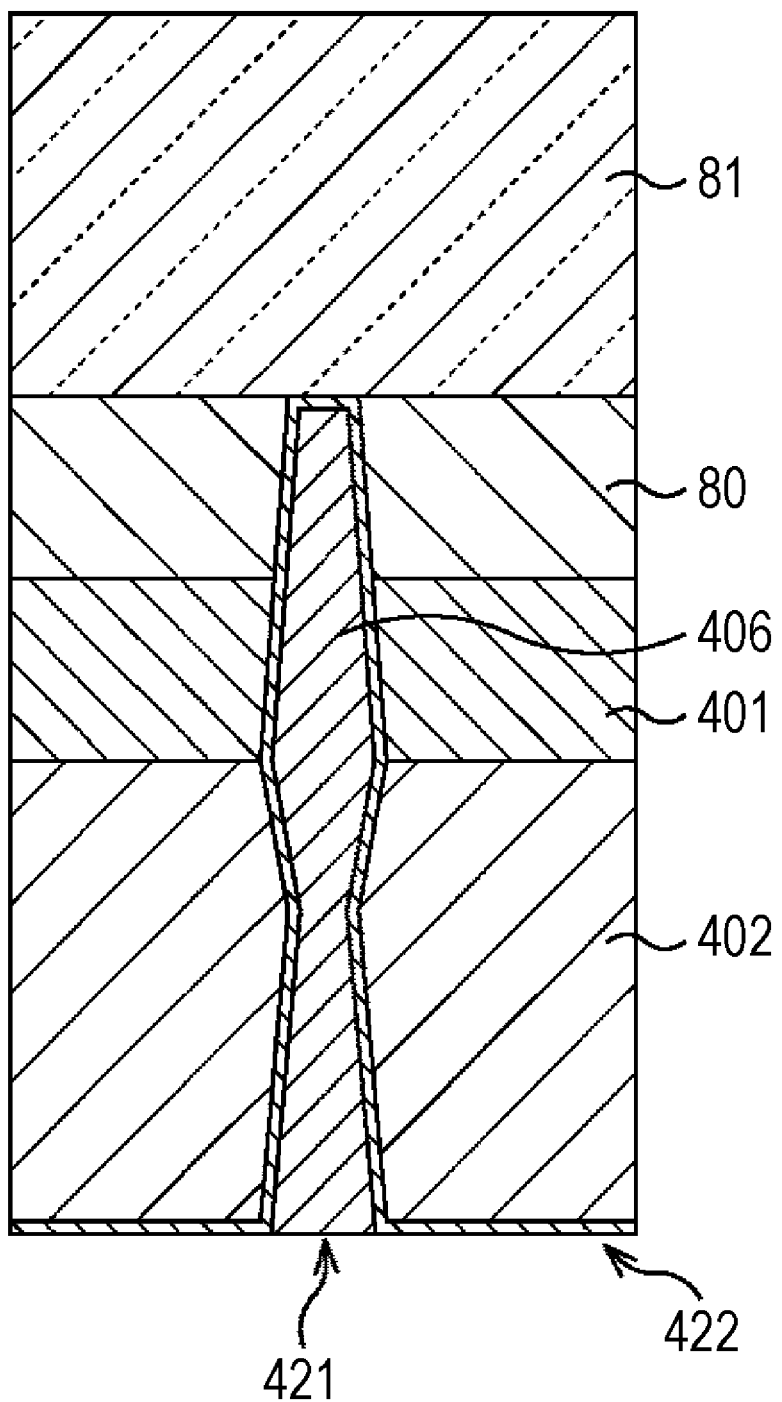
FIG. 38 is a diagram illustrating a configuration of a chip according to the fourth embodiment.

The chip 400 further includes a sidewall protecting portion 406-1 and a sidewall protecting portion 406-2 formed on both ends of the chip 400. The sidewall protecting portion 406 is formed to prevent intrusion of moisture from the side of the chip 400. FIG. 38 illustrates the enlarged sidewall protecting portion 406.

FIG. 38 is an enlarged view illustrating the sidewall protecting portion 406. The sidewall protecting portion 406 is formed to penetrate the adhesive layer 80, the first layer 401, and the second layer 402. The inner side of the sidewall protecting portion 406 is formed of a solder mask 421, and the outer side thereof is formed of an interconnection 422.

As will be described later, the sidewall protecting portion 406 is formed by two processes of a process of forming the TCV 403 (the first through electrode) and a process of forming the TSV 404 (the second through electrode). Since the sidewall protecting portion 406 is formed by two processes, the sidewall protecting portion 406 is shaped to have a narrow part in the middle as illustrated in FIG. 38.

A manufacturing process of forming the sidewall protecting portion 406 will be described. The manufacturing process described below will focus on manufacturing of the sidewall protecting portion 406 serving as one of characteristic components of the present technology, and a manufacturing method of a related art can be applied to manufacturing of other parts such as forming of layers, and thus a description thereof will be appropriately omitted.

(4-1)-St Embodiment

A process of manufacturing the chip 400 will be described with reference to FIGS. 39 and 40.

In step S401, a space 441 for forming the sidewall protecting portion 406 is formed in a first layer 401. In step S401, the first layer 401 in which the color filter layer 77 and the microlens layer 79 are not stacked yet but the photodiode 74 is already formed is prepared.

In step S401, the TCV 403 is also formed. In other words, in order to form the TCV 403, when silicon etching is performed, etching for the TCV 403 is performed, and the space 441 for forming the sidewall protecting portion 406 is formed by etching.

As described above, in the fourth embodiment, the process of forming the TCV 403 and the process of forming a part of the sidewall protecting portion 406 are included, and thus the sidewall protecting portion 406 can be formed without performing a new process.

In step S402, custom forming is performed. In step S402, the color filter layer 77, the microlens layer 79, and the like included in the first layer 401 are formed. Further, the adhesive layer 80 is formed.

In step S403, the cover glass 81 is bonded to the first layer 401. Then, in step S404, the support substrate 71 in the second layer 402 is thinned. In FIG. 39, steps S401 to S403 are different in scale from step S404. Further, in step S404, the substrate has been turned upside down, and the cover glass 81 is positioned at the lower side.

In the chip 400 in steps S401 to S404, the space 441 remains hollow. As illustrated in step S404, since the sidewall protecting portion 406 is formed at both ends of the chip 400, the space 441 is also formed at both ends of the chip 400.

Figure 39:
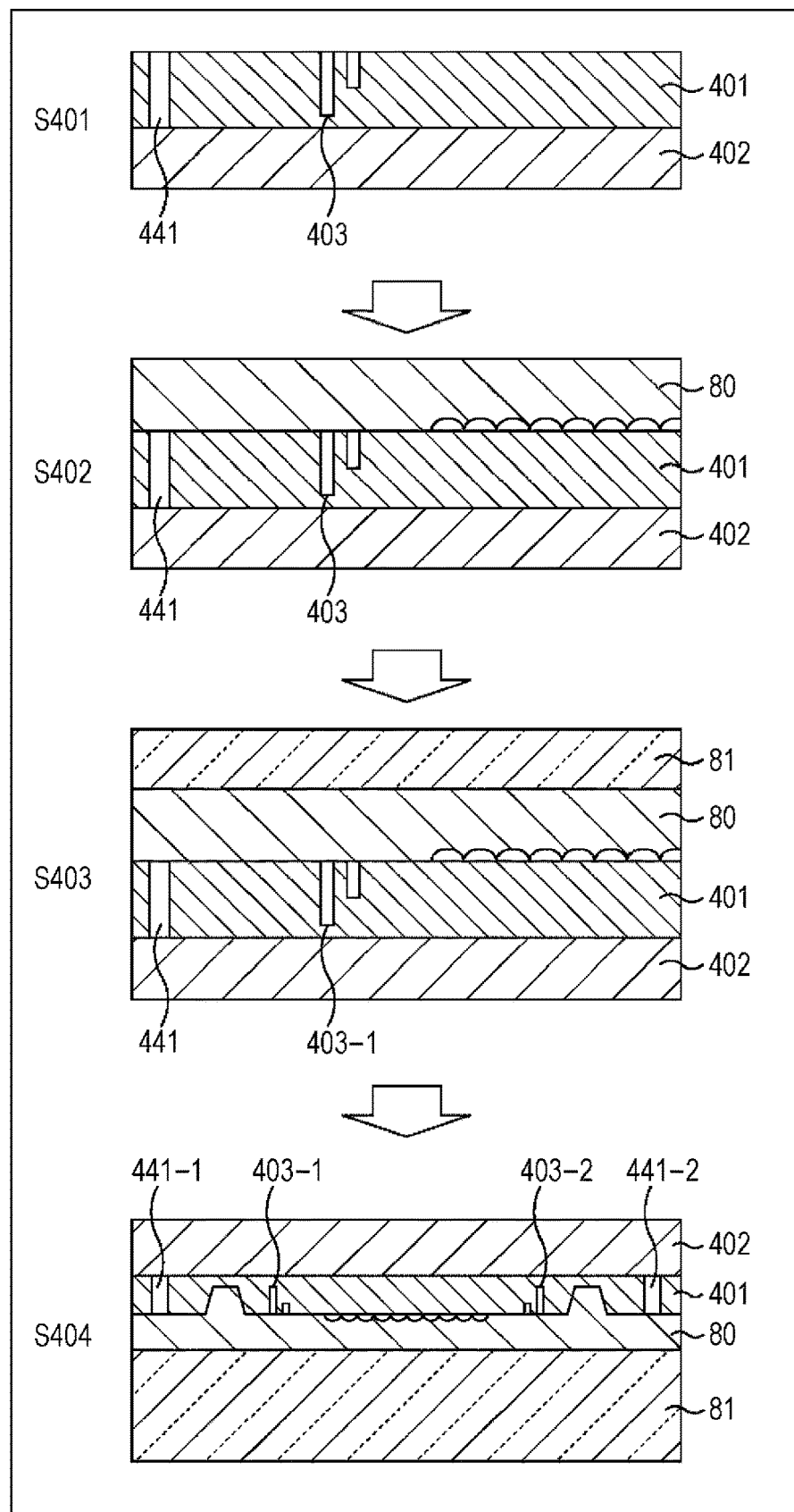
FIG. 39 is a diagram for describing a process of manufacturing a chip according to the fourth embodiment.
Figure 40:
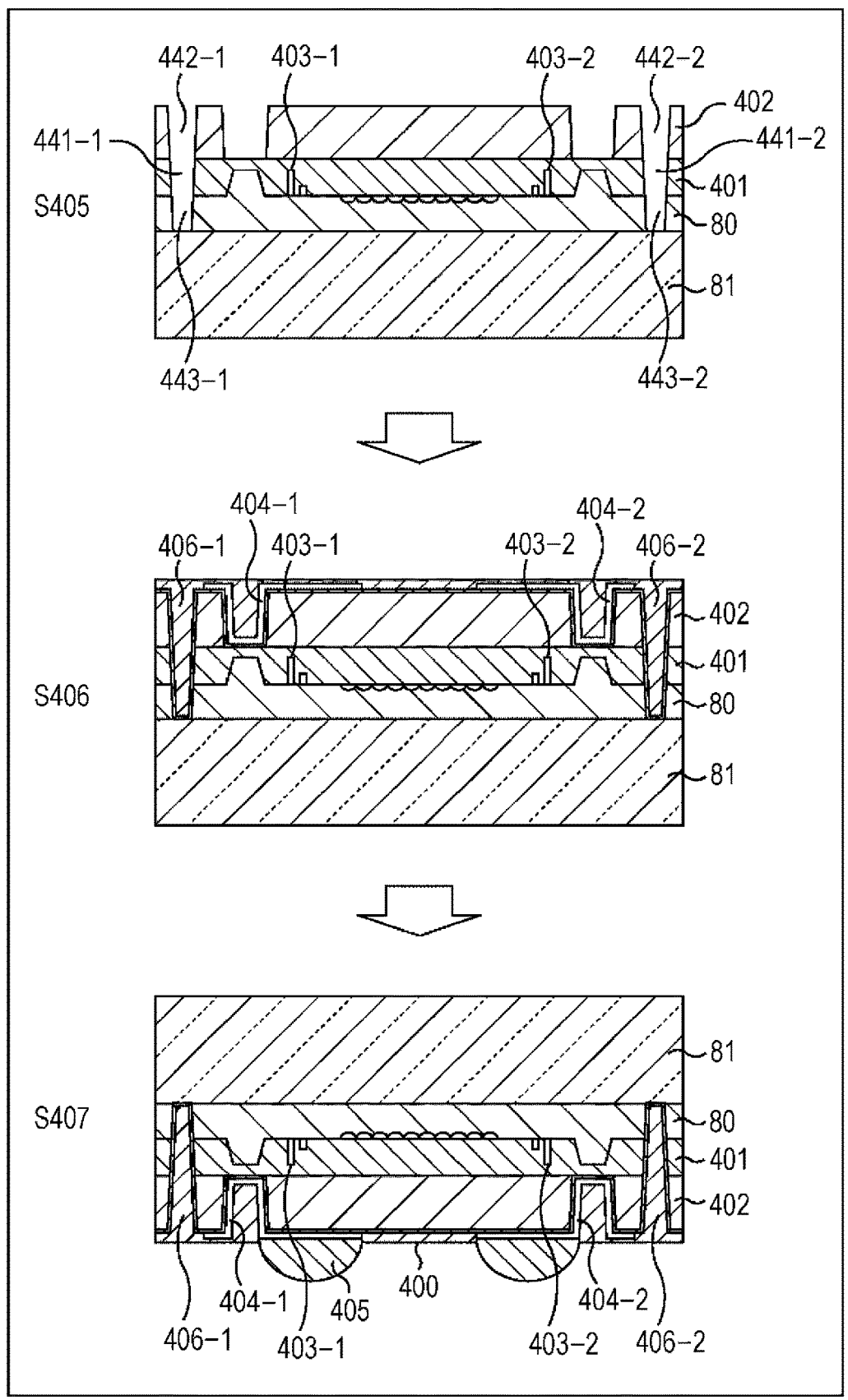
FIG. 40 is a diagram for describing a process of manufacturing a chip according to the fourth embodiment.

In other words, in the example illustrated in FIG. 39, the space 441-1 and the space 441-2 are formed at both ends of the chip 400.

In step S405 (FIG. 40) and step S406, a TSV 404 is formed. The TSV 404 is formed such that a through hole for opening an interconnection portion of a multi-layer interconnection (not illustrated) formed on a semiconductor wafer surface is formed by etching.

Then, an insulating film such as a silicon oxide film is formed, the insulating film of the through hole is opened by etching, a through electrode is formed in the through hole, for example, by Cu plating, and an interconnection is formed on a surface (a back surface) of a side opposite to a translucent substrate of the semiconductor wafer.

Then, a solder resist serving as an insulating member is formed on the back surface of the semiconductor wafer, an opening is formed above the interconnection, and in step S407, a solder ball serving as the connection terminal 405 is formed.

As a result, the TSV 404 is formed. In the fourth embodiment, when the TSV 404 is formed, a portion forming the sidewall protecting portion 406 is formed as well. In other words, in step S405, a space 442 and a space 443 for forming a part of the sidewall protecting portion 406 are formed.

The space 442-1 positioned above the space 441-1 in the second layer 402 is formed, and the space 443-1 positioned above the space 441-1 in the adhesive layer 80 is formed. Similarly, the space 442-2 positioned above the space 441-2 in the second layer 402 is formed, and the space 443-2 positioned above the space 441-2 in the adhesive layer 80 is formed.

As the space 441, the space 442, and the space 443 are formed as described above, one space penetrating the adhesive layer 80, the first layer 401, and the second layer 402 is formed. The space 442 and the space 443 are formed together at the time of etching in the process of forming the TSV 404.

Further, in step S406, the sidewall protecting portion 406 can be formed such that when the insulating film and the through electrode are formed in order to form the TSV 404, the insulating film and metal for forming the through electrode are formed even in the space formed by the space 441, the space 442, and the space 443.

As described above, in the fourth embodiment, the process of forming the TSV 404 and the process of forming a part of the sidewall protecting portion 406 are included, and thus the sidewall protecting portion 406 can be formed without performing a new process.

When the TCV 403 is formed in step S401 and when the TSV 404 is formed in step S405, excavating for forming the sidewall protecting portion 406 is performed. When excavating for forming the TCV 403 in step S401 is assumed to be downward excavating, excavating for forming the TSV 404 in step S405 is excavating in a state in which the wafer in step S401 is turned upside down, that is, upward excavating.

The sidewall protecting portion 406 is performed by performing excavating twice as described above, but the excavating is performed twice in different directions. Due to the difference in the direction of the excavating, the sidewall protecting portion 406 has a shape with a narrow part in the middle as described above with reference to FIG. 38.

As described above, in the fourth embodiment, the sidewall protecting portion 406 is formed on the side of the chip 400, and thus it is possible to prevent intrusion of moisture into the chip 400 and condensation in a sensor.

Further, since the sidewall protecting portion 406 is formed on the side of the chip 400, it is possible to prevent intrusion of necessary light from the side of the chip 400.

Further, since the sidewall protecting portion 406 is formed by two steps, processing of the sidewall protecting portion 406 is easy. Furthermore, since the processing of the sidewall protecting portion 406 can be performed together with another processing, that is, the processing of the TCV or the TSV in the above example, the sidewall protecting portion 406 can be formed without increasing the number of processing.

(4-2)-Nd Embodiment

Another manufacturing process of the chip 400 will be described with reference to FIGS. 41 and 42.

In step S421, a space 461 for forming the sidewall protecting portion 406 is formed in a first layer 401. The process in step S421 can be performed, similarly to step S401 illustrated in FIG. 39.

In step S422, custom forming is performed. Step S422 can be also performed, similarly to step S402 of FIG. 39, but step S422 is different in that material 471 of the adhesive layer 80 is poured into the formed space 461.

In other words, in step S422, the color filter layer 77 and the microlens layer 79 are formed, and the adhesive layer 80 is formed, but when the adhesive layer 80 is formed, the space 461 is also filled with the material 471 of the adhesive layer 80.

For example, the space 461 may be filled with the material 471 such that when the color filter layer 77, the microlens layer 79, and the like are formed, no film is formed in the space 461, or a film is formed in the space 461 and then moved, and then the adhesive layer 80 is poured into the space 461.

As described above, in the (4-2)-nd embodiment, after the space 461 is formed, the space 461 is filled with the material 471.

In step S423, the cover glass 81 is bonded, and in step S424, the support substrate 71 in the second layer 402 is thinned. The process of steps S423 and S424 is performed, similarly to the process of steps S403 and S404.

Figure 41:
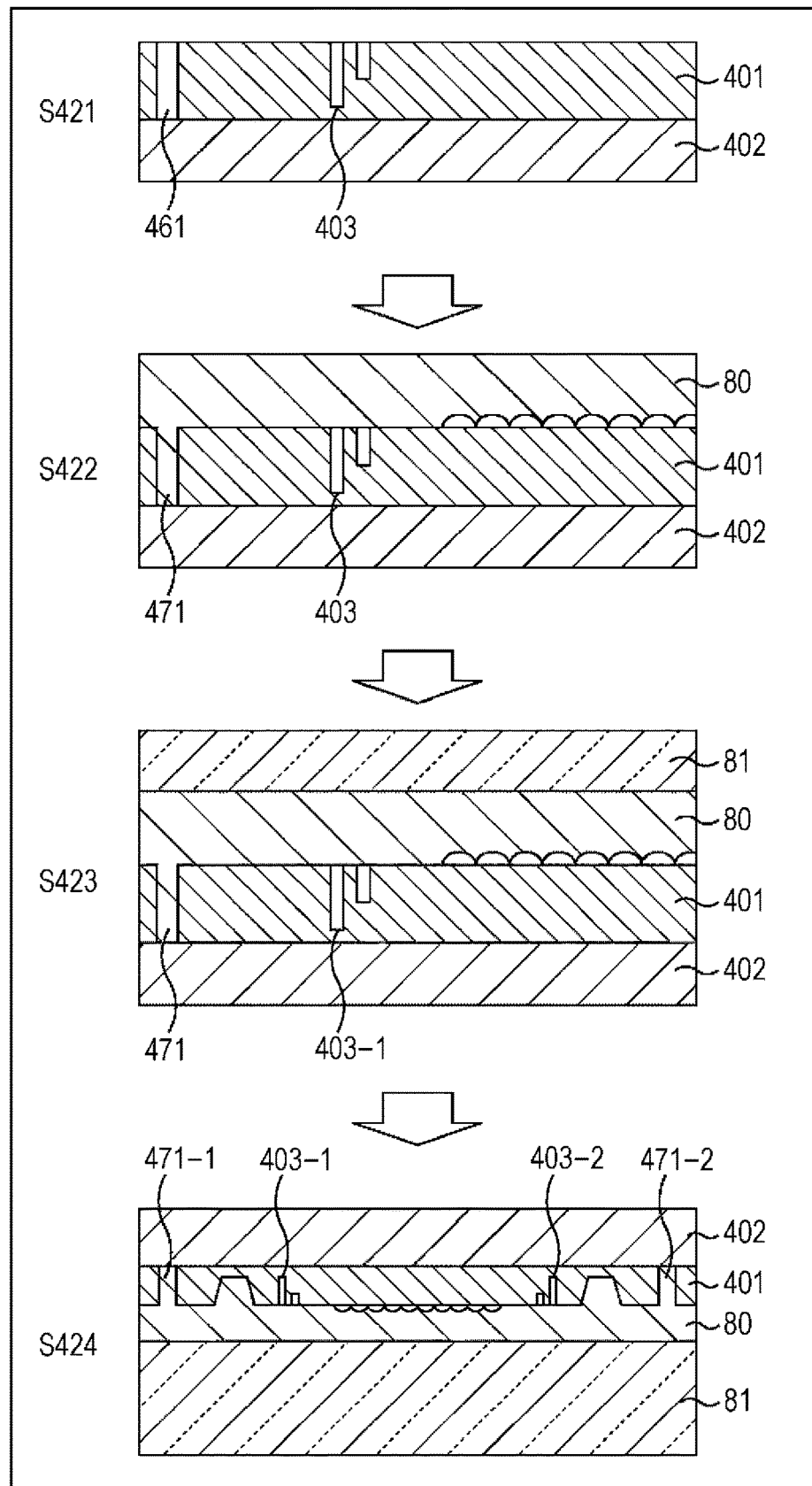
FIG. 41 is a diagram for describing a process of manufacturing a chip according to the fourth embodiment.
Figure 42:
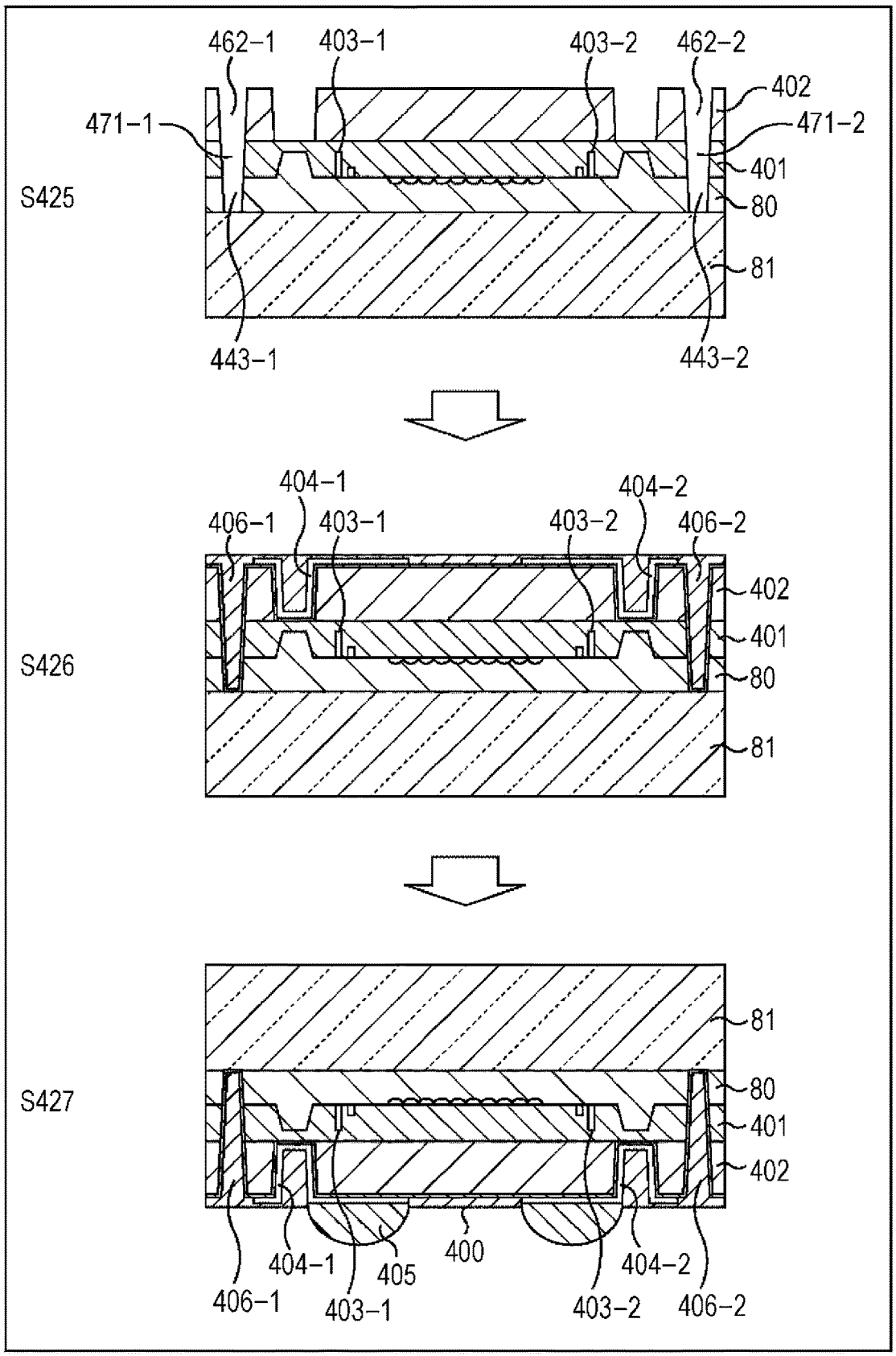
FIG. 42 is a diagram for describing a process of manufacturing a chip according to the fourth embodiment.

In FIG. 41, steps S421 to S423 are different in scale from step S424. Further, in step S424, the substrate has been turned upside down, and the cover glass 81 is positioned at the lower side.

In steps S422 to S424, in the chip 400, the space 461 is filled with the material 471. Further, as illustrated in step S424, since the sidewall protecting portion 406 is formed at both ends of the chip 400, the space 461 is also formed at both ends of the chip 400.

In other words, in the example illustrated in FIG. 41, the space 461-1 and the space 461-2 are formed at both ends of the chip 400 and filled with the material 471 that is the same material as the adhesive layer 80.

In step S425 (FIG. 42), a TSV 404 is formed. When a portion for forming the TSV 404 is excavated, a space 462 for the sidewall protecting portion 406 is formed together.

In other words, similarly to step S405, in the process of forming the TSV 404, the portion for forming the sidewall protecting portion 406 is also etched at the time of etching, and the space 462-1 and the space 462-2 are formed. At this time, the material 471 is etched together, and the space 462 is formed.

As a result, one space 462 penetrating the adhesive layer 80, the first layer 401, and the second layer 402 are formed in the process of forming the TSV 404.

Further, in step S426, the sidewall protecting portion 406 can be formed such that when the insulating film and the through electrode are formed in order to form the TSV 404, the insulating film and metal for forming the through electrode are formed even in the space 462.

As described above, in the fourth embodiment, the process of forming the TSV 404 and the process of forming a part of the sidewall protecting portion 406 are included, and thus the sidewall protecting portion 406 can be formed without performing a new process.

In the (4-2)-nd embodiment, when the TCV 403 is formed in step S421 and when the TSV 404 is formed in step S425, excavating for forming the sidewall protecting portion 406 is performed. When excavating for forming the TCV 403 in step S421 is assumed to be downward excavating, excavating for forming the TSV 404 in step S425 is excavating in a state in which the wafer in step S421 is turned upside down, that is, upward excavating.

The sidewall protecting portion 406 is performed by performing excavating twice as described above, but the excavating is performed twice in different directions. Due to the difference in the direction of the excavating, the sidewall protecting portion 406 has a shape with a narrow part in the middle as described above with reference to FIG. 38.

As described above, in the fourth embodiment, the sidewall protecting portion 406 is formed on the side of the chip 400, and thus it is possible to prevent intrusion of moisture into the chip 400 and condensation in a sensor.

Further, since the sidewall protecting portion 406 is formed on the side of the chip 400, it is possible to prevent intrusion of necessary light from the side of the chip 400.

Further, since the sidewall protecting portion 406 is formed by two steps, processing of the sidewall protecting portion 406 is easy. Furthermore, since the processing of the sidewall protecting portion 406 can be performed together with another processing, that is, the processing of the TCV or the TSV in the above example, the sidewall protecting portion 406 can be formed without increasing the number of processing.

(4-3)-Rd Embodiment

Another manufacturing process of the chip 400 will be described with reference to FIGS. 43 and 44.

In step S441, a space 481 for forming the sidewall protecting portion 406 is formed in a first layer 401. The process in step S441 can be performed, similarly to step S401 illustrated in FIG. 39.

In step S442, a material 491 is poured into the space 481. The material 491 is a material that is different from a material of the adhesive layer 80 and easily processed by etching or the like.

In step S443, custom forming is performed. Step S443 can be also performed, similarly to step S402 of FIG. 39, but step S442 is different in that the material 491 is poured into the formed space 481 before step S443.

As described above, in the (4-3)-rd embodiment, after the space 481 is formed, the space 481 is filled with the material 491.

In step S444, the cover glass 81 is bonded, and in step S445 (FIG. 44), the support substrate 71 in the second layer 402 is thinned. The process of steps S444 and S445 is performed, similarly to the process of steps S403 and step S404.

Figure 43:
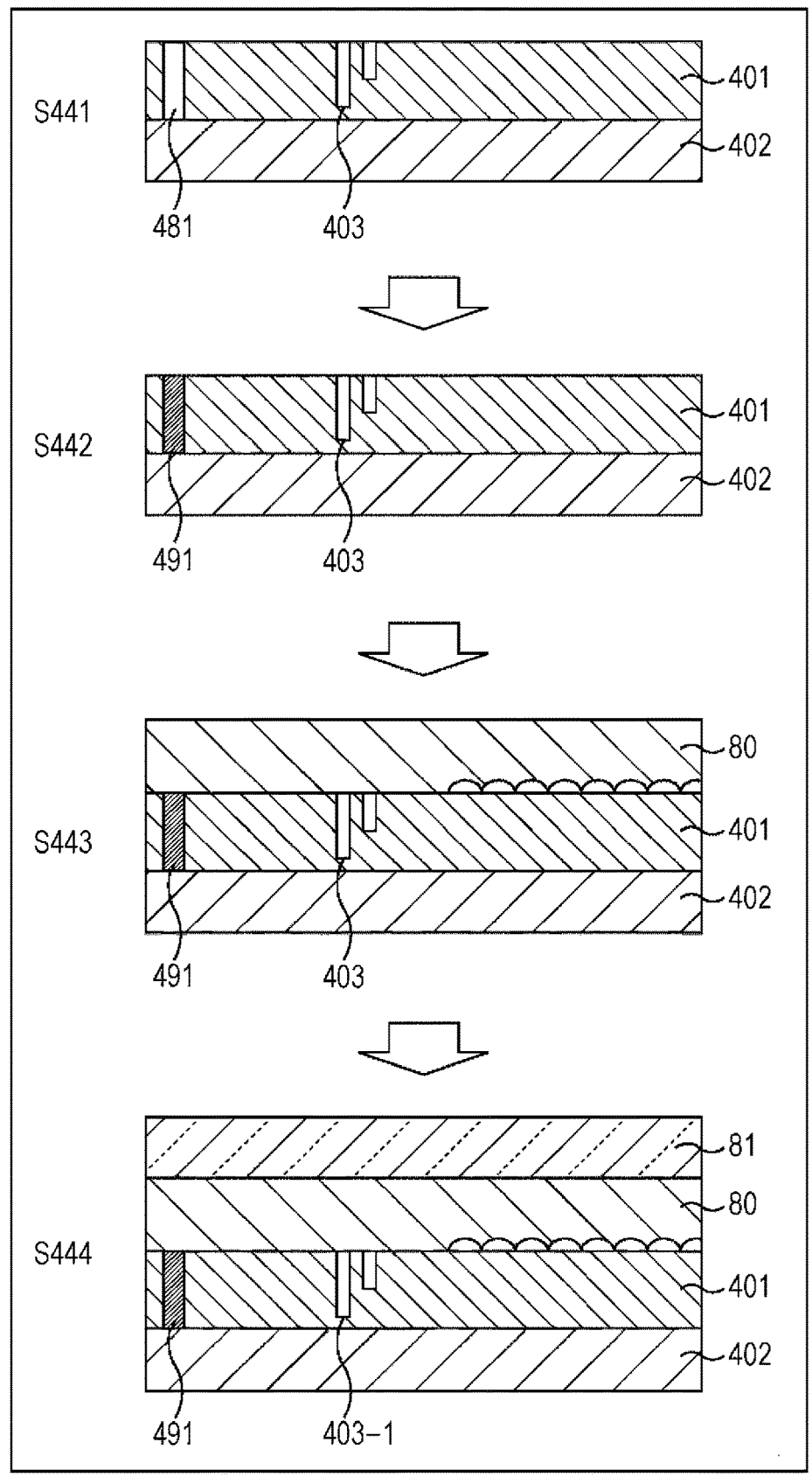
FIG. 43 is a diagram for describing a process of manufacturing a chip according to the fourth embodiment.

In FIG. 43, steps S441 to S444 are different in scale from step S445. Further, in step S445, the substrate has been turned upside down, and the cover glass 81 is positioned at the lower side.

In steps S443 to S445, in the chip 400, the space 481 is filled with the material 491. Further, as illustrated in step S445, since the sidewall protecting portion 406 is formed at both ends of the chip 400, the space 481 is also formed at both ends of the chip 400.

Figure 44:
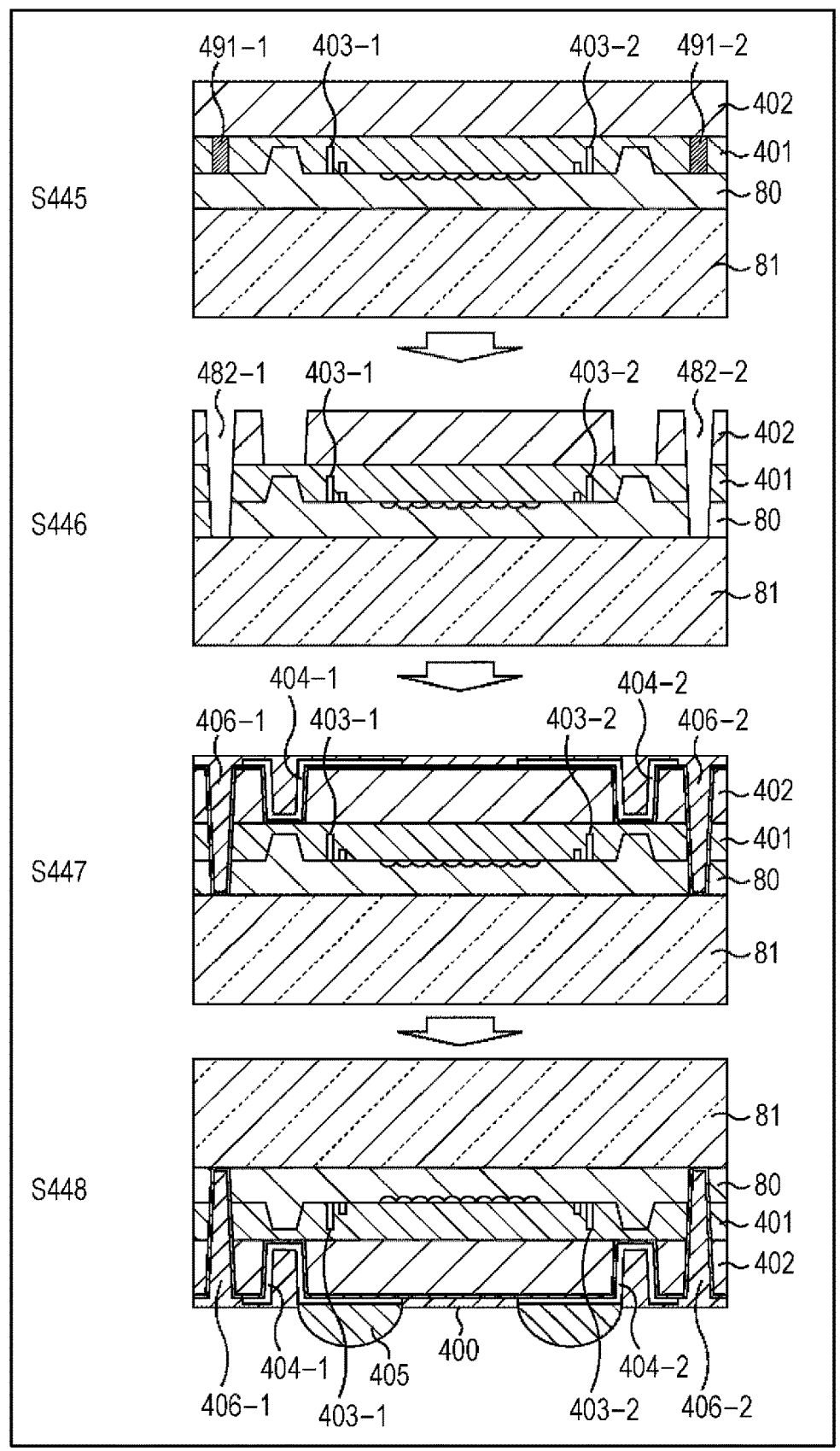
FIG. 44 is a diagram for describing a process of manufacturing a chip according to the fourth embodiment.

In other words, in the example illustrated in FIG. 44, the space 481-1 and the space 481-2 are formed at both ends of the chip 400, and the spaces 481 are filled with the material 491-1 and the material 491-2 that is an easily etched material.

In step S446, a TSV 404 is formed. When a portion for forming the TSV 404 is excavated, a space 482 for the sidewall protecting portion 406 is formed together.

In other words, similarly to step S405 (FIG. 40), in the process of forming the TSV 404, the portion for forming the sidewall protecting portion 406 is also etched at the time of etching, and the space 482-1 and the space 482-2 are formed. At this time, the material 491 is also removed by etching together.

As a result, one space 482 penetrating the adhesive layer 80, the first layer 401, and the second layer 402 are formed in the process of forming the TSV 404. At this time, since a material that is easily processed by etching or the like is used as the material 491, the space 482 can be easily formed.

Further, in step S447, the sidewall protecting portion 406 can be formed such that when the insulating film and the through electrode are formed in order to form the TSV 404, the insulating film and metal for forming the through electrode are formed even in the space 482.

As described above, in the fourth embodiment, the process of forming the TSV 404 and the process of forming a part of the sidewall protecting portion 406 are included, and thus the sidewall protecting portion 406 can be formed without performing a new process.

In the (4-3)-rd embodiment, when the TCV 403 is formed in step S441 and when the TSV 404 is formed in step S446, excavating for forming the sidewall protecting portion 406 is performed. When excavating for forming the TCV 403 in step S441 is assumed to be downward excavating, excavating for forming the TSV 404 in step S446 is excavating in a state in which the wafer in step S441 is turned upside down, that is, upward excavating.

The sidewall protecting portion 406 is performed by performing excavating twice as described above, but the excavating is performed twice in different directions. Due to the difference in the direction of the excavating, the sidewall protecting portion 406 has a shape with a narrow part in the middle as described above with reference to FIG. 38.

As described above, in the fourth embodiment, the sidewall protecting portion 406 is formed on the side of the chip 400, and thus it is possible to prevent intrusion of moisture into the chip 400 and condensation in a sensor.

Further, since the sidewall protecting portion 406 is formed on the side of the chip 400, it is possible to prevent intrusion of necessary light from the side of the chip 400.

Further, since the sidewall protecting portion 406 is formed by two steps, processing of the sidewall protecting portion 406 is easy. Furthermore, since the processing of the sidewall protecting portion 406 can be performed together with another processing, that is, the processing of the TCV or the TSV in the above example, the sidewall protecting portion 406 can be formed without increasing the number of processing.

Fifth Embodiment

In the fifth embodiment, intrusion of moisture into a chip is prevented such that a wall having moisture resistance made of metal is formed in a certain layer in a chip.

(5-1)-St Embodiment

Figure 45:
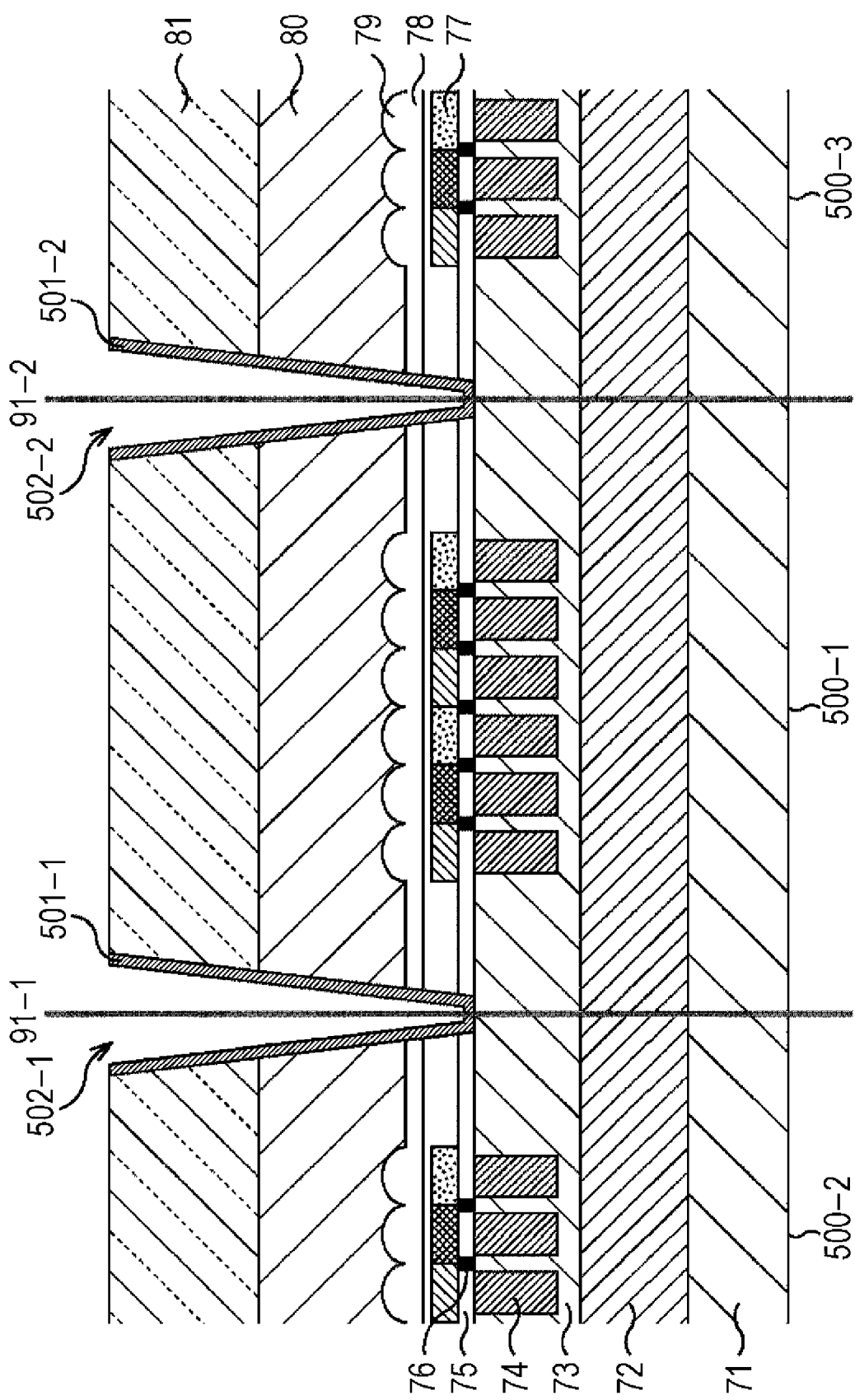
FIG. 45 is a diagram illustrating a configuration of a chip according to a fifth embodiment.

FIG. 45 illustrates a configuration of a chip according to the fifth embodiment. FIG. 45 illustrates a wafer that includes a plurality of chips (three chips in FIG. 45) and is not diced yet, similarly to FIG. 2.

Here, a chip positioned at the center is referred to as a "chip 500-1," a chip positioned at the left is referred to as a "chip 500-2," and a chip positioned at the right is referred to as a "chip 500-3." In the following description, when the chips 500-1 to 500-3 need not be distinguished from one another, the chips are referred to as simply a "chip 500."

Each chip 500 has the same configuration as the chip 70 described above with reference to FIGS. 2 and 3. In other words, the chip 500 is configured such that an interconnection layer 72 is arranged on a support substrate 71, and a silicon substrate 73 is arranged on the interconnection layer 72. In the silicon substrate 73, a plurality of photodiodes 74 (optical elements) serving as photoelectric conversion units of pixels are formed at certain intervals.

The planarization film 75 is formed on the silicon substrate 73, and a light shielding film 76 for preventing light from leaking into a neighboring pixel is formed in a portion of the planarization film 75 corresponding to a position between the photodiodes 74. A color filter layer 77 is formed on the planarization film 75. A planarization film 78 is formed on the color filter layer 77. A microlens layer 79 is formed on the planarization film 78. A cover glass 81 is bonded onto the microlens layer 79 through an adhesive layer 80.

In the wafer illustrated in FIG. 45, a groove 502 is formed between the chips 500. The groove 502-1 is formed between the chip 500-1 and the chip 500-2, and the groove 502-2 is formed between the chip 500-1 and the chip 500-3.

A moisture resistant film 501-1 is formed in the groove 502-1, and a moisture resistant film 501-2 is formed in the groove 502-2. The moisture resistant film 501 is preferably a film with a high moisture-proof property made of an inorganic material such as a SiN film. Since moisture is likely to intrude into a light receiving device (chip) to cause a problem such as image quality deterioration depending on conditions of humidity, temperature, or the like, the moisture resistant film 501 is formed to protect the end face of the light receiving device.

There is a scribe section 91-1 between the chip 500-1 and the chip 500-2, and the groove 502-1 is formed in the scribe section 91-1. Similarly, there is a scribe section 91-2 between the chip 500-1 and the chip 500-3, and the groove 502-2 is formed in the scribe section 91-2.

In the chip 500 illustrated in FIG. 45, the groove 502 is formed such that the cover glass 81, the adhesive layer 80, the microlens layer 79, the planarization film 78, the color filter layer 77, and the planarization film 75 are excavated up to an upper portion of the silicon substrate 73.

Further, since the moisture resistant film 501 is formed in the groove 502, the moisture resistant film 501 is formed on the side surfaces of the cover glass 81, the adhesive layer 80, the microlens layer 79, the planarization film 78, the color filter layer 77, and the planarization film 75 and the upper portion of the silicon substrate 73.

As will be described later, at the time of manufacturing, the groove 502 is formed after the cover glass 81 is bonded, and the moisture resistant film 501 is formed after the groove 502 is formed.

Figure 46:
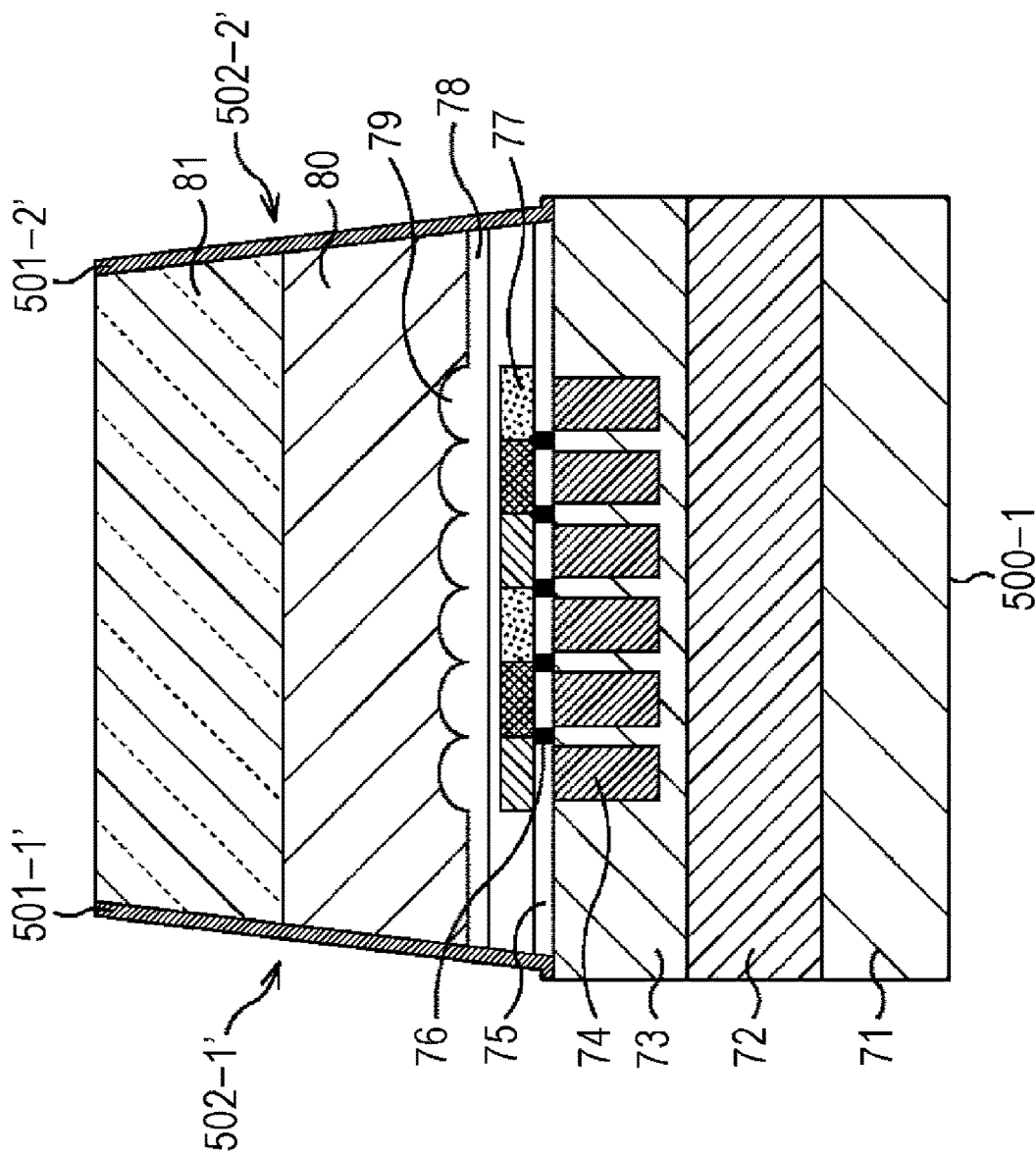
FIG. 46 is a diagram illustrating a configuration of a chip according to the fifth embodiment.

When the wafer in which the groove 502 is formed between the chips 500 is diced along the scribe section 91, the chip 500-1 illustrated in FIG. 46 is cut out. In the chip 500-1 illustrated in FIG. 46, the cross-sectional surfaces of the cover glass 81, the adhesive layer 80, the microlens layer 79, the planarization film 78, the color filter layer 77, and the planarization film 75 are covered with the moisture resistant film 501 and thus not exposed on the surface. Further, the moisture resistant film 501 is positioned on the top surface of the silicon substrate 73.

As described above, the diced chip 500-1 has a structure in which parts of the stacked layers of the chip 500-1 are covered with the moisture resistant film 501-1 and the moisture resistant film 501-2 formed in the groove 502-1' and the groove 502-2' (a dash is added to the grooves after dicing in order to be distinguished from the groove 502-1 and the groove 502-2 before dicing illustrated in FIG. 45).

Since the diced chip 500-1 is configured such that the groove 502-1' and the groove 502-2' remain, and the moisture resistant film 501 remains in the groove 502-1' and the groove 502-2' as described above, a width of the groove 502-1 or the groove 502-2 between the chips 500 before dicing (a width of the moisture resistant film 501 formed on the top surface of the silicon substrate 73 of the moisture resistant film 501) is preferably larger than a width of a blade used in the dicing process.

As the groove 502 is formed, and the moisture resistant film 501 is formed on the inner side of the groove 502 as described above, the moisture-proof performance can be further improved.

Figure 47:
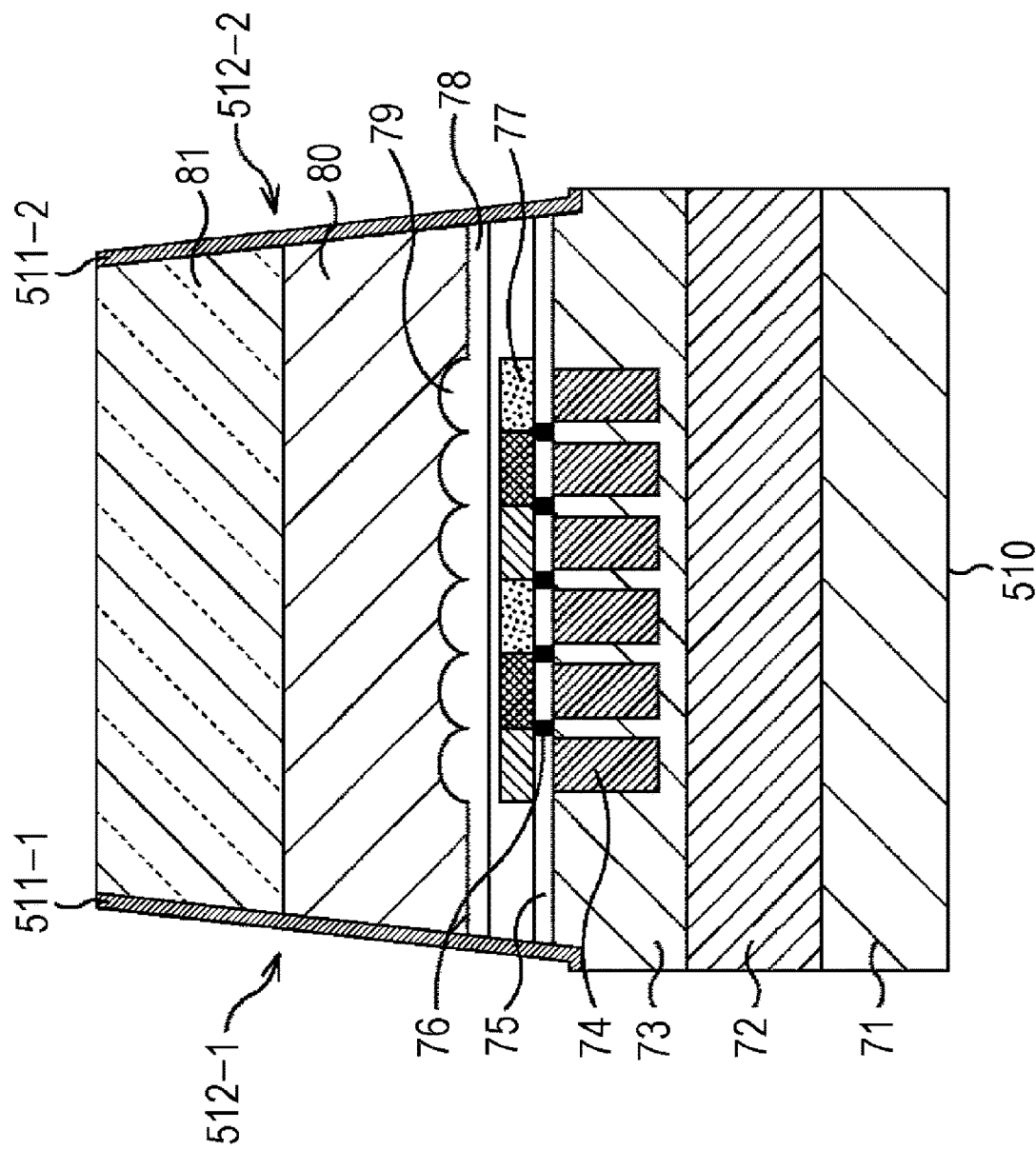
FIG. 47 is a diagram illustrating a configuration of a chip according to the fifth embodiment.

The groove 502 (the groove 502') illustrated in FIGS. 45 and 46 is formed to reach the top surface of the silicon substrate 73, but the groove 502 may be formed such that an up to the silicon substrate 73 is excavated. In other words, as illustrated in FIG. 47, a groove may be formed such that an up to a part of the silicon substrate 73 is excavated, and a moisture resistant film 511-1 and a moisture resistant film 511-2 may be formed in the groove.

As the moisture resistant film 511 is formed as described above, the side of the interface between the silicon substrate 73 and the planarization film 75 is also covered with the moisture resistant film 511, and thus the moisture-proof performance of the chip can be further improved.

The following description will proceed with the example of the chip 500 illustrated in FIGS. 45 and 46.

Manufacturing of Chip According to (5-1)-St Embodiment

Figure 48:
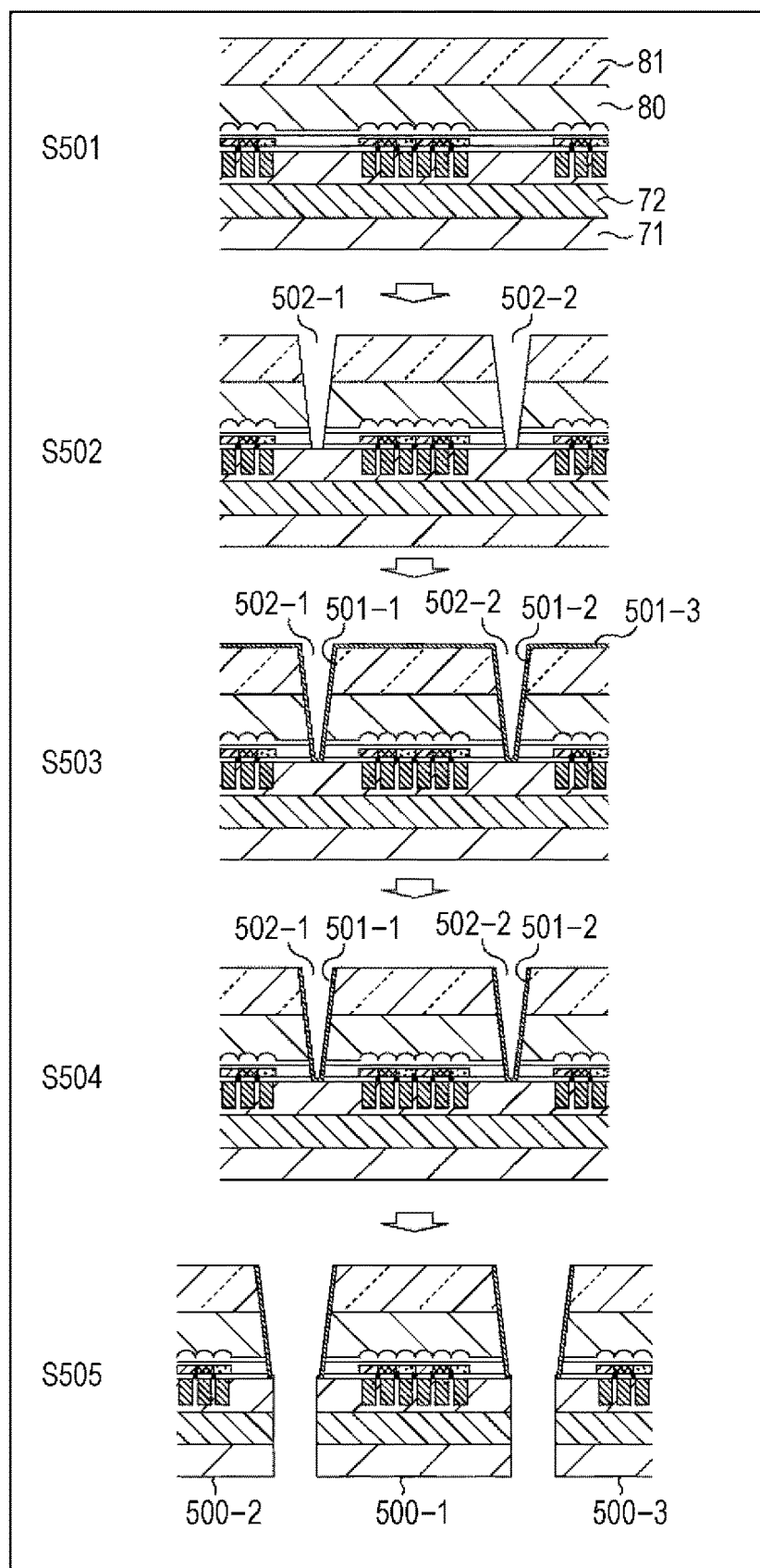
FIG. 48 is a diagram for describing a process of manufacturing a chip according to the fifth embodiment.

A process of manufacturing a chip (wafer) having such a groove will be described. FIG. 48 is a diagram for describing a process of manufacturing a chip prior to dicing. The manufacturing process described with reference to FIG. 48 will focus on manufacturing of a groove and a moisture resistant film serving as one of characteristic components of the present technology, and a manufacturing method of a related art can be applied to manufacturing of other parts such as forming of layers, and thus a description thereof will be appropriately omitted.

In step S501, the wafer illustrated in FIG. 2 is prepared such that the semiconductor wafer in which the photodiode 74 and the like are formed is bonded to the cover glass 81.

In step S502, the groove 502 is formed. For example, the groove 502 is formed by performing dicing from the cover glass 81 side. Alternatively, the groove 502 may be formed by a technique such as dry etching or wet etching.

In step S502, the groove 502 is formed such that the cover glass 81, the adhesive layer 80, the microlens layer 79, the planarization film 78, the color filter layer 77, and the planarization film 75 are excavated.

Further, when the groove 502 is formed up to a part of the silicon substrate 73, and the moisture resistant film 501 is formed as in the chip 510 illustrated in FIG. 47, in step S502, up to the part of the silicon substrate 73 is excavated.

In step S503, a material of the moisture resistant film 501 is coated, and a curing process is performed, so that the moisture resistant film 501 is formed. Through the film forming in step S503, the moisture resistant film 501-1 is formed in the groove 502-1, and the moisture resistant film 501-2 is formed in the groove 502-2. Further, the moisture resistant film 501-3 is formed even on the top surface of the cover glass 81.

The moisture resistant film 501-3 formed on the top surface of the cover glass 81 is unnecessary and thus removed in step S504. In step S504, for example, the moisture resistant film 501-3 formed on the top surface of the cover glass 81 is removed by a chemical mechanical polishing (CMP) technique.

A wafer obtained by removing the moisture resistant film 501-3 in step S504 is a wafer illustrated in FIG. 45.

In step S505, dicing is performed. The wafer illustrated in FIG. 45 is diced at the positions of the scribe section 91-1 and the scribe section 91-2, and thus the diced chip 500-1, the chip 500-2, and the chip 500-3 are manufactured. In step S505, the dicing is performed from the support substrate 71 side.

The chip dicing is performed such that cutting is performed from the cover glass 81 side, and cutting is performed from the support substrate 71 side. In other words, the dicing is performed such that upward cutting and downward cutting are separately performed.

As described above, in the manufacturing process of the chip according to the (5-1)-st embodiment, in step S502, dicing (or processing corresponding to dicing) is performed in order to form the groove 502. Since the process of step S502 includes processing for cutting from the cover glass 81 side, the groove 502 can be formed without adding a new process for forming the groove 502.

Further, step S505 is dicing of separating the remaining portions, and the cutting process performed from the support substrate 71 side. Thus, dicing can be performed without increasing the processing man-hours related to dicing.

As the moisture resistant film 511 is formed as described above, the moisture-proof performance of the chip can be further improved.

(5-2)-Nd Embodiment

Figure 49:
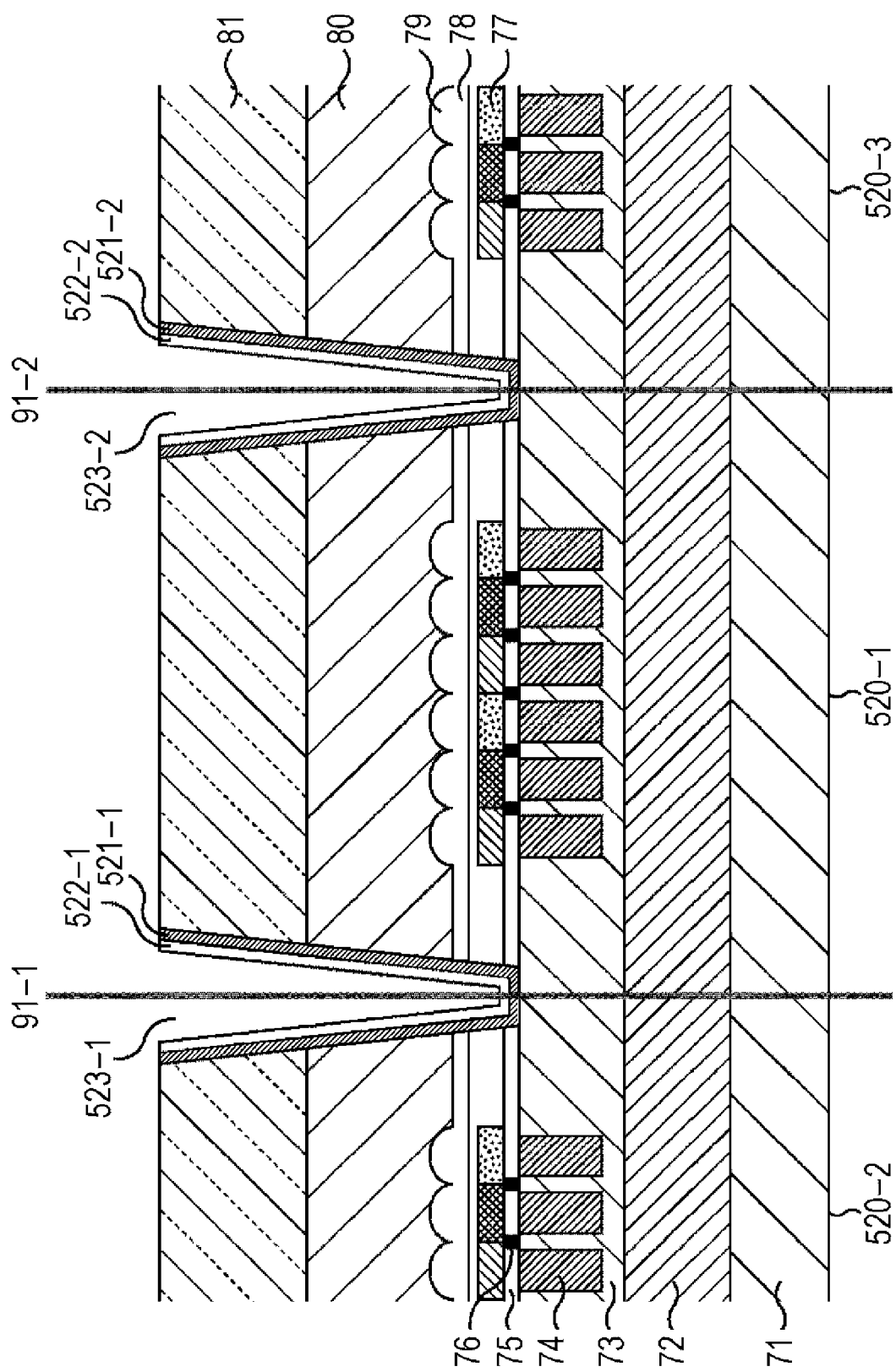
FIG. 49 is a diagram illustrating a configuration of a chip according to the fifth embodiment.

FIG. 49 illustrates another configuration of a chip according to the fifth embodiment. FIG. 49 illustrates a wafer that includes a plurality of chips (three chips in FIG. 49) and is not diced yet, similarly to FIG. 45.

Here, a chip positioned at the center is referred to as a "chip 520-1," a chip positioned at the left is referred to as a "chip 520-2," and a chip positioned at the right is referred to as a "chip 520-3." In the following description, when the chips 520-1 to 520-3 need not be distinguished from one another, the chips are referred to as simply a "chip 520."

Each chip 520 has the same configuration as the chip 500 described above with reference to FIG. 45 except a configuration of a film formed in the groove 502.

In the wafer illustrated in FIG. 49, a groove 523 is formed between the chips 520. The groove 523-1 is formed between the chip 520-1 and the chip 520-2, and the groove 523-2 is formed between the chip 520-1 and the chip 520-3.

A moisture resistant film 521-1 and a metallic film 522-1 are formed in the groove 523-1, and a moisture resistant film 521-2 and a metallic film 522-2 are formed in the groove 523-2.

The moisture resistant film 521 is preferably a film with a high moisture-proof property made of an inorganic material such as a SiN film. Since moisture is likely to intrude into a light receiving device (chip) to cause a problem such as image quality deterioration depending on conditions of humidity, temperature, or the like, the moisture resistant film 521 is formed to protect the end face of the light receiving device.

The metallic film 522 is made of metal, and formed to block light incident on the side of the chip 520 or reduce intensity of the light.

Here, the description proceeds with the example in which the moisture resistant film 521 and the metallic film 522 are stacked, but when the metallic film 522 has moisture-resistance performance, only the metallic film 522 may be formed in the groove 523 without the moisture resistant film 521.

There is a scribe section 91-1 between the chip 520-1 and the chip 520-2, and the groove 523-1 is formed in the scribe section 91-1. Similarly, there is a scribe section 91-2 between the chip 520-1 and the chip 520-3, and the groove 523-2 is formed in the scribe section 91-2.

In the chip 520 illustrated in FIG. 49, the groove 523 is formed such that the cover glass 81, the adhesive layer 80, the microlens layer 79, the planarization film 78, the color filter layer 77, and the planarization film 75 are excavated up to an upper portion of the silicon substrate 73.

Further, since the moisture resistant film 521 is formed in the groove 523, the moisture resistant film 521 is formed on the side surfaces of the cover glass 81, the adhesive layer 80, the microlens layer 79, the planarization film 78, the color filter layer 77, and the planarization film 75 and the top surface of the silicon substrate 73.

Further, since the metallic film 522 is stacked on the moisture resistant film 521, the metallic film 522 is formed on the side surface of the cover glass 81, the adhesive layer 80, the microlens layer 79, the planarization film 78, the color filter layer 77, and the planarization film 75 and the top surface of the silicon substrate 73.

As will be described later, at the time of manufacturing, the groove 523 is formed after the cover glass 81 is bonded, and the moisture resistant film 521 and the metallic film 522 are formed after the groove 523 is formed.

Figure 50:
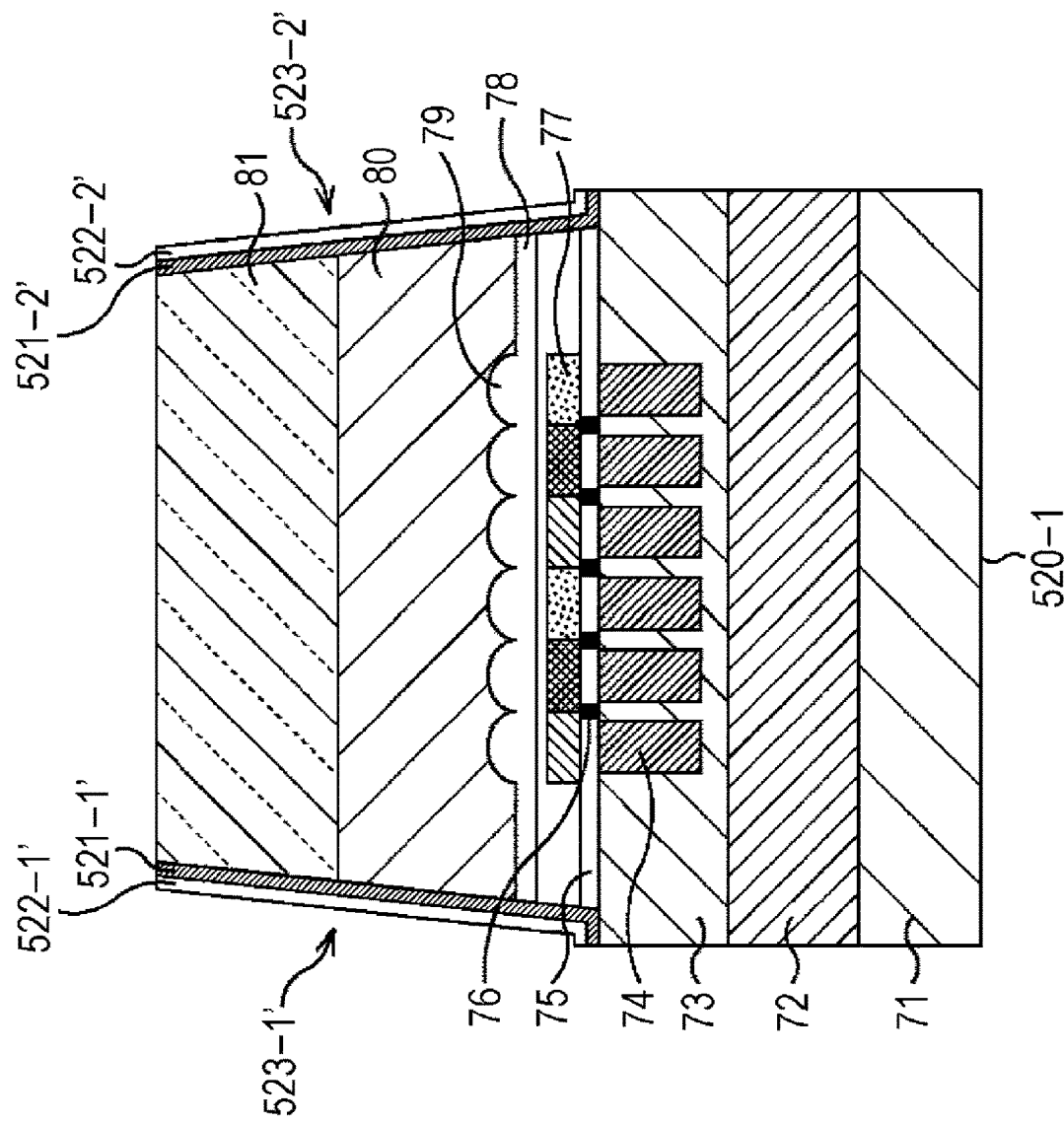
FIG. 50 is a diagram illustrating a configuration of a chip according to the fifth embodiment.

When the wafer in which the groove 523 is formed between the chips 520 is diced along the scribe section 91, the chip 520-1 illustrated in FIG. 50 is cut out. In the chip 520-1 illustrated in FIG. 50, the cross-sectional surfaces of the cover glass 81, the adhesive layer 80, the microlens layer 79, the planarization film 78, the color filter layer 77, and the planarization film 75 are covered with the moisture resistant film 521 and the metallic film 522 and thus not exposed on the surface. Further, the moisture resistant film 521 and the metallic film 522 are positioned on the top surface of the silicon substrate 73.

As described above, the diced chip 520-1 has a structure in which parts of the stacked layers of the chip 520-1 are covered with the moisture resistant film 521-1 and the moisture resistant film 521-2 formed in the groove 523-1' and the groove 523-2' (a dash is added to the grooves after dicing in order to be distinguished from the groove 523-1 and the groove 523-2 before dicing illustrated in FIG. 49).

Further, the diced chip 520-1 has a structure in which parts of the stacked layers of the chip 520-1 are covered with the metallic film 522-1 and the metallic film 522-2 formed in the groove 523-1' and the groove 523-2'.

Since the diced chip 520-1 is configured such that the groove 523-1' and the groove 523-2' remain, and the moisture resistant film 521 and the metallic film 522 remains in the groove 523-1' and the groove 523-2' as described above, a width of the groove 523-1 or the groove 523-2 between the chips 520 before dicing (a width of the moisture resistant film 521 and the metallic film 522 formed on the top surface of the silicon substrate 73) is preferably larger than a width of a blade used in the dicing process.

As the groove 523 is formed, and the moisture resistant film 521 is formed on the inner side of the groove 523 as described above, the moisture-proof performance can be further improved.

Further, the chip 520 illustrated in FIG. 49 is mounted in, for example, a camera system. In the camera system, there are various stray light components, and problems causing image quality deterioration such as a flare are likely to occur due to the stray light components.

When light is incident in the lateral direction of the chip in which the metallic film 522 is not formed, for example, the chip 70 illustrated in FIG. 3, the light is likely to be incident on the photodiode 74. Since there is no mechanism of blocking light incident from the side in the chip 70, the light incident from the side is likely to be incident on the photodiode 74 while maintaining its intensity. As described above, when stray light is incident on pixels, a flare image is generated, and thus an image quality deteriorates.

On the other hand, when the metallic film 522 is formed, and the metallic film 522 is made of a material of blocking light of a certain wavelength as illustrated in FIG. 50, for example, the metallic film 522 can block light incident from the side of the chip 520.

In other words, since the chip 520 has a mechanism of blocking light incident form the side, intensity of the light is reduced, and thus even when light is incident on the photodiode 74 from the side, a possibility of a flare image can be reduced, and image quality deterioration can be suppressed. As described above, as the metallic film 522 is formed, it is possible to block or reduce the stray light component and suppress image quality deterioration.

Figure 51:
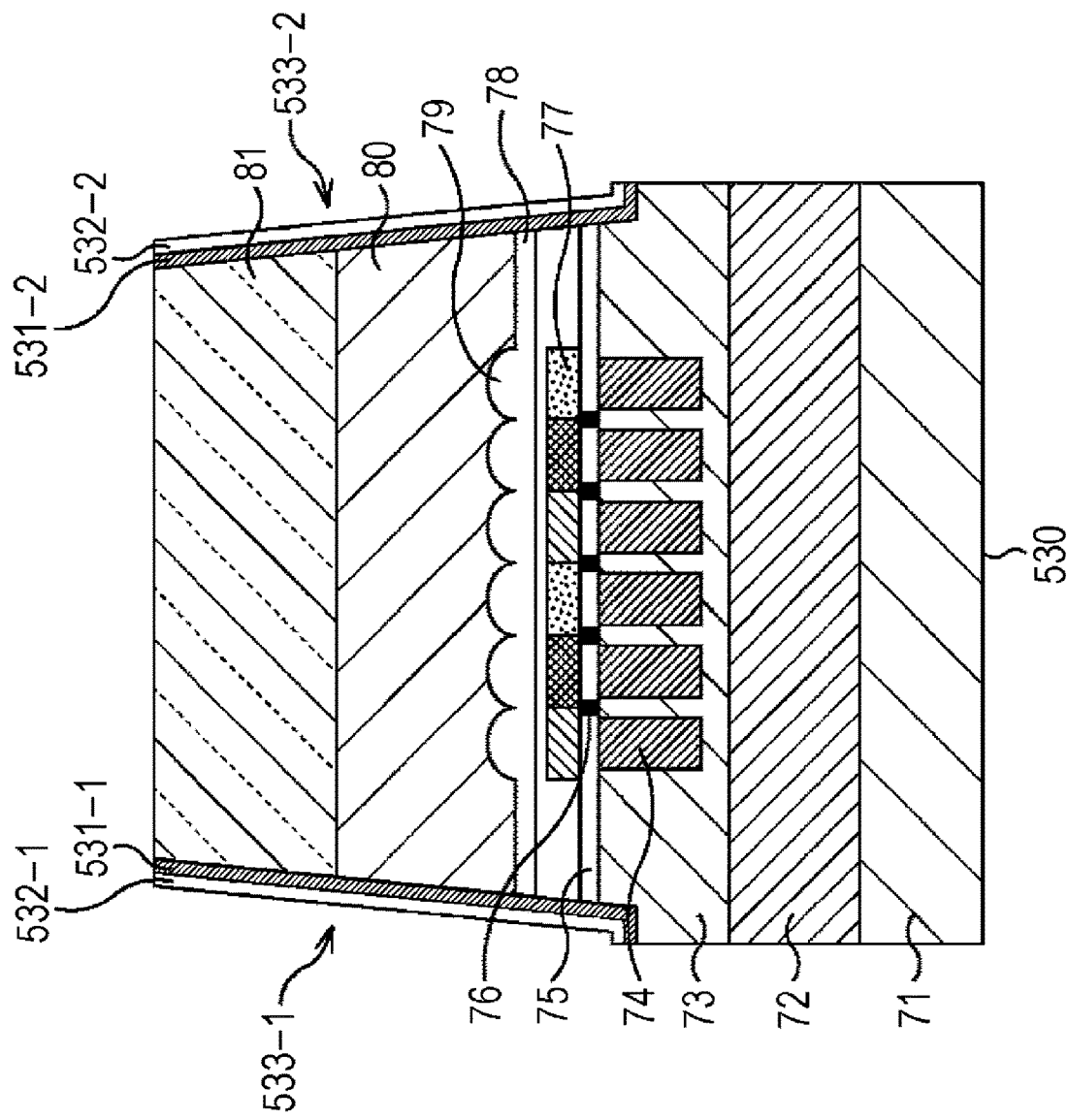
FIG. 51 is a diagram illustrating a configuration of a chip according to the fifth embodiment.

FIGS. 49 and 50 illustrate the state in which the groove 523 (the groove 523') reaches up to the top surface of the silicon substrate 73, but the groove 523 (the groove 523') may be formed such that up to the silicon substrate 73 is excavated. In other words, as illustrated in FIG. 51, a groove 533 may be formed such that up to a part of the silicon substrate 73 is excavated, and a moisture resistant film 531-1, a moisture resistant film 531-2, a metallic film 532-1, and a metallic film 532-2 are formed in the groove 533.

As the moisture resistant film 531 and the metallic film 532 are formed as described above, the side surfaces of the silicon substrate 73 and the planarization film 75 are also covered with the moisture resistant film 531 and the metallic film 532, and thus the moisture-proof performance and the light-shielding performance of the chip can be further improved.

The following description will proceed with the example of the chip 520 illustrated in FIGS. 49 and 50.

Manufacturing of Chip According to (5-2)-Nd Embodiment

Figure 52:
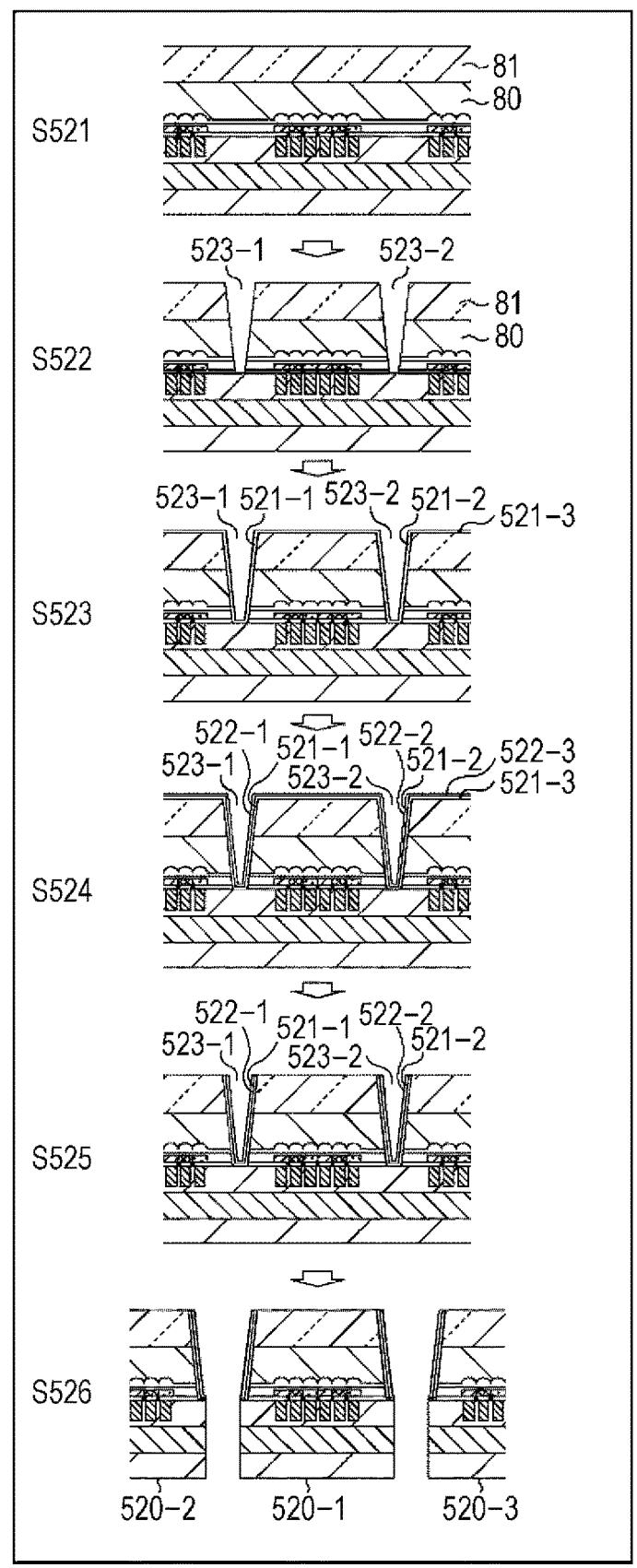
FIG. 52 is a diagram for describing a process of manufacturing a chip according to the fifth embodiment.

A process of manufacturing a chip (wafer) having such a groove will be described. FIG. 52 is a diagram for describing a process of manufacturing a chip prior to dicing. The manufacturing process described with reference to FIG. 52 will focus on manufacturing of a groove and a moisture resistant film serving as one of characteristic components of the present technology, and a manufacturing method of a related art can be applied to manufacturing of other parts such as forming of layers, and thus a description thereof will be appropriately omitted.

In step S521, the wafer illustrated in FIG. 2 is prepared such that the semiconductor wafer in which a photodiode 74 and the like are formed is bonded to the cover glass 81. In step S522, the groove 523 is formed.

For example, the groove 523 is formed by performing dicing from the cover glass 81 side. Alternatively, the groove 523 may be formed by a technique such as dry etching or wet etching.

In step S522, the groove 523 is formed such that the cover glass 81, the adhesive layer 80, the microlens layer 79, the planarization film 78, the color filter layer 77, and the planarization film 75 are excavated.

Further, when the groove 523 is formed up to a part of the silicon substrate 73, and the moisture resistant film 521 and the metallic film 522 are formed as in the chip 510 illustrated in FIG. 51, in step S523, up to the part of the silicon substrate 73 is excavated.

In step S523, a material of the moisture resistant film 521 is coated, and a curing process is performed, so that the moisture resistant film 521 is formed. In step S524, the metallic film 522 is formed. Through the film forming in steps S523 and S524, the moisture resistant film 521-1 and the metallic film 522-1 are formed in the groove 523-1, and the moisture resistant film 521-2 and the metallic film 522-2 are formed in the groove 523-2.

Further, the moisture resistant film 521-3 and the metallic film 522-3 are formed even on the top surface of the cover glass 81. The moisture resistant film 521-3 and the metallic film 522-3 formed on the top surface of the cover glass 81 is unnecessary and thus removed in step S525. In step S525, for example, the moisture resistant film 521-3 and the metallic film 522-3 formed on the top surface of the cover glass 81 are removed by a chemical mechanical polishing (CMP) technique.

A wafer obtained by removing the moisture resistant film 521-3 and the metallic film 522-3 in step S525 is a wafer illustrated in FIG. 49.

In step S525, dicing is performed. The wafer illustrated in FIG. 49 is diced at the positions of the scribe section 91-1 and the scribe section 91-2, and thus the diced chip 520-1, the chip 520-2, and the chip 520-3 are manufactured. In step S525, the dicing is performed from the support substrate 71 side.

The chip dicing is performed such that cutting is performed from the cover glass 81 side, and cutting is performed from the support substrate 71 side. In other words, the dicing is performed such that upward cutting and downward cutting are separately performed.

As described above, in the manufacturing process of the chip according to the (5-2)-nd embodiment, in step S522, dicing (or processing corresponding to dicing) is performed in order to form the groove 523.

Since the process of step S522 includes processing for cutting from the cover glass 81 side, the groove 523 can be formed without adding a new process for forming the groove 523.

Further, step S525 is dicing of separating the remaining portions, and the cutting process performed from the support substrate 71 side. Thus, dicing can be performed without increasing the processing man-hours related to dicing.

As the moisture resistant film 521 is formed as described above, the moisture-proof performance of the chip can be further improved.

Further, as the metallic film 522 is formed, light-shielding performance on stray light incident on the chip can be further improved, and a flare or the like can be prevented.

Sixth Embodiment

In the sixth embodiment, a certain layer in a chip is surrounded by a wall with moisture resistance such as glass to prevent intrusion of moisture into a chip.

(6-1)-St Embodiment

Figure 53:
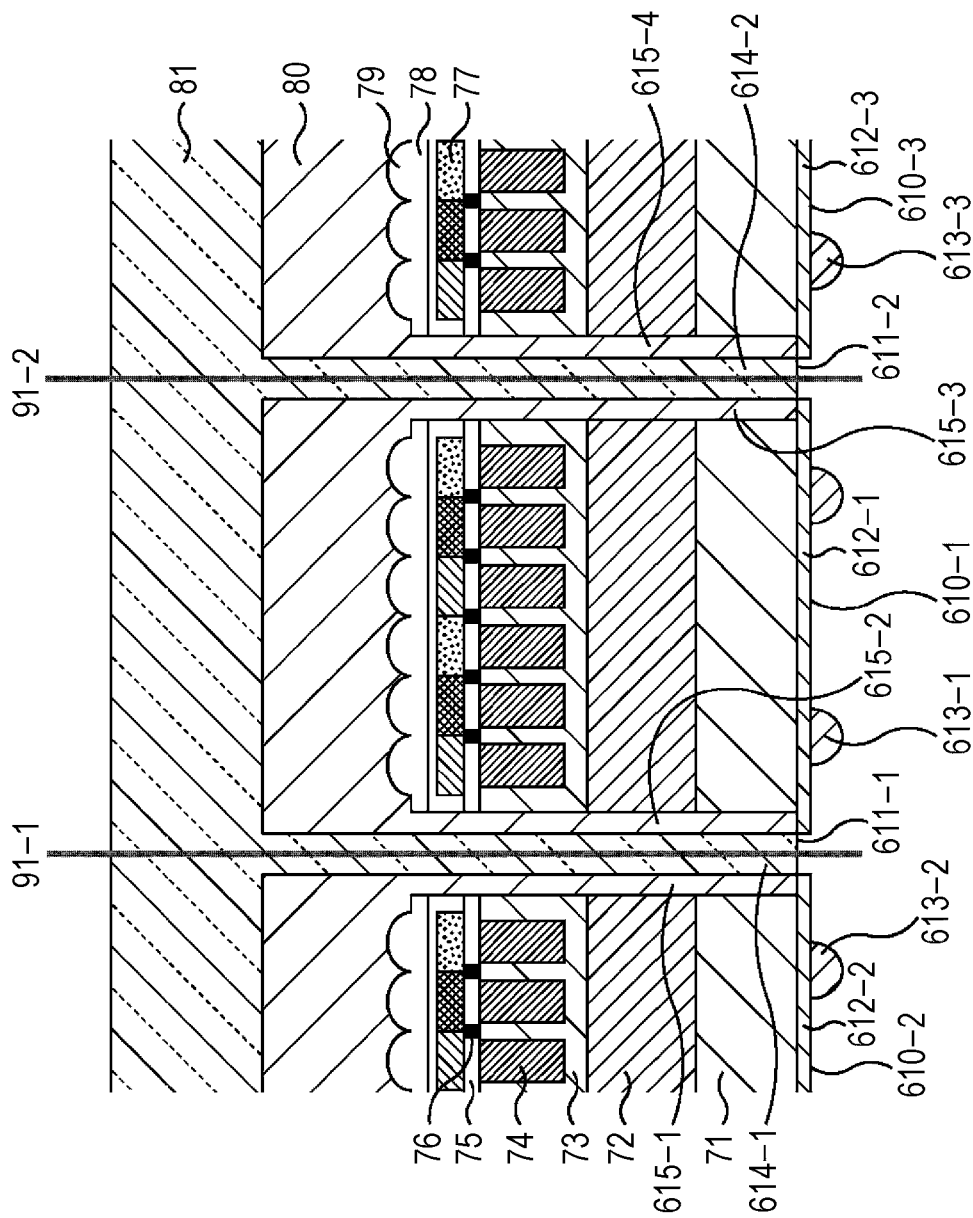
FIG. 53 is a diagram illustrating a configuration of a chip according to a sixth embodiment.

FIG. 53 illustrates a configuration of a chip according to the sixth embodiment. FIG. 53 illustrates a wafer that includes a plurality of chips (three chips in FIG. 53) and is not diced yet, similarly to FIG. 2.

Here, a chip positioned at the center is referred to as a "chip 610-1," a chip positioned at the left is referred to as a "chip 610-2," and a chip positioned at the right is referred to as a "chip 610-3." In the following description, when the chips 610-1 to 610-3 need not be distinguished from one another, the chips are referred to as simply a "chip 610."

Each chip 610 has the same configuration as the chip 70 described above with reference to FIGS. 2 and 3. In other words, the chip 610 is configured such that an interconnection layer 72 is arranged on a support substrate 71, and a silicon substrate 73 is arranged on the interconnection layer 72. In the silicon substrate 73, a plurality of photodiodes 74 (optical elements) serving as photoelectric conversion units of pixels are formed at certain intervals.

The planarization film 75 is formed on the silicon substrate 73, and a light shielding film 76 for preventing light from leaking into a neighboring pixel is formed in a portion of the planarization film 75 corresponding to a position between the photodiodes 74. A color filter layer 77 is formed on the planarization film 75. A planarization film 78 is formed on the color filter layer 77. A microlens layer 79 is formed on the planarization film 78. A cover glass 81 is bonded onto the microlens layer 79 through an adhesive layer 80.

A solder resist 612 and a connection terminal 613 for a connection with an external circuit are formed below the support substrate 71. Further, a through silicon via (TSV) and the like are formed, but illustration thereof is omitted in FIG. 53.

In the wafer illustrated in FIG. 53, a groove 611 is formed between the chips 610. The groove 611-1 is formed between the chip 610-1 and the chip 610-2, and the groove 611-2 is formed between the chip 610-1 and the chip 610-3.

There is a scribe section 91-1 between the chip 610-1 between the chip 610-2, and the groove 611-1 is formed in the scribe section 91-1. Similarly, there is a scribe section 91-2 between the chip 610-1 between the chip 610-3, and the groove 611-2 is formed in the scribe section 91-2.

In the chip 610 illustrated in FIG. 53, the groove 611 is formed such that the cover glass 81, the adhesive layer 80, the microlens layer 79, the planarization film 78, the color filter layer 77, the planarization film 75, the silicon substrate 73, the interconnection layer 72, and the support substrate 71 are excavated.

A glass 614 formed of the same glass as the cover glass 81 and an adhesive layer 615 formed of the same material as the adhesive layer 80 are stacked on the groove 611.

The adhesive layer 615-1 extend from the adhesive layer 80 is formed on the side surfaces of the microlens layer 79, the planarization film 78, the color filter layer 77, the planarization film 75, the silicon substrate 73, the interconnection layer 72, and the support substrate 71 at the chip 610-2 side of the groove 611-1.

The adhesive layer 615-2 extend from the adhesive layer 80 is formed on the side surfaces of the microlens layer 79, the planarization film 78, the color filter layer 77, the planarization film 75, the silicon substrate 73, the interconnection layer 72, and the support substrate 71 at the chip 610-3 side of the groove 611-1. As described above, when the adhesive layer 80 is formed in the horizontal direction, the adhesive layer 615 is formed in the vertical direction.

The glass 614-1 is formed between the adhesive layer 615-1 and the adhesive layer 615-2. The glass 614-1 is formed to extend from the cover glass 81. When the cover glass 81 is formed in the horizontal direction, the glass 614 is formed in the vertical direction.

Similarly, the adhesive layer 615-3 extend from the adhesive layer 80 is formed on the side surfaces of the microlens layer 79, the planarization film 78, the color filter layer 77, the planarization film 75, the silicon substrate 73, the interconnection layer 72, and the support substrate 71 at the chip 610-1 side of the groove 611-2.

The adhesive layer 615-4 extend from the adhesive layer 80 is formed on the side surfaces of the microlens layer 79, the planarization film 78, the color filter layer 77, the planarization film 75, the silicon substrate 73, the interconnection layer 72, and the support substrate 71 at the chip 610-3 side of the groove 611-2. As described above, when the adhesive layer 80 is formed in the horizontal direction, the adhesive layer 615 is formed in the vertical direction.

The glass 614-2 is formed between the adhesive layer 615-3 and the adhesive layer 615-4. The glass 614-2 is formed to extend from the cover glass 81. When the cover glass 81 is formed in the horizontal direction, the glass 614 is formed in the vertical direction.

Figure 54:
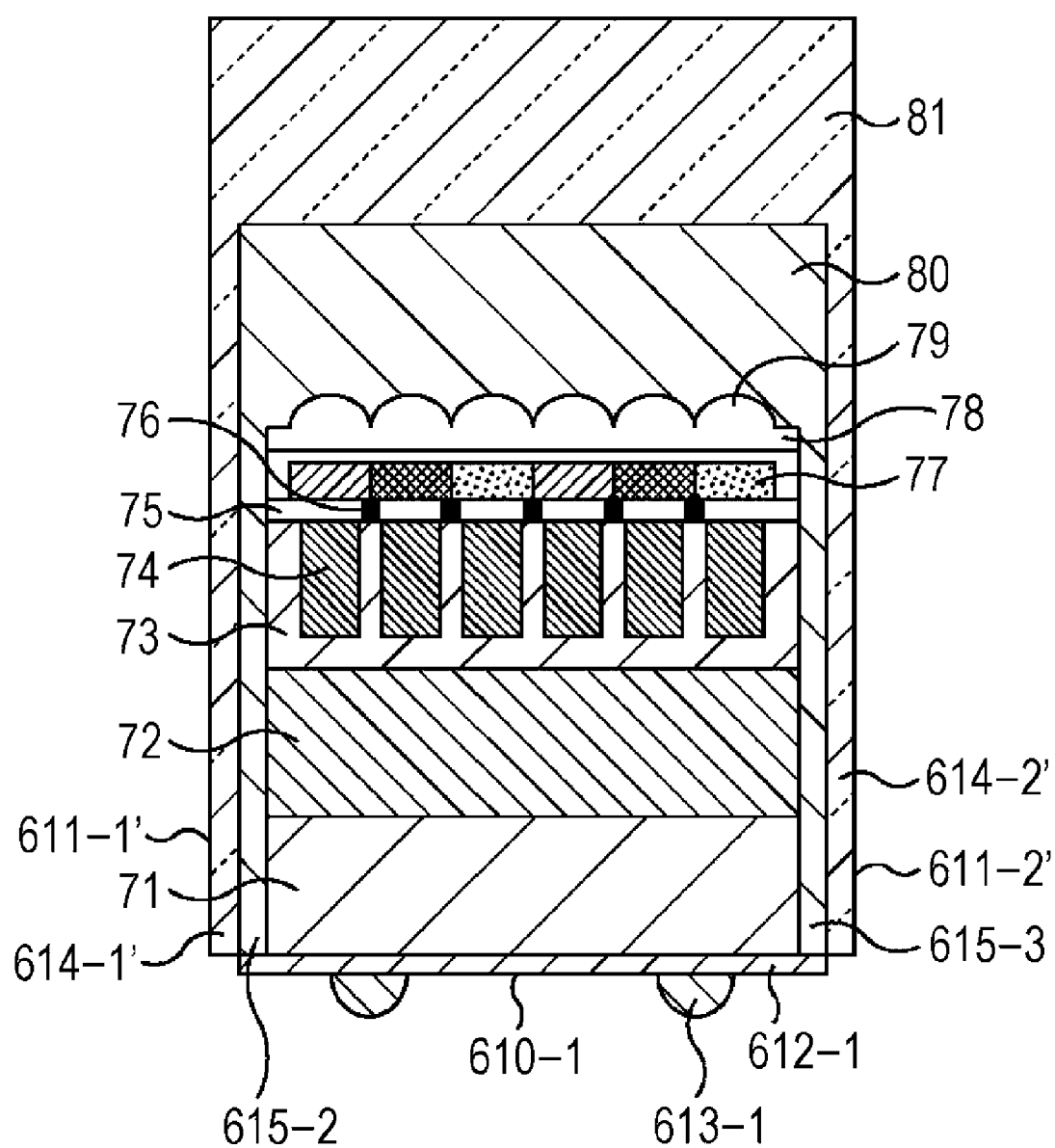
FIG. 54 is a diagram illustrating a configuration of a chip according to the sixth embodiment.

When the wafer in which the groove 611 is formed between the chips 610 is diced along the scribe section 91, the chip 610-1 illustrated in FIG. 54 is cut out. In the chip 610-1 illustrated in FIG. 54, the cross-sectional surfaces of the microlens layer 79, the planarization film 78, the color filter layer 77, the planarization film 75, the silicon substrate 73, the interconnection layer 72, and the support substrate 71 are covered with the film in which the glass 614 and the adhesive layer 615 are stacked and thus not exposed on the surface.

As described above, the diced chip 610-1 has a structure in which parts of the stacked layers of the chip 610-1 are covered with the glass 614-1' and the adhesive layer 615-2 formed in the groove 611-1' (a dash is added to the groove after dicing in order to be distinguished from the groove 611-1 before dicing illustrated in FIG. 53).

Further, the diced chip 610-1 has a structure in which parts of the stacked layers of the chip 610-1 are covered with the glass 614-2' and the adhesive layer 615-3 formed in the groove 611-2'.

As described above, both ends of the chip 610-1 are covered with the glass 614 and the adhesive layer 615. Thus, it is possible to prevent moisture from intruding into the chip 610-1 from the side of the chip 610-1.

Further, the solder resist 612-1 is formed below the chip 610-1, and thus it is possible to prevent moisture from intruding into the chip 610-1 from the bottom. Instead of the solder resist 612-1, an oxide film may be used, and an oxide film may be further stacked on the solder resist 612-1.

Since the diced chip 610-1 is configured such that the groove 611-1' and the groove 611-2' remain as described above, a width of the groove 611-1 and the groove 611-2 between the chips 610 before dicing (a width of the glass 614) is preferably larger than a width of a blade used in the dicing process.

As the groove 611 is formed, and the glass 614 and the adhesive layer 615 are formed in the groove 611 as described above, the moisture-proof performance can be further improved.

Manufacturing of Chip According to (6-1)-St Embodiment

Figure 55:
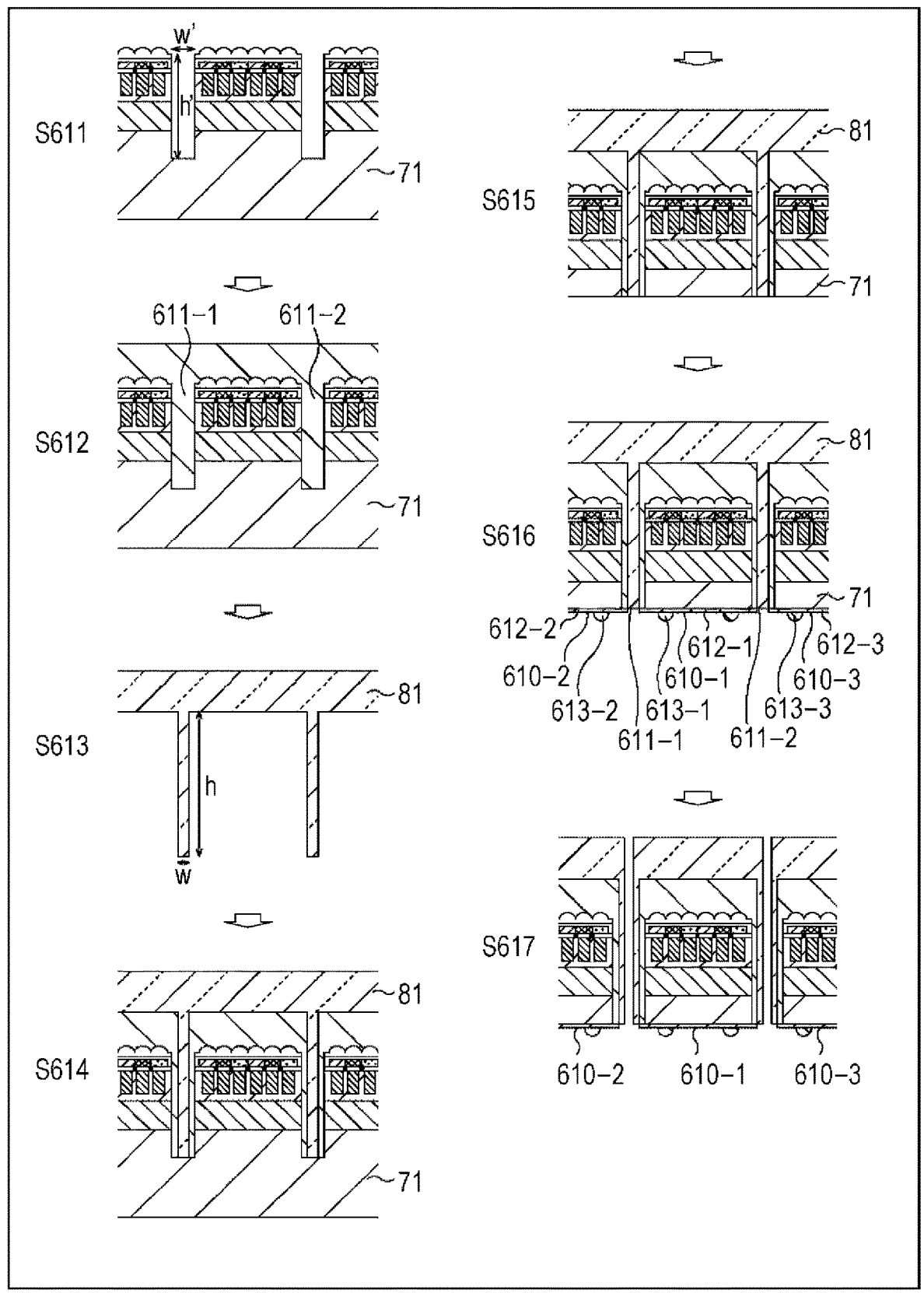
FIG. 55 is a diagram for describing a process of manufacturing a chip according to the sixth embodiment.

A process of manufacturing a chip (wafer) having such a groove will be described. FIG. 55 is a diagram for describing a process of manufacturing a chip prior to dicing.

The manufacturing process described with reference to FIG. 55 will focus on manufacturing of a groove serving as one of characteristic components of the present technology, and a manufacturing method of a related art can be applied to manufacturing of other parts such as forming of layers, and thus a description thereof will be appropriately omitted.

In step S611, a semiconductor wafer in which the photodiode 74 and the like are formed is prepared. The semiconductor wafer is configured such that the support substrate 71, the interconnection layer 72, the silicon substrate 73, the planarization film 75, the color filter layer 77, the planarization film 78, and the microlens layer 79 are stacked, the photodiode 74 is formed in the silicon substrate 73, and the light shielding film 76 is formed in the planarization film 75.

In step S611, the groove 611-1 and the groove 611-2 are formed in the semiconductor wafer. The groove 611 is formed in the scribe section 91 as described above. For example, the groove 611 is formed by performing dry etching after patterning. Alternatively, the groove 611 may be formed by a technique such as dry etching or wet etching.

An excavation amount of the semiconductor wafer (the depth of the groove 611) depends on a film thickness of silicon finally embedded in glass and is, for example, about 30 micrometers to 300 micrometers. An excavation width is larger than a width of the glass 614.

In step S612, an adhesive layer 80 is formed. When the adhesive layer 80 is formed, the groove 611 is also filled with the same material as a material for forming the adhesive layer 80. The material filling the groove 611 is the adhesive layer 615. The adhesive layer 80 is formed using a technique such as a coating technique or a lamination technique.

While the above manufacturing process is being performed, in step S613, the cover glass 81 is prepared. In step S613, excavating is performed on the prepared cover glass 81.

A width w of a protruding portion of the cover glass 81 illustrated in step S613 is smaller than a width w' (see step S611) of the groove 611 formed in the semiconductor wafer. Further, a height h of the protruding portion of the cover glass 81 is almost the same as or larger or smaller than a height h' (see step S611) of the groove 611 formed in the semiconductor wafer.

As a thickness of the cover glass 81 above the photodiode 74 (sensor) (a layer above an excavated layer) decreases, an effect of preventing a flare from a glass edge increases. In the bonding structure of the related art, the glass substrate serves as a support, and thus when the cover glass 81 is thin, a chip is likely to be broken, and the cover glass 81 has to have a certain thickness or more.

However, in the structure of the chip 610, the glass is formed to cover the outer side of the sensor chip, and thus the covered outer side is reinforced, and even when the glass thickness of the upper portion of the sensor is thin, the chip can be prevented from being broken.

Thus, it is possible to reduce the glass thickness of the sensor upper portion of the cover glass 81, for example, up to 100 micrometers to 500 micrometers.

According to the sixth embodiment, the glass thickness of the sensor upper portion of the cover glass 81 can be reduced, and thus it is possible to prevent a flare from the glass edge.

In step S614, the semiconductor wafer is bonded to the cover glass 81. The bonding is performed such that a portion (a convex portion of the silicon substrate 73) in which the photodiode 74 of the semiconductor wafer and the like are formed approaches an excavated portion (a concave portion) of the cover glass 81, and the protruding portion of the cover glass 81 other than the excavated portion serves as the glass 614.

When the bonding is performed, in order to prevent bubbles from coming into the bonding surface, a vacuum bonding machine is preferably used. Further, since the bonding is performed in a wafer level, there is no big influence, and a CSP process which will be described later is not influenced.

Here, the description proceeds with the example in which the adhesive layer 80 is formed on the semiconductor wafer and bonded to the cover glass 81, but the adhesive layer 80 may be formed on the cover glass 81 and bonded to the semiconductor wafer.

In step S615, the support substrate 71 is thinned. The thinning of the support substrate 71 is performed up to the bottom portion of the glass 614 (a front end of the convex portion of the cover glass 81) such that the bottom surface of the support substrate 71 is on the same plane as the bottom surface of the convex portion of the cover glass 81.

In step S616, a CSP process is performed. In order to open an interconnection portion of a multi-layer interconnection (not illustrated) formed in the semiconductor wafer surface, a through hole is formed by etching, an insulating film such as a silicon oxide film is formed, the insulating film in the through hole is etched and opened, a through electrode is formed in the through hole, for example, Cu plating, and an interconnection is formed on a surface (back surface) of a side opposite to a translucent substrate of the semiconductor wafer.

In step S617, dicing is performed using the convex portion (the glass 614) of the cover glass 81 as the scribe section 91, and thus the chip is diced.

As the groove 611 is formed, and the glass 614 and the adhesive layer 615 are formed in the groove 611 as described above, the moisture-proof performance can be further improved.

Further, as the groove 611 is formed, the glass 614 and the adhesive layer 615 are stacked in the groove 611, and dicing is performed along the glass 614 and the adhesive layer 615, force applied to an interface between films at the time of dicing can be mitigated, and a possibility that film peeling or a crack will occur can be reduced.

A possibility that film peeling or a crack will occur can be reduced, and thus the moisture-proof performance of the chip can be further improved.

(6-2)-Nd Embodiment

Figure 56:
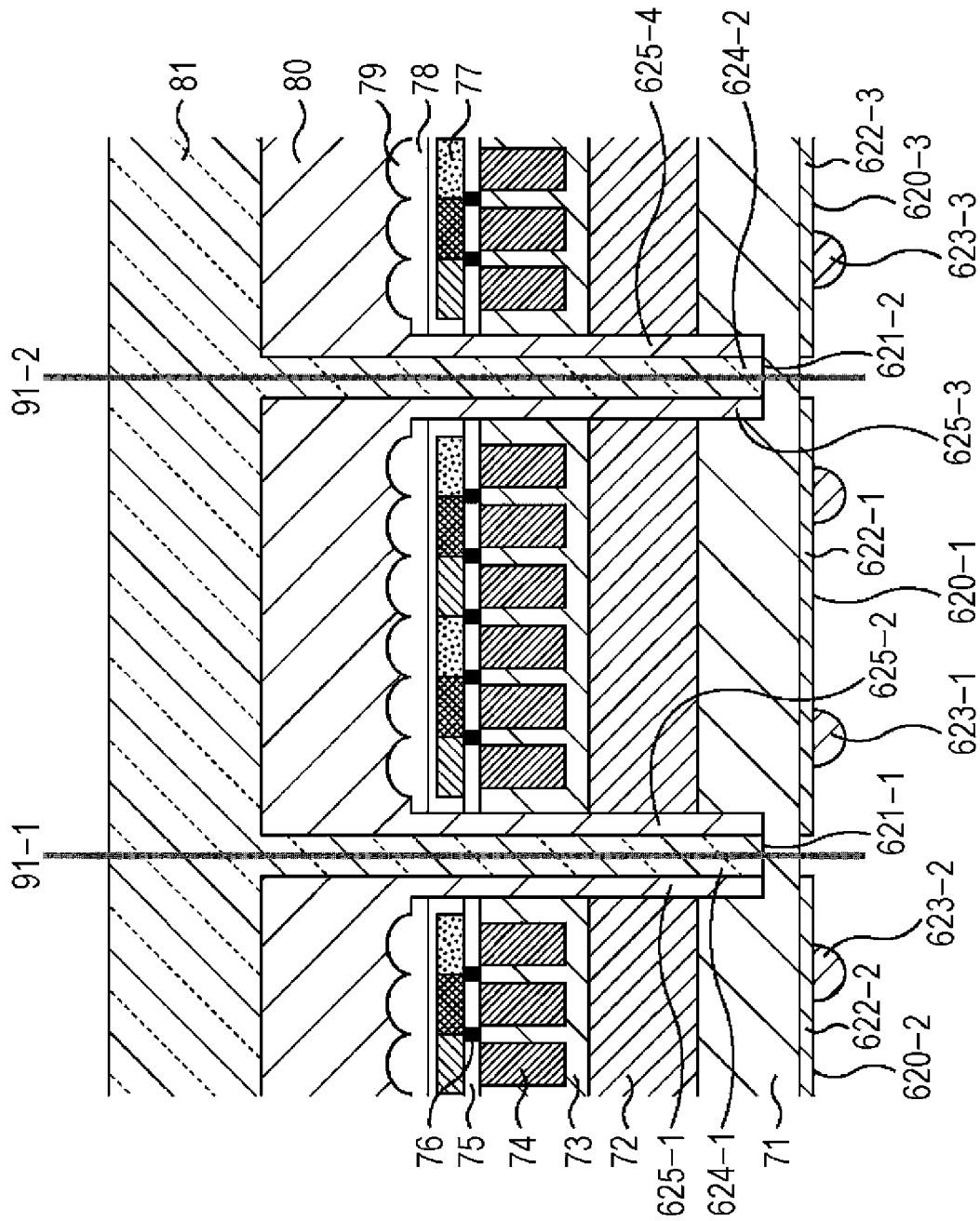
FIG. 56 is a diagram illustrating a configuration of a chip according to the sixth embodiment.

FIG. 56 illustrates another configuration of a chip according to the sixth embodiment. FIG. 56 illustrates a wafer that includes a plurality of chips (three chips in FIG. 56) and is not diced yet, similarly to FIG. 53.

Here, a chip positioned at the center is referred to as a "chip 620-1," a chip positioned at the left is referred to as a "chip 620-2," and a chip positioned at the right is referred to as a "chip 620-3." In the following description, when the chips 620-1 to 620-3 need not be distinguished from one another, the chips are referred to as simply a "chip 620."

Each chip 620 has the same configuration as the chip 610 described above with reference to FIG. 53 except that a configuration of a groove or the like is different, and a description will proceed with a different portion.

In the wafer illustrated in FIG. 56, a groove 621 is formed between the chips 620. The groove 621-1 is formed between the chip 620-1 and the chip 620-2, and the groove 621-2 is formed between the chip 620-1 and the chip 620-3.

There is a scribe section 91-1 between the chip 620-1 and the chip 620-2, and the groove 621-1 is formed in the scribe section 91-1. Similarly, there is a scribe section 91-2 between the chip 620-1 and the chip 620-3, and the groove 621-2 is formed in the scribe section 91-2.

In the chip 620 illustrated in FIG. 56, the groove 621 is formed such that the cover glass 81, the adhesive layer 80, the microlens layer 79, the planarization film 78, the color filter layer 77, the planarization film 75, the silicon substrate 73, the interconnection layer 72, and a part of the support substrate 71 are excavated.

A glass 624 formed of the same glass as the cover glass 81 and an adhesive layer 625 formed of the same material as the adhesive layer 80 are stacked on the groove 621.

The adhesive layer 625-1 extend from the adhesive layer 80 is formed on the side surfaces of the microlens layer 79, the planarization film 78, the color filter layer 77, the planarization film 75, the silicon substrate 73, the interconnection layer 72, and the part of the support substrate 71 at the chip 620-2 side of the groove 621-1.

The adhesive layer 625-2 extend from the adhesive layer 80 is formed on the side surfaces of the microlens layer 79, the planarization film 78, the color filter layer 77, the planarization film 75, the silicon substrate 73, the interconnection layer 72, and the part of the support substrate 71 at the chip 620-1 side of the groove 621-1. As described above, when the adhesive layer 80 is formed in the horizontal direction, the adhesive layer 625 is formed in the vertical direction.

The glass 624-1 is formed between the adhesive layer 625-1 and the adhesive layer 625-2. The glass 624-1 is formed to extend from the cover glass 81. When the cover glass 81 is formed in the horizontal direction, the glass 624 is formed in the vertical direction.

Similarly, the adhesive layer 625-3 extend from the adhesive layer 80 is formed on the side surfaces of the microlens layer 79, the planarization film 78, the color filter layer 77, the planarization film 75, the silicon substrate 73, the interconnection layer 72, and the part of the support substrate 71 at the chip 620-1 side of the groove 621-2.

The adhesive layer 625-4 extend from the adhesive layer 80 is formed on the side surfaces of the microlens layer 79, the planarization film 78, the color filter layer 77, the planarization film 75, the silicon substrate 73, the interconnection layer 72, and the part of the support substrate 71 at the chip 620-3 side of the groove 621-2. As described above, when the adhesive layer 80 is formed in the horizontal direction, the adhesive layer 625 is formed in the vertical direction.

The glass 624-2 is formed between the adhesive layer 625-3 and the adhesive layer 625-4. The glass 624-2 is formed to extend from the cover glass 81. When the cover glass 81 is formed in the horizontal direction, the glass 624 is formed in the vertical direction.

Figure 57:
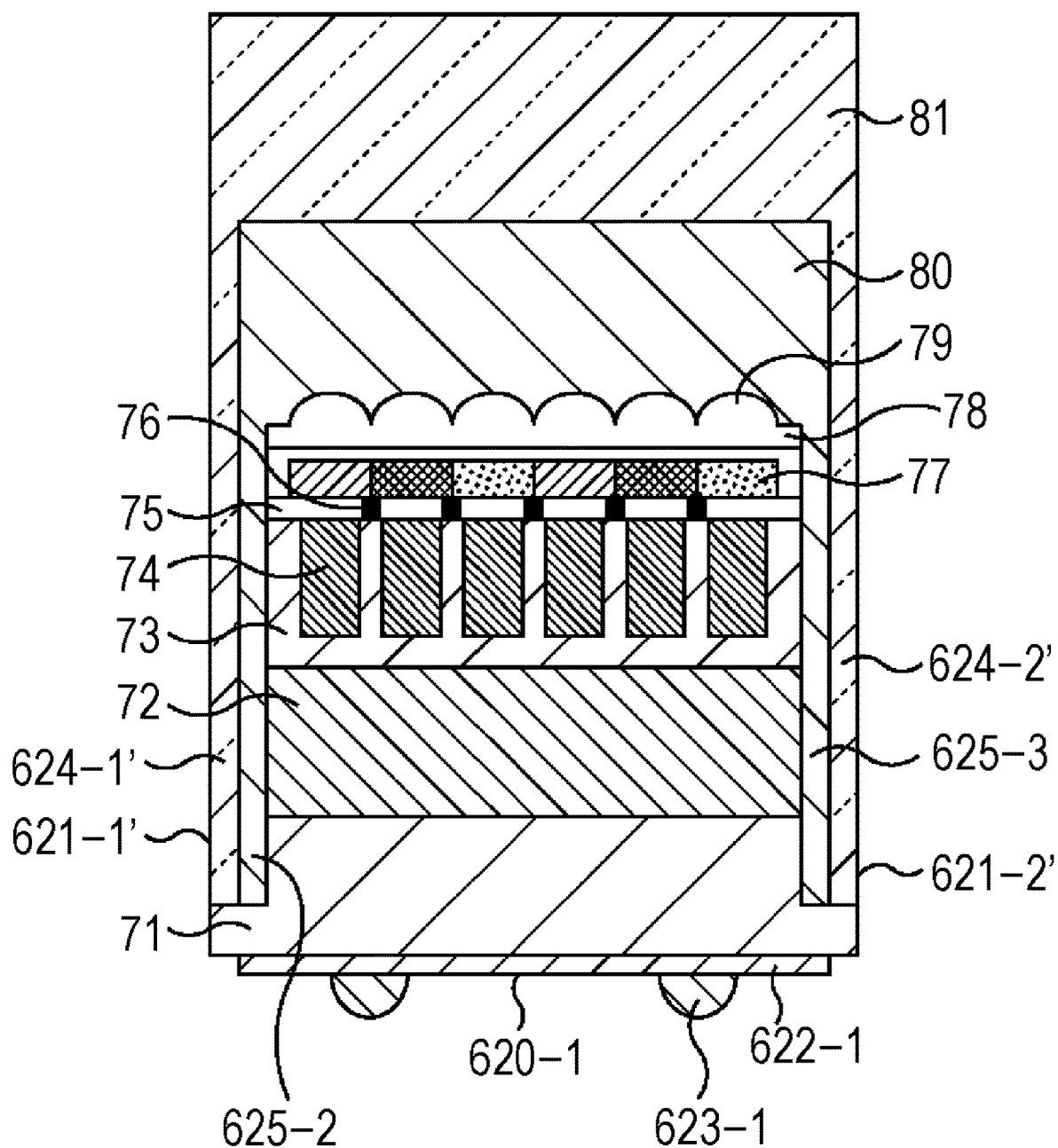
FIG. 57 is a diagram illustrating a configuration of a chip according to the sixth embodiment.

When the wafer in which the groove 621 is formed between the chips 620 is diced along the scribe section 91, the chip 620-1 illustrated in FIG. 57 is cut out. In the chip 620-1 illustrated in FIG. 57, the cross-sectional surfaces of the microlens layer 79, the planarization film 78, the color filter layer 77, the planarization film 75, the silicon substrate 73, the interconnection layer 72, and the part of the support substrate 71 are covered with the film in which the glass 624 and the adhesive layer 625 are stacked and thus not exposed on the surface.

As described above, the diced chip 620-1 has a structure in which parts of the stacked layers of the chip 620-1 are covered with the glass 624-1' and the adhesive layer 625-2 formed in the groove 621-1' (a dash is added to the groove after dicing in order to be distinguished from the groove 621-1 before dicing illustrated in FIG. 56).

Further, the diced chip 620-1 has a structure in which parts of the stacked layers of the chip 620-1 are covered with the glass 624-2' and the adhesive layer 625-3 formed in the groove 621-2'.

As described above, both ends of the chip 620-1 are covered with the glass 624 and the adhesive layer 625. Thus, it is possible to prevent moisture from intruding into the chip 620-1 from the side of the chip 620-1.

Further, the front ends of the glass 624 and the adhesive layer 625 are formed in the support substrate 71. In order to make the support substrate 71 expect the moisture-proof performance, the front end of the adhesive layer 625 is covered with the support substrate 71, and thus it is possible to prevent moisture from intruding from the front end of the adhesive layer 625.

Further, a solder resist 622-1 is formed below the chip 620-1, and thus it is possible to prevent moisture from intruding into the chip 620-1 from the bottom. Instead of the solder resist 622-1, an oxide film may be used, and an oxide film may be further stacked on the solder resist 622-1.

Since the diced chip 620-1 is configured such that the groove 621-1' and the groove 621-2' remain, and the part of the groove remains in that portion as described above, a width of the groove 621-1 and the groove 621-2 between the chips 620 before dicing (a width of the glass 624) is preferably larger than a width of a blade used in the dicing process.

As the groove 621 is formed, and the glass 624 and the adhesive layer 625 are formed in the groove 621 as described above, the moisture-proof performance can be further improved. Further, as the front end of the adhesive layer 625 is covered with the support substrate 71, intrusion of moisture from the bottom of the chip 620 can be prevented, and the moisture-proof performance can be further improved.

Manufacturing of Chip According to (6-2)-Nd Embodiment

Figure 58:
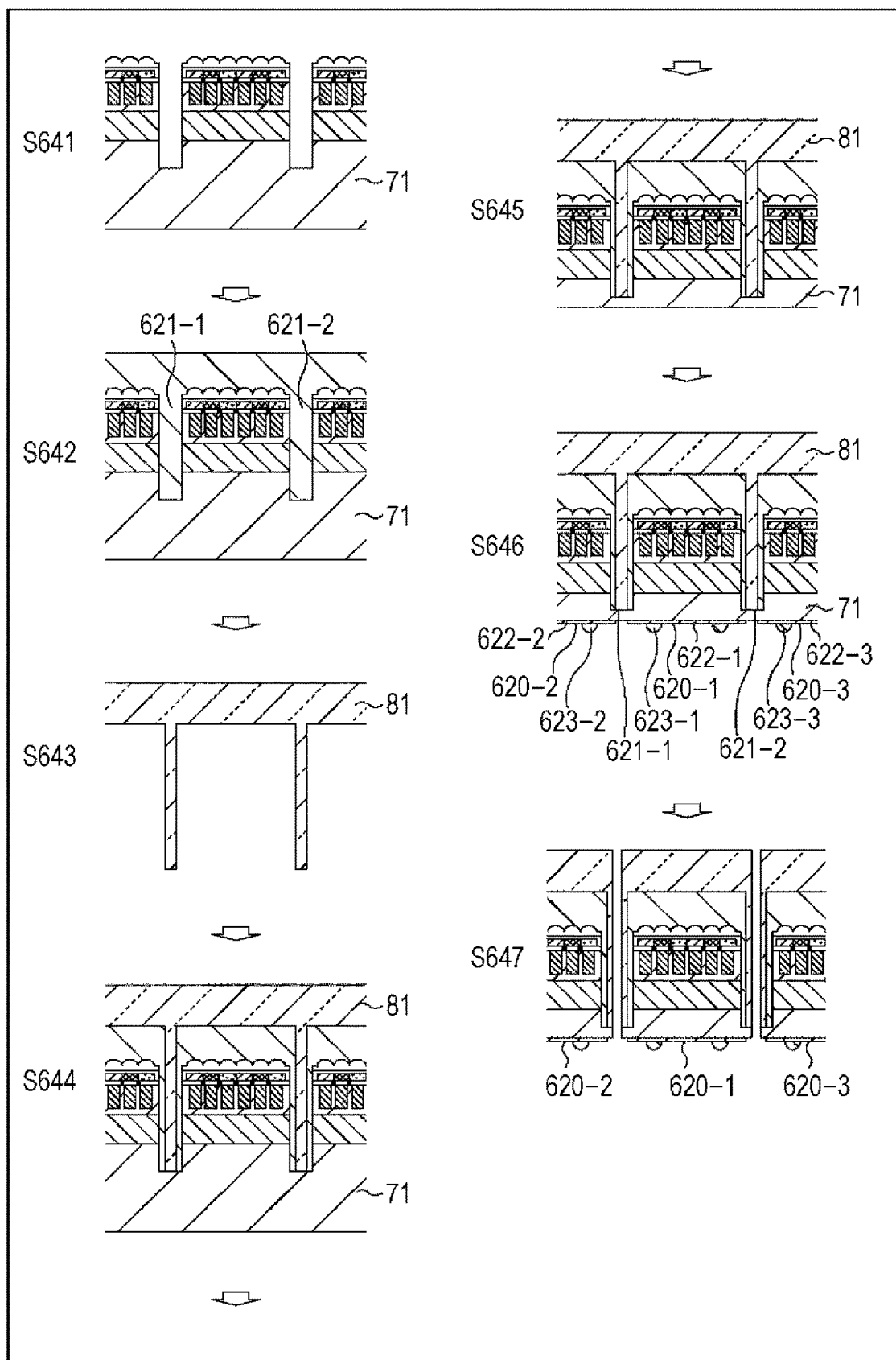
FIG. 58 is a diagram for describing a process of manufacturing a chip according to the sixth embodiment.

A process of manufacturing a chip (wafer) having such a groove will be described. FIG. 58 is a diagram for describing a process of manufacturing a chip prior to dicing.

The manufacturing process described with reference to FIG. 58 will focus on manufacturing of a groove serving as one of characteristic components of the present technology, and a manufacturing method of a related art can be applied to manufacturing of other parts such as forming of layers, and thus a description thereof will be appropriately omitted.

The same processes as the processes of manufacturing the chip 610 according to the (6-1)-st embodiment are included, and thus a description of the same processes will be appropriately omitted. Specifically, a difference lies in that when the support substrate 71 is thinned, the thinning is performed in the state in which the support substrate 71 remains.

In step S641, a groove 621-1 and a groove 621-2 are formed in the semiconductor wafer. In step S642, an adhesive layer 80 is formed. When the adhesive layer 80 is formed, the groove 621 is also filled with the same material as a material for forming the adhesive layer 80.

In step S643, excavating is performed on the cover glass 81. In step S644, the semiconductor wafer is bonded to the cover glass 81. The bonding is performed such that the convex portion of the cover glass 81 overlap the concave portion of the semiconductor wafer.

Here, the description proceeds with the example in which the adhesive layer 80 is formed on the semiconductor wafer and bonded to the cover glass 81, but the adhesive layer 80 may be formed on the cover glass 81 and bonded to the semiconductor wafer.

The process of steps S641 to S644 is performed in the same manner as the process of steps S611 to S614 related to the manufacturing of the chip 610 illustrated in FIG. 55.

Thus, in the (6-2)-nd embodiment, similarly to the (6-1)-st embodiment, it is possible to reduce the thickness of the sensor upper portion of the cover glass 81, and it is possible to prevent a flare from the glass edge.

Further, when the bonding is performed in step S644, the bonding is performed in a wafer level, and thus there is no big influence, and a chip size package (CSP) process which will be latter process is not influenced.

In step S645, the support substrate 71 is thinned. The thinning of the support substrate 71 is performed before reaching the bottom portion of the glass 624 (the front end of the convex portion of the cover glass 81) such that the state in which the bottom surface of the support substrate 71 and the bottom surface of the convex portion of the cover glass 81, that is, the bottom surface of the adhesive layer 625 are covered with the support substrate 71 is maintained.

In step S646, a CSP process is performed. In step S647, dicing is performed using the convex portion (the glass 624) of the cover glass 81 as the scribe section 91, and thus the chip is diced. The process of steps S646 and S647 is performed in the same manner as the process of steps S616 and S617 related to the manufacturing of the chip 610 illustrated in FIG. 55.

As the groove 621 is formed, and the glass 624 and the adhesive layer 625 are formed in the groove 621 as described above, the moisture-proof performance can be further improved. Further, as the thinning is performed so that the support substrate 71 remains in the front end portion of the adhesive layer 625, it is possible to prevent moisture from intruding from the bottom of the chip 620, and the moisture-proof performance can be further improved.

Further, as the groove 621 is formed, the glass 624 and the adhesive layer 625 are stacked in the groove 621, and dicing is performed along the glass 624 and the adhesive layer 625, force applied to an interface between films at the time of dicing can be mitigated, and a possibility that film peeling or a crack will occur can be reduced.

A possibility that film peeling or a crack will occur can be reduced, and thus the moisture-proof performance of the chip can be further improved.

(6-3)-Rd Embodiment

Figure 59:
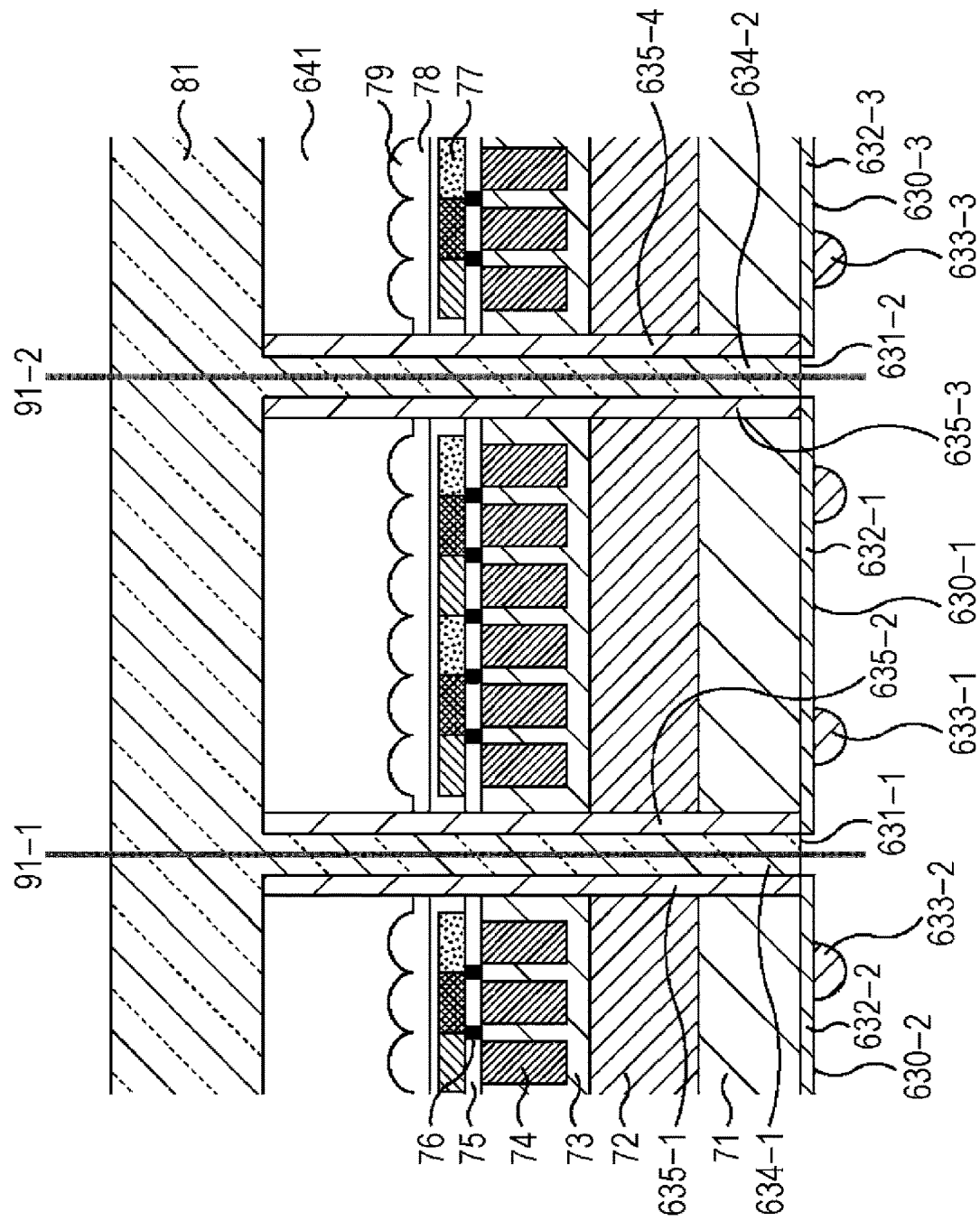
FIG. 59 is a diagram illustrating a configuration of a chip according to the sixth embodiment.

FIG. 59 illustrates another configuration of a chip according to the sixth embodiment. FIG. 59 illustrates a wafer that includes a plurality of chips (three chips in FIG. 59) and is not diced yet, similarly to FIG. 53.

Here, a chip positioned at the center is referred to as a "chip 630-1," a chip positioned at the left is referred to as a "chip 630-2," and a chip positioned at the right is referred to as a "chip 630-3." In the following description, when the chips 630-1 to 630-3 need not be distinguished from one another, the chips are referred to as simply a "chip 630."

Each chip 630 has the same configuration as the chip 610 described above with reference to FIG. 53 except that no adhesive layer 80 is formed on the microlens layer 79. The chip 610 according to the (6-1)-st embodiment and the chip 620 according to the (6-2)-nd embodiment are cavity-less chip size packages (CSPs), but the chip 630 according to the (6-3)-rd embodiment is a cavity CSP.

Since the chip 630 is the cavity CSP, as illustrated in FIG. 59, a space layer 641 is formed between a microlens layer 79 and a cover glass 81 of the chip 630.

In the wafer illustrated in FIG. 59, a groove 631 is formed between the chips 630. The groove 631-1 is formed between the chip 630-1 and the chip 630-2, and the groove 631-2 is formed between the chip 630-1 and the chip 630-3.

There is a scribe section 91-1 between the chip 630-1 and the chip 630-2, and the groove 631-1 is formed in the scribe section 91-1. Similarly, there is a scribe section 91-2 between the chip 630-1 and the chip 630-3, and the groove 631-2 is formed in the scribe section 91-2.

In the chip 630 illustrated in FIG. 59, the groove 631 is formed such that the cover glass 81, the space layer 641, the microlens layer 79, the planarization film 78, the color filter layer 77, the planarization film 75, the silicon substrate 73, the interconnection layer 72, and the support substrate 71 are excavated.

A glass 634 formed of the same glass as the cover glass 81 and an adhesive layer 635 formed of the same material as the adhesive layer 80 are stacked on the groove 631.

For the adhesive layer 80, since the chip 630 has the cavity structure, there is no adhesive layer 80, and instead there is the space layer 641, but as will be described later, in the manufacturing process, the adhesive layer 80 is formed, a part of the adhesive layer 80 remains, and the remaining part of the adhesive layer 80 is formed as the space layer 641.

The adhesive layer 635-1 is formed on the side surfaces of the space layer 641, the microlens layer 79, the planarization film 78, the color filter layer 77, the planarization film 75, the silicon substrate 73, the interconnection layer 72, and the support substrate 71 at the chip 630-2 side of the groove 631-1.

The adhesive layer 635-2 is formed on the side surfaces of the space layer 641, the microlens layer 79, the planarization film 78, the color filter layer 77, the planarization film 75, the silicon substrate 73, the interconnection layer 72, and the support substrate 71 at the chip 630-1 side of the groove 631-1. As described above, when the adhesive layer 80 is formed in the horizontal direction, the adhesive layer 635 is formed in the vertical direction.

The glass 634-1 is formed between the adhesive layer 635-1 and the adhesive layer 635-2. The glass 634-1 is formed to extend from the cover glass 81. When the cover glass 81 is formed in the horizontal direction, the glass 634 is formed in the vertical direction.

Similarly, the adhesive layer 635-3 is formed on the side surfaces of the space layer 641, the microlens layer 79, the planarization film 78, the color filter layer 77, the planarization film 75, the silicon substrate 73, the interconnection layer 72, and the support substrate 71 at the chip 630-1 side of the groove 631-2.

The adhesive layer 635-4 is formed on the side surfaces of the space layer 641, the microlens layer 79, the planarization film 78, the color filter layer 77, the planarization film 75, the silicon substrate 73, the interconnection layer 72, and the support substrate 71 at the chip 630-3 side of the groove 631-2. As described above, when the adhesive layer 80 is formed in the horizontal direction, the adhesive layer 635 is formed in the vertical direction.

The glass 634-2 is formed between the adhesive layer 635-3 and the adhesive layer 635-4. The glass 634-2 is formed to extend from the cover glass 81. When the cover glass 81 is formed in the horizontal direction, the glass 634 is formed in the vertical direction.

Figure 60:
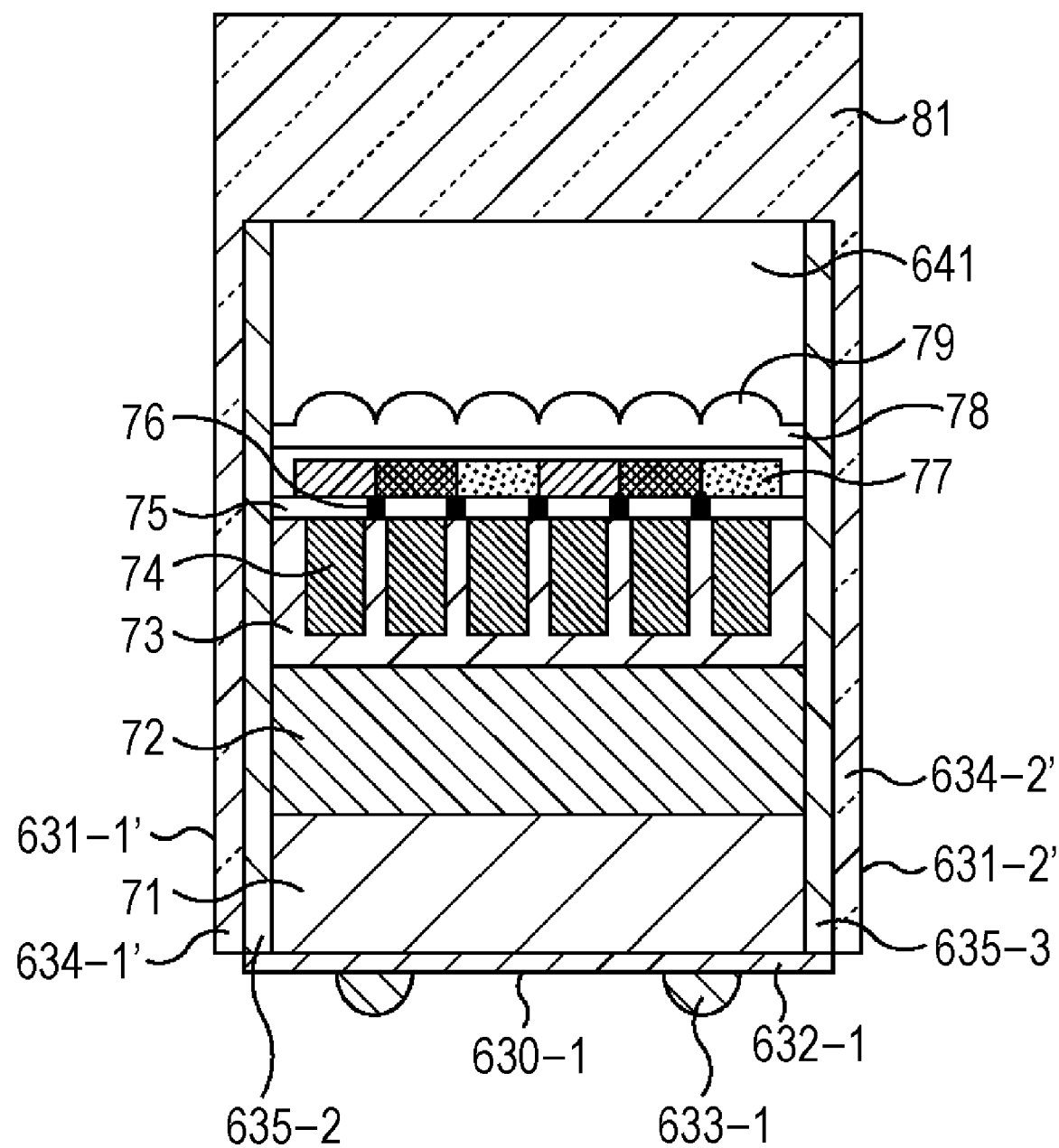
FIG. 60 is a diagram illustrating a configuration of a chip according to the sixth embodiment.

When the wafer in which the groove 631 is formed between the chips 630 is diced along the scribe section 91, the chip 630-1 illustrated in FIG. 60 is cut out. In the chip 630-1 illustrated in FIG. 60, the cross-sectional surfaces of the space layer 641, the microlens layer 79, the planarization film 78, the color filter layer 77, the planarization film 75, the silicon substrate 73, the interconnection layer 72, and the support substrate 71 are covered with the film in which the glass 634 and the adhesive layer 635 are stacked and thus not exposed on the surface.

As described above, the diced chip 630-1 has a structure in which parts of the stacked layers of the chip 630-1 are covered with the glass 634-1' and the adhesive layer 635-2 formed in the groove 631-1' (a dash is added to the groove after dicing in order to be distinguished from the groove 631-1 before dicing illustrated in FIG. 59).

Further, the diced chip 630-1 has a structure in which parts of the stacked layers of the chip 630-1 are covered with the glass 634-2' and the adhesive layer 635-3 formed in the groove 631-2'.

As described above, both ends of the chip 630-1 are covered with the glass 634 and the adhesive layer 635. Thus, it is possible to prevent moisture from intruding into the chip 630-1 from the side of the chip 630-1.

Further, a solder resist 632-1 is formed below the chip 630-1, and thus it is possible to prevent moisture from intruding into the chip 630-1 from the bottom. Instead of the solder resist 632-1, an oxide film may be used, and an oxide film may be further stacked on the solder resist 632-1.

Since the diced chip 630-1 is configured such that the groove 631-1' and the groove 631-2' remain, a width of the groove 631-1 and the groove 631-2 between the chips 630 before dicing (a width of the glass 634) is preferably larger than a width of a blade used in the dicing process.

As the groove 631 is formed, and the glass 634 and the adhesive layer 635 are formed in the groove 631 as described above, the moisture-proof performance can be further improved.

Manufacturing of Chip According to (6-2)-Nd Embodiment

Figure 61:
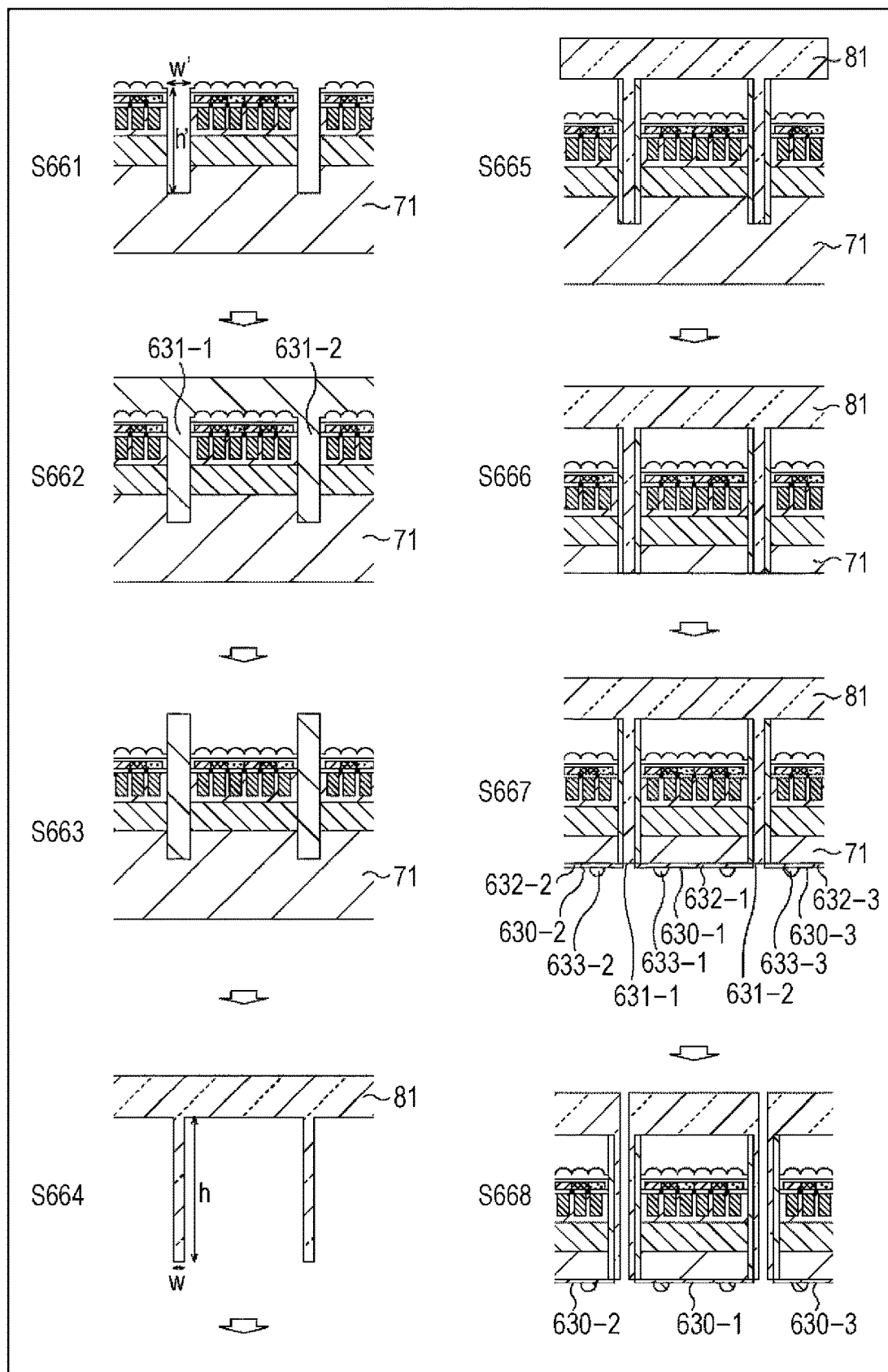
FIG. 61 is a diagram for describing a process of manufacturing a chip according to the sixth embodiment.

A process of manufacturing a chip (wafer) having such a groove will be described. FIG. 61 is a diagram for describing a process of manufacturing a chip prior to dicing. The manufacturing process described with reference to FIG. 61 will focus on manufacturing of a groove serving as one of characteristic components of the present technology, and a manufacturing method of a related art can be applied to manufacturing of other parts such as forming of layers, and thus a description thereof will be appropriately omitted.

The same processes as the processes of manufacturing the chip 610 according to the (6-1)-st embodiment are included, and thus a description of the same processes will be appropriately omitted.

In step S661, the groove 631-1 and the groove 631-2 are formed in the semiconductor wafer. In step S662, the adhesive layer 80 is formed. When the adhesive layer 80 is formed, the groove 631 is also filled with the same material as a material for forming the adhesive layer 80.

The process of steps S661 and S662 is performed in the same manner as the process of steps S611 and S612 related to the manufacturing of the chip 610 illustrated in FIG. 55.

In step S663, a part of the formed adhesive layer 80 is removed, so that a portion serving as the space layer 641 is formed. As described above, since a part of the adhesive layer 80 is removed after the adhesive layer 80 is formed, a photosensitive adhesive is preferably used as a material of the adhesive layer 80. Then, patterning and etching are performed, so that the adhesive layer 80 formed in the portion serving as the space layer 641 is removed.

In step S664, excavating is performed on the cover glass 81. In step S665, the semiconductor wafer is bonded to the cover glass 81. The bonding is performed such that the convex portion of the cover glass 81 overlap the concave portion of the semiconductor wafer.

As a result, as the cover glass 81 is bonded to the semiconductor wafer, the space layer 641 is formed. In order to form the space layer 641, the depth of the groove 631 formed in the semiconductor wafer and the depth of the convex portion of the cover glass 81 have to satisfy the following relation.

In other words, the height h of the protruding portion of the cover glass 81 is larger than the height h' (see step S661) of the groove 611 formed in the semiconductor wafer. In other words, the height h of the convex portion of the cover glass 81 and the height h' of the groove 611 satisfy a relation of (height h>height h').

Since there is a difference between the height of the groove 611 and the height of the convex portion of the cover glass 81 (the height of the portion corresponding to the glass 634) as described above, the space layer 641 can be formed.

Further, the width w of the convex portion of the cover glass 81 is smaller than the width w' (see step S611) of the groove 611 formed in the semiconductor wafer, similarly to the (6-1)-st embodiment.

Here, the description proceeds with the example in which the adhesive layer 80 is formed on the semiconductor wafer and bonded to the cover glass 81, but the adhesive layer 80 may be formed on the cover glass 81, an unnecessary part of the adhesive layer 80 may be removed, and then the resultant adhesive layer 80 may be bonded to the semiconductor wafer.

The process of steps S661 to S665 (except step S663) is performed in the same manner as the process of steps S611 to S614 related to the manufacturing of the chip 610 illustrated in FIG. 55. Thus, in the (6-3)-rd embodiment, similarly to the (6-1)-st embodiment, it is possible to reduce the thickness of the sensor upper portion of the cover glass 81, and it is possible to prevent a flare from the glass edge.

Further, when the bonding is performed in step S665, the bonding is performed in a wafer level, and thus there is no big influence, and a CSP process which will be latter process is not influenced.

In step S666, the support substrate 71 is thinned. The thinning of the support substrate 71 is performed up to the bottom portion of the glass 634 (the front end of the convex portion of the cover glass 81) such that the bottom surface of the support substrate 71 is on the same plane as the bottom surface of the convex portion of the cover glass 81.

In step S667, a CSP process is performed. In step S668, dicing is performed using the convex portion (the glass 634) of the cover glass 81 as the scribe section 91, and thus the chip is diced. The process of steps S667 and S668 is performed in the same manner as the process of steps S616 and S617 related to the manufacturing of the chip 610 illustrated in FIG. 55.

As the groove 631 is formed, and the glass 634 and the adhesive layer 635 are formed in the groove 631 as described above, the moisture-proof performance can be further improved.

Further, the groove 631 is formed, the glass 634 and the adhesive layer 635 are stacked in the groove 631, and the portion corresponding to the glass 634 and the adhesive layer 635 is diced, and thus force applied to an interface between films at the time of dicing can be mitigated, and a possibility that film peeling or a crack will occur can be reduced.

A possibility that film peeling or a crack will occur can be reduced, and thus the moisture-proof performance of the chip can be further improved.

Here, although not illustrated, the (6-2)-nd embodiment may be applied to the (6-3)-rd embodiment. In other words, the glass 634 of the chip 630 with the cavity structure and the front end of the adhesive layer 635 may be covered with the support substrate 71.

In the case in which the chip 630 is configured as described above, when the thinning of the support substrate 71 is performed in step S666, similarly to the process of step S645 (FIG. 58), the thinning may be performed before reaching the bottom surface of the glass 634 (the front end of the convex portion of the cover glass 81) such that the state in which the bottom surface of the support substrate 71 and the bottom surface of the convex portion of the cover glass 81, that is, the bottom surface of the adhesive layer 635 are covered with the support substrate 71 is maintained.

As the entire chip is covered with the cover glass 81 as described above, the chip has the structure in which there is no interface at the edge. As a result, it is possible to prevent intrusion of moisture from the edge interface of the chip.

Further, since the distance from the edge to the interface is large, it is possible to implement a structure into which moistures is unlikely to intrude.

Further, since the chip is covered with the cover glass 81 in a box structure, the end portion of the chip can have a sufficient glass thickness, and the thickness of the glass in the upper portion of the sensor can be reduced, and thus it is possible to prevent a flare from the glass edge.

Further, since the structure in which only glass is cut at the time of dicing is provided, the cost can be reduced.

Seventh Embodiment

In the seventh embodiment, a certain layer in a chip is surrounded by a hydrophobic film to prevent intrusion of moisture into a chip.

(7-1)-St Embodiment

Figure 62:
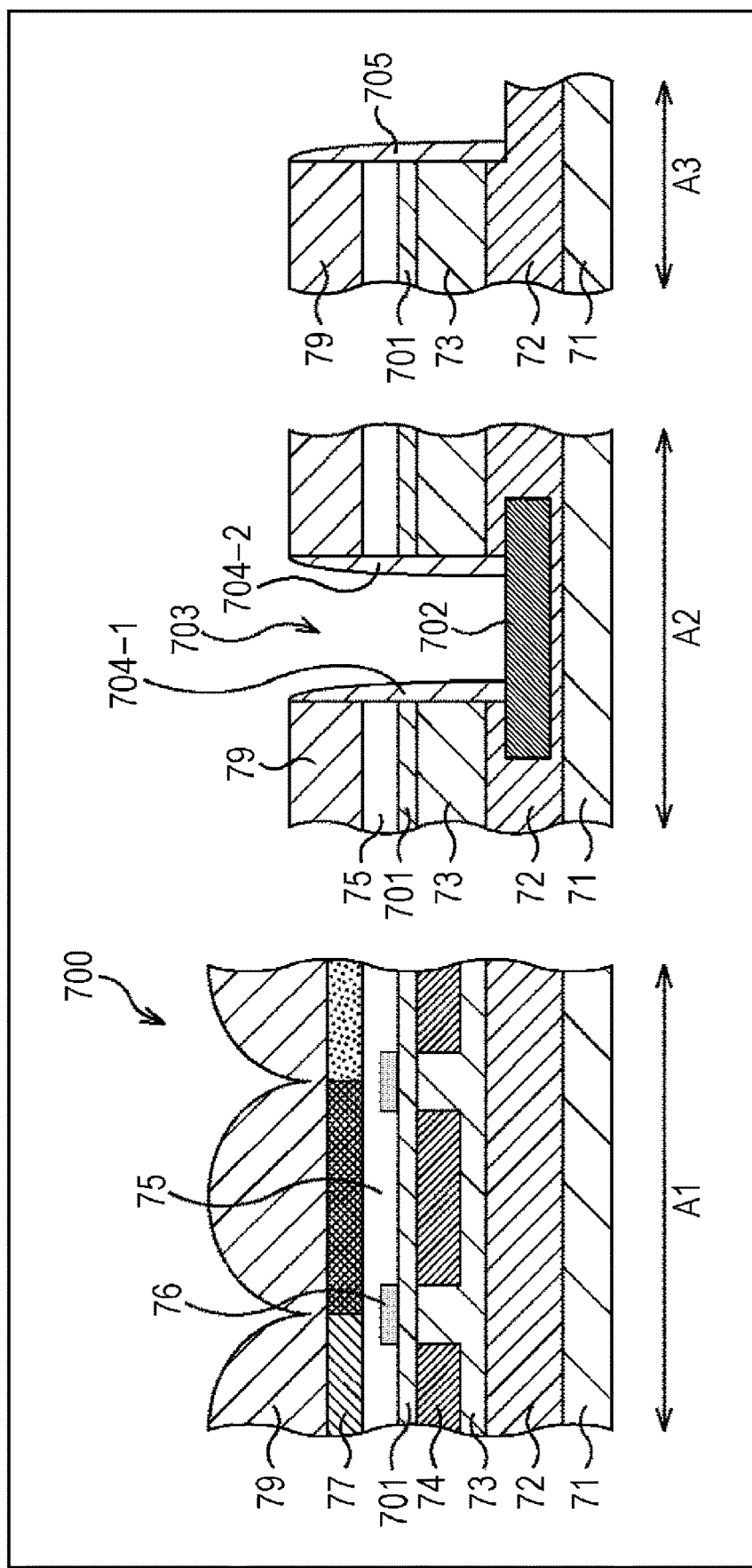
FIG. 62 is a diagram illustrating a configuration of a chip according to a seventh embodiment.

FIG. 62 illustrates a configuration of a chip according to the seventh embodiment. A chip 700 illustrated in FIG. 62 configures a backside-illumination type CMOS image sensor. Parts having the same configuration as in the chip 70 illustrated in FIG. 2 are denoted by the same reference numerals, and then a description will proceed.

Specifically, an interconnection layer 72 made of SiO2 is formed on a support substrate 71, and silicon substrate 73 is formed on the interconnection layer 72. A plurality of photodiodes 74 serving photoelectric conversion units of pixels are formed on the surface of the silicon substrate 73 at certain intervals.

A passivation film 701 made of SiO2 is formed on the silicon substrate 73 and the photodiode 74. A light shielding film 76 for preventing light from leaking into a neighboring pixel is formed on a portion of the passivation film 701 between the neighboring photodiodes 74. A planarization film 75 for planarizing a region on which a color filter is formed is formed on the passivation film 701 and the light shielding film 76.

A color filter layer 77 is formed on the planarization film 75. In the color filter layer 77, a plurality of color filters are formed in units of pixels, and, for example, colors of the color filters are arranged according to a Bayer array.

A microlens layer 79 is formed on the color filter layer 77. In the microlens layer 79, a microlens layer for collecting light onto the photodiode 74 of each pixel is formed for each pixel.

Figure 63:
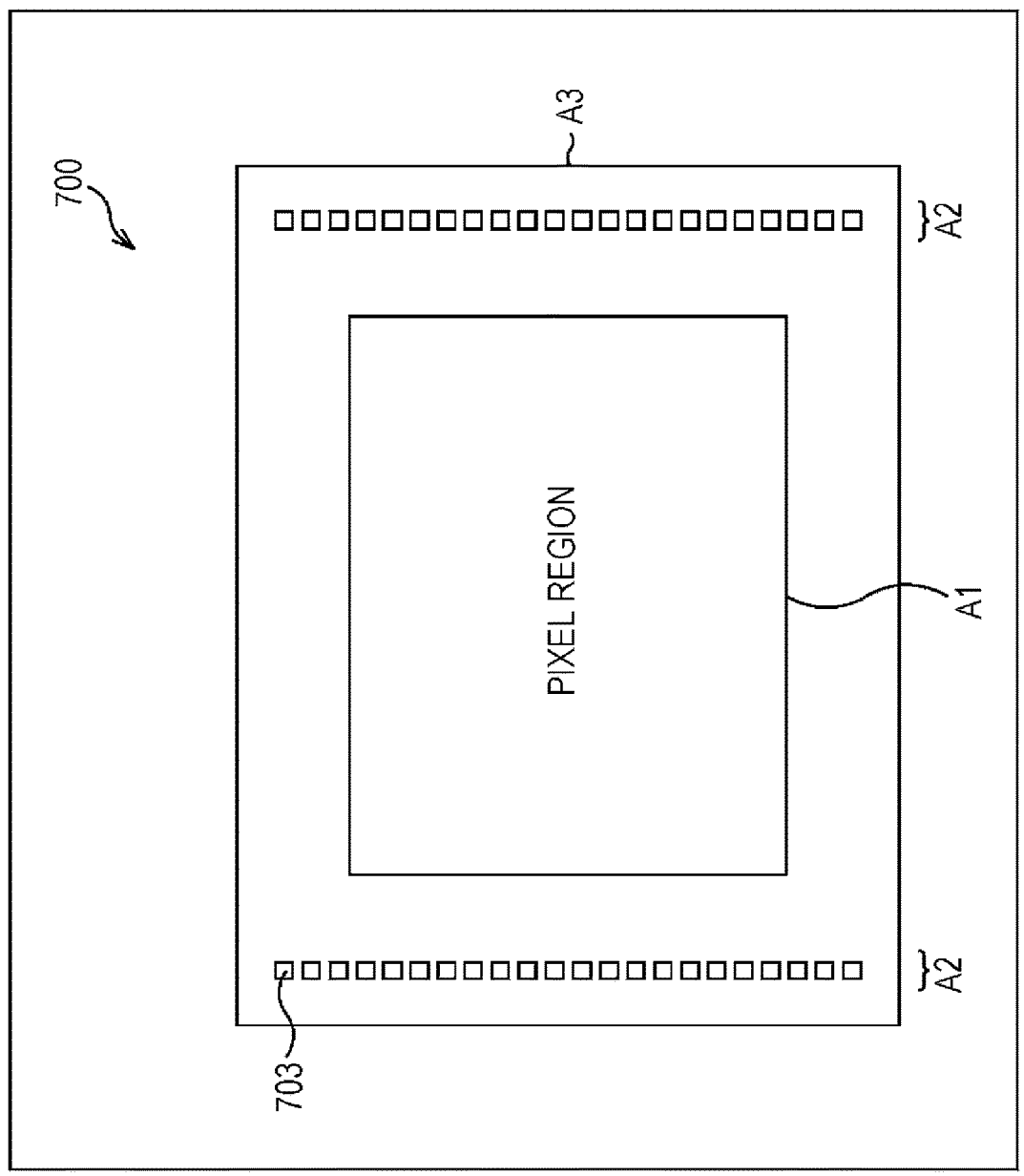
FIG. 63 is a diagram illustrating a configuration of a chip according to the seventh embodiment.

Here, the configuration of the chip 700 will be further described with reference to FIG. 63 in addition to FIG. 62. FIG. 63 is a plane view schematically illustrating the configuration of the chip 700. In FIG. 63, in order to help with understanding with the drawing, a reference numeral of a pad opening portion 703 is partially omitted.

The chip 700 is roughly divided into a pixel region A1, a pad region A2, a scribe region A3, and a remaining region.

The pixel region A1 is a region in which a pixel including the photodiode 74 formed on the surface of the silicon substrate 73 is arranged.

The pad regions A2 are defined outside the pixel region A1 to be arranged in parallel along two opposite sides of the chip 700. In each of the pad regions A2, pad opening portions 703 each of which serves as a hole that extends from the upper end of the chip 700 to the inside of the interconnection layer 72 and is used as an interconnection hole for an electrode pad 702 are formed side by side in a straight line. Further, the electrode pad 702 for interconnection is formed at the bottom of the pad opening portion 703.

The scribe region A3 is a region in which the chip 700 is cut from the wafer, and includes an edge portion (hereinafter, referred to as a "chip edge") of the chip 700.

In the pad region A2 and the scribe region A3, a hydrophobic film for preventing intrusion of moisture from the outside or intrusion of impurities is formed. For example, the hydrophobic film may be formed by F-based deposition by etching using CxFy-based gas or CxHyFz-based gas (for example, $CF_4$, $C_4F_8$, $C_5F_8$, $C_4F_6$, $CHF_3$, $CH_2F_2$, $CH_3F$, or $C_5HF_7$) or may be formed by self-alignment in a sidewall portion.

In the pad region A2, the hydrophobic film is formed to cover the inner wall of the pad opening portion 703. In the chip 700 illustrated in FIG. 62, a hydrophobic film 704-1 is formed on the pixel region A1 side of the pad opening portion 703, and the hydrophobic film 704-2 is formed on the scribe region A3 side of the pad opening portion 703.

Since FIG. 62 is a cross-sectional view of the chip 700, the hydrophobic film 704 is illustrated to be formed on the inner wall of each pad opening portion 703, but since the pad opening portion 703 has a closed shape such as a circular shape or a square shape as illustrated in FIG. 63, the hydrophobic film 704-1 and the hydrophobic film 704-2 are formed as one uninterrupted hydrophobic film.

For convenience of description, in the drawings subsequent to FIG. 63, the hydrophobic film 704 formed on the pad opening portion 703 is illustrated as illustrated in FIG. 62, and the hydrophobic film 704 will be described to be formed on the inner wall of each pad opening portion 703.

The hydrophobic film 704 formed on the pad opening portion 703 is formed to cover the inner wall of the pad opening portion 703, and covers from the upper end of the microlens layer 79 to the part of the silicon substrate in which the interconnection layer 72 is formed. The front end of the hydrophobic film 704 comes into contact with the top surface of the electrode pad 702.

A hydrophobic film 705 is formed on the chip edge. Hereinafter, a portion formed vertically to the surface of the silicon substrate 73 on the side surface of the chip 700 (the outer sidewall, that is, the outer wall of the chip 700) is referred to as a "sidewall portion." The hydrophobic film 705 formed in the sidewall portion covers the side surface of the chip 700 from the upper end of the microlens layer 79 to the part of the silicon substrate in which the interconnection layer 72 is formed. The front end of the hydrophobic film 705 comes into contact with the silicon substrate in which the interconnection layer 72 is formed.

As described above, the inner wall of the groove formed in the vertical direction to the substrate such as each pad opening portion 703 of the chip 700 is covered with the hydrophobic film 704 without a gap. Further, the sidewall portion formed in the vertical direction to the substrate of the chip 700 is covered with the hydrophobic film 705 without a gap. As a result, intrusion of moisture or impurities into the chip 700 is prevented by the hydrophobic film 704 and the hydrophobic film 705. Thus, the chip 700 with the improved moisture-proof performance can be implemented.

Since there is a stacked film interface on the inner wall and the sidewall portion of the pad opening portion 703, moisture is more likely to intrude into the inner wall and the sidewall portion of the pad opening portion 703 than the surface of the chip. As the hydrophobic film is formed on the inner wall and the sidewall portion of the pad opening portion 703 to cover the stacked film interface, intrusion of moisture or impurities into the chip can be prevented.

Further, as the hydrophobic film is formed in the sidewall portion (the scribe region A3), force applied to an interface between films at the time of dicing can be mitigated, and a possibility that film peeling or a crack will occur can be reduced. A possibility that film peeling or a crack will occur can be reduced, and thus the moisture-proof performance of the chip can be further improved.

Manufacturing of Chip According to (7-1)-St Embodiment

Figure 64:
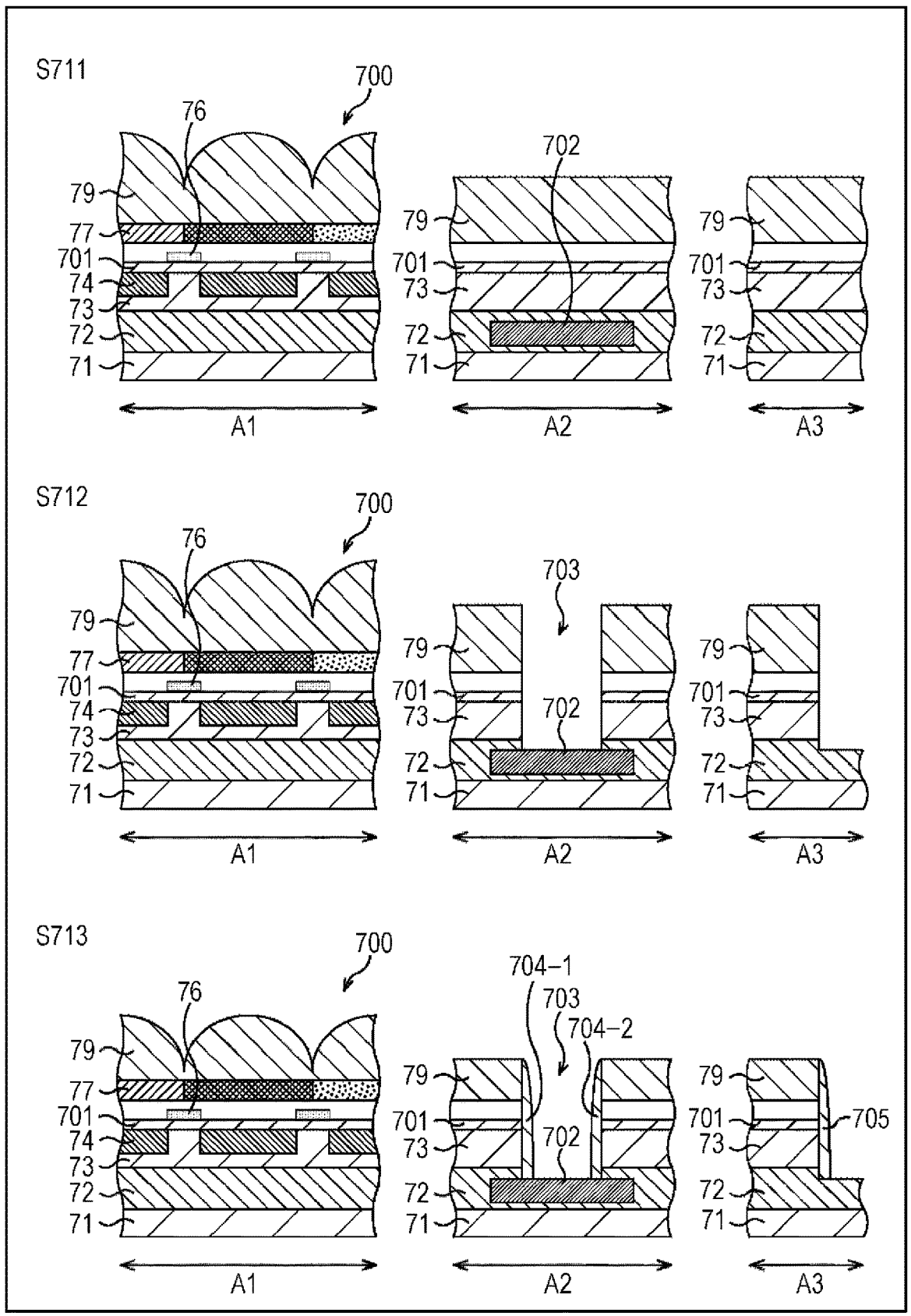
FIG. 64 is a diagram for describing a process of manufacturing a chip according to the seventh embodiment.

A process of manufacturing a chip (wafer) having such a groove will be described. FIG. 64 is a diagram for describing a process of manufacturing a chip prior to dicing. The manufacturing process that will be described with reference to FIG. 64 will focus on manufacturing of the hydrophobic film that is one of characteristic components of the present technology, and a manufacturing method of a related art can be applied to manufacturing of other parts such as forming of layers, and thus a description thereof will be appropriately omitted.

In step S711, a semiconductor wafer in which the photodiode 74 and the like are formed is prepared.

In step S712, the pad opening portion 703 of the pad region A2 of the semiconductor wafer is formed. For example, the pad opening portion 703 is formed by etching after patterning.

In step S713, the hydrophobic film 704 and the hydrophobic film 705 are formed. The hydrophobic film 704 and the hydrophobic film 705 may be formed by F-based deposition by etching using CxFy-based gas or CxHyFz-based gas (for example, $CF_4$, $C_4F_8$, $C_5F_8$, $C_4F_6$, $CHF_3$, $CH_2F_2$, $CH_3F$, or $C_5HF_7$) or may be formed by self-alignment in the sidewall portion.

As the hydrophobic film is formed on the inner wall of the pad opening portion 703 and the chip edge as described above, the moisture-proof performance can be further improved.

Further, as dicing is performed after the hydrophobic film is formed in the sidewall portion (the scribe region A3), force applied to an interface between films at the time of dicing can be mitigated, and a possibility that film peeling or a crack will occur can be reduced. A possibility that film peeling or a crack will occur can be reduced, and thus the moisture-proof performance of the chip can be further improved.

(7-2)-Nd Embodiment

Figure 65:
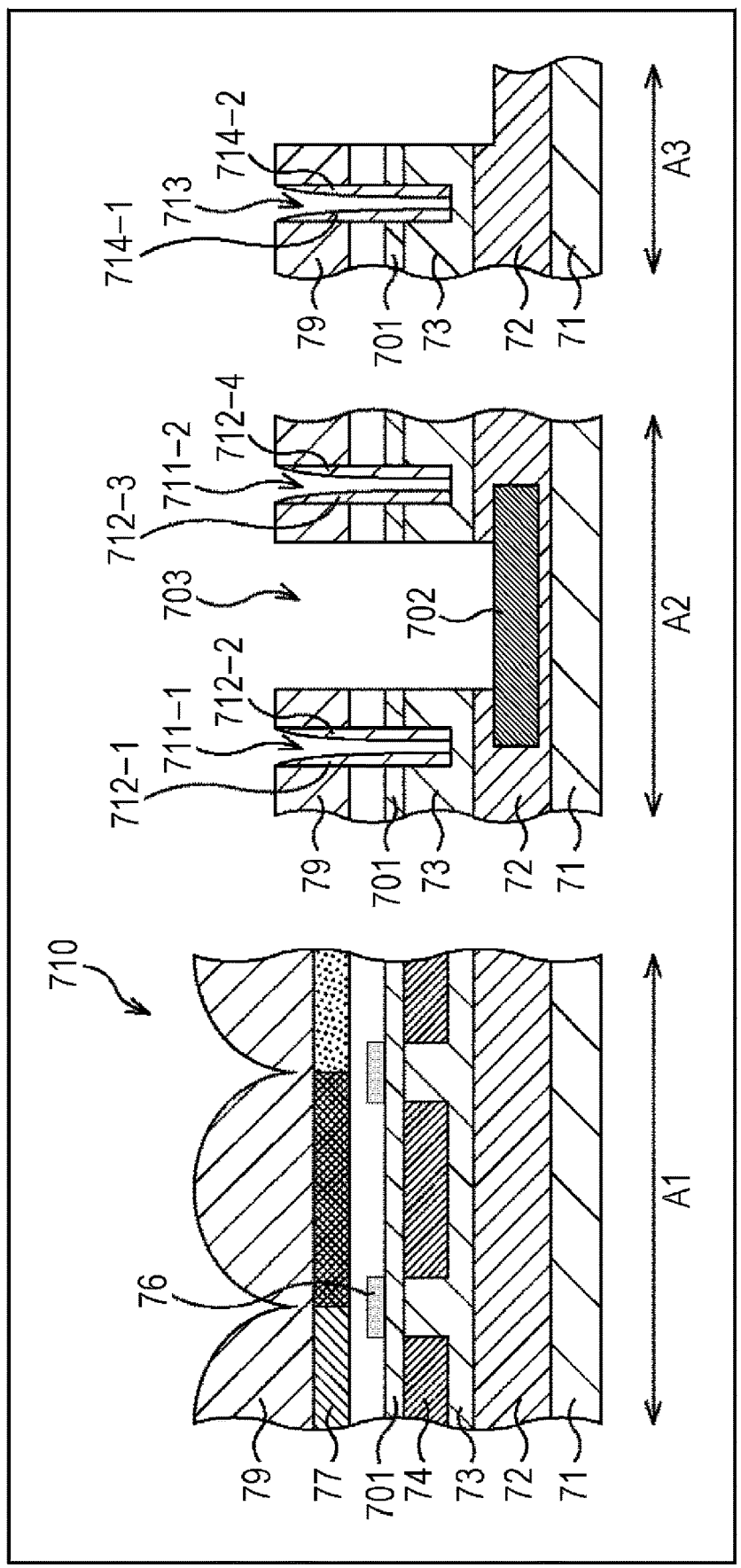
FIG. 65 is a diagram illustrating a configuration of a chip according to the seventh embodiment.

FIG. 65 illustrates another configuration of a chip according to the seventh embodiment. A chip 710 illustrated in FIG. 65 configures a backside-illumination type CMOS image sensor. In the chip 710 illustrated in FIG. 65, parts having the same configuration as in the chip 700 illustrated in FIG. 62 are denoted by the same reference numerals, and then a description will proceed.

In the configuration of the chip 710 illustrated in FIG. 65 according to the (7-2)-nd embodiment, the configuration in the pixel region A1 is the same as in the configuration of the chip 700 illustrated in FIG. 62 according to the (7-1)-st embodiment.

In the pad region A2 of the chip 710, grooves (slits) are formed at both sides of a pad opening portion 703, and hydrophobic films are formed in the grooves. A groove 711-1 is formed on the pixel region A1 side of the pad opening portion 703, and a hydrophobic film 712-1 and a hydrophobic film 712-2 are formed on the inner wall of the groove 711-1. Similarly, a groove 711-2 is formed at the scribe region A3 side of the pad opening portion 703, and a hydrophobic film 712-3 and a hydrophobic film 712-4 are formed on the inner wall of the groove 711-2.

The groove 711 is formed such that up to a part of a silicon substrate 73 in which the photodiode 74 is formed is excavated. The hydrophobic film 712 is formed on the inner side of the groove 711. In other words, the hydrophobic film 712 is formed to cover from the upper end of the microlens layer 79 to the part of the silicon substrate 73, and the front end of the hydrophobic film 704 is formed to come into contact with the silicon substrate 73.

A groove (slit) is formed in the scribe region A3, and a hydrophobic film is formed in the groove. A groove 713 is formed in the scribe region A3, and a hydrophobic film 714-1 and a hydrophobic film 714-2 are formed on the inner wall of the groove 713.

Similarly to the groove 711, the groove 713 is formed such that a part of the silicon substrate 73 in which the photodiode 74 is formed is excavated. The hydrophobic film 714 is formed on the inner side of the groove 713. In other words, the hydrophobic film 714 is formed to cover from the upper end of the microlens layer 79 to the part of the silicon substrate 73, and the front end of the hydrophobic film 704 is formed to come into contact with the silicon substrate 73.

As the groove is formed, and the hydrophobic film is formed as described above, the pixel region A1 in which the photodiode 74 is arranged and the region including the color filter layer 77 are surrounded by the silicon substrate 73 and the hydrophobic films 712 and 714 having a waterproofing property without a gap.

As a result, intrusion of moisture or impurities into the photodiode 74 and the color filter layer 77 is prevented, and an increase in a dark current and a change in spectral characteristics of a color filter are prevented.

A hydrophobic film formed along the inner wall of the pad opening portion or the side surface of the chip to be exposed to the outside such as the hydrophobic film 704 or the hydrophobic film 705 of the chip 700 of FIG. 62 is referred to as a "sidewall type." Meanwhile, a hydrophobic film embedded and formed in the inner side of the formed groove such as the hydrophobic film 712 or the hydrophobic film 714 of the chip 710 of FIG. 65 is referred to as an "embedded type."

The embedded type hydrophobic film can be formed to have a vertical step difference smaller than the sidewall type hydrophobic film.

As described above, according to the chip 710 of the (7-2)-nd embodiment, intrusion of moisture or impurities into the chip 710 is prevented by the hydrophobic film 712 and the hydrophobic film 714. Thus, the chip 710 with the improved moisture-proof performance can be implemented.

Since there is a stacked film interface in the pad opening portion 703 or the chip edge, moisture is more likely to intrude into the pad opening portion 703 or the chip edge than the surface of the chip. As the groove and the hydrophobic film are formed in the pad opening portion 703 and the chip edge to cover the stacked film interface, intrusion of moisture or impurities into the chip can be prevented.

Further, as the hydrophobic film is formed in the sidewall portion (the scribe region A3), force applied to each film interface at the time of dicing can be expected to be mitigated, and a possibility that film peeling or a crack will occur can be reduced.

Further, even when film peeling or a crack occurs, as the groove is formed, the occurrence of film peeling or a crack can be prevented by the groove, and the pad region A2 can be prevented from being influenced.

It is possible to reduce a possibility that film peeling or a crack will occur and reduce influence even when film peeling or a crack occurs, and thus the moisture-proof performance of the chip can be further improved.

(7-3)-Rd Embodiment

Figure 66:
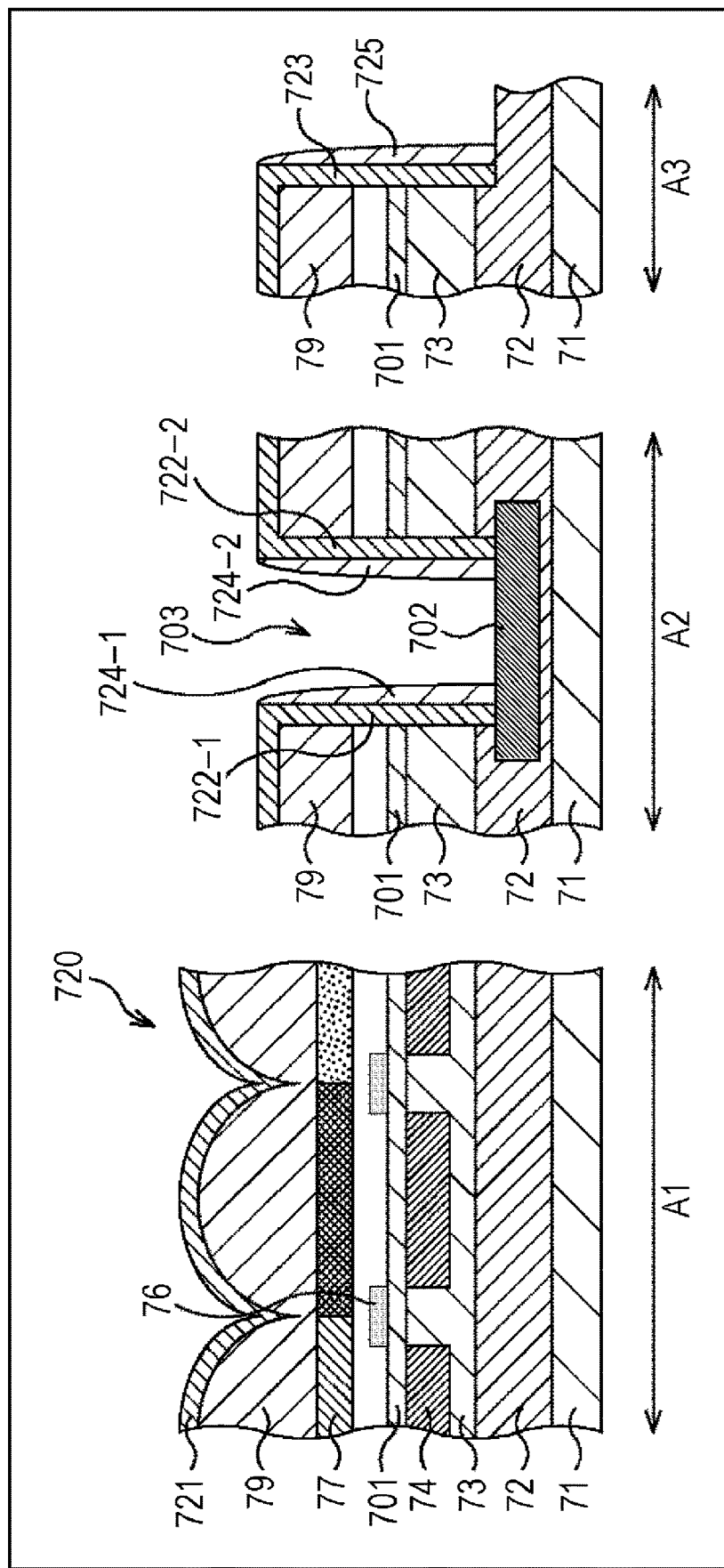
FIG. 66 is a diagram illustrating a configuration of a chip according to the seventh embodiment.

FIG. 66 illustrates another configuration of a chip according to the seventh embodiment. A chip 720 illustrated in FIG. 66 configures a backside-illumination type CMOS image sensor. In the chip 720 illustrated in FIG. 66, parts having the same configuration as in the chip 700 illustrated in FIG. 62 are denoted by the same reference numerals, and then a description will proceed.

In the chip 720 illustrated in FIG. 66, a passivation film 721 for preventing intrusion of moisture or impurities is formed on the surface of a microlens layer 79. For example, the passivation film 721 is formed of transparent SiN (silicon nitride) having a waterproofing property.

Here, the configuration of the passivation film 721 will be described in detail with reference to FIG. 63. The passivation film 721 can be roughly divided into a ceiling portion, a porous wall portion, and a sidewall portion.

The ceiling portion is formed to cover the entire region surrounded by the sidewall portion excluding the portion in which a pad opening portion 703 is formed. Further, a color filter layer 77 is arranged between the ceiling portion and a silicon substrate 73. The passivation film 721 is formed in the ceiling portion.

The porous wall portion is formed to cover the inner wall of each pad opening portion 703. The outer wall of the porous wall portion comes into contact with the silicon substrate 73, and the lower end of the porous wall portion comes into contact with the top surface of the electrode pad 702. A passivation film 722-1 and a passivation film 722-2 (FIG. 66) are formed in the porous wall portion.

Since FIG. 66 is a cross-sectional view of the chip 720, the passivation film 722 is illustrated to be formed on the inner wall of each pad opening portion 703, but since the pad opening portion 703 has a closed shape such as a circular shape or a square shape as illustrated in FIG. 63, the passivation film 722-1 and the passivation film 722-2 are formed as one uninterrupted passivation film.

For convenience of description, in the drawings subsequent to FIG. 66, the passivation film 722 formed on the pad opening portion 703 is illustrated as illustrated in FIG. 66, and the passivation film 722 will be described to be formed on the inner wall of each pad opening portion 703.

The sidewall portion is formed vertically to the surface of the silicon substrate 73 in the side surface of the chip 720 (the outer sidewall, that is, the outer wall of the chip 720). The sidewall portion covers the side surface of the chip 720 from the upper end of the microlens layer 79 to a part of the interconnection layer 72, and the inner wall of the sidewall portion comes into contact with the side surface of the silicon substrate 73. A passivation film 723 is formed in the sidewall portion.

Thus, the entire surface of the silicon substrate 73 including the pixel region A1 and the entire color filter layer 77 excluding the portion in which the pad opening portion 703 is formed are surrounded by the passivation film 721 of the ceiling portion and the passivation film 723 of the sidewall portion without a gap. Further, each inner wall (the porous wall portion) of the pad opening portion 703 is covered with the passivation film 722 without a gap.

As a result, intrusion of moisture or impurities from the surface (the upper portion) of the chip 720 is prevented by the passivation film 721 in the ceiling portion. Further, intrusion of moisture or impurities from the side of the chip 720 is prevented by the passivation film 722 in the porous wall portion and the passivation film 723 of the sidewall portion. Furthermore, intrusion of moisture or impurities from the bottom of the chip 720 is prevented by the bottom surface of the silicon substrate 73.

As a result, for example, even when the chip 720 is placed in an environment in which water vapor pressure is high, and moisture is rapidly diffused, an increase in a dark current and a change in spectral characteristics caused by intrusion of moisture or impurities into the surface of the photodiode 74 or the color filter layer 77 can be prevented.

Further, in the chip 720 illustrated in FIG. 66, the hydrophobic film is formed in the porous wall portion and the sidewall portion.

In the chip 720 illustrated in FIG. 66, a hydrophobic film 724-1 is formed in the pixel region A1 side of the pad opening portion 703, and a hydrophobic film 724-2 is formed in the scribe region A3 side of the pad opening portion 703.

The hydrophobic film 724 formed in the pad opening portion 703 is formed to covers the inner wall of the pad opening portion 703 from the upper end of the microlens layer 79 to the part of the silicon substrate in which the interconnection layer 72 is formed. The front end of the hydrophobic film 724 comes into contact with the top surface of the electrode pad 702.

A hydrophobic film 725 is formed at the chip edge. The hydrophobic film 724 formed in the sidewall portion covers the side surface of the chip 700 from the upper end of the microlens layer 79 to the part of the silicon substrate in which the interconnection layer 72 is formed. The front end of the hydrophobic film 725 comes into contact with the silicon substrate in which the interconnection layer 72 is formed.

As described above, the inner wall of each pad opening portion 703 of the chip 720 is covered with the hydrophobic film 724 without a gap. Further, the sidewall portion of the chip 720 is covered with the hydrophobic film 725 without a gap.

Since there is a stacked film interface in the porous wall portion and the sidewall portion, moisture is more likely to intrude into the porous wall portion and the sidewall portion than the surface of the chip. The hydrophobic film is formed in the porous wall portion and the sidewall portion to cover the stacked film interface, and thus intrusion of moisture or impurities into the chip can be prevented.

Further, as the hydrophobic film is formed in the sidewall portion (the scribe region A3), force applied to an interface between films at the time of dicing can be mitigated, and a possibility that film peeling or a crack will occur can be reduced. A possibility that film peeling or a crack will occur can be reduced, and thus the moisture-proof performance of the chip can be further improved.

As described above, the chip 720 illustrated in FIG. 66 has a structure in which intrusion of moisture or impurities is prevented by the film in which the two layers of the passivation film and the hydrophobic film are stacked. Thus, the chip 720 with the improved moisture-proof performance can be implemented.

Manufacturing of Chip According to (7-3)-Rd Embodiment

Figure 67:
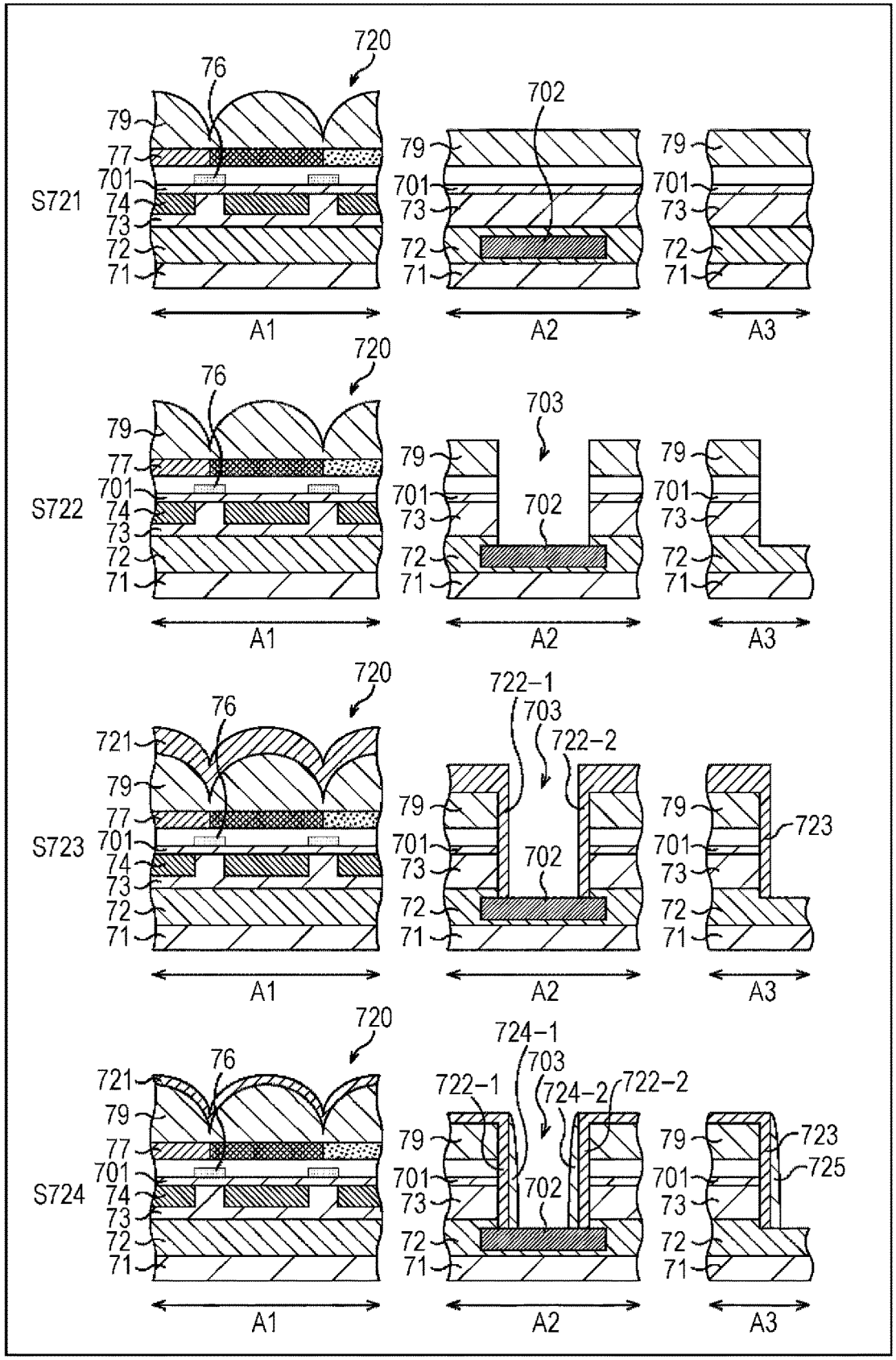
FIG. 67 is a diagram for describing a process of manufacturing a chip according to the seventh embodiment.

A process of manufacturing a chip (wafer) having such a groove will be described. FIG. 64 is a diagram for describing a process of manufacturing a chip prior to dicing. The manufacturing process which will be described with reference to FIG. 67 will focus on manufacturing of the hydrophobic film that is one of characteristic components of the present technology, a manufacturing method of a related art can be applied to manufacturing of other parts such as forming of layers, and thus a description thereof will be appropriately omitted.

In step S721, a semiconductor wafer in which the photodiode 74 and the like are formed is prepared.

In step S722, the pad opening portion 703 of the pad region A2 of the semiconductor wafer is formed. For example, the pad opening portion 703 is formed by etching after patterning.

In step S723, the passivation film 721, the passivation film 722, and the passivation film 723 are formed. After the passivation films are formed, a process of thinning the passivation films is performed as necessary.

In step S724, the hydrophobic film 704 and the hydrophobic film 705 are formed. The hydrophobic film 704 and the hydrophobic film 705 may be formed by F-based deposition by etching using CxFy-based gas or CxHyFz-based gas (for example, $CF_4$, $C_4F_8$, $C_5F_8$, $C_4F_6$, $CHF_3$, $CH_2F_2$, $CH_3F$, or $C_5HF_7$) or may be formed by self-alignment in the sidewall portion.

As the passivation film and the hydrophobic film are formed on the inner wall of the pad opening portion 703 (the porous wall portion) and the chip edge (the sidewall portion), the moisture-proof performance can be further improved.

As dicing is performed after the passivation film and the hydrophobic film are formed in the sidewall portion (the scribe region A3), force applied to an interface between films at the time of dicing can be mitigated, and a possibility that film peeling or a crack will occur can be reduced. A possibility that film peeling or a crack will occur can be reduced, and thus the moisture-proof performance of the chip can be further improved.

(7-4)-Th Embodiment

Figure 68:
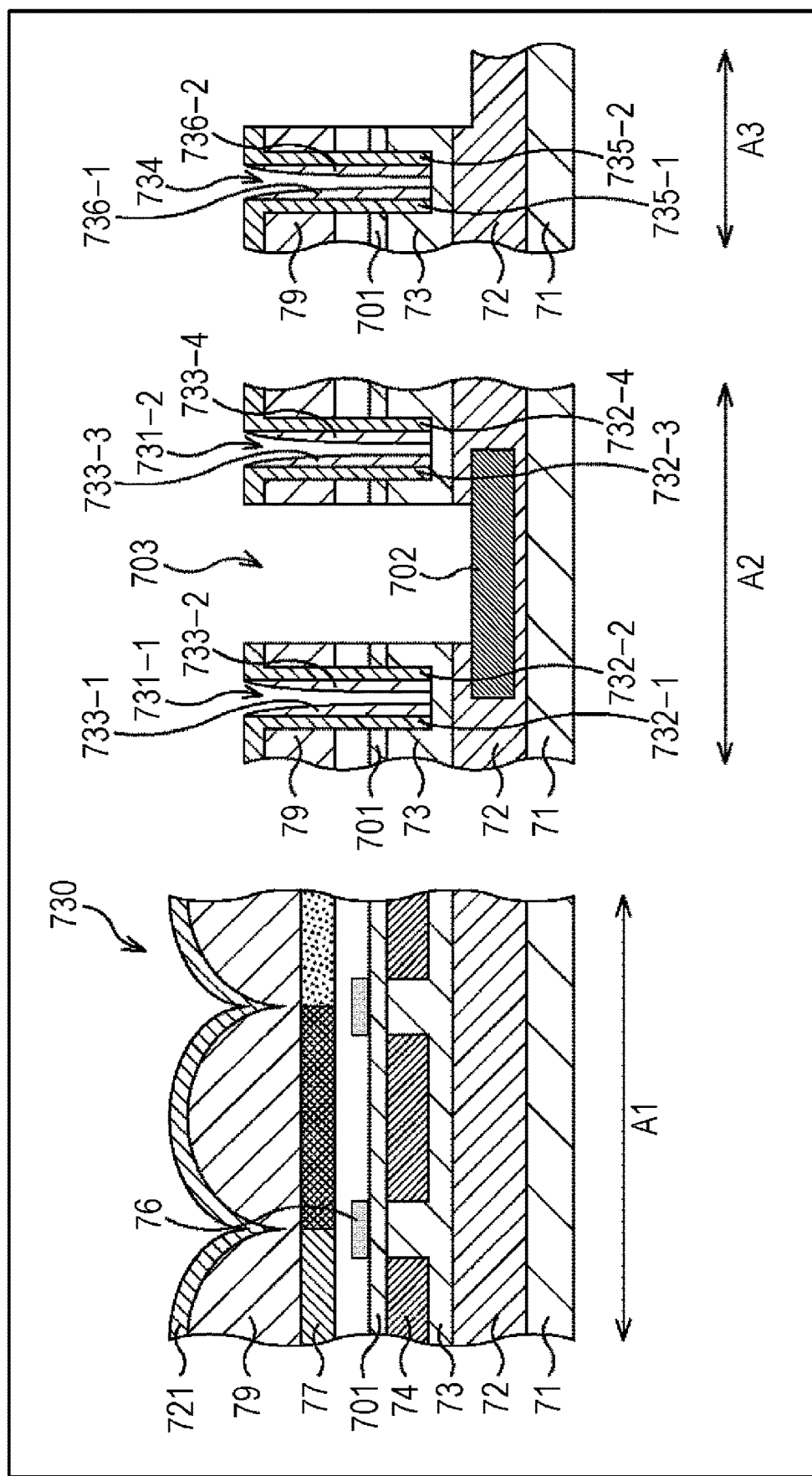
FIG. 68 is a diagram illustrating a configuration of a chip according to the seventh embodiment.

FIG. 68 illustrates another configuration of a chip according to the seventh embodiment. A chip 730 illustrated in FIG. 68 configures a backside-illumination type CMOS image sensor. In the chip 730 illustrated in FIG. 68, parts having the same configuration as in the chip 720 illustrated in FIG. 66 are denoted by the same reference numerals, and then a description will proceed.

In the configuration of the chip 730 illustrated in FIG. 68 according to the (7-4)-th embodiment, the configuration in the pixel region A1 is the same as in the configuration of the chip 720 illustrated in FIG. 66 according to the (7-3)-rd embodiment, and a passivation film 721 is formed on a microlens layer 79.

In a pad region A2 of the chip 730, grooves (slits) are formed at both sides of a pad opening portion 703, and a passivation film and a hydrophobic film are formed in the grooves. A groove 731-1 is formed on the pixel region A1 side of the pad opening portion 703, and on the inner wall of the groove 731-1, a hydrophobic film 733-1 is formed to be stacked on a passivation film 732-1, and a hydrophobic film 733-2 is formed to be stacked on a passivation film 732-2.

Similarly, a groove 731-2 is formed on a scribe region A3 side of the pad opening portion 703, and on the inner wall of the groove 731-2, a hydrophobic film 733-3 is formed to be stacked on a passivation film 732-3, and a hydrophobic film 733-4 is formed to be stacked on a passivation film 732-4.

The groove 731 is formed such that up to a part of the silicon substrate 73 in which the photodiode 74 is formed is excavated. The passivation film 732 and the hydrophobic film 733 are formed on the inner side of the groove 731. In other words, the passivation film 732 and the hydrophobic film 733 are formed to cover from the upper end of the microlens layer 79 to the part of the silicon substrate 73, and the passivation film 732 and the front end of the hydrophobic film 704 are formed to come into contact with the silicon substrate 73.

A groove (slit) is formed in the scribe region A3, and a hydrophobic film is formed in the groove. A groove 734 is formed in the scribe region A3, and on the inner wall of the groove 734, a hydrophobic film 736-1 is formed to be stacked on a passivation film 735-1, and a hydrophobic film 736-2 is formed to be stacked on a passivation film 735-2.

Similarly to the groove 731, the groove 734 is formed such that up to a part of the silicon substrate 73 in which the photodiode 74 is formed is excavated. The passivation film 735 and the hydrophobic film 736 are formed on the inner side of the groove 734. In other words, the passivation film 735 and the hydrophobic film 736 are formed to cover from the upper end of the microlens layer 79 to the part of the silicon substrate 73, and the front ends of the passivation film 735 and the hydrophobic film 736 are formed to come into contact with the silicon substrate 73.

As the groove is formed, and the passivation film and the hydrophobic film are formed as described above, the pixel region A1 in which the photodiode 74 is arranged and the region including the color filter layer 77 are surrounded by the silicon substrate 73, the passivation film, and the hydrophobic film having the waterproofing property without a gap. As a result, intrusion of moisture or impurities into the photodiode 74 and the color filter layer 77 is prevented, and an increase in a dark current and a change in spectral characteristics of a color filter are prevented.

As described above, according to the chip 730 according to the (7-4)-th embodiment, intrusion of moisture or impurities into the chip 730 is prevented by the passivation film and the hydrophobic film. Thus, the chip 730 with the improved moisture-proof performance can be implemented.

Since there is a stacked film interface on the pad opening portion 703 and the chip edge, moisture is more likely to intrude into the pad opening portion 703 and the chip edge than the surface of the chip. As the groove and the hydrophobic film are formed in the pad opening portion 703 and the chip edge, and the stacked film interface is covered with the hydrophobic film, intrusion of moisture or impurities into the chip can be prevented.

Further, as the hydrophobic film is formed in the sidewall portion (the scribe region A3), force applied to each film interface at the time of dicing can be expected to be mitigated, and a possibility that film peeling or a crack will occur can be reduced.

Further, even when film peeling or a crack occurs, as the groove is formed, the occurrence of film peeling or a crack can be prevented by the groove, and the pad region A2 can be prevented from being influenced.

It is possible to reduce a possibility that film peeling or a crack will occur and reduce influence even when film peeling or a crack occurs, and thus the moisture-proof performance of the chip can be further improved.

(7-5)-Th Embodiment

Figure 69:
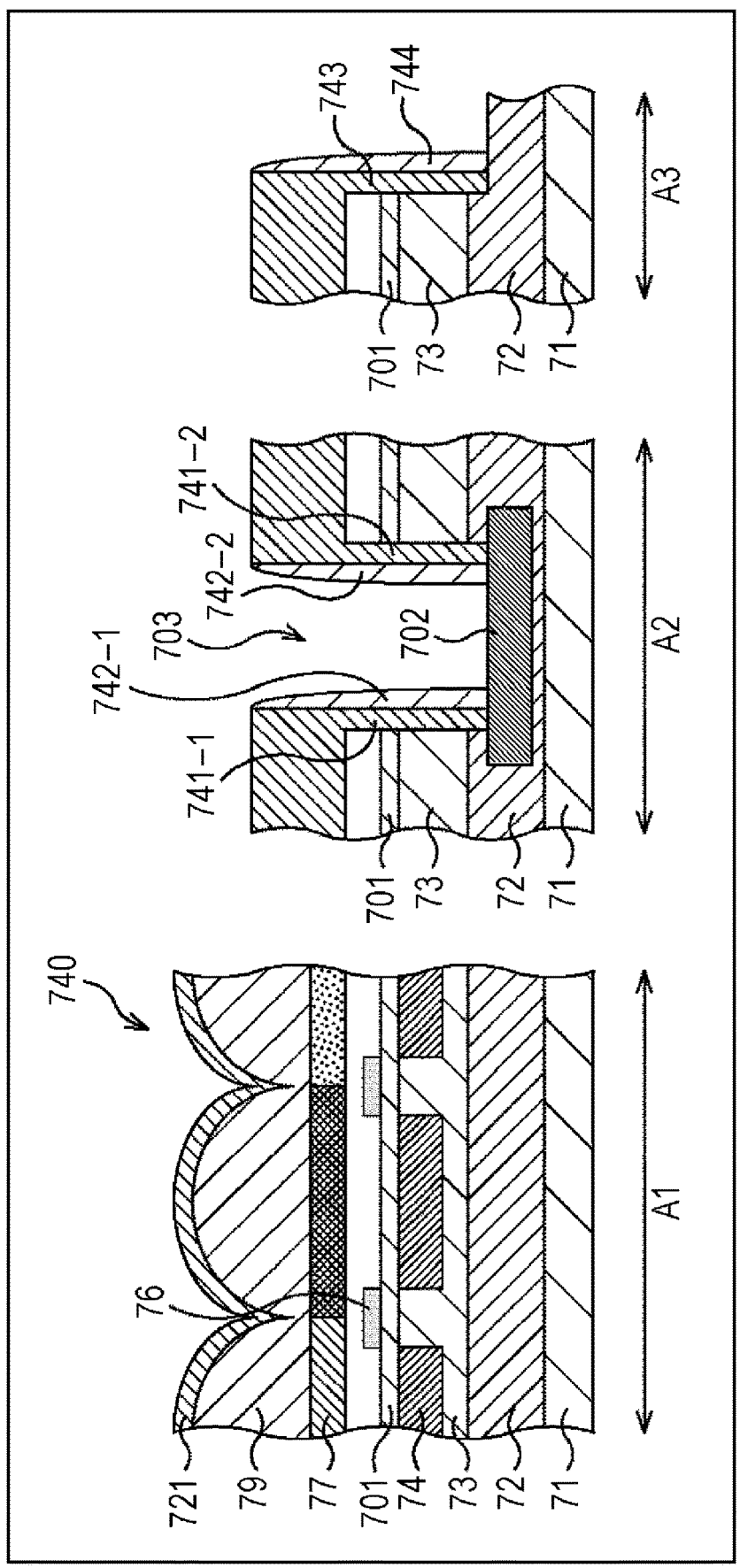
FIG. 69 is a diagram illustrating a configuration of a chip according to the seventh embodiment.

FIG. 69 illustrates another configuration of a chip according to the seventh embodiment. A chip 740 illustrated in FIG. 69 configures a backside-illumination type CMOS image sensor. In a chip 740 illustrated in FIG. 69, parts having the same configuration as in the chip 720 illustrated in FIG. 66 are denoted by the same reference numerals, and then a description will proceed.

In the chip 740 illustrated in FIG. 69, a passivation film 721 for preventing intrusion of moisture or impurities is formed on the surface of a microlens layer 79. This point is the same as in the chip 720 illustrated in FIG. 66, but the chip 740 illustrated in FIG. 69 is different from the chip 720 in that in a pad region A2 and a scribe region A3, no microlens layer 79 is formed, and a passivation film 721 is formed at a film thickness instead of the microlens layer 79.

In the pad region A2 and the scribe region A3, the photodiode 74 is not formed, and thus it is unnecessary to form a microlens. As no microlens layer 79 is formed in the pad region A2 and the scribe region A3, it is possible to reduce a possibility that moisture or the like will intrude into the microlens layer 79.

In the chip 740 illustrated in FIG. 69, similarly to the chip 720 illustrated in FIG. 66, a hydrophobic film is formed in the porous wall portion and the sidewall portion.

In the chip 740 illustrated in FIG. 69, a hydrophobic film 742-1 is formed to be stacked on a passivation film 741-1 on the pixel region A1 side of a pad opening portion 703, and a hydrophobic film 742-2 formed to be stacked on a passivation film 741-2 on the scribe region A3 side of the pad opening portion 703.

The passivation film 741 formed in the pad opening portion 703 is formed to cover the inner wall of the pad opening portion 703, and covers from the upper end of a planarization film 75 to the part of the silicon substrate in which the interconnection layer 72 is formed. The front end of the passivation film 741 comes into contact with the top surface of an electrode pad 702.

Similarly, the hydrophobic film 742 formed in the pad opening portion 703 is formed to cover the inner wall of the pad opening portion 703, and covers from the upper end of the passivation film 721 to the part of the silicon substrate in which the interconnection layer 72 is formed. The front end of the hydrophobic film 742 comes into contact with the top surface of the electrode pad 702.

The hydrophobic film 742 is formed to be stacked on the passivation film 743 at the chip edge. The passivation film 743 formed in the sidewall portion covers from the upper end of the planarization film 75 to the part of the silicon substrate in which the interconnection layer 72 is formed.

The front end of the passivation film 743 comes into contact with the silicon substrate in which an interconnection layer 72 is formed.

Similarly, a hydrophobic film 744 formed in the sidewall portion covers from the upper end of the passivation film 721 to the part of the silicon substrate in which the interconnection layer 72 is formed. The front end of the hydrophobic film 744 comes into contact with the silicon substrate in which the interconnection layer 72 is formed.

As described above, the inner wall of each pad opening portion 703 of the chip 740 is covered with the passivation film 741 and the hydrophobic film 742 without a gap. Further, the sidewall portion of the chip 740 is covered with the passivation film 743 and the hydrophobic film 742 without a gap.

Since there is a stacked film interface in the porous wall portion and the sidewall portion, moisture is more likely to intrude into the porous wall portion and the sidewall portion than the surface of the chip. The passivation film and the hydrophobic film are formed in the porous wall portion and the sidewall portion to cover the stacked film interface, and thus intrusion of moisture or impurities into the chip can be prevented. Further, the passivation film of the corresponding portion can be thickly formed, and thus the moisture proof effect can be further increased.

Further, as the passivation film and the hydrophobic film are formed in the sidewall portion (the scribe region A3) before dicing, force applied to an interface between films at the time of dicing can be mitigated, and a possibility that film peeling or a crack will occur can be reduced. A possibility that film peeling or a crack will occur can be reduced, and thus the moisture-proof performance of the chip can be further improved.

As described above, the chip 740 illustrated in FIG. 69 has a structure in which intrusion of moisture or impurities is prevented by the film in which the two layers of the passivation film and the hydrophobic film are stacked. Thus, the chip 740 with the improved moisture-proof performance can be implemented.

(7-6)-Th Embodiment

Figure 70:
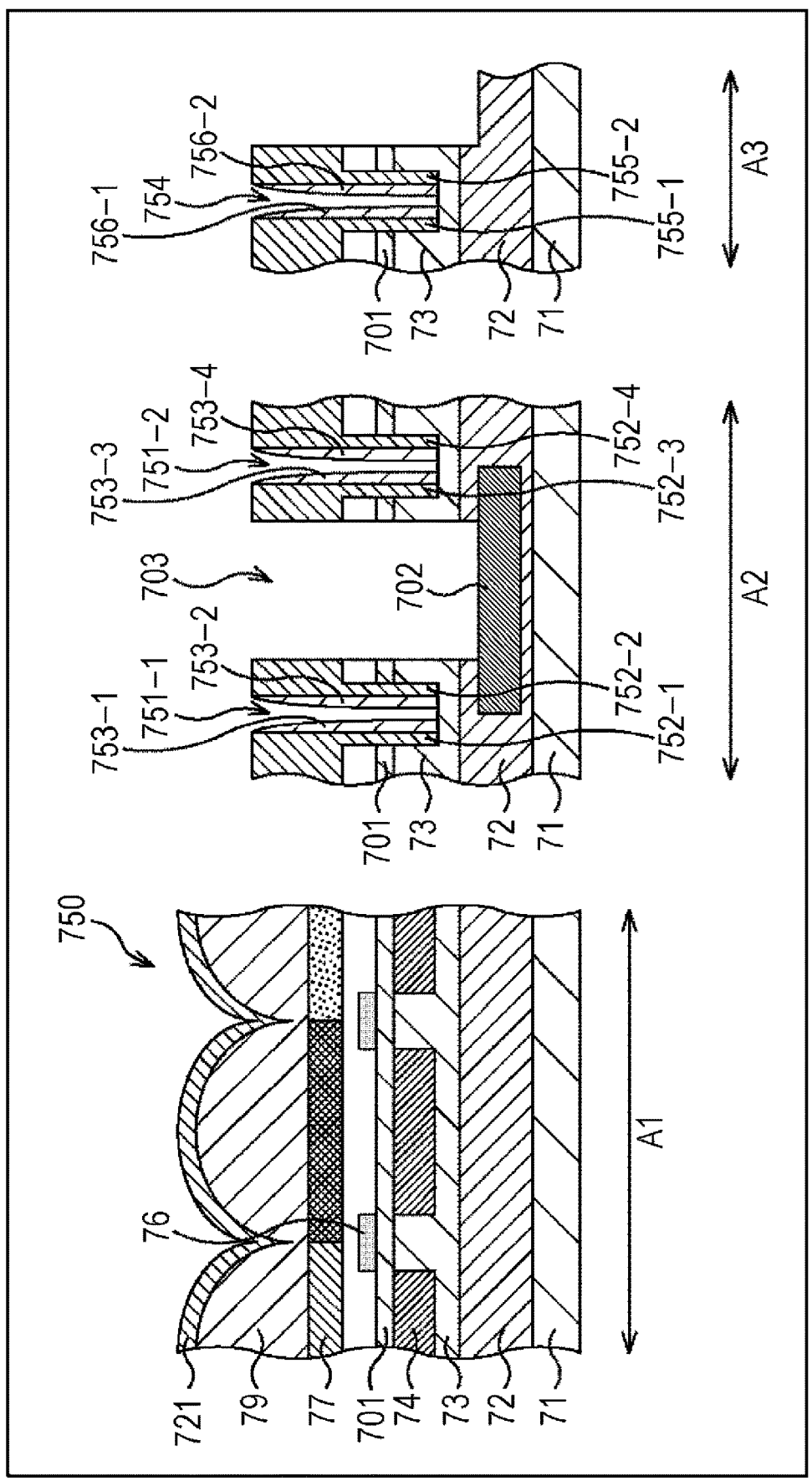
FIG. 70 is a diagram illustrating a configuration of a chip according to the seventh embodiment.

FIG. 70 illustrates another configuration of a chip according to the seventh embodiment. A chip 750 illustrated in FIG. 70 configures a backside-illumination type CMOS image sensor. In the chip 750 illustrated in FIG. 70, parts having the same configuration as in the chip 730 illustrated in FIG. 68 are denoted by the same reference numerals, and then a description will proceed.

In the chip 750 illustrated in FIG. 70, a passivation film 721 for preventing intrusion of moisture or impurities is formed on the surface of a microlens layer 79. This point is the same as in the chip 730 illustrated in FIG. 68, but the chip 750 illustrated in FIG. 70 is different from the chip 730 in that in a pad region A2 and a scribe region A3, no microlens layer 79 is formed, and a passivation film 721 is formed at a film thickness instead of the microlens layer 79.

In the pad region A2 and the scribe region A3, the photodiode 74 is not formed, and thus it is unnecessary to form a microlens. As no microlens layer 79 is formed in the pad region A2 and the scribe region A3, it is possible to reduce a possibility that moisture or the like will intrude into the microlens layer 79.

In the chip 750 illustrated in FIG. 70, similarly to the chip 730 illustrated in FIG. 68, a hydrophobic film is formed in the porous wall portion and the sidewall portion.

In the pad region A2 of the chip 750, grooves (slits) are formed at both sides of the pad opening portion 703, and a passivation film and a hydrophobic film are formed in the grooves. A groove 751-1 is formed at the pixel region A1 side of the pad opening portion 703, and on the inner wall of the groove 751-1, a hydrophobic film 753-1 is formed to be stacked on a passivation film 752-1, and a hydrophobic film 753-2 is formed to be stacked on a passivation film 752-2.

Similarly, a groove 751-2 is formed at the scribe region A3 side of the pad opening portion 703, and on the inner wall of the groove 751-2, a hydrophobic film 753-3 is formed to be stacked on a passivation film 752-3, and a hydrophobic film 753-4 is formed to be stacked on a passivation film 752-4.

The groove 751 is formed such that up to a part of the silicon substrate 73 in which the photodiode 74 is formed is excavated. The passivation film 752 and the hydrophobic film 753 are formed on the inner side of the groove 751. In other words, the passivation film 752 is formed to cover from the upper end of the planarization film 75 to the part of the silicon substrate 73, and the front end of the passivation film 752 is formed to come into contact with the silicon substrate 73.

The hydrophobic film 753 is formed to cover from the upper end of the passivation film 721 to the part of the silicon substrate 73, and the front end of the hydrophobic film 753 is formed to come into contact with the silicon substrate 73.

A groove (slit) is formed in the scribe region A3, and a hydrophobic film is formed in the groove. A groove 754 is formed in the scribe region A3, and on the inner wall of the groove 754, a hydrophobic film 756-1 is formed to be stacked on a passivation film 755-1, and a hydrophobic film 756-2 is formed to be stacked on a passivation film 755-2.

Similarly to the groove 751, a groove 754 is formed such that up to a part of the silicon substrate 73 in which the photodiode 74 is formed is excavated. The passivation film 755 and the hydrophobic film 756 are formed on the inner side of the groove 754. In other words, the passivation film 755 is formed to cover from the upper end of the planarization film 75 to the part of the silicon substrate 73, and the front end of the passivation film 755 is formed to come into contact with the silicon substrate 73.

The hydrophobic film 756 is formed to cover from the upper end of the passivation film 721 to the part of the silicon substrate 73, and the front end of the hydrophobic film 756 is formed to come into contact with the silicon substrate 73.

As the groove is formed, and the passivation film and the hydrophobic film are formed as described above, the pixel region A1 in which the photodiode 74 is arranged and the region including the color filter layer 77 are surrounded by the silicon substrate 73, passivation film, and the hydrophobic film having the waterproofing property without a gap. As a result, intrusion of moisture or impurities into the photodiode 74 and the color filter layer 77 is prevented, and an increase in a dark current and a change in spectral characteristics of a color filter are prevented.

As described above, according to the chip 750 of the (7-4)-th embodiment, intrusion of moisture or impurities into the chip 750 are prevented by the passivation film and the hydrophobic film. Thus, the chip 750 with the improved moisture-proof performance can be implemented.

Since there is a stacked film interface on the pad opening portion 703 and the chip edge, moisture is more likely to intrude into the pad opening portion 703 and the chip edge than the surface of the chip. As the groove and the hydrophobic film are formed in the pad opening portion 703 and the chip edge, and the stacked film interface is covered with the hydrophobic film, intrusion of moisture or impurities into the chip can be prevented.

Further, as the hydrophobic film is formed in the sidewall portion (the scribe region A3), force applied to each film interface at the time of dicing can be expected to be mitigated, and a possibility that film peeling or a crack will occur can be reduced.

Further, even when film peeling or a crack occurs, as the groove is formed, the occurrence of film peeling or a crack can be prevented by the groove, and the pad region A2 can be prevented from being influenced.

It is possible to reduce a possibility that film peeling or a crack will occur and reduce influence even when film peeling or a crack occurs, and thus the moisture-proof performance of the chip can be further improved.

(7-7)-Th Embodiment

Figure 71:
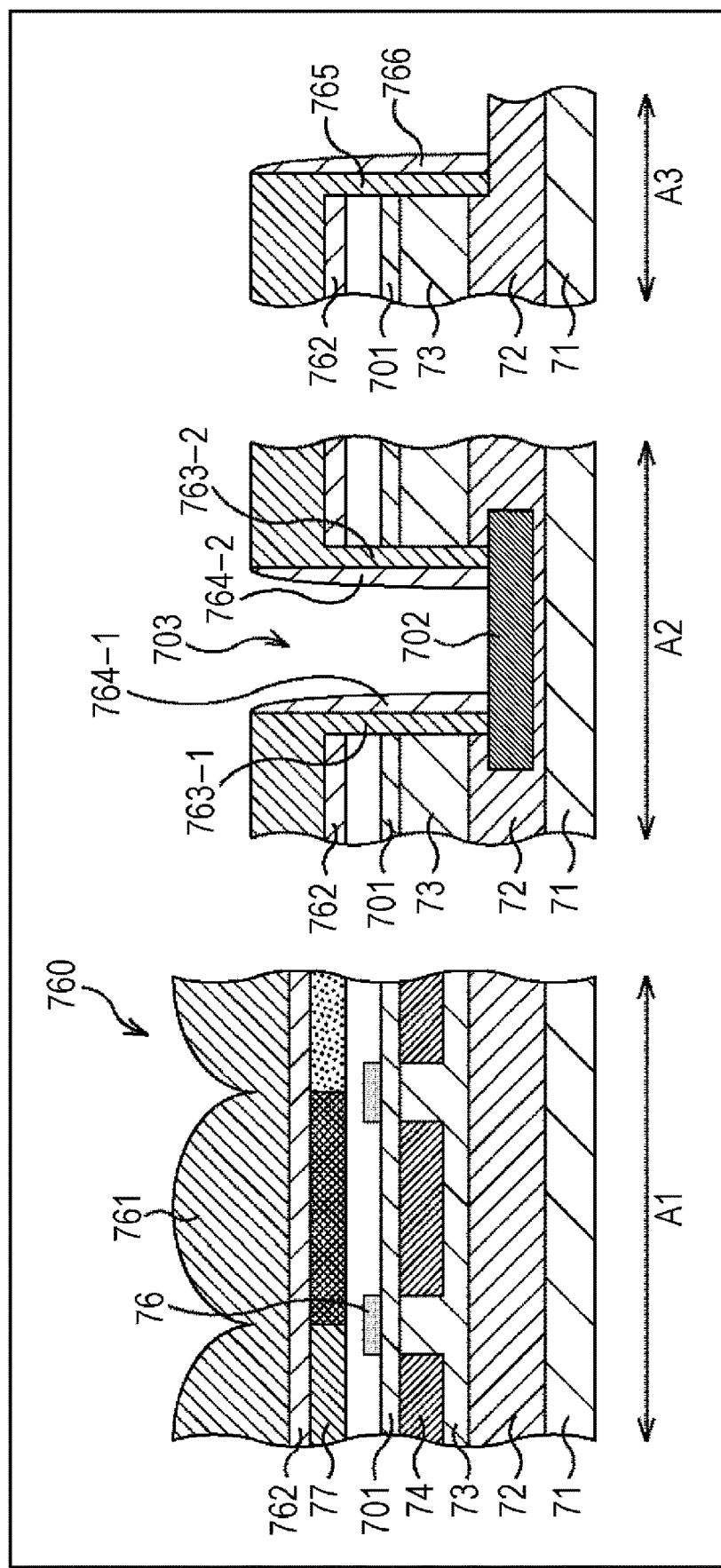
FIG. 71 is a diagram illustrating a configuration of a chip according to the seventh embodiment.

FIG. 71 illustrates another configuration of a chip according to the seventh embodiment. A chip 760 illustrated in FIG. 71 configures a backside-illumination type CMOS image sensor. In the chip 760 illustrated in FIG. 71, parts having the same configuration as in the chip 720 illustrated in FIG. 66 are denoted by the same reference numerals, and then a description will proceed.

The chip 760 of FIG. 71 is different from the chip 720 of FIG. 66 in that a microlens passivation film 761 and a planarization film 762 are formed instead of a passivation film 721 and a microlens layer 79.

The planarization film 762 is formed between a color filter layer 77 and the microlens passivation film 761 in order to planarize a region in which a microlens is formed.

For example, the microlens passivation film 761 is formed of SiN that is transparent and has a waterproofing property, and performs the functions of the microlens layer 79 and the passivation film 721 of FIG. 66 as well. The microlens passivation film 761 includes a ceiling portion, a porous wall portion, and a sidewall portion.

In the ceiling portion, in a pixel region A1, a microlens for collecting light onto the photodiode 74 of each pixel is formed for each pixel. The ceiling portion is formed to cover the entire region surrounded by the sidewall portion excluding the portion in which the pad opening portion 703 is formed.

A microlens passivation film 763-1 and a microlens passivation film 763-2 formed in the porous wall portion are formed to cover the inner wall of a pad opening portion 703. Further, the outer walls of the microlens passivation film 763-1 and the microlens passivation film 763-2 formed in the porous wall portion come into contact with the silicon substrate 73, and the lower ends of the microlens passivation film 763-1 and the microlens passivation film 763-2 formed in the porous wall portion come into contact with the top surface of an electrode pad 702.

A microlens passivation film 765 formed in the sidewall portion is formed to cover a range of the side surface of the chip 760 from the upper end of the planarization film 762 to a part of an interconnection layer 72. Further, the microlens passivation film 765 formed in the sidewall portion is vertical to the surface of a silicon substrate 73, and comes into contact with the side surface of the silicon substrate 73.

As a result, the pixel region A1 in which the photodiode 74 is arranged and the region including the color filter layer 77 are surrounded by the silicon substrate 73, the microlens passivation film 761, the microlens passivation film 763, and the microlens passivation film 765 having the waterproofing property without a gap. As a result, intrusion of moisture or impurities into the surface of the photodiode 74 and the color filter layer 77 is prevented, and an increase in a dark current and a change in spectral characteristics of a color filter are prevented.

Further, the microlens passivation film 761 functions as both a microlens and a passivation film having a waterproofing property, and thus it is possible to reduce the number of stacked layers of the chip 760 and the number of manufacturing processes.

In the chip 760 illustrated in FIG. 71, the hydrophobic film is formed in the porous wall portion and the sidewall portion.

In the chip 760 illustrated in FIG. 71, a hydrophobic film 764-1 is formed at the pixel region A1 side of the pad opening portion 703, and a hydrophobic film 764-2 is formed at the, the scribe region A3 side of the pad opening portion 703.

The hydrophobic film 764 formed in the pad opening portion 703 is formed to cover the inner wall of the pad opening portion 703, and covers from the upper end of the microlens passivation film 761 to the part of the silicon substrate in which the interconnection layer 72 is formed. The front end of the hydrophobic film 764 comes into contact with the top surface of the electrode pad 702.

A hydrophobic film 766 is formed in the sidewall portion. The hydrophobic film 766 formed in the sidewall portion covers the side surface of the chip 760 from the upper end of the microlens passivation film 761 to the part of the silicon substrate in which the interconnection layer 72 is formed. Further, the front end of the hydrophobic film 766 comes into contact with the silicon substrate in which the interconnection layer 72 is formed.

As described above, the inner wall of each pad opening portion 703 of the chip 760 is covered with the hydrophobic film 764 without a gap. Further, the sidewall portion of the chip 760 is covered with the hydrophobic film 766 without a gap.

Since there is a stacked film interface in the porous wall portion and the sidewall portion, moisture is more likely to intrude into the porous wall portion and the sidewall portion than the surface of the chip. As the hydrophobic film is formed in the porous wall portion and the sidewall portion to cover the stacked film interface, intrusion of moisture or impurities into the chip can be prevented.

Further, as the microlens passivation film and the hydrophobic film are formed in the sidewall portion (the scribe region A3), force applied to an interface between films at the time of dicing can be mitigated, and a possibility that film peeling or a crack will occur can be reduced. A possibility that film peeling or a crack will occur can be reduced, and thus the moisture-proof performance of the chip can be further improved.

As described above, the chip 760 illustrated in FIG. 71 has a structure in which intrusion of moisture or impurities is prevented by the film in which the two layers of the microlens passivation film and the hydrophobic film are stacked. Thus, the chip 760 with the improved moisture-proof performance can be implemented.

(7-8)-Th Embodiment

Figure 72:
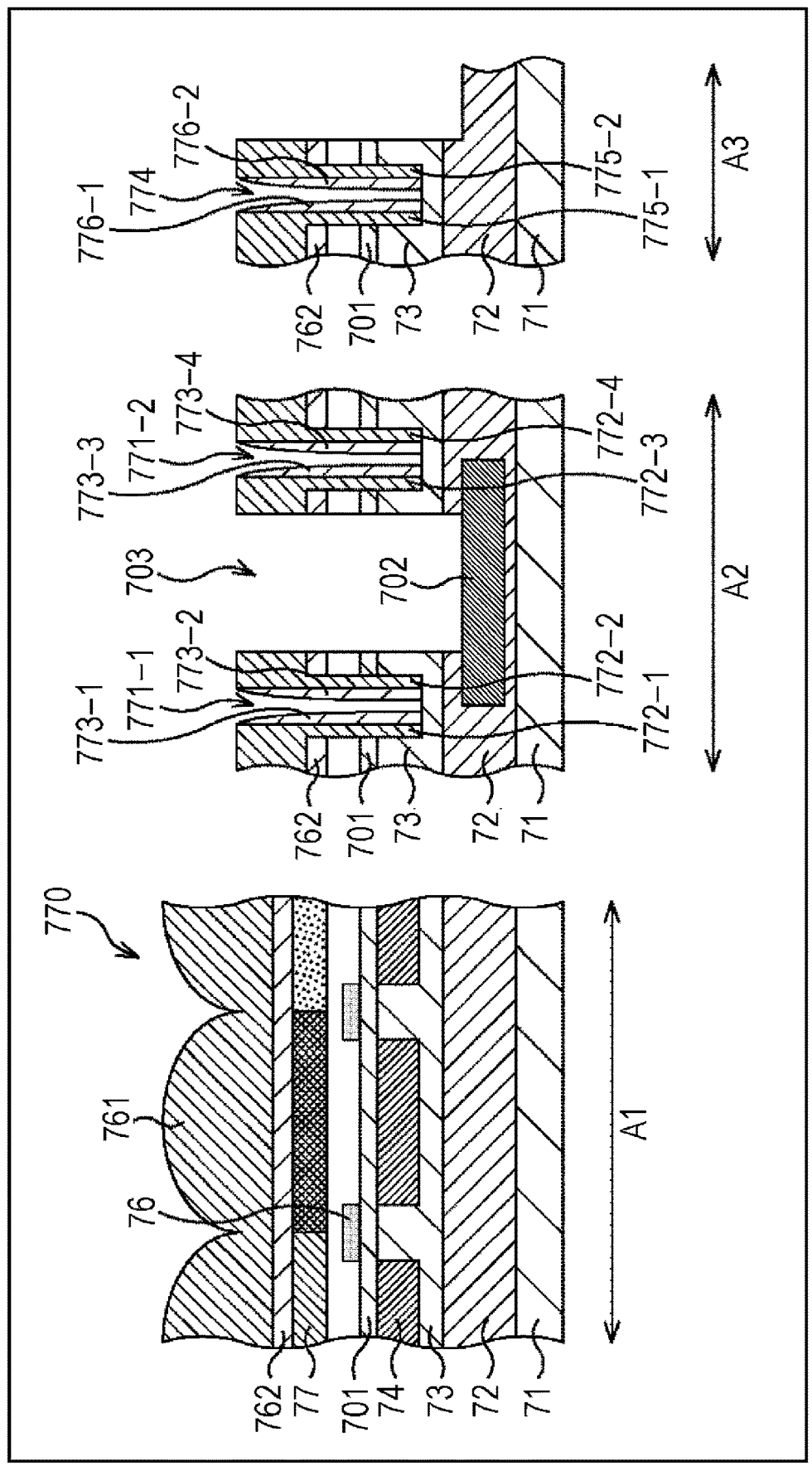
FIG. 72 is a diagram illustrating a configuration of a chip according to the seventh embodiment.

FIG. 72 illustrates another configuration of a chip according to the seventh embodiment. A chip 770 illustrated in FIG. 72 configures a backside-illumination type CMOS image sensor. In the chip 770 illustrated in FIG. 72, parts having the same configuration as in the chip 730 illustrated in FIG. 68 are denoted by the same reference numerals, and then a description will proceed.

The chip 770 of FIG. 72 is different from the chip 730 of FIG. 68 in that a microlens passivation film 761 and a planarization film 762 are formed instead of the passivation film 721 and the microlens layer 79.

The planarization film 762 is formed between a color filter layer 77 and a microlens passivation film 761 in order to planarize a region in which a microlens is formed.

For example, the microlens passivation film 761 is formed of SiN that is transparent and has a waterproofing property, and performs the functions of the microlens layer 79 and the passivation film 721 of FIG. 68 as well. The microlens passivation film 761 includes a ceiling portion, a porous wall portion, and a sidewall portion.

In the ceiling portion, in a pixel region A1, a microlens for collecting light onto a photodiode 74 of each pixel is formed for each pixel. Further, the ceiling portion is formed to cover the entire region surrounded by the sidewall portion excluding the portion in which a pad opening portion 703 is formed.

In the pad region A2 of the chip 770, grooves (slits) are formed at both sides of the pad opening portion 703, and the microlens passivation film and the hydrophobic film are formed in the grooves. A groove 771-1 is formed at the pixel region A1 side of the pad opening portion 703, and on the inner wall of the groove 771-1, a hydrophobic film 773-1 is formed to be stacked on a microlens passivation film 772-1, and a hydrophobic film 773-2 is formed to be stacked on a microlens passivation film 772-2.

Similarly, a groove 771-2 is formed at the scribe region A3 side of the pad opening portion 703, and on the inner wall of the groove 771-2, a hydrophobic film 773-3 is formed to be stacked on a microlens passivation film 772-3, and a hydrophobic film 773-4 is formed to be stacked on a microlens passivation film 772-4.

The groove 771 is formed such that up to a part of the silicon substrate 73 in which the photodiode 74 is formed is excavated. The microlens passivation film 772 and the hydrophobic film 773 are formed on the inner side of the groove 771. In other words, the microlens passivation film 772 is formed to cover from the upper end of the planarization film 762 to the part of the silicon substrate 73, and the front end of the microlens passivation film 772 is formed to come into contact with the silicon substrate 73.

The hydrophobic film 773 is formed to cover from the upper end of the microlens passivation film 761 to the part of the silicon substrate 73, and the front end of the hydrophobic film 773 is formed to come into contact with the silicon substrate 73.

A groove (slit) is formed in the scribe region A3, and a hydrophobic film is formed in the groove. A groove 774 is formed in the scribe region A3, and on the inner wall of the groove 774, a hydrophobic film 776-1 is formed to be stacked on a microlens passivation film 775-1, and a hydrophobic film 776-2 is formed to be stacked on a microlens passivation film 775-2.

Similarly to the groove 771, the groove 774 is formed such that up to a part of the silicon substrate 73 in which the photodiode 74 is formed is excavated. The microlens passivation film 775 and the hydrophobic film 776 are formed on the inner side of the groove 774.

In other words, the microlens passivation film 775 is formed to cover from the upper end of the planarization film 762 to the part of the silicon substrate 73, and the front end of the microlens passivation film 775 is formed to come into contact with the silicon substrate 73.

The hydrophobic film 776 is formed to cover from the upper end of the microlens passivation film 761 to the part of the silicon substrate 73, and the front end of the hydrophobic film 776 is formed to come into contact with the silicon substrate 73.

As the groove is formed, and the microlens passivation film and the hydrophobic film are formed as described above, the pixel region A1 in which the photodiode 74 is arranged and the region including the color filter layer 77 are surrounded by the silicon substrate 73, the microlens passivation film, and the hydrophobic film having the waterproofing property without a gap. As a result, intrusion of moisture or impurities into the photodiode 74 and the color filter layer 77 is prevented, and an increase in a dark current and a change in spectral characteristics of a color filter are prevented.

As described above, according to the chip 770 of the (7-8)-th embodiment, intrusion of moisture or impurities into the chip 770 is prevented by the microlens passivation film and the hydrophobic film. Thus, the chip 770 with the improved moisture-proof performance can be implemented.

Since there is a stacked film interface on the pad opening portion 703 and the chip edge, moisture is more likely to intrude into the pad opening portion 703 and the chip edge than the surface of the chip. As the groove and the hydrophobic film are formed in the pad opening portion 703 and the chip edge, and the stacked film interface is covered with the hydrophobic film, intrusion of moisture or impurities into the chip can be prevented.

Further, as the hydrophobic film is formed in the sidewall portion (the scribe region A3), force applied to each film interface at the time of dicing can be expected to be mitigated, and a possibility that film peeling or a crack will occur can be reduced.

Further, even when film peeling or a crack occurs, as the groove is formed, the occurrence of film peeling or a crack can be prevented by the groove, and the pad region A2 can be prevented from being influenced.

It is possible to reduce a possibility that film peeling or a crack will occur and reduce influence even when film peeling or a crack occurs, and thus the moisture-proof performance of the chip can be further improved.

(7-9)-Th Embodiment

Figure 73:
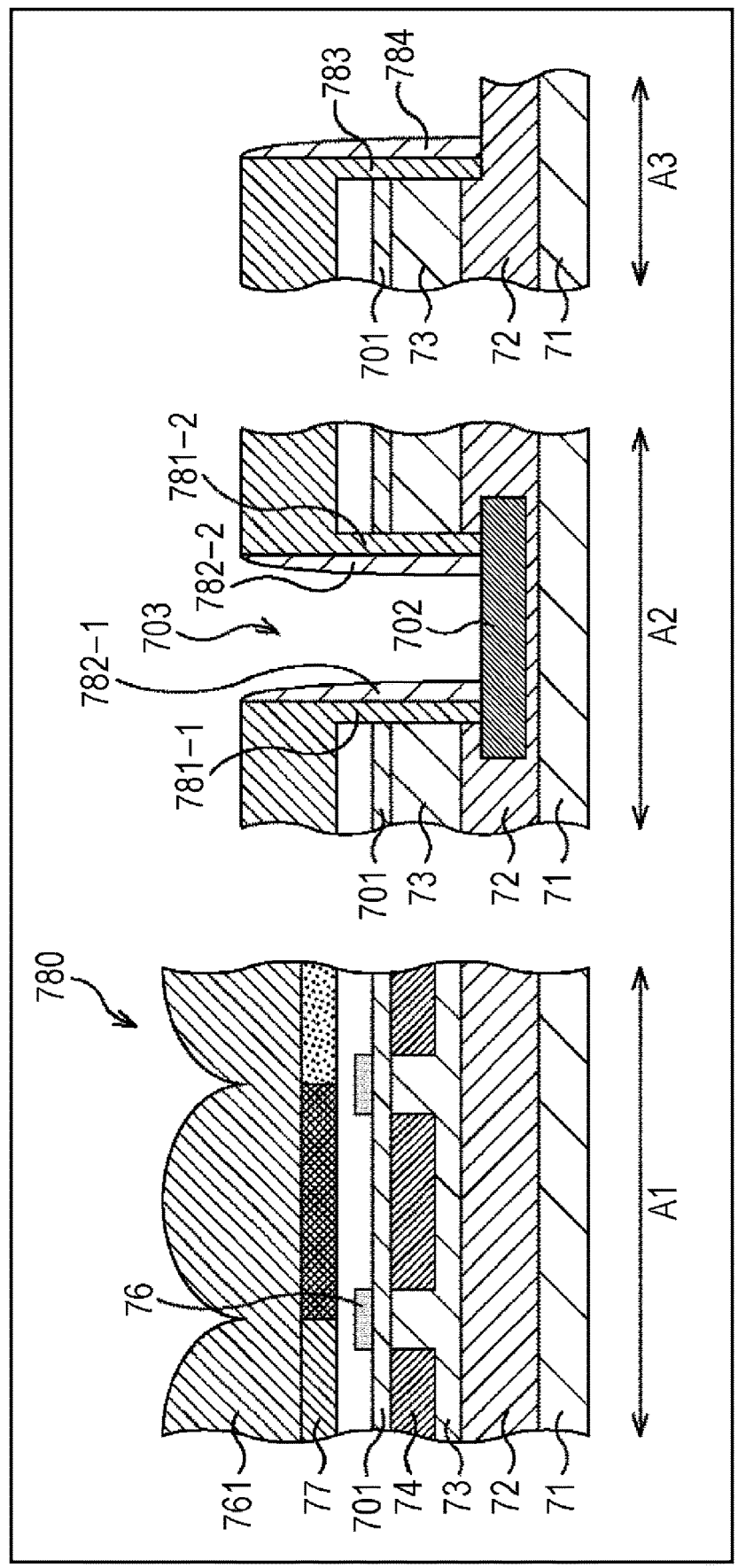
FIG. 73 is a diagram illustrating a configuration of a chip according to the seventh embodiment.

FIG. 73 illustrates another configuration of a chip according to the seventh embodiment. A chip 780 illustrated in FIG. 73 configures a backside-illumination type CMOS image sensor. In the chip 780 illustrated in FIG. 73, parts having the same configuration as in the chip 760 illustrated in FIG. 71 are denoted by the same reference numerals, and then a description will proceed.

The chip 780 of FIG. 73 has a configuration in which the planarization film 762 is removed from the chip 760 of FIG. 71. In other words, the ceiling portion of a microlens passivation film 761 of the chip 780 illustrated in FIG. 73 comes into contact with the top surface of a color filter layer 77.

As a result, the chip 780 is slightly lower in flatness of a microlens than the chip 760 of FIG. 71, but it is possible to realize a reduction in a manufacturing process and a cost reduction while implementing the same waterproofing effect.

In the chip 780 of FIG. 73, similarly to the chip 760 of FIG. 71, for example, a microlens passivation film 761 is formed of SiN that is transparent and has a waterproofing property, and includes the ceiling portion, the porous wall portion, and the sidewall portion.

The microlens passivation film 761 formed in the ceiling portion is formed for each pixel as the microlens for collecting light onto a photodiode 74 of each pixel in the pixel region A1. Further, the ceiling portion is formed to cover the entire region surrounded by the sidewall portion excluding the portion in which a pad opening portion 703 is formed.

A microlens passivation film 781-1 and a microlens passivation film 781-2 formed in the porous wall portion are formed to cover the inner wall of the pad opening portion 703. Further, the outer walls of the microlens passivation film 781-1 and the microlens passivation film 781-2 formed in the porous wall portion come into contact with the silicon substrate 73, and the lower ends of the microlens passivation film 781-1 and the microlens passivation film 781-2 formed in the porous wall portion come into contact with the top surface of an electrode pad 702.

A microlens passivation film 783 formed in the sidewall portion is formed to cover a range of the side surface of the chip 780 from the upper end of the planarization film 75 to a part of an interconnection layer 72. Further, the microlens passivation film 783 formed in the sidewall portion is vertical to the surface of the interconnection layer 72, and comes into contact with the side surface of the interconnection layer 72.

As a result, the pixel region A1 in which the photodiode 74 is arranged and the region including the color filter layer 77 are surrounded by the silicon substrate 73, the microlens passivation film 761, the microlens passivation film 781, and the microlens passivation film 783 having the waterproofing property without a gap. As a result, intrusion of moisture or impurities into the surface of the photodiode 74 and the color filter layer 77 is prevented, and an increase in a dark current and a change in spectral characteristics of a color filter are prevented.

Further, the microlens passivation film 761 functions as both a microlens and a passivation film having a waterproofing property, and thus it is possible to reduce the number of stacked layers of the chip 780 and the number of manufacturing processes.

In the chip 780 illustrated in FIG. 73, the hydrophobic film is formed in the porous wall portion and the sidewall portion.

In the chip 780 illustrated in FIG. 73, a hydrophobic film 782-1 is formed at the pixel region A1 side of the pad opening portion 703, and a hydrophobic film 782-2 is formed at the scribe region A3 side of the pad opening portion 703.

The hydrophobic film 782 formed on the pad opening portion 703 is formed to cover the inner wall of the pad opening portion 703, and covers from the upper end of the microlens passivation film 761 to the part of the silicon substrate in which the interconnection layer 72 is formed. The front end of the hydrophobic film 782 comes into contact with the top surface of the electrode pad 702.

A hydrophobic film 784 is formed in the sidewall portion. The hydrophobic film 784 formed in the sidewall portion covers the side surface of the chip 780 from the upper end of the microlens passivation film 761 to the part of the silicon substrate in which the interconnection layer 72 is formed. Further, the front end of the hydrophobic film 784 comes into contact with the silicon substrate in which the interconnection layer 72 is formed.

As described above, the inner wall of each pad opening portion 703 of the chip 780 is covered with the hydrophobic film 782 without a gap. Further, the sidewall portion of the chip 780 is covered with the hydrophobic film 784 without a gap.

Since there is a stacked film interface in the porous wall portion and the sidewall portion, moisture is more likely to intrude into the porous wall portion and the sidewall portion than the surface of the chip. As the hydrophobic film is formed in the porous wall portion and the sidewall portion to cover the stacked film interface, intrusion of moisture or impurities into the chip can be prevented.

Further, as the microlens passivation film and the hydrophobic film are formed in the sidewall portion (the scribe region A3), force applied to an interface between films at the time of dicing can be mitigated, and a possibility that film peeling or a crack will occur can be reduced. A possibility that film peeling or a crack will occur can be reduced, and thus the moisture-proof performance of the chip can be further improved.

As described above, the chip 780 illustrated in FIG. 73 has a structure in which intrusion of moisture or impurities is prevented by the film in which the two layers of the microlens passivation film and the hydrophobic film are stacked. Thus, the chip 780 with the improved moisture-proof performance can be implemented.

(7-10)-Th Embodiment

Figure 74:
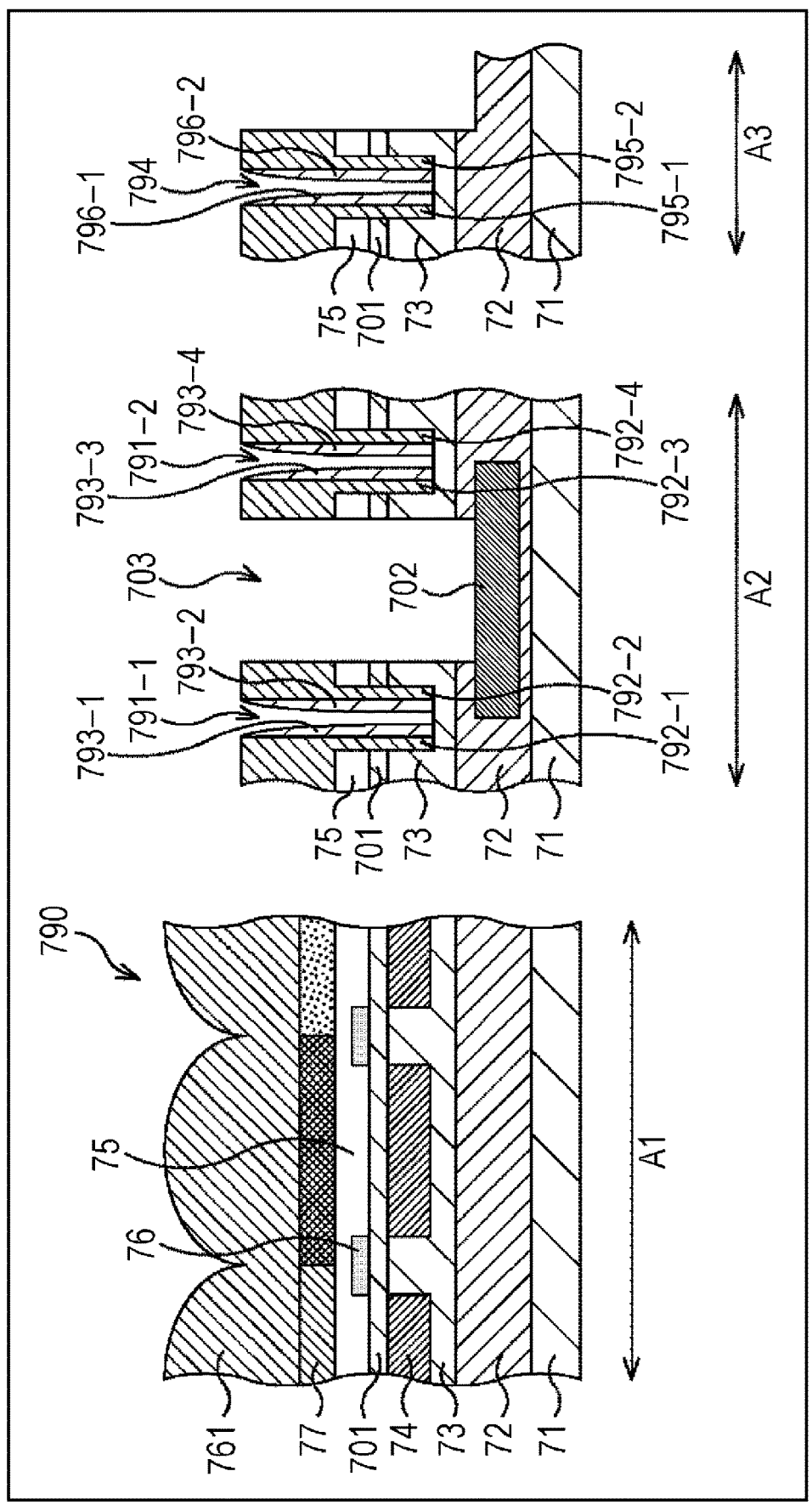
FIG. 74 is a diagram illustrating a configuration of a chip according to the seventh embodiment.

FIG. 74 illustrates another configuration of a chip according to the seventh embodiment. A chip 790 illustrated in FIG. 74 configures a backside-illumination type CMOS image sensor. In the chip 790 illustrated in FIG. 74, parts having the same configuration as in the chip 770 illustrated in FIG. 72 are denoted by the same reference numerals, and then a description will proceed.

The chip 790 of FIG. 74 has a configuration in which the planarization film 762 is removed from the chip 770 of FIG. 72. In other words, the ceiling portion of a microlens passivation film 761 of the chip 790 illustrated in FIG. 74 comes into contact with the top surface of a color filter layer 77.

As a result, the chip 790 is slightly lower in flatness of a microlens than the chip 770 of FIG. 72, but it is possible to realize a reduction in a manufacturing process and a cost reduction while implementing the same waterproofing effect.

In the chip 790 of FIG. 74, similarly to the chip 770 of FIG. 72, for example, the microlens passivation film 761 is formed of SiN that is transparent and has a waterproofing property, and includes the ceiling portion, the porous wall portion, and the sidewall portion.

The microlens passivation film 761 formed in the ceiling portion is formed for each pixel as the microlens for collecting light onto a photodiode 74 of each pixel in a pixel region A1. Further, the ceiling portion is formed to cover the entire region surrounded by the sidewall portion excluding the portion in which a pad opening portion 703 is formed.

In a pad region A2 of the chip 790, grooves (slits) are formed at both sides of the pad opening portion 703, and the microlens passivation film and the hydrophobic film are formed in the grooves. A groove 791-1 is formed on the pixel region A1 side of the pad opening portion 703, and on the inner wall of the groove 791-1, a hydrophobic film 793-1 is formed to be stacked on a microlens passivation film 792-1, and a hydrophobic film 793-2 is formed to be stacked on a microlens passivation film 792-2.

Similarly, a groove 791-2 is formed on a scribe region A3 side of the pad opening portion 703, and on the inner wall of the groove 791-2, a hydrophobic film 793-3 is formed to be stacked on a microlens passivation film 792-3, and a hydrophobic film 793-4 is formed to be stacked on a microlens passivation film 792-4.

The groove 791 is formed such that up to a part of the silicon substrate 73 in which the photodiode 74 is formed is excavated. The microlens passivation film 792 and the hydrophobic film 793 are formed on the inner side of the groove 791. In other words, the microlens passivation film 792 is formed to cover from the upper end of a planarization film 75 to the part of the silicon substrate 73, and the front end of the microlens passivation film 792 is formed to come into contact with the silicon substrate 73.

The hydrophobic film 793 is formed to cover from the upper end of the microlens passivation film 761 to the part of the silicon substrate 73, and the front end of the hydrophobic film 793 is formed to come into contact with the silicon substrate 73.

A groove (slit) is formed in the scribe region A3, and a hydrophobic film is formed in the groove. A groove 794 is formed in the scribe region A3, and on the inner wall of the groove 794, a hydrophobic film 796-1 is formed to be stacked on a microlens passivation film 795-1, and a hydrophobic film 796-2 is formed to be stacked on a microlens passivation film 795-2.

Similarly to the groove 791, the groove 794 is formed such that up to a part of the silicon substrate 73 in which the photodiode 74 is formed is excavated. The microlens passivation film 795 and the hydrophobic film 796 are formed on the inner side of the groove 794.

In other words, the microlens passivation film 795 is formed to cover the upper end of the planarization film 75 to the part of the silicon substrate 73, and the front end of the microlens passivation film 795 is formed to come into contact with the silicon substrate 73.

The hydrophobic film 796 is formed to cover from the upper end of the microlens passivation film 761 to the part of the silicon substrate 73, and the front end of the hydrophobic film 796 is formed to come into contact with the silicon substrate 73.

As the groove is formed, and the microlens passivation film and the hydrophobic film are formed as described above, the pixel region A1 in which the photodiode 74 is arranged and the region including the color filter layer 77 are surrounded by the silicon substrate 73, the microlens passivation film, and the hydrophobic film having the waterproofing property without a gap. As a result, intrusion of moisture or impurities into the photodiode 74 and the color filter layer 77 is prevented, and an increase in a dark current and a change in spectral characteristics of a color filter are prevented.

As described above, according to the chip 790 of the (7-10)-th embodiment, intrusion of moisture or impurities into the chip 790 can be prevented by is prevented by the microlens passivation film and the hydrophobic film. Thus, the chip 790 with the improved moisture-proof performance can be implemented.

Since there is a stacked film interface on the pad opening portion 703 and the chip edge, moisture is more likely to intrude into the pad opening portion 703 and the chip edge than the surface of the chip. As the groove and the hydrophobic film are formed in the pad opening portion 703 and the chip edge, and the stacked film interface is covered with the hydrophobic film, intrusion of moisture or impurities into the chip can be prevented.

Further, as the hydrophobic film is formed in the sidewall portion (the scribe region A3), force applied to each film interface at the time of dicing can be expected to be mitigated, and a possibility that film peeling or a crack will occur can be reduced.

Further, even when film peeling or a crack occurs, as the groove is formed, the occurrence of film peeling or a crack can be prevented by the groove, and the pad region A2 can be prevented from being influenced.

It is possible to reduce a possibility that film peeling or a crack will occur and reduce influence even when film peeling or a crack occurs, and thus the moisture-proof performance of the chip can be further improved.

(7-11)-Th Embodiment

Figure 75:
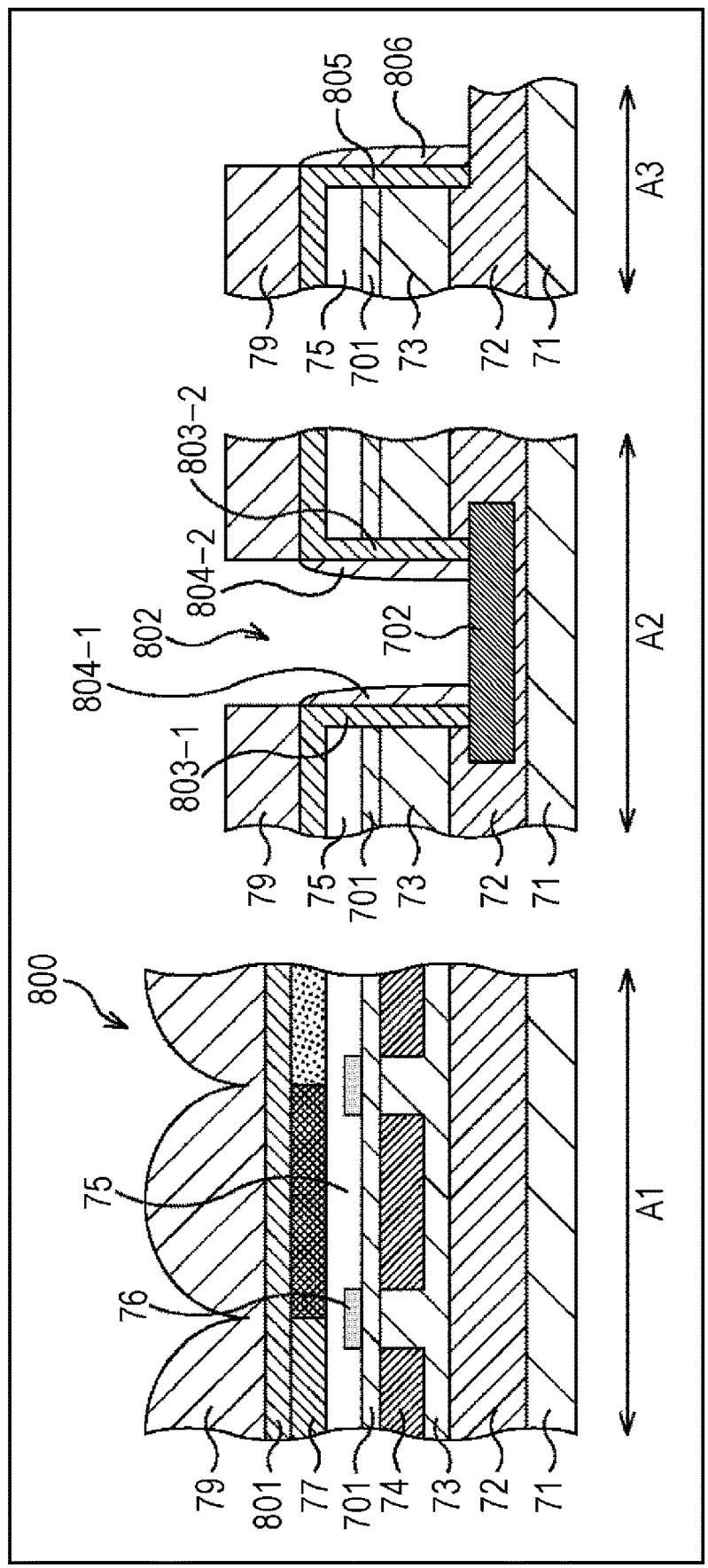
FIG. 75 is a diagram illustrating a configuration of a chip according to the seventh embodiment.

FIG. 75 illustrates another configuration of a chip according to the seventh embodiment. A chip 800 illustrated in FIG. 75 configures a backside-illumination type CMOS image sensor. In the chip 800 illustrated in FIG. 75, parts having the same configuration as in the chip 720 illustrated in FIG. 66 are denoted by the same reference numerals, and then a description will proceed.

In the chip 800 illustrated in FIG. 75, a passivation film 801 for preventing intrusion of moisture or impurities is formed between a microlens layer 79 and a color filter layer 77. For example, the passivation film 801 is formed of transparent SiN (silicon nitride) having a waterproofing property.

A ceiling portion of the passivation film 801 is formed between the color filter layer 77 and the microlens layer 79, and comes into contact with the top surface of a color filter layer 77 and the bottom surface of the microlens layer 79. Here, in the pad region A2 and the scribe region A3 in which the color filter layer 77 is not formed, the ceiling portion is formed between a planarization film 75 and the microlens layer 79 and comes into contact with the top surface of the planarization film 75 and the bottom surface of the microlens layer 79.

The passivation film 801 formed in the ceiling portion is formed to cover the entire region surrounded by the sidewall portion excluding a portion in which a pad opening portion 802 is formed. Further, the color filter layer 77 is arranged between the passivation film 801 formed in the ceiling portion and the silicon substrate 73.

The passivation film 801 formed in the porous wall portion is formed to cover the inner wall of each pad opening portion 802, and a passivation film 803-1 and a passivation film 803-2 (FIG. 75) are formed. The passivation film 803 formed in the porous wall portion comes into contact with a silicon substrate 73, and the lower end of the porous wall portion comes into contact with the top surface of an electrode pad 702.

As the passivation film 801 formed in the sidewall portion, a passivation film 805 is formed on the side surface of the chip 800 (the outer sidewall, that is, the outer wall of the chip 800) vertically to the surface of the silicon substrate 73. The passivation film 805 formed in the sidewall portion covers a range of the side surface of the chip 800 from the upper end of the planarization film 75 to a part of the interconnection layer 72, and the inner wall of the sidewall portion comes into contact with the side surface of the silicon substrate 73.

Thus, excluding the portion in which the pad opening portion 802 is formed, the entire surface of the silicon substrate 73 including the pixel region A1 and the entire color filter layer 77 are surrounded by the passivation film 801 in the ceiling portion and the passivation film 805 in the sidewall portion without a gap. Further, the inner wall (the porous wall portion) of each pad opening portion 802 is covered with the passivation film 803 without a gap.

As a result, intrusion of moisture or impurities from the surface (the upper portion) of the chip 800 is prevented by the passivation film 801 in the ceiling portion and the passivation film 803 in the sidewall portion. Further, intrusion of moisture or impurities from the side of the chip 800 is prevented by the passivation film 805 in the sidewall portion. Furthermore, intrusion of moisture or impurities from the bottom of the chip 800 is prevented by the bottom surface of the silicon substrate 73.

As a result, for example, even when the chip 800 is placed in an environment in which water vapor pressure is high, and moisture is rapidly diffused, an increase in a dark current and a change in spectral characteristics caused by intrusion of moisture or impurities into the surface of a photodiode 74 or the color filter layer 77 can be prevented.

Further, in the chip 800 illustrated in FIG. 75, the hydrophobic film is formed in the porous wall portion and the sidewall portion.

In the chip 800 illustrated in FIG. 75, a hydrophobic film 804-1 is formed at the pixel region A1 side of the pad opening portion 802, and a hydrophobic film 804-2 is formed at the scribe region A3 side of the pad opening portion 802.

The hydrophobic film 804 formed in the pad opening portion 802 is formed to cover the inner wall of the pad opening portion 802, and covers from the upper end of the passivation film 801 to the part of the silicon substrate in which the interconnection layer 72 is formed. The front end of the hydrophobic film 804 comes into contact with the top surface of the electrode pad 702.

A hydrophobic film 806 is formed at the chip edge. The hydrophobic film 806 formed in the sidewall portion covers the side surface of the chip 800 from the upper end of the passivation film 801 to the part of the silicon substrate in which the interconnection layer 72 is formed. Further, the front end of the hydrophobic film 806 comes into contact with the silicon substrate in which the interconnection layer 72 is formed.

As described above, the inner wall of each pad opening portion 802 of the chip 800 is covered with the hydrophobic film 804 without a gap. Further, the sidewall portion of the chip 800 is covered with the hydrophobic film 806 without a gap.

Since there is a stacked film interface in the porous wall portion and the sidewall portion, moisture is more likely to intrude into the porous wall portion and the sidewall portion than the surface of the chip. As the hydrophobic film is formed in the porous wall portion and the sidewall portion to cover the stacked film interface, intrusion of moisture or impurities into the chip can be prevented.

Further, as the hydrophobic film is formed in the sidewall portion (the scribe region A3), force applied to an interface between films at the time of dicing can be mitigated, and a possibility that film peeling or a crack will occur can be reduced. A possibility that film peeling or a crack will occur can be reduced, and thus the moisture-proof performance of the chip can be further improved.

As described above, the chip 800 illustrated in FIG. 75 has a structure in which intrusion of moisture or impurities is prevented by the film in which the two layers of the passivation film and the hydrophobic film are stacked. Thus, the chip 800 with the improved moisture-proof performance can be implemented.

(7-12)-Th Embodiment

Figure 76:
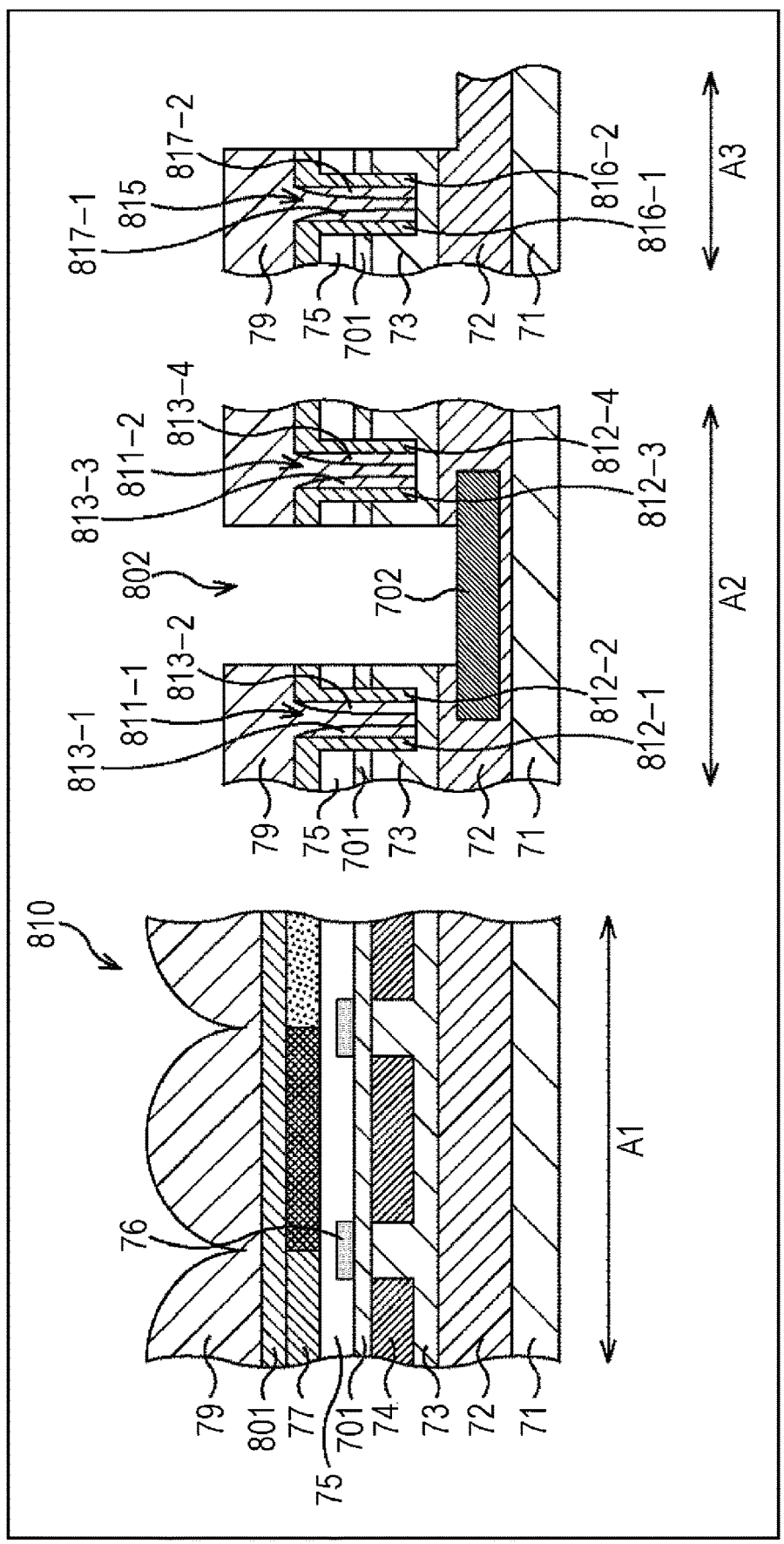
FIG. 76 is a diagram illustrating a configuration of a chip according to the seventh embodiment.

FIG. 76 illustrates another configuration of a chip according to the seventh embodiment. A chip 810 illustrated in FIG. 76 configures a backside-illumination type CMOS image sensor. In the chip 810 illustrated in FIG. 76, parts having the same configuration as in the chip 710 illustrated in FIG. 65 are denoted by the same reference numerals, and then a description will proceed.

In the chip 810 illustrated in FIG. 76, a passivation film 801 for preventing intrusion of moisture or impurities is formed between a microlens layer 79 and a color filter layer 77. For example, the passivation film 801 is formed of transparent SiN (silicon nitride) having a waterproofing property.

A ceiling portion of the passivation film 801 is formed between the color filter layer 77 and the microlens layer 79, and comes into contact with the top surface of the color filter layer 77 and the bottom surface of the microlens layer 79. Here, in a pad region A2 and a scribe region A3 in which the color filter layer 77 is not formed, the ceiling portion is formed between a planarization film 75 and the microlens layer 79 and comes into contact with the top surface of the planarization film 75 and the bottom surface of the microlens layer 79.

In the pad region A2 of the chip 810, grooves (slits) are formed at both ends of the pad opening portion 802, and a passivation film and a hydrophobic film are formed in the grooves.

A groove 811-1 is formed on the pixel region A1 side of the pad opening portion 802, and on the inner wall of the groove 811-1, a hydrophobic film 813-1 is formed to be stacked on a passivation film 812-1, and a hydrophobic film 813-2 is formed to be stacked on a passivation film 812-2. The groove 811-1 is filled with the same material as the material for forming the microlens layer 79, and formed to be consecutive to the microlens layer 79.

Similarly, a groove 811-2 is formed on the scribe region A3 side of the pad opening portion 802, and on the inner wall of the groove 811-2, a hydrophobic film 813-3 is formed to be stacked on a passivation film 812-3, and a hydrophobic film 813-4 is formed to be stacked on a passivation film 812-4. The groove 811-2 is filled with the same material as the material for forming the microlens layer 79.

The groove 811 is formed such that up to a part of the silicon substrate 73 in which the photodiode 74 is formed is excavated. The passivation film 812 and the hydrophobic film 813 are formed on the inner side of the groove 811. In other words, the passivation film 812 is formed to cover from the upper end of the planarization film 75 to the part of the silicon substrate 73, and the front end of the passivation film 812 is formed to come into contact with the silicon substrate 73.

The hydrophobic film 813 is formed to cover from the upper end of the passivation film 801 to the part of the silicon substrate 73, and the front end of the hydrophobic film 813 is formed to come into contact with the silicon substrate 73. In other words, the hydrophobic film 813 is formed to cover the side surface of the passivation film 801.

A groove (slit) is formed in a scribe region A3, and a passivation film and a hydrophobic film are formed in the groove. A groove 815 is formed in the scribe region A3, and on the inner wall of the groove 815, a hydrophobic film 817-1 is formed to be stacked on a passivation film 816-1, and a hydrophobic film 817-2 is formed to be stacked on a passivation film 816-2.

The groove 815 is filled with the same material as the material for forming the microlens layer 79.

Similarly to the groove 811, the groove 815 is formed such that up to a part of the silicon substrate 73 in which the photodiode 74 is formed is excavated. The passivation film 816 and the hydrophobic film 817 are formed on the inner side of the groove 815. In other words, the passivation film 816 is formed to cover from the upper end of the planarization film 75 to the part of the silicon substrate 73, and the front end of the passivation film 816 is formed to come into contact with the silicon substrate 73.

The hydrophobic film 817 is formed to cover from the upper end of the passivation film 801 to the part of the silicon substrate 73, and the front end of the hydrophobic film 817 is formed to come into contact with the silicon substrate 73. In other words, the hydrophobic film 817 is formed to cover the side surface of the passivation film 801.

As the groove is formed, and the passivation film and the hydrophobic film are formed as described above, the pixel region A1 in which the photodiode 74 is arranged and the region including the color filter layer 77 is surrounded by the silicon substrate 73, passivation film, and the hydrophobic film having the waterproofing property without a gap. As a result, intrusion of moisture or impurities into the photodiode 74 and the color filter layer 77 is prevented, and an increase in a dark current and a change in spectral characteristics of a color filter are prevented.

As described above, according to the chip 810 of the (7-12)-th embodiment, intrusion of moisture or impurities into the chip 810 is prevented by the passivation film and the hydrophobic film. Thus, the chip 810 with the improved moisture-proof performance can be implemented.

Since there is a stacked film interface on the pad opening portion 703 and the chip edge, moisture is more likely to intrude into the pad opening portion 703 and the chip edge than the surface of the chip. As the groove and the hydrophobic film are formed in the pad opening portion 703 and the chip edge, and the stacked film interface is covered with the hydrophobic film, intrusion of moisture or impurities into the chip can be prevented.

Further, as the hydrophobic film is formed in the sidewall portion (the scribe region A3), force applied to each film interface at the time of dicing can be expected to be mitigated, and a possibility that film peeling or a crack will occur can be reduced.

Further, even when film peeling or a crack occurs, as the groove is formed, the occurrence of film peeling or a crack can be prevented by the groove, and the pad region A2 can be prevented from being influenced.

It is possible to reduce a possibility that film peeling or a crack will occur and reduce influence even when film peeling or a crack occurs, and thus the moisture-proof performance of the chip can be further improved.

Further, since the portion in which the groove is formed is filled with the same material as the material for forming the microlens layer 79, the configuration in which intrusion of moisture or the like is not allowed can be provided, and the moisture-proof performance can be further improved.

(7-13)-Th Embodiment

Figure 77:
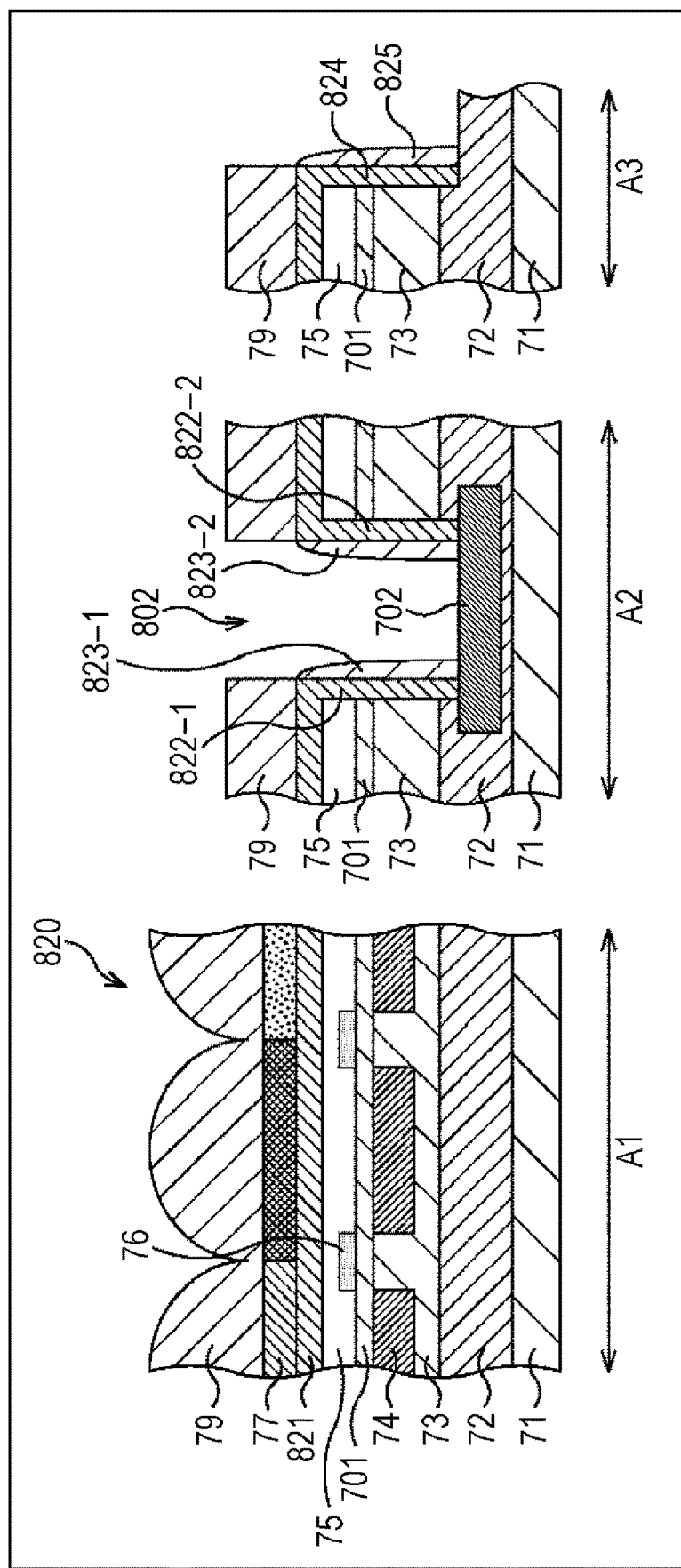
FIG. 77 is a diagram illustrating a configuration of a chip according to the seventh embodiment.

FIG. 77 illustrates another configuration of a chip according to the seventh embodiment. A chip 820 illustrated in FIG. 77 configures a backside-illumination type CMOS image sensor. In the chip 820 illustrated in FIG. 77, parts having the same configuration as in the chip 800 illustrated in FIG. 75 are denoted by the same reference numerals, and then a description will proceed.

In the chip 820 illustrated in FIG. 77, a passivation film 821 for preventing intrusion of moisture or impurities is formed between a planarization film 75 and a color filter layer 77. For example, the passivation film 821 is formed of transparent SiN (silicon nitride) having a waterproofing property.

A ceiling portion of the passivation film 821 is formed between the planarization film 75 and the color filter layer 77, and comes into contact with the top surface of the planarization film 75 and the bottom surface of the color filter layer 77. Here, in a pad region A2 and a scribe region A3 in which the color filter layer 77 is not formed, the ceiling portion is formed between the planarization film 75 and a microlens layer 79 and comes into contact with the top surface of the planarization film 75 and the bottom surface of the microlens layer 79.

The passivation film 821 formed in the ceiling portion is formed to cover the entire region surrounded by the sidewall portion excluding a portion in which a pad opening portion 802 is formed.

The passivation film 821 formed in the porous wall portion is formed to cover the inner wall of each pad opening portion 802, and a passivation film 822-1 and a passivation film 822-2 are formed. The passivation film 822 formed in the porous wall portion comes into contact with a silicon substrate 73, and the lower end of the porous wall portion comes into contact with the top surface of an electrode pad 702.

A passivation film 824 formed in the sidewall portion is formed on the side surface of the chip 820 (the outer sidewall, that is, the outer wall of the chip 820) vertical to the surface of the silicon substrate 73, and formed as the passivation film 824. The passivation film 824 formed in the sidewall portion covers a range of the side surface of the chip 820 from the upper end of the planarization film 75 to a part of an interconnection layer 72, and the inner wall of the sidewall portion comes into contact with the side surface of the silicon substrate 73.

Thus, excluding the portion in which the pad opening portion 802 is formed, the entire surface of the silicon substrate 73 including a pixel region A1 is surrounded by the passivation film 821 in the ceiling portion and the passivation film 824 in the sidewall portion without a gap. Further, the inner wall (the porous wall portion) of each pad opening portion 802 is covered with the passivation film 822 without a gap.

As a result, intrusion of moisture or impurities from the surface (the upper portion) of the chip 820 is prevented by the passivation film 821 in the ceiling portion and the passivation film 822 in the sidewall portion. Further, intrusion of moisture or impurities from the side of the chip 820 is prevented by the passivation film 824 in the sidewall portion. Furthermore, intrusion of moisture or impurities from the bottom of the chip 820 is prevented by the bottom surface of the silicon substrate 73.

As a result, for example, even when the chip 820 is placed in an environment in which water vapor pressure is high, and moisture is rapidly diffused, an increase in a dark current and a change in spectral characteristics caused by intrusion of moisture or impurities into the surface of the photodiode 74 or the color filter layer 77 can be prevented.

Further, in the chip 820 illustrated in FIG. 77, the hydrophobic film is formed in the porous wall portion and the sidewall portion.

In the chip 820 illustrated in FIG. 77, a hydrophobic film 823-1 is formed at the pixel region A1 side of the pad opening portion 802, and a hydrophobic film 823-2 is formed at the scribe region A3 side of the pad opening portion 802.

The hydrophobic film 823 formed in the pad opening portion 802 is formed to cover the inner wall of the pad opening portion 802, and covers from the upper end of the passivation film 821 to the part of the silicon substrate in which the interconnection layer 72 is formed. The front end of the hydrophobic film 823 comes into contact with the top surface of the electrode pad 702.

A hydrophobic film 825 is formed at the chip edge. The hydrophobic film 825 formed in the sidewall portion covers the side surface of the chip 820 from the upper end of the passivation film 821 to the part of the silicon substrate in which the interconnection layer 72 is formed. Further, the front end of the hydrophobic film 825 comes into contact with the silicon substrate in which the interconnection layer 72 is formed.

As described above, the inner wall of each pad opening portion 802 of the chip 820 is covered with the hydrophobic film 823 without a gap. Further, the sidewall portion of the chip 820 is covered with the hydrophobic film 825 without a gap.

Since there is a stacked film interface in the porous wall portion and the sidewall portion, moisture is more likely to intrude into the porous wall portion and the sidewall portion than the surface of the chip. As the hydrophobic film is formed in the porous wall portion and the sidewall portion to cover the stacked film interface, intrusion of moisture or impurities into the chip can be prevented.

Further, as the hydrophobic film is formed in the sidewall portion (the scribe region A3), force applied to an interface between films at the time of dicing can be mitigated, and a possibility that film peeling or a crack will occur can be reduced. A possibility that film peeling or a crack will occur can be reduced, and thus the moisture-proof performance of the chip can be further improved.

As described above, the chip 820 illustrated in FIG. 77 has a structure in which intrusion of moisture or impurities is prevented by the film in which the two layers of the passivation film and the hydrophobic film are stacked. Thus, the chip 820 with the improved moisture-proof performance can be implemented.

(7-14)-Th Embodiment

Figure 78:
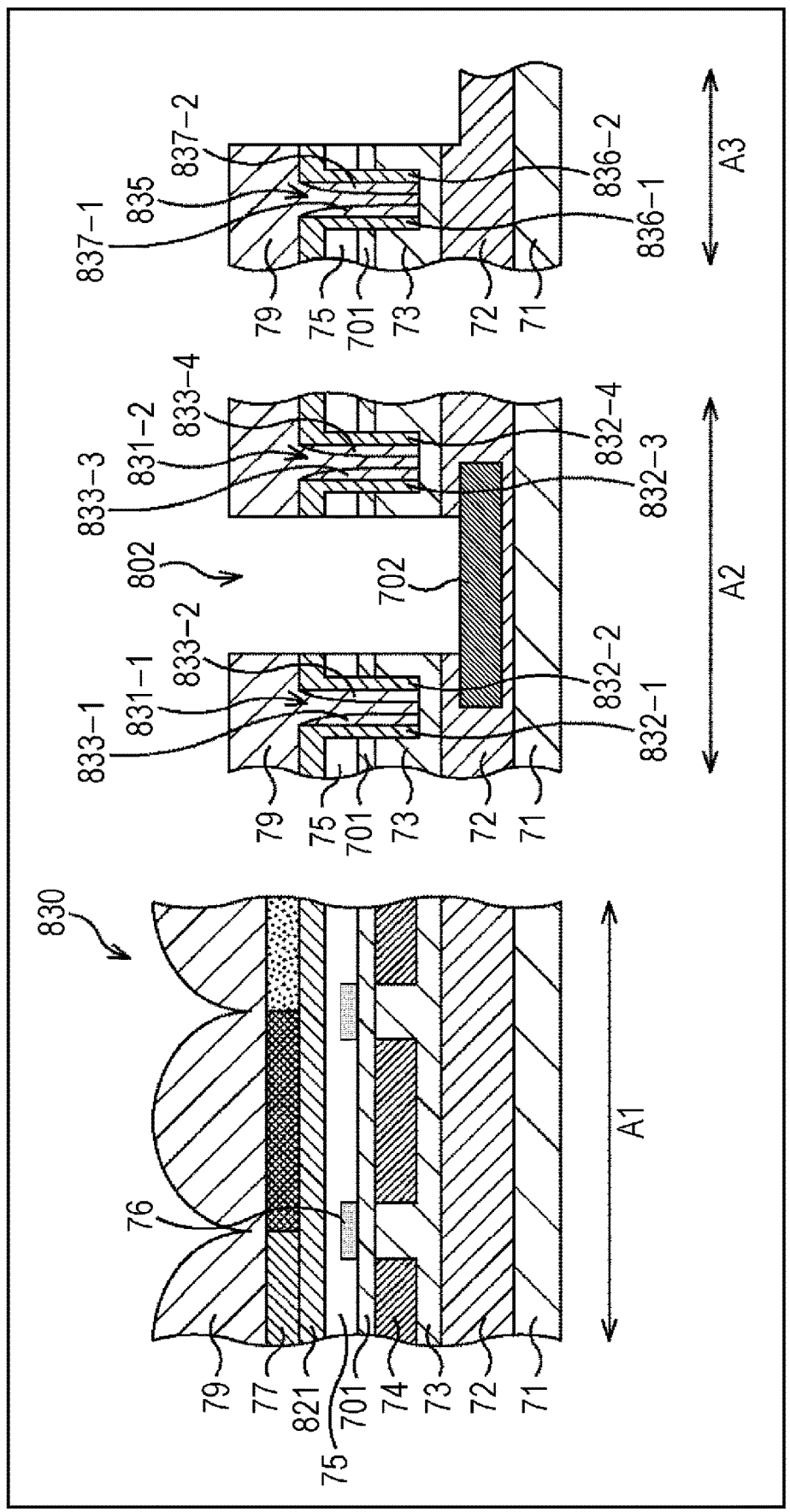
FIG. 78 is a diagram illustrating a configuration of a chip according to the seventh embodiment.

FIG. 78 illustrates another configuration of a chip according to the seventh embodiment. A chip 830 illustrated in FIG. 78 configures a backside-illumination type CMOS image sensor. In the chip 830 illustrated in FIG. 78, parts having the same configuration as in the chip 810 illustrated in FIG. 76 are denoted by the same reference numerals, and then a description will proceed.

In the chip 830 illustrated in FIG. 78, a passivation film 821 for preventing intrusion of moisture or impurities is formed between a planarization film 75 and a color filter layer 77. For example, the passivation film 821 is formed of transparent SiN (silicon nitride) having a waterproofing property.

The ceiling portion of the passivation film 821 is formed between the planarization film 75 and the color filter layer 77, and comes into contact with the top surface of the planarization film 75 and the bottom surface of the color filter layer 77. Here, in a pad region A2 and a scribe region A3 in which the color filter layer 77 is not formed, the ceiling portion is formed between the planarization film 75 and a microlens layer 79 and comes into contact with the top surface of the planarization film 75 and the bottom surface of the microlens layer 79.

In the pad region A2 of the chip 830, grooves (slits) are formed at both ends of a pad opening portion 802, and a passivation film and a hydrophobic film are formed in the grooves.

A groove 831-1 is formed on the pixel region A1 side of the pad opening portion 802, and on the inner wall of the groove 831-1, a hydrophobic film 833-1 is formed to be stacked on a passivation film 832-1, and a hydrophobic film 833-2 is formed to be stacked on a passivation film 832-2. The groove 831-1 is filled with the same material as the material for forming the microlens layer 79 and formed to be consecutive to the microlens layer 79.

Similarly, a groove 831-2 is formed on the scribe region A3 side of the pad opening portion 802, and on the inner wall of the groove 831-2, a hydrophobic film 833-3 is formed to be stacked on a passivation film 832-3, and a hydrophobic film 833-4 is formed to be stacked on a passivation film 832-4. The groove 831-2 is filled with the same material as the material for forming the microlens layer 79.

The groove 831 is formed such that up to a part of a silicon substrate 73 in which a photodiode 74 is formed is excavated. The passivation film 832 and the hydrophobic film 833 are formed on the inner side of the groove 831. In other words, the passivation film 832 is formed to cover from the upper end of the planarization film 75 to the part of the silicon substrate 73, and the front end of the passivation film 832 is formed to come into contact with the silicon substrate 73.

The hydrophobic film 833 is formed to cover from the upper end of the passivation film 821 to the part of the silicon substrate 73, and the front end of the hydrophobic film 833 is formed to come into contact with the silicon substrate 73. In other words, the hydrophobic film 833 is formed to cover the side surface of the passivation film 832.

A groove (slit) is formed in the scribe region A3, and a hydrophobic film is formed in the groove. A groove 835 is formed in the scribe region A3, and on the inner wall of the groove 835, a hydrophobic film 837-1 is formed to be stacked on a passivation film 836-1, and a hydrophobic film 837-2 is formed to be stacked on a passivation film 836-2.

The groove 835 is filled with the same material as the material for forming the microlens layer 79.

Similarly to the groove 831, the groove 835 is formed such that up to a part of the silicon substrate 73 in which the photodiode 74 is formed is excavated. The passivation film 836 and the hydrophobic film 837 are formed on the inner side of the groove 835. In other words, the passivation film 836 is formed to cover from the upper end of the planarization film 75 to the part of the silicon substrate 73, and the front end of the passivation film 836 is formed to come into contact with the silicon substrate 73.

The hydrophobic film 837 is formed to cover from the upper end of the passivation film 821 to the part of the silicon substrate 73, and the front end of the hydrophobic film 837 is formed to come into contact with the silicon substrate 73. In other words, the hydrophobic film 837 is formed to cover the side surface of the passivation film 836.

As the groove is formed, and the passivation film and the hydrophobic film are formed as described above, the region including a pixel region A1 in which the photodiode 74 is arranged is surrounded by the silicon substrate 73, passivation film, and the hydrophobic film having the waterproofing property without a gap. As a result, intrusion of moisture or impurities into the photodiode 74 is prevented, and an increased in a dark current is prevented.

As described above, according to the chip 830 of the (7-14)-th embodiment, intrusion of moisture or impurities into the chip 830 is prevented by the passivation film and the hydrophobic film. Thus, the chip 830 with the improved moisture-proof performance can be implemented.

Since there is a stacked film interface on the pad opening portion 703 and the chip edge, moisture is more likely to intrude into the pad opening portion 703 and the chip edge than the surface of the chip. As the groove and the hydrophobic film are formed in the pad opening portion 703 and the chip edge, and the stacked film interface is covered with the hydrophobic film, intrusion of moisture or impurities into the chip can be prevented.

Further, as the hydrophobic film is formed in the sidewall portion (the scribe region A3), force applied to each film interface at the time of dicing can be expected to be mitigated, and a possibility that film peeling or a crack will occur can be reduced.

Further, even when film peeling or a crack occurs, as the groove is formed, the occurrence of film peeling or a crack can be prevented by the groove, and the pad region A2 can be prevented from being influenced.

It is possible to reduce a possibility that film peeling or a crack will occur and reduce influence even when film peeling or a crack occurs, and thus the moisture-proof performance of the chip can be further improved.

Further, since the portion in which the groove is formed is filled with the same material as the material for forming the microlens layer 79, the configuration in which intrusion of moisture or the like is not allowed can be provided, and the moisture-proof performance can be further improved.

(7-15)-Th Embodiment

Figure 79:
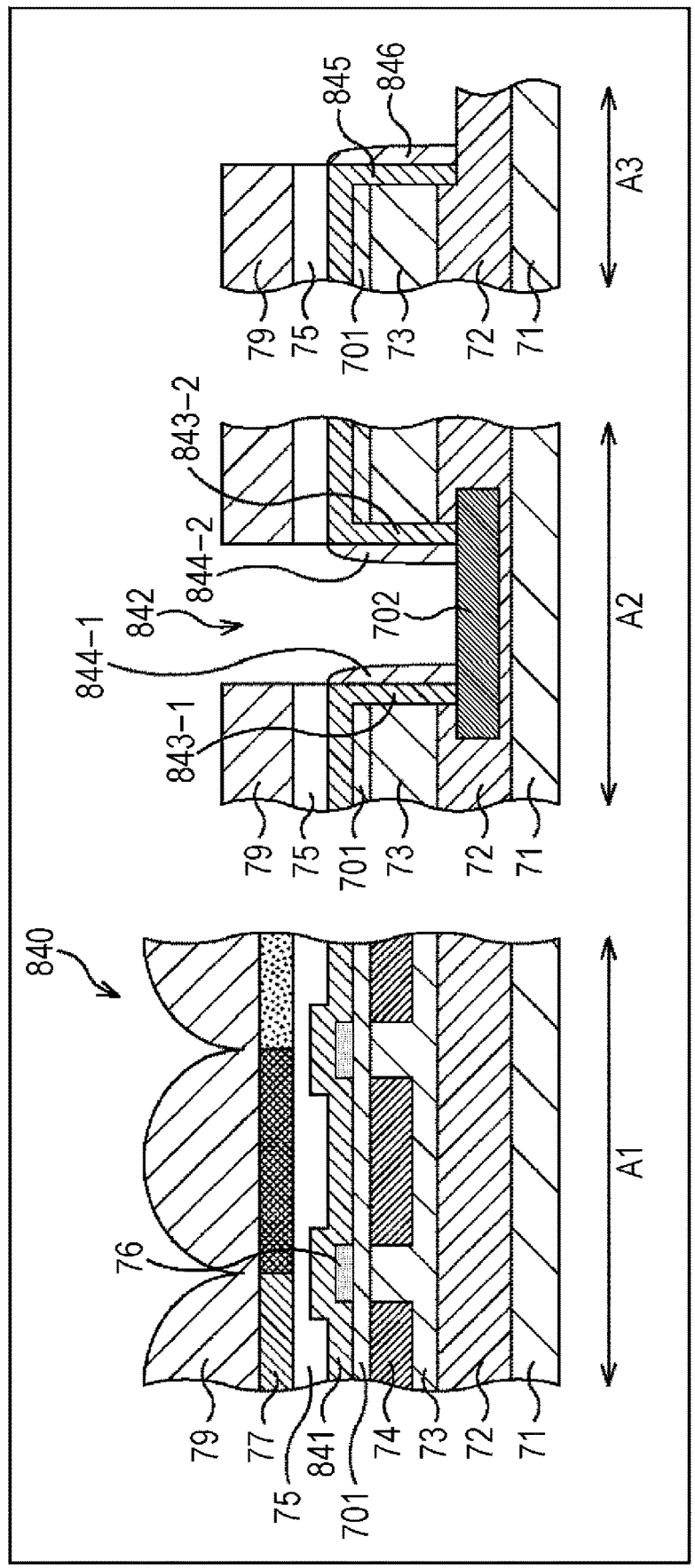
FIG. 79 is a diagram illustrating a configuration of a chip according to the seventh embodiment.

FIG. 79 illustrates another configuration of a chip according to the seventh embodiment. A chip 840 illustrated in FIG. 79 configures a backside-illumination type CMOS image sensor. In the chip 840 illustrated in FIG. 79, parts having the same configuration as in the chip 800 illustrated in FIG. 75 are denoted by the same reference numerals, and then a description will proceed.

In the chip 840 illustrated in FIG. 79, a passivation film 841 for preventing intrusion of moisture or impurities is formed between a passivation film 701 and a planarization film 75. Further, a light shielding film 76 is formed on the top surface of the passivation film 701, and in the portion in which the light shielding film 76 is formed, the passivation film 841 is formed between the light shielding film 76 and the planarization film 75.

The passivation film 841 is consecutively formed. For example, the passivation film 841 is formed of transparent SiN (silicon nitride) having a waterproofing property.

A ceiling portion of the passivation film 841 is consecutively formed between the passivation film 701 and the planarization film 75 and between the light shielding film 76 and the planarization film 75, and comes into contact with the top surfaces of the passivation film 701 and the light shielding film 76 and the bottom surface of the planarization film 75. Here, in a pad region A2 in which the light shielding film 76 is not formed and a scribe region A3, the ceiling portion is formed between the passivation film 701 and the planarization film 75, and the top surface of the passivation film 701 and the bottom surface of the planarization film 75 comes into contact with.

The passivation film 841 formed in the ceiling portion is formed to cover the entire region surrounded by the sidewall portion excluding a portion in which a pad opening portion 842 is formed.

The passivation film 841 formed in the porous wall portion is formed to cover the inner wall of each pad opening portion 842, and formed as a passivation film 843-1 and a passivation film 843-2.

The passivation film 841 formed in the sidewall portion is formed on the side surface of the chip 840 vertically to the surface of a silicon substrate 73, and formed as a passivation film 845. The sidewall portion covers the side surface of the chip 840 from the upper end of the passivation film 701 to a part of an interconnection layer 72, and the inner wall of the sidewall portion comes into contact with the side surface of the silicon substrate 73.

Thus, excluding the portion in which the pad opening portion 842 is formed, the entire surface of the silicon substrate 73 including a pixel region A1 is surrounded by the passivation film 841 in the ceiling portion and the passivation film 845 in the sidewall portion without a gap.

As a result, intrusion of moisture or impurities from the surface (the upper portion) of the chip 840 is prevented by the passivation film 841 in the ceiling portion. Further, intrusion of moisture or impurities from the side of the chip 840 is prevented by the passivation film 845 in the sidewall portion. Furthermore, intrusion of moisture or impurities from the bottom of the chip 840 is prevented by the bottom surface of the silicon substrate 73.

As a result, for example, even the chip 840 is placed in an environment in which water vapor pressure is high, and moisture is rapidly diffused, it is possible to prevent an increase in a dark current and a change in spectral characteristics caused by intrusion of moisture or impurities into the surface of a photodiode 74.

Further, in the chip 840 illustrated in FIG. 79, the hydrophobic film is formed in the porous wall portion and the sidewall portion.

In the chip 840 illustrated in FIG. 79, a hydrophobic film 844-1 is formed at the pixel region A1 side of the pad opening portion 842, and the hydrophobic film 844-2 is formed at the scribe region A3 side of the pad opening portion 842.

The hydrophobic film 844 formed in the pad opening portion 842 is formed to cover the inner wall of the pad opening portion 842, and covers from the upper end of the passivation film 841 to the part of the silicon substrate in which the interconnection layer 72 is formed. The front end of the hydrophobic film 844 comes into contact with the top surface of an electrode pad 870. In other words, the hydrophobic film 844 is formed to cover the passivation film 843.

A hydrophobic film 846 is formed at the chip edge. The hydrophobic film 846 formed in the sidewall portion covers the side surface of the chip 840 from the upper end of the passivation film 841 to the part of the silicon substrate in which the interconnection layer 72 is formed. Further, the front end of the hydrophobic film 846 comes into contact with the silicon substrate in which the interconnection layer 72 is formed. In other words, the hydrophobic film 846 is formed to cover the passivation film 845.

As described above, the inner wall of each pad opening portion 842 of the chip 840 is covered with the hydrophobic film 844 without a gap. Further, the sidewall portion of the chip 840 is covered with the hydrophobic film 846 without a gap.

Since there is a stacked film interface in the porous wall portion and the sidewall portion, moisture is more likely to intrude into the porous wall portion and the sidewall portion than the surface of the chip. As the hydrophobic film is formed in the porous wall portion and the sidewall portion to cover the stacked film interface, intrusion of moisture or impurities into the chip can be prevented.

Further, as the hydrophobic film is formed in the sidewall portion (the scribe region A3), force applied to an interface between films at the time of dicing can be mitigated, and a possibility that film peeling or a crack will occur can be reduced. A possibility that film peeling or a crack will occur can be reduced, and thus the moisture-proof performance of the chip can be further improved.

As described above, the chip 840 illustrated in FIG. 79 has a structure in which intrusion of moisture or impurities is prevented by the film in which the two layers of the passivation film and the hydrophobic film are stacked. Thus, the chip 840 with the improved moisture-proof performance can be implemented.

(7-16)-Th Embodiment

Figure 80:
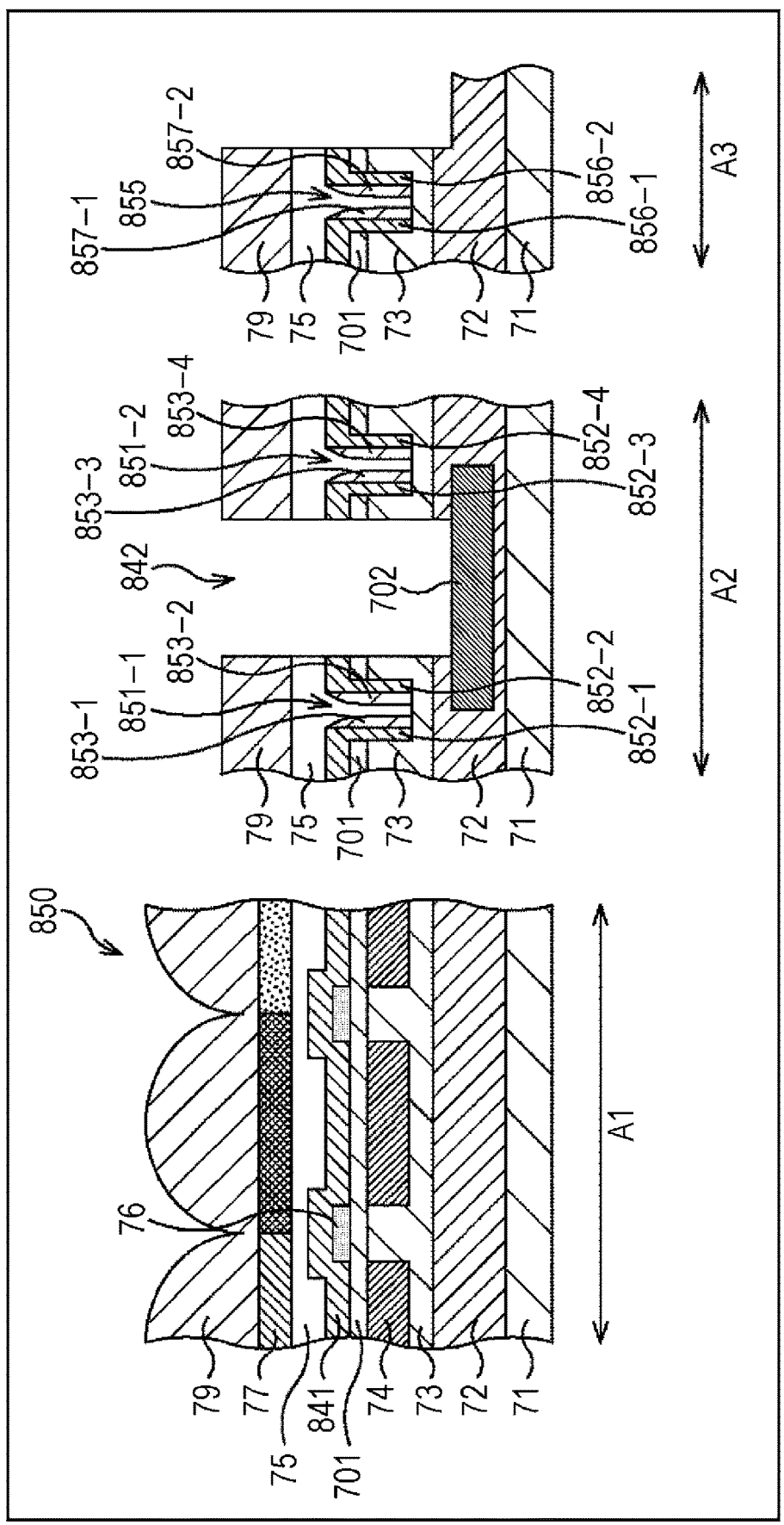
FIG. 80 is a diagram illustrating a configuration of a chip according to the seventh embodiment.

FIG. 80 illustrates another configuration of a chip according to the seventh embodiment. A chip 850 illustrated in FIG. 80 configures a backside-illumination type CMOS image sensor. In the chip 850 illustrated in FIG. 80, parts having the same configuration as in the chip 810 illustrated in FIG. 76 are denoted by the same reference numerals, and then a description will proceed.

In the chip 850 illustrated in FIG. 80, a passivation film 841 for preventing intrusion of moisture or impurities is formed between a passivation film 701 and a planarization film 75. A light shielding film 76 is formed on the top surface of the passivation film 701, and in the portion in which the light shielding film 76 is formed, a passivation film 841 is formed between the light shielding film 76 and the planarization film 75.

The passivation film 841 is consecutively formed. For example, the passivation film 841 is formed of transparent SiN (silicon nitride) having a waterproofing property.

A ceiling portion of the passivation film 841 is consecutively formed between the passivation film 701 and the planarization film 75 and between the light shielding film 76 and the planarization film 75, and comes into contact with the top surfaces of the passivation film 701 and the light shielding film 76 and the bottom surface of the planarization film 75. Here, in a pad region A2 in which the light shielding film 76 is not formed and a scribe region A3, the ceiling portion is formed between the passivation film 701 and the planarization film 75, and the top surface of the passivation film 701 and the bottom surface of the planarization film 75 comes into contact with.

The passivation film 841 formed in the ceiling portion is formed to cover the entire region surrounded by the sidewall portion excluding a portion in which a pad opening portion 842 is formed.

In the pad region A2 of the chip 850, grooves (slits) are formed at both sides of the pad opening portion 842, and a passivation film and a hydrophobic film are formed in the grooves.

A groove 851-1 is formed on a pixel region A1 side of the pad opening portion 842, and on the inner wall of the groove 851-1, a hydrophobic film 853-1 is formed to be stacked on a passivation film 852-1, and a hydrophobic film 853-2 is formed to be stacked on a passivation film 852-2. The groove 851-1 is filled with the same material as the material for forming the planarization film 75 and formed to be consecutive to the planarization film 75.

Similarly, a groove 851-2 is formed on the scribe region A3 side of the pad opening portion 842, and on the inner wall of the groove 851-2, a hydrophobic film 853-3 is formed to be stacked on a passivation film 852-3, and a hydrophobic film 853-4 is formed to be stacked on a passivation film 852-4. The groove 851-2 is filled with the same material as the material for forming the planarization film 75.

The groove 851 is formed such that up to a part of a silicon substrate 73 in which a photodiode 74 is formed is excavated. The passivation film 852 and the hydrophobic film 853 are formed on the inner side of the groove 851. In other words, the passivation film 852 is formed to cover from the upper end of the passivation film 701 to the part of the silicon substrate 73, and the front end of the passivation film 852 is formed to come into contact with the silicon substrate 73.

The hydrophobic film 853 is formed to cover from the upper end of the passivation film 841 to the part of the silicon substrate 73, and the front end of the hydrophobic film 853 is formed to come into contact with the silicon substrate 73. In other words, the hydrophobic film 853 is formed to cover the passivation film 852.

A groove (slit) is formed in the scribe region A3, and a hydrophobic film is formed in the groove. A groove 855 is formed in the scribe region A3, and on the inner wall of the groove 855, a hydrophobic film 857-1 is formed to be stacked on a passivation film 856-1, and a hydrophobic film 857-2 is formed to be stacked on a passivation film 856-2.

The groove 855 is filled with the same material as the material for forming the planarization film 75.

Similarly to the groove 851, the groove 855 is formed such that up to a part of the silicon substrate 73 in which the photodiode 74 is formed is excavated. The passivation film 856 and the hydrophobic film 857 are formed on the inner side of the groove 855. In other words, the passivation film 856 is formed to cover from the upper end of the passivation film 701 to the part of the silicon substrate 73, and the front end of the passivation film 856 is formed to come into contact with the silicon substrate 73.

The hydrophobic film 857 is formed to cover from the upper end of the passivation film 841 to the part of the silicon substrate 73, and the front end of the hydrophobic film 857 is formed to come into contact with the silicon substrate 73. In other words, the hydrophobic film 857 is formed to cover the passivation film 856.

As the groove is formed, and the passivation film and the hydrophobic film are formed as described above, the region including the pixel region A1 in which the photodiode 74 is arranged is surrounded by the silicon substrate 73, passivation film, and the hydrophobic film having the waterproofing property without a gap. As a result, intrusion of moisture or impurities into the photodiode 74 is prevented.

As described above, according to the chip 850 of the (7-16)-th embodiment, intrusion of moisture or impurities into the chip 850 is prevented by the passivation film and the hydrophobic film. Thus, the chip 850 with the improved moisture-proof performance can be implemented.

Since there is a stacked film interface on the pad opening portion 842 and the chip edge, moisture is more likely to intrude into the pad opening portion 842 and the chip edge than the surface of the chip. As the groove and the hydrophobic film are formed in the pad opening portion 842 and the chip edge, and the stacked film interface is covered with the hydrophobic film, intrusion of moisture or impurities into the chip can be prevented.

Further, as the hydrophobic film is formed in the sidewall portion (the scribe region A3), force applied to each film interface at the time of dicing can be expected to be mitigated, and a possibility that film peeling or a crack will occur can be reduced.

Further, even when film peeling or a crack occurs, as the groove is formed, the occurrence of film peeling or a crack can be prevented by the groove, and the pad region A2 can be prevented from being influenced.

It is possible to reduce a possibility that film peeling or a crack will occur and reduce influence even when film peeling or a crack occurs, and thus the moisture-proof performance of the chip can be further improved.

Further, since the portion in which the groove is formed is filled with the same material as the material for forming the planarization film 75, the configuration in which intrusion of moisture or the like is not allowed can be provided, and the moisture-proof performance can be further improved.

(7-17)-Th Embodiment

The (7-1)-st to the (7-16)-th embodiments have been described in connection with the examples in which the present technology is applied to the backside-illumination type CMOS image sensors, but the present technology can be applied even to surface-illumination type CMOS image sensors.

Figure 81:
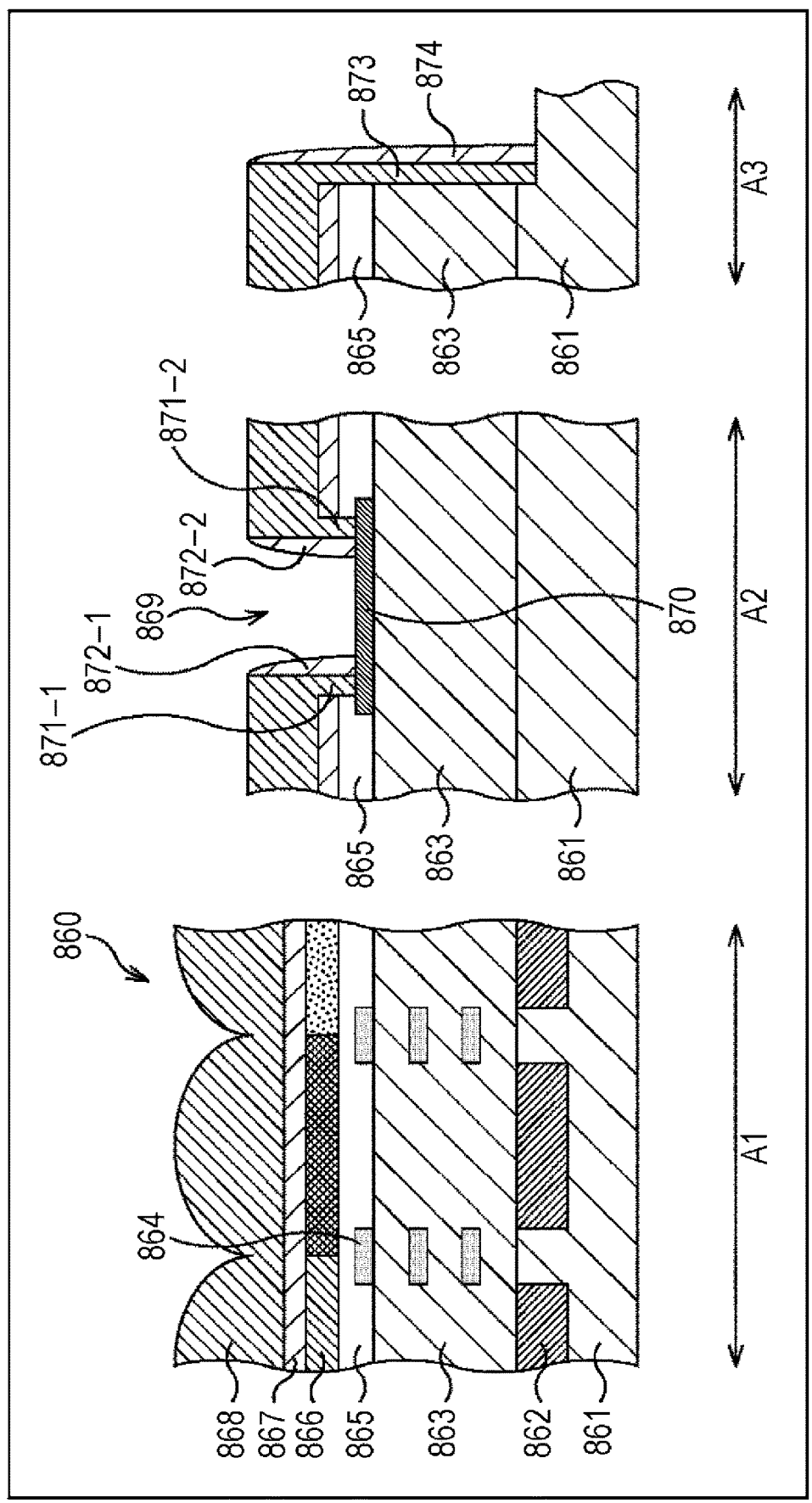
FIG. 81 is a diagram illustrating a configuration of a chip according to the seventh embodiment.

FIG. 81 is a diagram illustrating a configuration of a chip when the present technology is applied to a surface-illumination type CMOS image sensor, that is, a diagram illustrating another configuration of a chip according to the seventh embodiment.

A plurality of photodiodes 862 serving as photoelectric conversion units of pixels are formed on the surface of a silicon substrate 861 of a chip 860 at certain intervals.

An inter-layer insulating film 863 is formed on the silicon substrate 861 and the photodiode 862. In or on the inter-layer insulating film 863, interconnection layer metals 864 are vertically formed between the neighboring photodiodes 862.

In other words, the chip 860 is configured as a surface-illumination type CMOS image sensor in which the interconnection layers are formed above (at the surface side) of the photodiodes 862. The interconnection layer metal 864 has a function of a light shielding film for preventing light from leaking into a neighboring pixel as well.

A planarization film 865 for planarizing a region in which a color filter is formed is formed on the inter-layer insulating film 863 and the topmost interconnection layer metal 864.

A color filter layer 866 is formed on the planarization film 865. In the color filter layer 866, color filters are formed in units of pixels, and, for example, colors of the color filters are arranged according to a Bayer array.

A planarization film 867 and a microlens passivation film 868 are formed on the color filter layer 866. The planarization film 867 is formed between the color filter layer 866 and the microlens passivation film 868 in order to planarize the region in which the microlens is formed.

For example, the microlens passivation film 868 is formed of SiN that is transparent and has a waterproofing property, and performs the functions of the microlens layer 79 and the passivation film 721 of FIG. 66 as well.

Similarly to the chip of the backside-illumination type CMOS image sensor, the chip 860 is roughly divided into a pixel region A1, a pad region A2, a scribe region A3, and the remaining region. Further, the microlens passivation film 868 includes a ceiling portion, a porous wall portion, and a sidewall portion.

The microlens passivation film 868 in the ceiling portion is formed for each pixel as the microlens for collecting light onto the photodiode 862 of each pixel in the pixel region A1. Further, the microlens passivation film 868 in the ceiling portion is formed to cover the entire region surrounded by the sidewall portion excluding a portion in which a pad opening portion 869 is formed.

A microlens passivation film 871-1 and a microlens passivation film 871-2 formed in the porous wall portion are formed to cover the inner wall of the pad opening portion 869. Further, the outer walls of the microlens passivation film 871-1 and the microlens passivation film 871-2 formed in the porous wall portion come into contact with the planarization film 865 and the planarization film 867, and the lower ends of the microlens passivation film 871-1 and the microlens passivation film 871-2 formed in the porous wall portion come into contact with the top surface of the electrode pad 870.

A microlens passivation film 873 formed in the sidewall portion is formed to cover a range of the side surface of the chip 860 from the upper end of the planarization film 867 to a part of the silicon substrate 861. Further, the microlens passivation film 873 formed in the sidewall portion is vertical to the surface of the silicon substrate 861, and comes into contact with the side surface of the silicon substrate 861.

As a result, the pixel region A1 in which the photodiode 862 is arranged and the region including the color filter layer 866 are surrounded by the silicon substrate 861, the microlens passivation film 868, the microlens passivation film 871, the microlens passivation film 873 having the waterproofing property without a gap. As a result, intrusion of moisture or impurities into the surface of the photodiode 862 and the color filter layer 866 is prevented, and an increase in a dark current and a change in spectral characteristics of a color filter are prevented.

Further, the microlens passivation film 868 functions as both a microlens and a passivation film having a waterproofing property, and thus it is possible to reduce the number of stacked layers of the chip 860 and the number of manufacturing processes.

In the chip 860 illustrated in FIG. 81, the hydrophobic film is formed in the porous wall portion and the sidewall portion.

In the chip 860 illustrated in FIG. 81, a hydrophobic film 872-1 is formed at the pixel region A1 side of the pad opening portion 869, and a hydrophobic film 872-2 is formed at the scribe region A3 side of the pad opening portion 869.

The hydrophobic film 872 formed in the pad opening portion 869 is formed to cover the inner wall of the pad opening portion 869, and covers from the upper end of the microlens passivation film 868 to a part of the planarization film 865. The front end of the hydrophobic film 872 comes into contact with the top surface of the electrode pad 870. In other words, the hydrophobic film 872 is formed to cover the microlens passivation film 871.

A hydrophobic film 874 is formed in the sidewall portion. The hydrophobic film 874 is formed in the sidewall portion covers the side surface of the chip 860 from the upper end of the microlens passivation film 868 to a part of the silicon substrate 861. The front end of the hydrophobic film 874 comes into contact with the silicon substrate 861. In other words, the hydrophobic film 874 is formed to cover the microlens passivation film 873.

As described above, the inner wall of each pad opening portion 869 of the chip 860 is covered with the hydrophobic film 872 without a gap. Further, the sidewall portion of the chip 860 is covered with the hydrophobic film 874 without a gap.

Since there is a stacked film interface in the porous wall portion and the sidewall portion, moisture is more likely to intrude into the porous wall portion and the sidewall portion than the surface of the chip. As the hydrophobic film is formed in the porous wall portion and the sidewall portion to cover the stacked film interface, intrusion of moisture or impurities into the chip can be prevented.

Further, as the microlens passivation film and the hydrophobic film are formed in the sidewall portion (the scribe region A3), force applied to an interface between films at the time of dicing can be mitigated, and a possibility that film peeling or a crack will occur can be reduced. A possibility that film peeling or a crack will occur can be reduced, and thus the moisture-proof performance of the chip can be further improved.

As described above, the chip 860 illustrated in FIG. 81 has a structure in which intrusion of moisture or impurities is prevented by the film in which the two layers of the microlens passivation film and the hydrophobic film are stacked. Thus, the chip 860 with the improved moisture-proof performance can be implemented.

(7-18)-Th Embodiment

Figure 82:
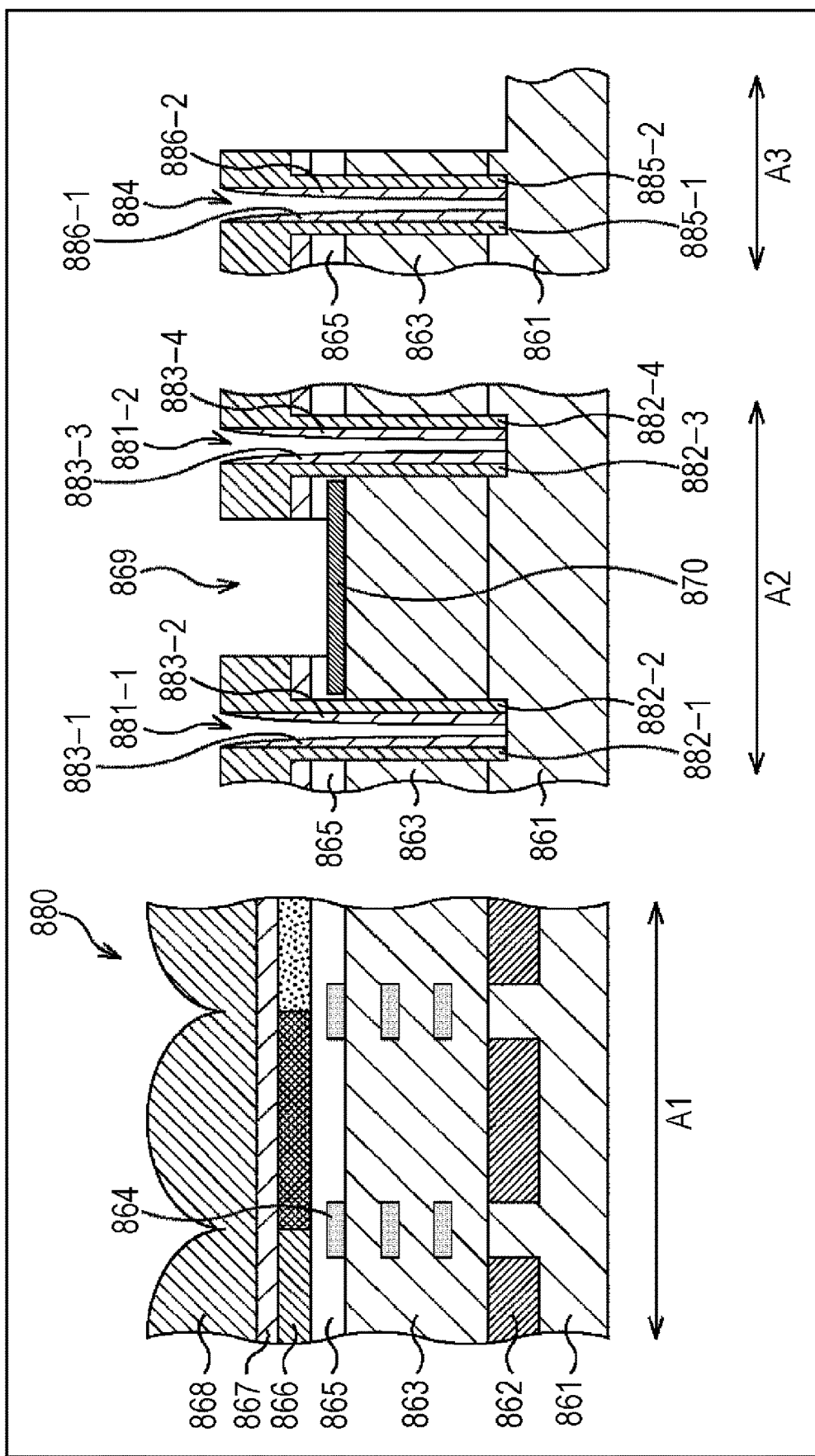
FIG. 82 is a diagram illustrating a configuration of a chip according to the seventh embodiment.

FIG. 82 illustrates another configuration of a chip according to the seventh embodiment. A chip 880 illustrated in FIG. 82 configures a surface-illumination type CMOS image sensor. In the chip 880 illustrated in FIG. 82, parts having the same configuration as in the chip 860 illustrated in FIG. 81 are denoted by the same reference numerals, and then a description will proceed.

A pixel region A1 of the chip 880 illustrated in FIG. 82 has a configuration similar to the pixel region A1 of the chip 860 illustrated in FIG. 81, but a difference lies in that grooves (slits) are formed in a pad region A2 and a scribe region A3.

In the pad region A2 of the chip 880, grooves (slits) are formed at both sides of the pad opening portion 869, and a microlens passivation film and a hydrophobic film are formed in the grooves. A groove 881-1 is formed on the pixel region A1 side of the pad opening portion 869, and on the inner wall of the groove 881-1, a hydrophobic film 883-1 is formed to be stacked on a microlens passivation film 882-1, and a hydrophobic film 883-2 is formed to be stacked on a microlens passivation film 882-2.

Similarly, a groove 881-2 is formed on the scribe region A3 side of the pad opening portion 869, and on the inner wall of the groove 881-2, a hydrophobic film 883-3 is formed to be stacked on a microlens passivation film 882-3, and a hydrophobic film 883-4 is formed to be stacked on a microlens passivation film 882-4.

The groove 881 is formed such that up to a part of the silicon substrate 861 in which the photodiode 862 is formed is excavated. The microlens passivation film 882 and the hydrophobic film 883 are formed on the inner side of the groove 881. In other words, the microlens passivation film 882 is formed to cover from the upper end of the planarization film 867 to a part of the silicon substrate 861, and the front end of the microlens passivation film 882 is formed to come into contact with the silicon substrate 861.

The hydrophobic film 883 is formed to cover from the upper end of the microlens passivation film 868 to a part of the silicon substrate 861, and the front end of the hydrophobic film 883 is formed to come into contact with the silicon substrate 861. In other words, the hydrophobic film 883 is formed to cover the microlens passivation film 882.

A groove (slit) is formed in the scribe region A3, and a hydrophobic film is formed in the groove. A groove 884 is formed in the scribe region A3, and on the inner wall of the groove 884, a hydrophobic film 886-1 is formed to be stacked on a microlens passivation film 885-1, and a hydrophobic film 886-2 is formed to be stacked on a microlens passivation film 885-2.

Similarly to the groove 881, the groove 884 is formed such that up to a part of the silicon substrate 861 in which the photodiode 862 is formed is excavated. The microlens passivation film 885 and the hydrophobic film 886 are formed on the inner side of the groove 884.

In other words, the microlens passivation film 885 is formed to cover from the upper end of the planarization film 867 to a part of the silicon substrate 861, and the front end of the microlens passivation film 885 is formed to come into contact with the silicon substrate 861.

The hydrophobic film 886 is formed to cover from the upper end of the microlens passivation film 868 to a part of the silicon substrate 861, and the front end of the hydrophobic film 886 is formed to come into contact with the silicon substrate 861. In other words, the hydrophobic film 886 is formed to cover the microlens passivation film 885.

As the groove is formed, and the microlens passivation film and the hydrophobic film are formed as described above, the pixel region A1 in which the photodiode 862 is arranged and the region including the color filter layer 866 are surrounded by the silicon substrate 861, the microlens passivation film, and the hydrophobic film having the waterproofing property without a gap. As a result, intrusion of moisture or impurities into the photodiode 862 and the color filter layer 866 is prevented, and an increase in a dark current and a change in spectral characteristics of a color filter are prevented.

As described above, according to the chip 880 illustrated in FIG. 82, intrusion of moisture or impurities into the chip 880 is prevented by the microlens passivation film and the hydrophobic film. Thus, the chip 880 with the improved moisture-proof performance can be implemented.

Since there is a stacked film interface on the pad opening portion 869 and the chip edge, moisture is more likely to intrude into the pad opening portion 869 and the chip edge than the surface of the chip. As the groove and the hydrophobic film are formed in the pad opening portion 869 and the chip edge, and the stacked film interface is covered with the hydrophobic film, intrusion of moisture or impurities into the chip can be prevented.

Further, as the hydrophobic film is formed in the sidewall portion (the scribe region A3), force applied to each film interface at the time of dicing can be expected to be mitigated, and a possibility that film peeling or a crack will occur can be reduced.

Further, even when film peeling or a crack occurs, as the groove is formed, the occurrence of film peeling or a crack can be prevented by the groove, and the pad region A2 can be prevented from being influenced.

It is possible to reduce a possibility that film peeling or a crack will occur and reduce influence even when film peeling or a crack occurs, and thus the moisture-proof performance of the chip can be further improved.

(7-19)-Th Embodiment

Figure 83:
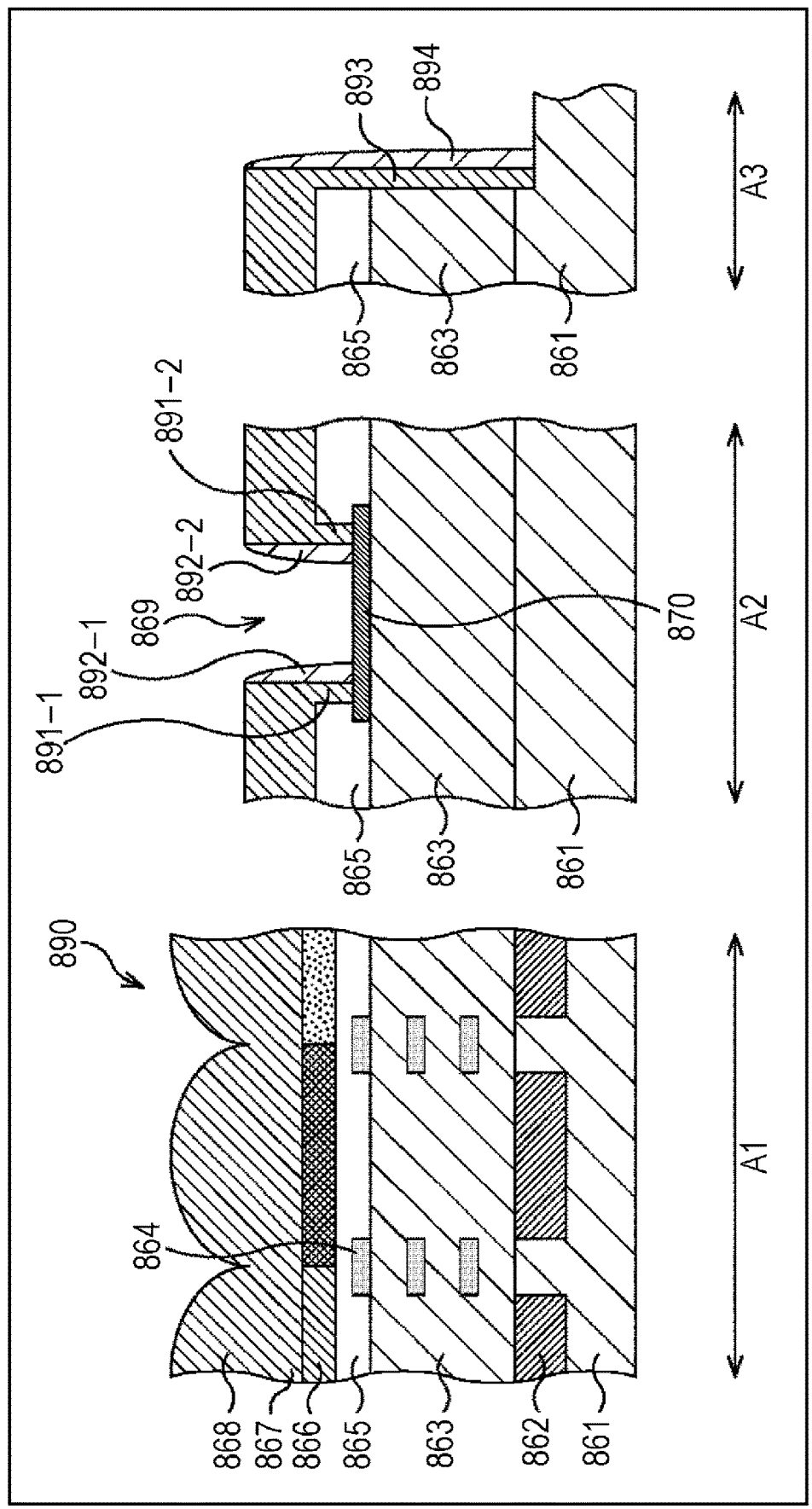
FIG. 83 is a diagram illustrating a configuration of a chip according to the seventh embodiment.

FIG. 83 illustrates another configuration of a chip according to the seventh embodiment. A chip 890 illustrated in FIG. 83 configures a surface-illumination type CMOS image sensor. In the chip 890 illustrated in FIG. 83, parts having the same configuration as in the chip 860 illustrated in FIG. 81 are denoted by the same reference numerals, and then a description will proceed.

The chip 890 of FIG. 83 has a configuration in which the planarization film 867 is removed from the chip 860 of FIG. 81. In other words, the ceiling portion of a microlens passivation film 868 of the chip 890 illustrated in FIG. 83 comes into contact with a color filter layer 866.

As a result, the chip 890 is slightly lower in flatness of a microlens than the chip 860 of FIG. 81, but it is possible to realize a reduction in a manufacturing process and a cost reduction while implementing the same waterproofing effect.

In the chip 890 of FIG. 83, similarly to the chip 860 of FIG. 81, for example, the microlens passivation film 868 is formed of SiN that is transparent and has a waterproofing property, and includes a ceiling portion, a porous wall portion, and a sidewall portion.

The microlens passivation film 868 formed in the ceiling portion is formed for each pixel as the microlens for collecting light onto a photodiode 862 of each pixel in a pixel region A1. Further, the microlens passivation film 868 in the ceiling portion is formed to cover the entire region surrounded by the sidewall portion excluding the portion in which a pad opening portion 869 is formed.

A microlens passivation film 891-1 and a microlens passivation film 891-2 formed in the porous wall portion are formed to cover the inner wall of the pad opening portion 869. Further, the microlens passivation film 891-1 and the microlens passivation film 891-2 formed in the porous wall portion comes into contact with a planarization film 865, and the lower ends of the microlens passivation film 891-1 and the microlens passivation film 891-2 come into contact with the top surface of an electrode pad 870.

A microlens passivation film 893 formed in the sidewall portion is formed to cover a range of the side surface of the chip 890 from the upper end of the planarization film 865 to a part of a silicon substrate 861. Further, the microlens passivation film 893 formed in the sidewall portion is vertical to the surface of the silicon substrate 861, and comes into contact with the side surface of the silicon substrate 861.

As a result, the pixel region A1 in which the photodiode 862 is arranged and the region including the color filter layer 866 are surrounded by the silicon substrate 861 and the microlens passivation film 868 having the waterproofing property without a gap. As a result, intrusion of moisture or impurities into the surface of the photodiode 862 and the color filter layer 866 is prevented, and an increase in a dark current and a change in spectral characteristics of a color filter are prevented.

Further, the microlens passivation film 868 functions as both a microlens and a passivation film having a waterproofing property, and thus it is possible to reduce the number of stacked layers of the chip 890 and the number of manufacturing processes.

In the chip 890 illustrated in FIG. 83, the hydrophobic film is formed in the porous wall portion and the sidewall portion.

In the chip 890 illustrated in FIG. 83, a hydrophobic film 892-1 is formed at the pixel region A1 side of the pad opening portion 869, and a hydrophobic film 892-2 is formed at the scribe region A3 side of the pad opening portion 869.

The hydrophobic film 892 formed in the pad opening portion 869 is formed to cover the inner wall of the pad opening portion 869 from the upper end of the microlens passivation film 868 to the electrode pad 870, and comes into contact with the top surface of the electrode pad 870. In other words, the hydrophobic film 892 is formed to cover the microlens passivation film 891.

A hydrophobic film 894 is formed in the sidewall portion. The hydrophobic film 894 formed in the sidewall portion covers the side surface of the chip 890 from the upper end of the microlens passivation film 868 to a part of the silicon substrate 861. Further, the front end of the hydrophobic film 894 comes into contact with the silicon substrate 861. In other words, the hydrophobic film 894 is formed to cover the microlens passivation film 893.

As described above, the inner wall of each pad opening portion 869 of the chip 890 is covered with the hydrophobic film 892 without a gap. Further, the sidewall portion of the chip 890 is covered with the hydrophobic film 894 without a gap.

Since there is a stacked film interface in the porous wall portion and the sidewall portion, moisture is more likely to intrude into the porous wall portion and the sidewall portion than the surface of the chip. As the hydrophobic film is formed in the porous wall portion and the sidewall portion to cover the stacked film interface, intrusion of moisture or impurities into the chip can be prevented.

Further, as the microlens passivation film and the hydrophobic film are formed in the sidewall portion (the scribe region A3), force applied to an interface between films at the time of dicing can be mitigated, and a possibility that film peeling or a crack will occur can be reduced. A possibility that film peeling or a crack will occur can be reduced, and thus the moisture-proof performance of the chip can be further improved.

As described above, the chip 890 illustrated in FIG. 83 has a structure in which intrusion of moisture or impurities is prevented by the film in which the two layers of the microlens passivation film and the hydrophobic film are stacked. Thus, the chip 890 with the improved moisture-proof performance can be implemented.

(7-20)-Th Embodiment

Figure 84:
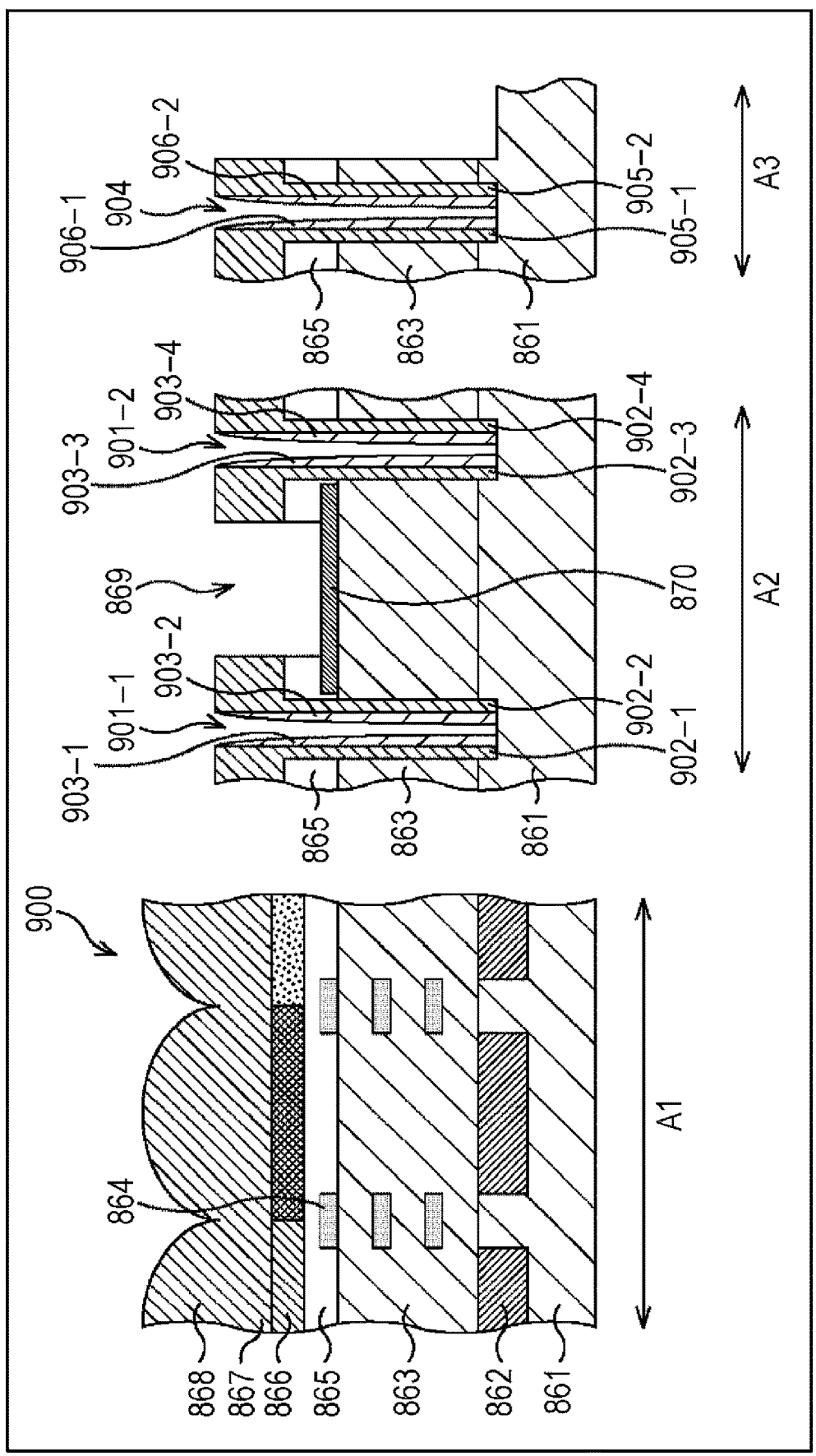
FIG. 84 is a diagram illustrating a configuration of a chip according to the seventh embodiment.

FIG. 84 illustrates another configuration of a chip according to the seventh embodiment. A chip 900 illustrated in FIG. 84 configures a surface-illumination type CMOS image sensor. In the chip 900 illustrated in FIG. 84, parts having the same configuration as in the chip 880 illustrated in FIG. 82 are denoted by the same reference numerals, and then a description will proceed.

The chip 900 of FIG. 84 has a configuration in which the planarization film 867 is removed from the chip 880 of FIG. 82. In other words, the ceiling portion of a microlens passivation film 868 of the chip 900 illustrated in FIG. 84 comes into contact with a color filter layer 866.

As a result, the chip 900 is slightly lower in flatness of a microlens than the chip 880 of FIG. 82, but it is possible to realize a reduction in a manufacturing process and a cost reduction while implementing the same waterproofing effect.

In the chip 900 of FIG. 84, similarly to the chip 880 of FIG. 82, for example, a microlens passivation film 868 is formed of SiN that is transparent and has a waterproofing property, and includes a ceiling portion, a porous wall portion, and a sidewall portion.

The microlens passivation film 868 in the ceiling portion is formed for each pixel as the microlens for collecting light onto a photodiode 862 of each pixel in a pixel region A1.

Further, the microlens passivation film 868 in the ceiling portion is formed to cover the entire region surrounded by the sidewall portion excluding the portion in which a pad opening portion 869, a groove 901, and a groove 904 are formed.

In a pad region A2 of the chip 900, grooves (slits) are formed at both sides of the pad opening portion 869, and a microlens passivation film and a hydrophobic film are formed in the grooves. A groove 901-1 is formed on the pixel region A1 side of the pad opening portion 869, and on the inner wall of the groove 901-1, a hydrophobic film 903-1 is formed to be stacked on a microlens passivation film 902-1, and a hydrophobic film 903-2 is formed to be stacked on a microlens passivation film 902-2.

Similarly, a groove 901-2 is formed on a scribe region A3 side of the pad opening portion 869, and on the inner wall of the groove 901-2, a hydrophobic film 903-3 is formed to be stacked on a microlens passivation film 902-3, and a hydrophobic film 903-4 is formed to be stacked on a microlens passivation film 902-4.

The groove 901 is formed such that up to a part of a silicon substrate 861 in which a photodiode 862 is formed is excavated. The microlens passivation film 902 and the hydrophobic film 903 are formed on the inner side of the groove 901. In other words, the microlens passivation film 902 is formed to cover from the upper end of the planarization film 865 to a part of the silicon substrate 861, and the front end of the microlens passivation film 902 is formed to come into contact with the silicon substrate 861.

The hydrophobic film 903 is formed to cover the upper end of the microlens passivation film 868 to a part of the silicon substrate 861, and the front end of the hydrophobic film 903 is formed to come into contact with the silicon substrate 861. In other words, the hydrophobic film 903 is formed to cover the microlens passivation film 902.

A groove (slit) is formed in a scribe region A3, and a hydrophobic film is formed in the groove. A groove 904 is formed in the scribe region A3, and on the inner wall of the groove 904, a hydrophobic film 906-1 is formed to be stacked on a microlens passivation film 905-1, and a hydrophobic film 906-2 is formed to be stacked on a microlens passivation film 905-2.

Similarly to the groove 901, the groove 904 is formed such that up to a part of the silicon substrate 861 in which the photodiode 862 is formed is excavated. The microlens passivation film 905 and the hydrophobic film 906 are formed on the inner side of the groove 904.

In other words, the microlens passivation film 905 is formed to cover from the upper end of the planarization film 865 to a part of the silicon substrate 861, and the front end of the microlens passivation film 905 is formed to come into contact with the silicon substrate 861.

The hydrophobic film 906 is formed to cover the upper end of the microlens passivation film 868 to a part of the silicon substrate 861, and the front end of the hydrophobic film 906 is formed to come into contact with the silicon substrate 861. In other words, the hydrophobic film 906 is formed to cover the microlens passivation film 905.

As the groove is formed, and the microlens passivation film and the hydrophobic film are formed as described above, the pixel region A1 in which the photodiode 862 is arranged and the region including the color filter layer 866 are surrounded by the silicon substrate 861, the microlens passivation film, and the hydrophobic film having the waterproofing property without a gap. As a result, intrusion of moisture or impurities into the photodiode 862 and the color filter layer 866 is prevented, and an increase in a dark current and a change in spectral characteristics of a color filter are prevented.

As described above, according to the chip 900 illustrated in FIG. 84, intrusion of moisture or impurities into the chip 900 is prevented by the microlens passivation film and the hydrophobic film. Thus, the chip 900 with the improved moisture-proof performance can be implemented.

Since there is a stacked film interface on the pad opening portion 869 and the chip edge, moisture is more likely to intrude into the pad opening portion 869 and the chip edge than the surface of the chip. As the groove and the hydrophobic film are formed in the pad opening portion 869 and the chip edge, and the stacked film interface is covered with the hydrophobic film, intrusion of moisture or impurities into the chip can be prevented.

Further, as the hydrophobic film is formed in the sidewall portion (the scribe region A3), force applied to each film interface at the time of dicing can be expected to be mitigated, and a possibility that film peeling or a crack will occur can be reduced.

Further, even when film peeling or a crack occurs, as the groove is formed, the occurrence of film peeling or a crack can be prevented by the groove, and the pad region A2 can be prevented from being influenced.

It is possible to reduce a possibility that film peeling or a crack will occur and reduce influence even when film peeling or a crack occurs, and thus the moisture-proof performance of the chip can be further improved.

(7-21)-St Embodiment

Figure 85:
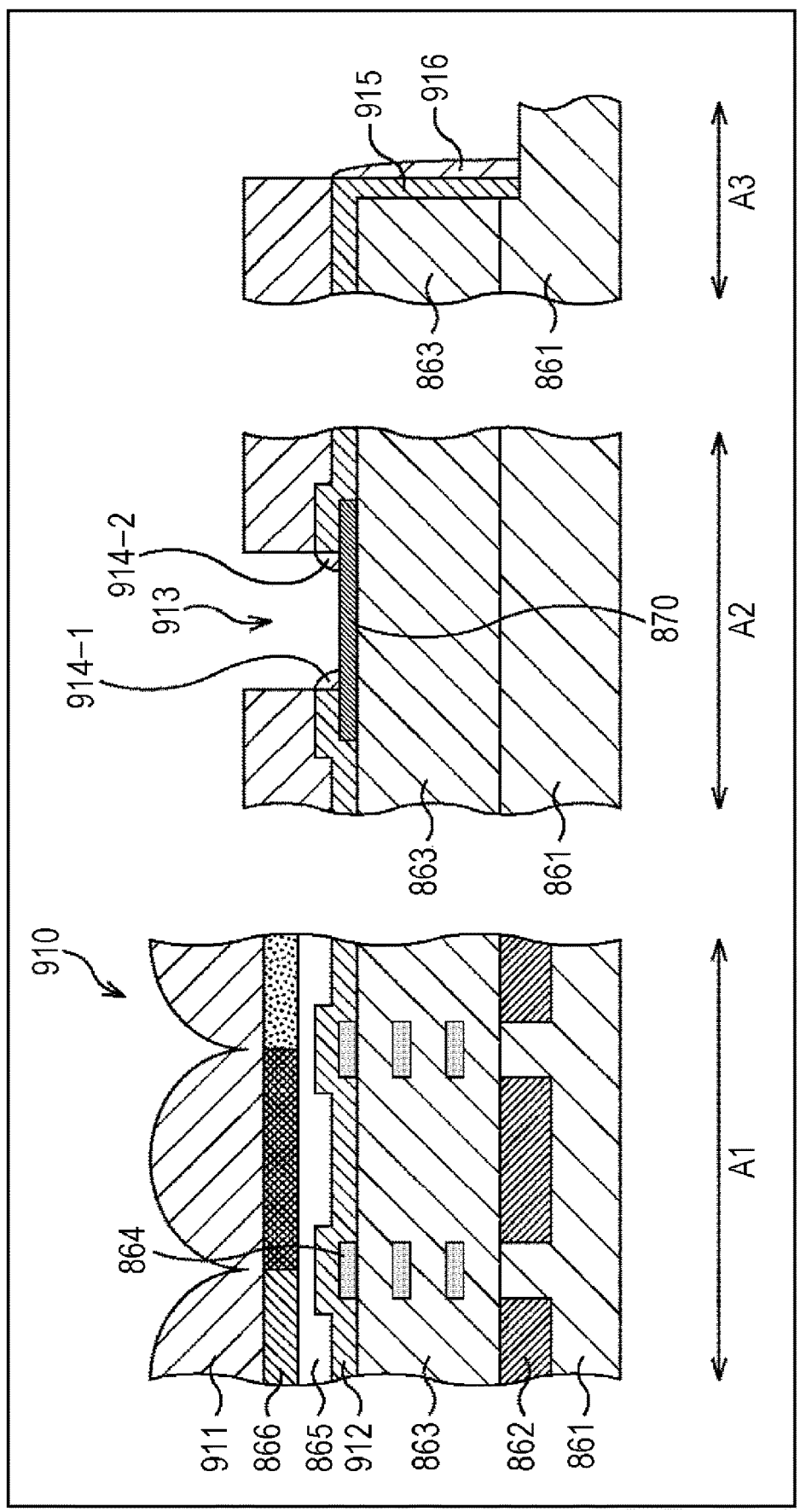
FIG. 85 is a diagram illustrating a configuration of a chip according to the seventh embodiment.

FIG. 85 illustrates another configuration of a chip according to the seventh embodiment. A chip 910 illustrated in FIG. 85 configures a surface-illumination type CMOS image sensor. In the chip 910 illustrated in FIG. 85, parts having the same configuration as in the chip 860 illustrated in FIG. 81 are denoted by the same reference numerals, and then a description will proceed.

The chip 910 illustrated in FIG. 85 is different from the chip 860 illustrated in FIG. 81 in that instead of the microlens passivation film 868, a microlens layer 911 is formed to function as a microlens.

In the chip 910 illustrated in FIG. 85, a passivation film 912 for preventing intrusion of moisture or impurities is formed between an inter-layer insulating film 863 and a planarization film 865. An interconnection layer metal 864 is formed on the top surface of the inter-layer insulating film 863, and in the portion in which the interconnection layer metal 864 is formed, the passivation film 912 is formed between the interconnection layer metal 864 and a planarization film 865.

The passivation film 912 is consecutively formed. For example, the passivation film 912 is formed of transparent SiN (silicon nitride) having a waterproofing property.

A ceiling portion of the passivation film 912 is consecutively formed between the inter-layer insulating film 863 and the planarization film 865 and between the interconnection layer metal 864 and the planarization film 865, and comes into contact with the top surfaces of the inter-layer insulating film 863 and the interconnection layer metal 864 and the bottom surface of the planarization film 865.

In a pad region A2 and a scribe region A3, the interconnection layer metal 864, the planarization film 865, and the color filter layer 866 are not formed, and thus the passivation film 912 in the ceiling portion is formed between the inter-layer insulating film 863 and the microlens layer 911, and comes into contact with the top surface of the inter-layer insulating film 863 and the bottom surface of the microlens layer 911.

The passivation film 912 formed in the ceiling portion is formed to cover the entire region surrounded by the sidewall portion excluding the portion in which a pad opening portion 913 is formed.

The passivation film 912 formed in the sidewall portion is formed on the side surface of the chip 910 vertically to the surface of the silicon substrate 861 as a passivation film 915. The passivation film 915 in the sidewall portion covers a range of the side surface of the chip 910 from the upper end of the inter-layer insulating film 863 to a part of the silicon substrate 861, and the inner wall of the sidewall portion comes into contact with the silicon substrate 861.

Thus, excluding the portion in which the pad opening portion 913 is formed, the entire surface of the silicon substrate 861 including a pixel region A1 is surrounded by the passivation film 912 in the ceiling portion and the passivation film 915 in the sidewall portion without a gap.

As a result, intrusion of moisture or impurities from the surface (the upper portion) of the chip 910 is prevented by the passivation film 912 in the ceiling portion. Further, intrusion of moisture or impurities from the side of the chip 910 is prevented by the passivation film 915 in the sidewall portion. Furthermore, intrusion of moisture or impurities from the bottom of the chip 910 is prevented by the bottom surface of the silicon substrate 861.

As a result, for example, even when the chip 910 is placed in an environment in which water vapor pressure is high, and moisture is rapidly diffused, an increase in a dark current or a change in spectral characteristics by intrusion of moisture or impurities into the surface of the photodiode 862 can be prevented.

Further, in the chip 910 illustrated in FIG. 85, the hydrophobic film is formed in the porous wall portion and the sidewall portion.

In the chip 910 illustrated in FIG. 85, a hydrophobic film 914-1 is formed at the pixel region A1 side of the pad opening portion 913, and a hydrophobic film 914-2 is formed at the scribe region A3 side of the pad opening portion 913.

The hydrophobic film 914 formed in the pad opening portion 913 is formed to cover the inner wall of the pad opening portion 913, and cover the side surface of the passivation film 912 at the pad opening portion 913 side. The front end of the hydrophobic film 914 comes into contact with the top surface of the electrode pad 870.

A hydrophobic film 916 is formed at the chip edge. The hydrophobic film 916 formed in the sidewall portion covers the side surface of the chip 900 from the upper end of the passivation film 912 to a part of the silicon substrate 861. The front end of the hydrophobic film 916 comes into contact with the silicon substrate 861. In other words, the hydrophobic film 916 is formed to cover the passivation film 915.

As described above, the inner wall of each pad opening portion 913 of the chip 910 is covered with the hydrophobic film 914 without a gap. The sidewall portion of the chip 910 is covered with the hydrophobic film 916 without a gap.

Since there is a stacked film interface in the porous wall portion and the sidewall portion, moisture is more likely to intrude into the porous wall portion and the sidewall portion than the surface of the chip. As the hydrophobic film is formed in the porous wall portion and the sidewall portion to cover the stacked film interface, intrusion of moisture or impurities into the chip can be prevented.

Further, as the passivation film and the hydrophobic film are formed in the sidewall portion (the scribe region A3), force applied to an interface between films at the time of dicing can be mitigated, and a possibility that film peeling or a crack will occur can be reduced. A possibility that film peeling or a crack will occur can be reduced, and thus the moisture-proof performance of the chip can be further improved.

As described above, the chip 910 illustrated in FIG. 85 has a structure in which intrusion of moisture or impurities is prevented by the film in which the two layers of the passivation film and the hydrophobic film are stacked. Thus, the chip 910 with the improved moisture-proof performance can be implemented.

(7-22)-Nd Embodiment

Figure 86:
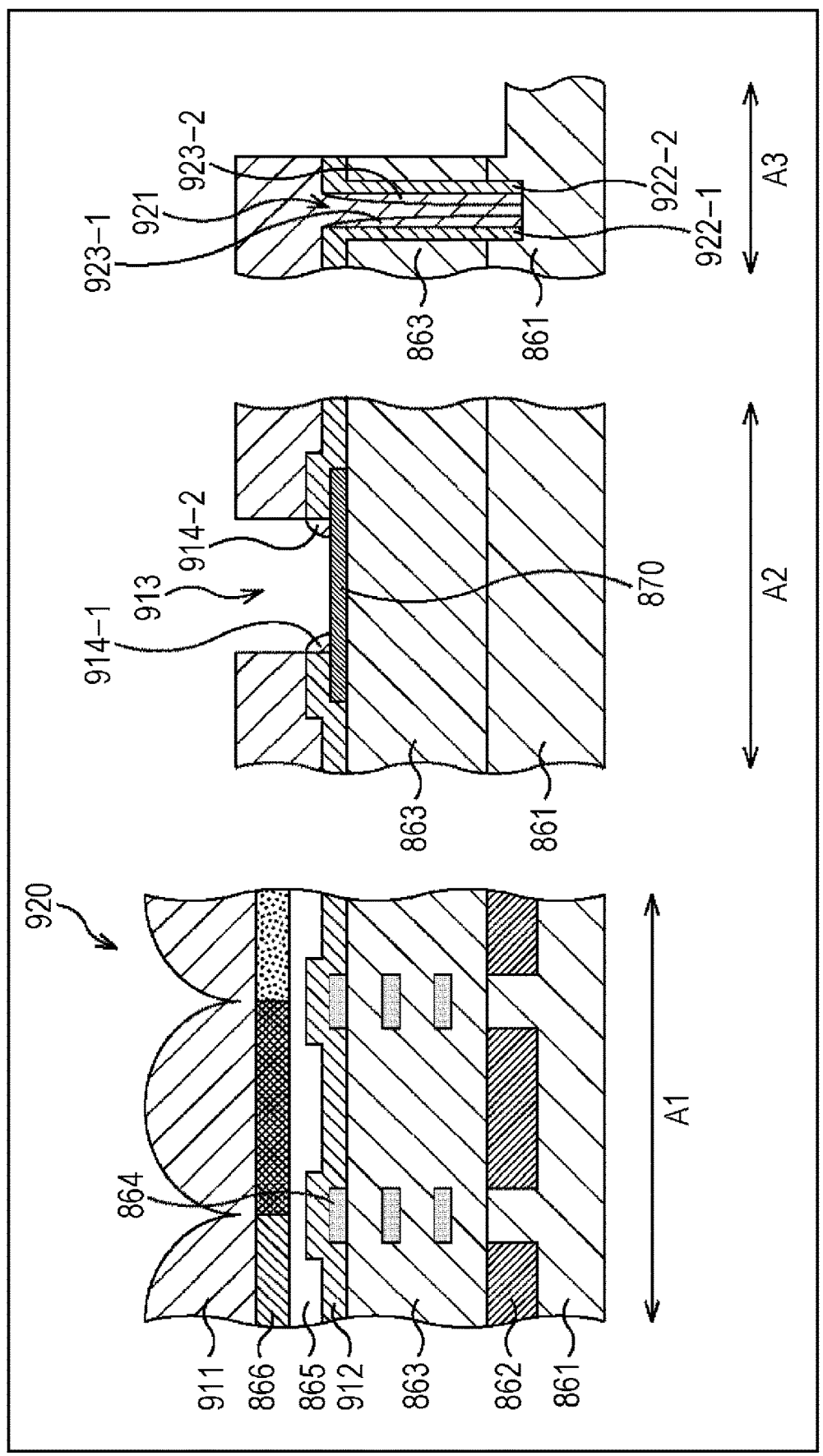
FIG. 86 is a diagram illustrating a configuration of a chip according to the seventh embodiment.

FIG. 86 illustrates another configuration of a chip according to the seventh embodiment. A chip 920 illustrated in FIG. 86 configures a surface-illumination type CMOS image sensor. In the chip 920 illustrated in FIG. 86, parts having the same configuration as in the chip 910 illustrated in FIG. 85 are denoted by the same reference numerals, and then a description will proceed.

In the chip 920 illustrated in FIG. 86, similarly to the chip 910 illustrated in FIG. 85, instead of the microlens passivation film 868, a microlens layer 911 is formed to function as a microlens.

In the chip 920 illustrated in FIG. 86, similarly to the chip 910 illustrated in FIG. 85, a passivation film 912 for preventing intrusion of moisture or impurities is formed between an inter-layer insulating film 863 and a planarization film 865. An interconnection layer metal 864 is formed on the top surface of the inter-layer insulating film 863, and in the portion in which the interconnection layer metal 864 is formed, the passivation film 912 is formed between the interconnection layer metal 864 and the planarization film 865.

A pixel region A1 and a pad region A2 of the chip 920 illustrated in FIG. 86 have the same configurations as the pixel region A1 and the pad region A2 as the chip 910 illustrated in FIG. 85.

A groove 921 is formed in the scribe region A3 of the chip 920, and a passivation film 922 and a hydrophobic film 923 are formed in the groove 921. In other words, the groove 921 is formed in a scribe region A3, and on the inner wall of the groove 921, a hydrophobic film 923-1 is formed to be stacked on a passivation film 922-1, and a hydrophobic film 923-2 is formed to be stacked on a passivation film 922-2.

The groove 921 is formed such that up to a part of the silicon substrate 861 in which the photodiode 862 is formed is excavated. The passivation film 922 and the hydrophobic film 923 are formed on the inner side of the groove 921.

In other words, the passivation film 922 is formed to cover from the upper end of the inter-layer insulating film 863 to a part of the silicon substrate 861, and the front end of the passivation film 922 is formed to come into contact with the silicon substrate 861.

The hydrophobic film 923 is formed to cover from the upper end of the passivation film 912 to a part of the silicon substrate 861, and the front end of the hydrophobic film 923 is formed to come into contact with the silicon substrate 861. The hydrophobic film 923 is formed to cover the entire side surface of the passivation film 922.

As the groove is formed, and the passivation film and the hydrophobic film are formed as described above, the pixel region A1 in which the photodiode 862 is arranged is surrounded by the silicon substrate 861, the passivation film, and the hydrophobic film having the waterproofing property without a gap. As a result, intrusion of moisture or impurities into the photodiode 862 is prevented, and an increased in a dark current is prevented.

As described above, according to the chip 920 illustrated in FIG. 86, intrusion of moisture or impurities into the chip 920 is prevented by the passivation film and the hydrophobic film. Thus, the chip 920 with the improved moisture-proof performance can be implemented.

Since there is a stacked film interface on the pad opening portion 913 and the chip edge, moisture or the like is more likely to intrude into the pad opening portion 913 and the chip edge than the surface of the chip. As the groove and the hydrophobic film are formed in the pad opening portion 913 and the chip edge, and the stacked film interface is covered with the hydrophobic film, intrusion of moisture or impurities into the chip can be prevented.

Further, as the hydrophobic film is formed in the sidewall portion (the scribe region A3), force applied to each film interface at the time of dicing can be expected to be mitigated, and a possibility that film peeling or a crack will occur can be reduced.

Further, even when film peeling or a crack occurs, as the groove is formed, the occurrence of film peeling or a crack can be prevented by the groove, and the pad region A2 can be prevented from being influenced.

It is possible to reduce a possibility that film peeling or a crack will occur and reduce influence even when film peeling or a crack occurs, and thus the moisture-proof performance of the chip can be further improved.

(7-23)-Rd Embodiment

For example, a chip size package (CSP) technique can be employed as a method of packaging each of the chips described in the (7-1)-st to (7-22)-nd embodiments.

Figure 87:
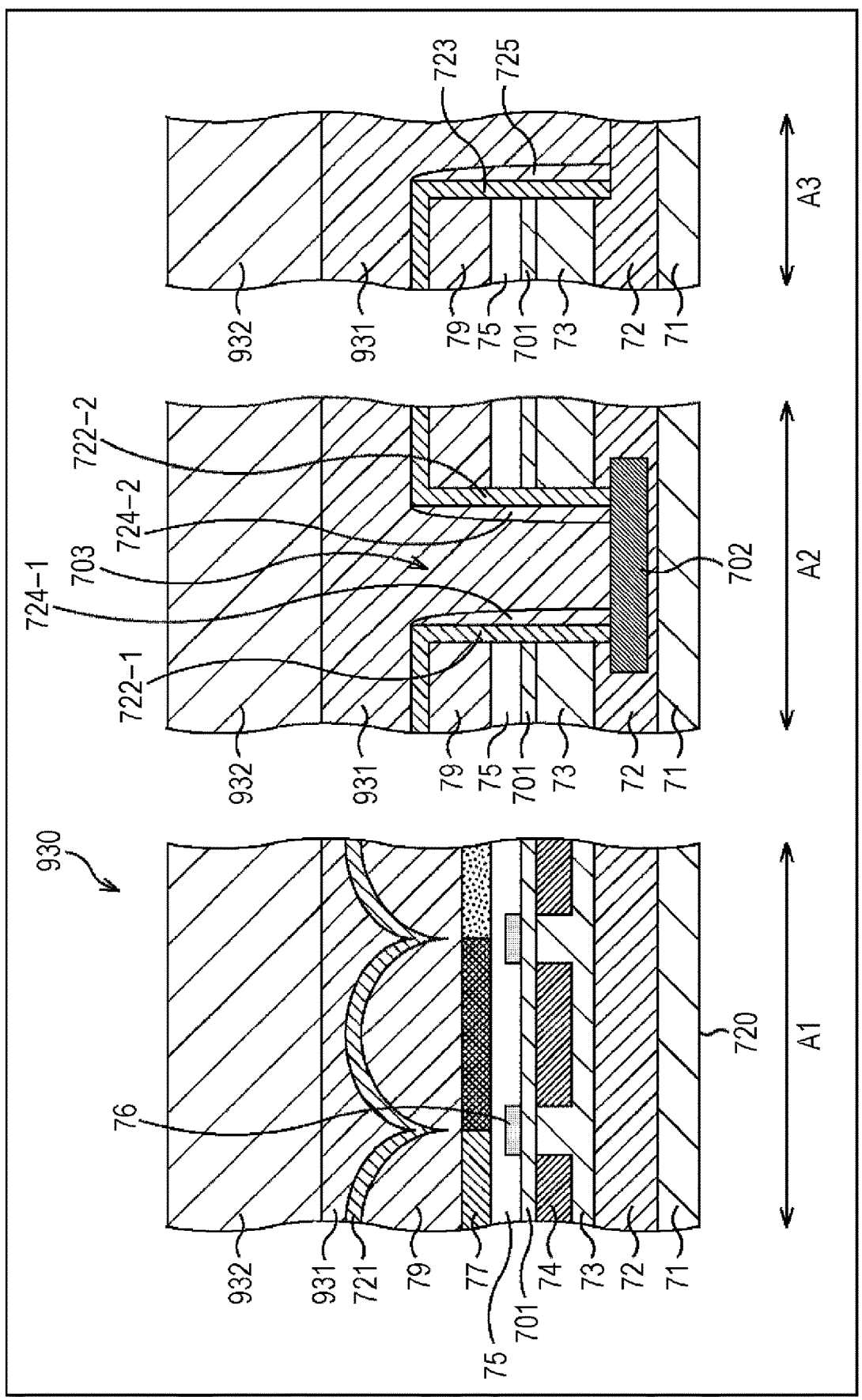
FIG. 87 is a diagram illustrating a configuration of a chip according to the seventh embodiment.

FIG. 87 is a cross-sectional view schematically illustrating an exemplary configuration of a semiconductor package 930 obtained by packaging the chip 720 illustrated in FIG. 66 by the CSP technique. In FIG. 87, parts corresponding to those of FIG. 66 are denoted by the same reference numerals, and a description thereof will be appropriately omitted.

In the semiconductor package 930, transparent seal resin 931 is formed on the surface of the chip 720, and a glass substrate 932 is stacked on the seal resin 931. Thus, the chip 720 is protected from an external environment.

Further, the pad opening portion 703 is also filled with the seal resin 931. In other words, the inside of the pad opening portion 703 surrounded by a hydrophobic film 724 formed in the porous wall portion is filled with the seal resin 931. Further, a hydrophobic film 725 formed in the sidewall portion is covered with the seal resin 931.

As the pad opening portion 703 is filled with the seal resin 931, for example, when external force is applied to the semiconductor package 930, the portion filled with the seal resin 931 can be expected to undertake a shock absorber, and thus tolerance to external pressure or the like can be improved.

Further, as the hydrophobic film 725 formed in the sidewall portion is covered with the seal resin 931, force applied to a film interface at the time of dicing can be mitigated, and a possibility that film peeling or a crack will occur at the time of dicing can be reduced. Furthermore, since film peeling or a crack does not occur, the moisture-proof performance of the chip can be improved.

Further, when moisture intrudes into the seal resin 931, a component of an adhesive included in the seal resin 931 is likely to melt into the intruded moisture, and thus the quality of the chip 720 may deteriorate. However, since intrusion of moisture into the surface of a photodiode 74 and a color filter layer 77 of the chip 720 is prevented by the function of the passivation film 721 as described above, deterioration in the quality of the chip 720 is prevented.

Further, since there are the stacked film interfaces in the portion in which the pad opening portion is formed and the chip edge, moisture or the like is more likely to intrude to the portion in which the pad opening portion is formed and the chip edge than the surface of the chip. As the hydrophobic film as well as the passivation film is formed in the portions to cover the stacked film interface, even when moisture intrudes into the seal resin 931, since intrusion of moisture into the surface of the photodiode 74 and the color filter layer 77 of the chip 720 is prevented, a deterioration of the quality of the chip 720 can be prevented.

(7-24)-Th Embodiment

Figure 88:
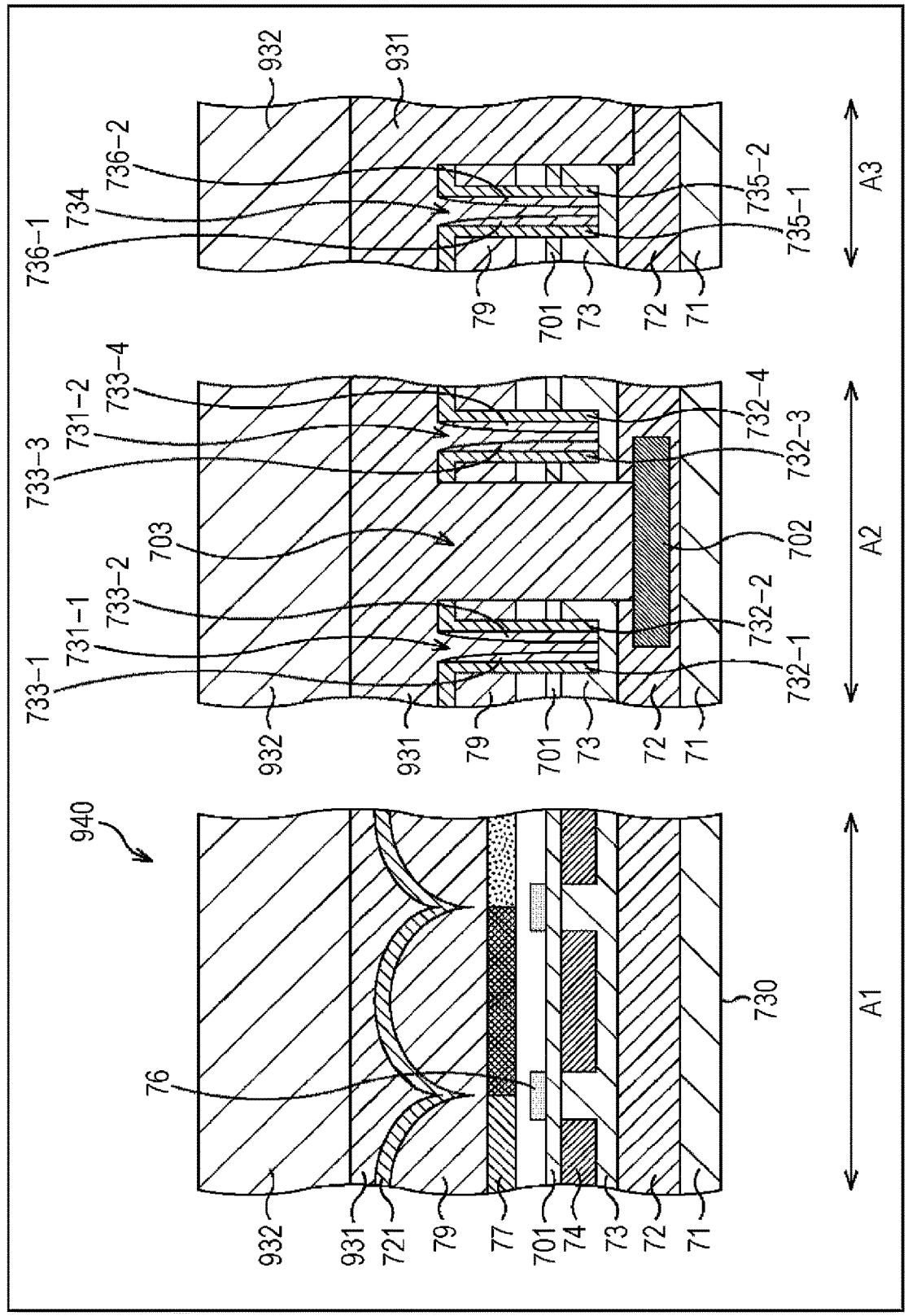
FIG. 88 is a diagram illustrating a configuration of a chip according to the seventh embodiment.

FIG. 88 is a cross-sectional view schematically illustrating an exemplary configuration of a semiconductor package 940 obtained by packaging the chip 730 illustrated in FIG. 68 by the CSP technique. In FIG. 88, parts corresponding to those of FIG. 68 are denoted by the same reference numerals, and a description thereof will be appropriately omitted.

In the semiconductor package 940, transparent seal resin 931 is formed on the surface of the chip 730, and a glass substrate 932 is stacked on the seal resin 931. Thus, the chip 730 is protected from an external environment.

Further, a pad opening portion 703, a groove 731-1, a groove 731-2, and a groove 734 are also filled with the seal resin 931. The chip edge of a scribe region A3 is also filled with the seal resin 931.

As the pad opening portion 703, the groove 731-1, the groove 731-2, and the groove 734 are filled with the seal resin 931, for example, when external force is applied to the semiconductor package 930, the portions filled with the seal resin 931 can be expected to undertake a shock absorber, and thus tolerance to external pressure or the like can be improved.

Further, as a scribe region A3 is also filled with the seal resin 931, force applied to a film interface at the time of dicing can be mitigated, and a possibility that film peeling or a crack will occur at the time of dicing can be reduced. Furthermore, since film peeling or a crack does not occur, the moisture-proof performance of the chip can be improved.

Further, when moisture intrudes into the seal resin 931, a component of an adhesive included in the seal resin 931 is likely to melt into the intruded moisture, and thus the quality of the chip 730 may deteriorate. However, since intrusion of moisture into the surface of the photodiode 74 and the color filter layer 77 of the chip 730 is prevented by the function of the passivation film 721 as described above, deterioration in the quality of the chip 730 is prevented.

Since there is a stacked film interface on the pad opening portion 703 and the chip edge, moisture is more likely to intrude into the pad opening portion 703 and the chip edge than the surface of the chip. As the groove and the hydrophobic film are formed in the pad opening portion 703 and the chip edge, and the stacked film interface is covered with the hydrophobic film, intrusion of moisture or impurities into the chip can be prevented.

Further, as the hydrophobic film is formed in the sidewall portion (the scribe region A3), force applied to each film interface at the time of dicing can be expected to be mitigated, and a possibility that film peeling or a crack will occur can be reduced.

Further, even when film peeling or a crack occurs, as the groove is formed, the occurrence of film peeling or a crack can be prevented by the groove, and a pad region A2 can be prevented from being influenced.

It is possible to reduce a possibility that film peeling or a crack will occur and reduce influence even when film peeling or a crack occurs, and thus the moisture-proof performance of the chip can be further improved.

(7-25)-Th Embodiment

Figure 89:
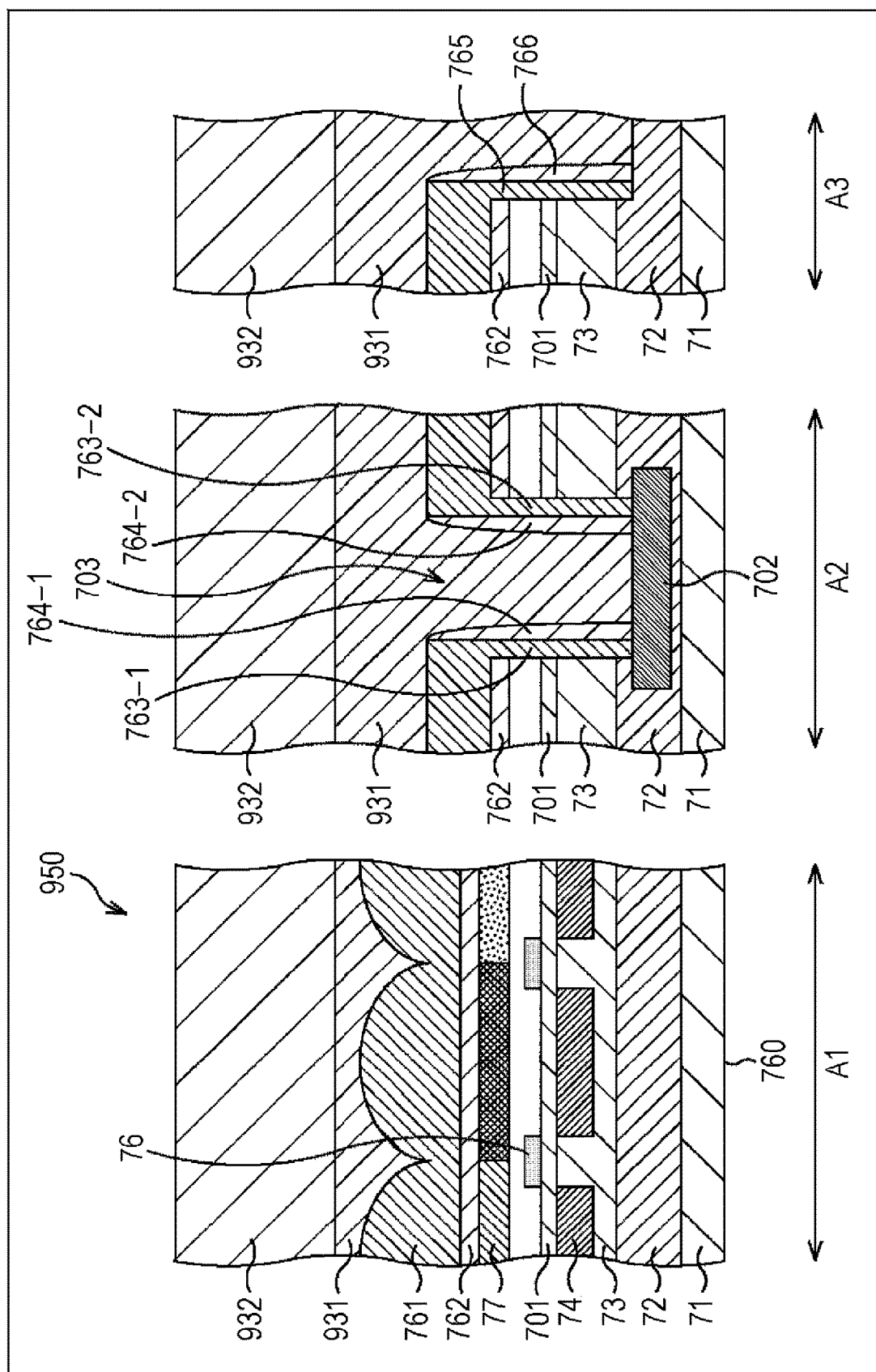
FIG. 89 is a diagram illustrating a configuration of a chip according to the seventh embodiment.

FIG. 89 is a cross-sectional view schematically illustrating an exemplary configuration of a semiconductor package 950 obtained by packaging the chip 760 illustrated in FIG. 71 by the CSP technique. In FIG. 89, parts corresponding to those of FIG. 71 are denoted by the same reference numerals, and a description thereof will be appropriately omitted.

In the semiconductor package 950, transparent seal resin 931 is formed on the surface of the chip 760, and a glass substrate 932 is stacked on the seal resin 931. Thus, the chip 760 is protected from an external environment.

A pad opening portion 703 is filled with the seal resin 931. In other words, the inside surrounded by a hydrophobic film 764 formed in the porous wall portion is filled with the seal resin 931. Further, a hydrophobic film 766 formed in the sidewall portion is also covered with the seal resin 931.

As the pad opening portion 703 is filled with the seal resin 931, for example, when external force is applied to the semiconductor package 950, the portion filled with the seal resin 931 can be expected to undertake a shock absorber, and thus tolerance to external pressure or the like can be improved.

Further, as the hydrophobic film 766 formed in the sidewall portion is covered with the seal resin 931, force applied to a film interface at the time of dicing can be mitigated, and a possibility that film peeling or a crack will occur at the time of dicing can be reduced. Furthermore, since film peeling or a crack does not occur, the moisture-proof performance of the chip can be improved.

Further, when moisture intrudes into the seal resin 931, a component of an adhesive included in the seal resin 931 is likely to melt into the intruded moisture, and thus the quality of the chip 760 may deteriorate. However, since intrusion of moisture into the surface of a photodiode 74 and a color filter layer 77 of the chip 760 is prevented by the functions of microlens passivation films 761, 763, and 765 as described above, deterioration in the quality of the chip 760 can be prevented.

Further, since there are the stacked film interfaces in the portion in which the pad opening portion is formed and the chip edge, moisture or the like is more likely to intrude to the portion in which the pad opening portion is formed and the chip edge than the surface of the chip. As the hydrophobic film as well as the microlens passivation film is formed in the portions to cover the stacked film interface, even when moisture intrudes into the seal resin 931, since intrusion of moisture into the surface of the photodiode 74 and the color filter layer 77 of the chip 760 is prevented, a deterioration of the quality of the chip 760 can be prevented.

(7-26)-Th Embodiment

Figure 90:
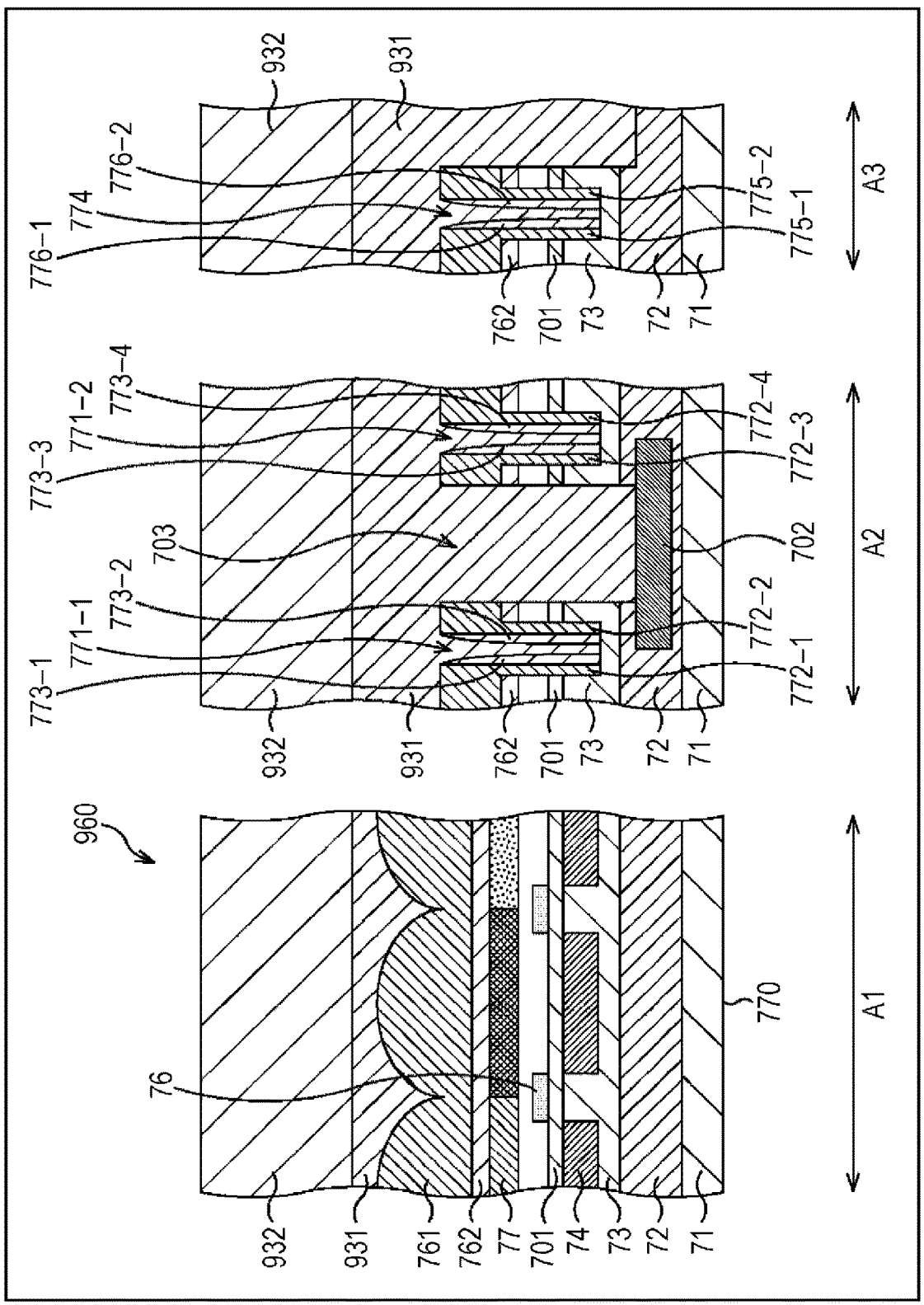
FIG. 90 is a diagram illustrating a configuration of a chip according to the seventh embodiment.

FIG. 90 is a cross-sectional view schematically illustrating an exemplary configuration of a semiconductor package 960 obtained by packaging the chip 770 illustrated in FIG. 72 by the CSP technique. In FIG. 90, parts corresponding to those of FIG. 72 are denoted by the same reference numerals, and a description thereof will be appropriately omitted.

In the semiconductor package 960, transparent seal resin 931 is formed on the surface of the chip 770, and a glass substrate 932 is stacked on the seal resin 931. Thus, the chip 770 is protected from an external environment.

Further, a pad opening portion 703, a groove 771-1, a groove 771-2, and a groove 774 are also filled with the seal resin 931. A scribe region A3 is also filled with the seal resin 931.

As the pad opening portion 703, the groove 771-1, the groove 771-2, and the groove 774 are filled with the seal resin 931, for example, when external force is applied to the semiconductor package 930, the portions filled with the seal resin 931 can be expected to undertake a shock absorber, and thus tolerance to external pressure or the like can be improved.

Further, as the scribe region A3 is also filled with the seal resin 931, force applied to a film interface at the time of dicing can be mitigated, and a possibility that film peeling or a crack will occur at the time of dicing can be reduced. Furthermore, since film peeling or a crack does not occur, the moisture-proof performance of the chip can be improved.

Further, when moisture intrudes into the seal resin 931, a component of an adhesive included in the seal resin 931 is likely to melt into the intruded moisture, and thus the quality of the chip 770 may deteriorate. However, since intrusion of moisture into the surface of a photodiode 74 and a color filter layer 77 of the chip 770 is prevented by the functions of microlens passivation films 761, 772, and 775 as described above, deterioration in the quality of the chip 770 is prevented.

Since there is a stacked film interface on the pad opening portion 703 and the chip edge, moisture is more likely to intrude into the pad opening portion 703 and the chip edge than the surface of the chip. As the groove and the hydrophobic film are formed in the pad opening portion 703 and the chip edge, and the stacked film interface is covered with the hydrophobic film, intrusion of moisture or impurities into the chip can be prevented.

Further, as the hydrophobic film is formed in the sidewall portion (the scribe region A3), force applied to each film interface at the time of dicing can be expected to be mitigated, and a possibility that film peeling or a crack will occur can be reduced.

Further, even when film peeling or a crack occurs, as the groove is formed, the occurrence of film peeling or a crack can be prevented by the groove, and a pad region A2 can be prevented from being influenced.

It is possible to reduce a possibility that film peeling or a crack will occur and reduce influence even when film peeling or a crack occurs, and thus the moisture-proof performance of the chip can be further improved.

(7-27)-Th Embodiment

Figure 91:
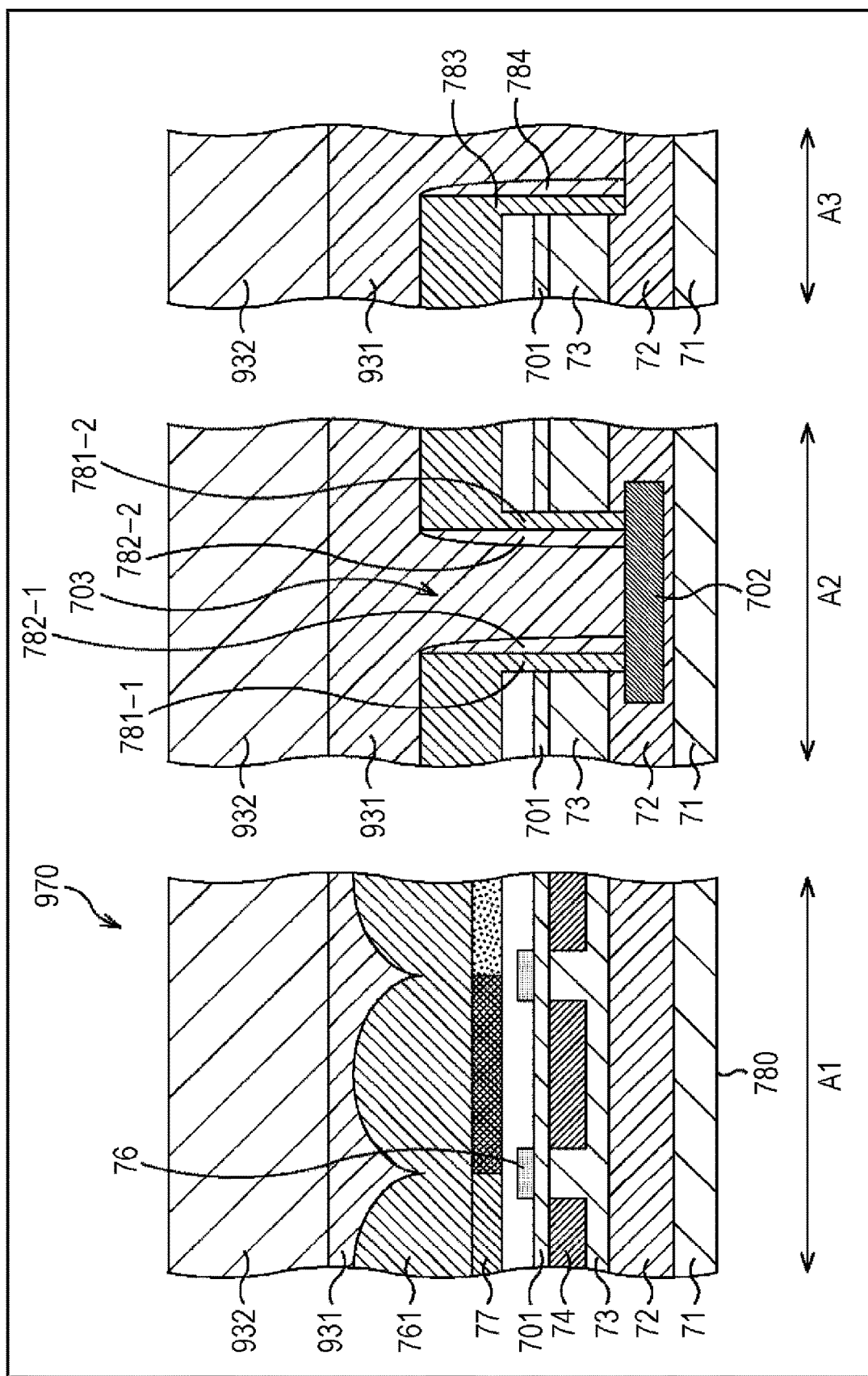
FIG. 91 is a diagram illustrating a configuration of a chip according to the seventh embodiment.

FIG. 91 is a cross-sectional view schematically illustrating an exemplary configuration of a semiconductor package 970 obtained by packaging the chip 780 illustrated in FIG. 73 by the CSP technique. In FIG. 91, parts corresponding to those of FIG. 73 are denoted by the same reference numerals, and a description thereof will be appropriately omitted.

In the semiconductor package 970, transparent seal resin 931 is formed on the surface of the chip 780, and a glass substrate 932 is stacked on the seal resin 931. Thus, the chip 780 is protected from an external environment.

A pad opening portion 703 is filled with the seal resin 931. In other words, the inside surrounded by a hydrophobic film 782 formed in the porous wall portion is filled with the seal resin 931. Further, a hydrophobic film 784 formed in the sidewall portion is also covered with the seal resin 931.

As a pad opening portion 703 is filled with the seal resin 931, for example, when external force is applied to the semiconductor package 970, the portion filled with the seal resin 931 can be expected to undertake a shock absorber, and thus tolerance to external pressure or the like can be improved.

Further, as the hydrophobic film 784 formed in the sidewall portion is covered with the seal resin 931, force applied to a film interface at the time of dicing can be mitigated, and a possibility that film peeling or a crack will occur at the time of dicing can be reduced. Furthermore, since film peeling or a crack does not occur, the moisture-proof performance of the chip can be improved.

Further, when moisture intrudes into the seal resin 931, a component of an adhesive included in the seal resin 931 is likely to melt into the intruded moisture, and thus the quality of the chip 780 may deteriorate. However, since intrusion of moisture into the surface of a photodiode 74 and a color filter layer 77 of the chip 780 is prevented by the functions of microlens passivation films 761, 781, and 783 as described above, deterioration in the quality of the chip 780 can be prevented.

Further, since there are the stacked film interfaces in the portion in which the pad opening portion is formed and the chip edge, moisture or the like is more likely to intrude to the portion in which the pad opening portion is formed and the chip edge than the surface of the chip. As the hydrophobic film as well as the microlens passivation film is formed in the portions to cover the stacked film interface, even when moisture intrudes into the seal resin 931, since intrusion of moisture into the surface of the photodiode 74 and the color filter layer 77 of the chip 780 is prevented, a deterioration of the quality of the chip 780 can be prevented.

(7-28)-Th Embodiment

Figure 92:
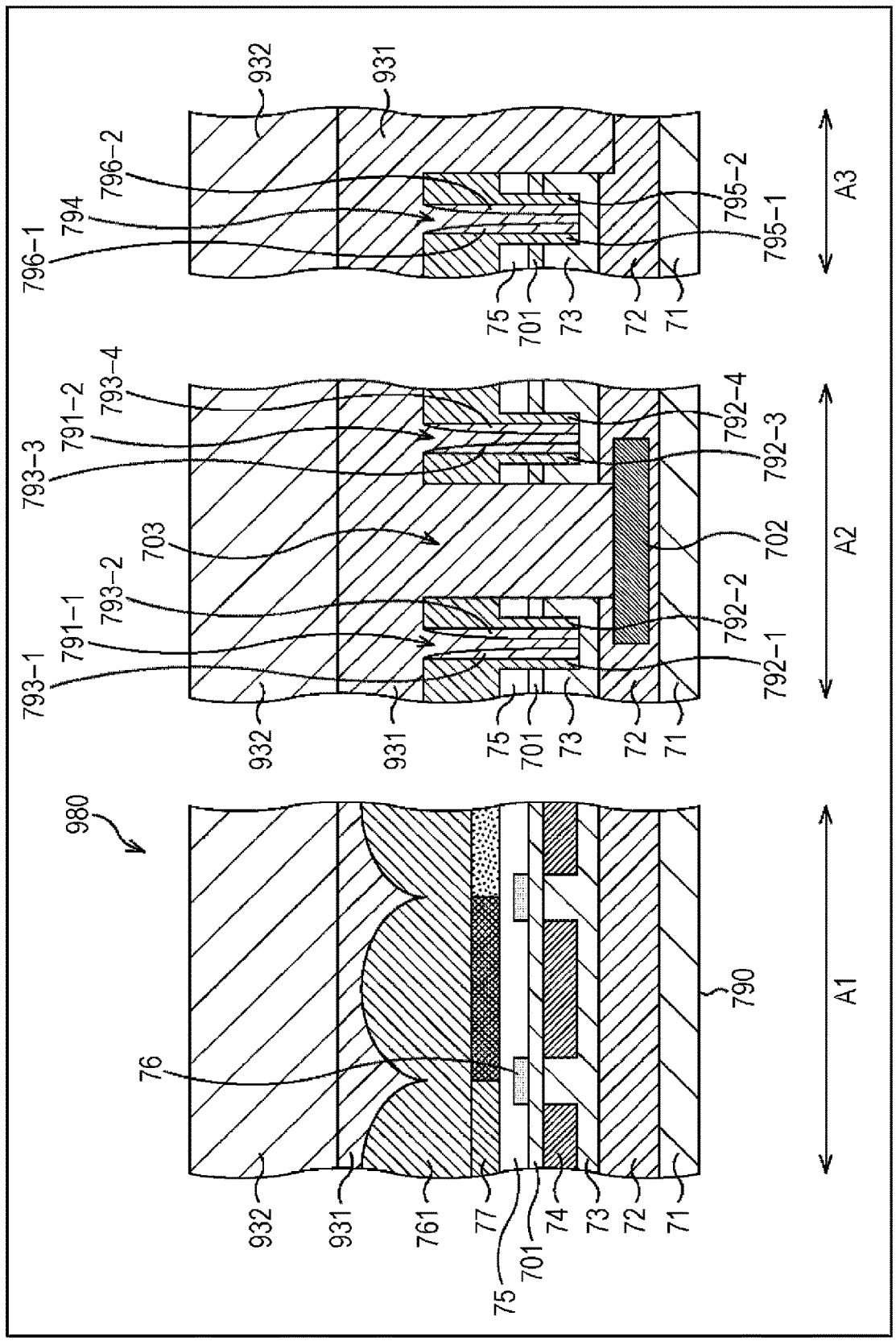
FIG. 92 is a diagram illustrating a configuration of a chip according to the seventh embodiment.

FIG. 92 is a cross-sectional view schematically illustrating an exemplary configuration of a semiconductor package 980 obtained by packaging the chip 790 illustrated in FIG. 74 by the CSP technique. In FIG. 92, parts corresponding to those of FIG. 74 are denoted by the same reference numerals, and a description thereof will be appropriately omitted.

In the semiconductor package 980, transparent seal resin 931 is formed on the surface of the chip 790, and a glass substrate 932 is stacked on the seal resin 931. Thus, the chip 790 is protected from an external environment.

Further, a pad opening portion 703, a groove 791-1, a groove 791-2, and a groove 794 are also filled with the seal resin 931. Furthermore, the chip edge of a scribe region A3 is also filled with the seal resin 931.

As the pad opening portion 703, the groove 791-1, the groove 791-2, and the groove 794 are filled with the seal resin 931, for example, when external force is applied to the semiconductor package 980, the portions filled with the seal resin 931 can be expected to undertake a shock absorber, and thus tolerance to external pressure or the like can be improved.

Further, as the scribe region A3 is also filled with the seal resin 931, force applied to a film interface at the time of dicing can be mitigated, and a possibility that film peeling or a crack will occur at the time of dicing can be reduced. Furthermore, since film peeling or a crack does not occur, the moisture-proof performance of the chip can be improved.

Further, when moisture intrudes into the seal resin 931, a component of an adhesive included in the seal resin 931 is likely to melt into the intruded moisture, and thus the quality of the chip 790 may deteriorate. However, since intrusion of moisture into the surface of a photodiode 74 and a color filter layer 77 of the chip 790 is prevented by the functions of microlens passivation films 761, 792, and 795 as described above, deterioration in the quality of the chip 790 is prevented.

Since there is a stacked film interface on the pad opening portion 703 and the chip edge, moisture is more likely to intrude into the pad opening portion 703 and the chip edge than the surface of the chip. As the groove and the hydrophobic film are formed in the pad opening portion 703 and the chip edge, and the stacked film interface is covered with the hydrophobic film, intrusion of moisture or impurities into the chip can be prevented.

Further, as the hydrophobic film is formed in the sidewall portion (the scribe region A3), force applied to each film interface at the time of dicing can be expected to be mitigated, and a possibility that film peeling or a crack will occur can be reduced.

Further, even when film peeling or a crack occurs, as the groove is formed, the occurrence of film peeling or a crack can be prevented by the groove, and a pad region A2 can be prevented from being influenced.

It is possible to reduce a possibility that film peeling or a crack will occur and reduce influence even when film peeling or a crack occurs, and thus the moisture-proof performance of the chip can be further improved.

(7-29)-Th Embodiment

Figure 93:
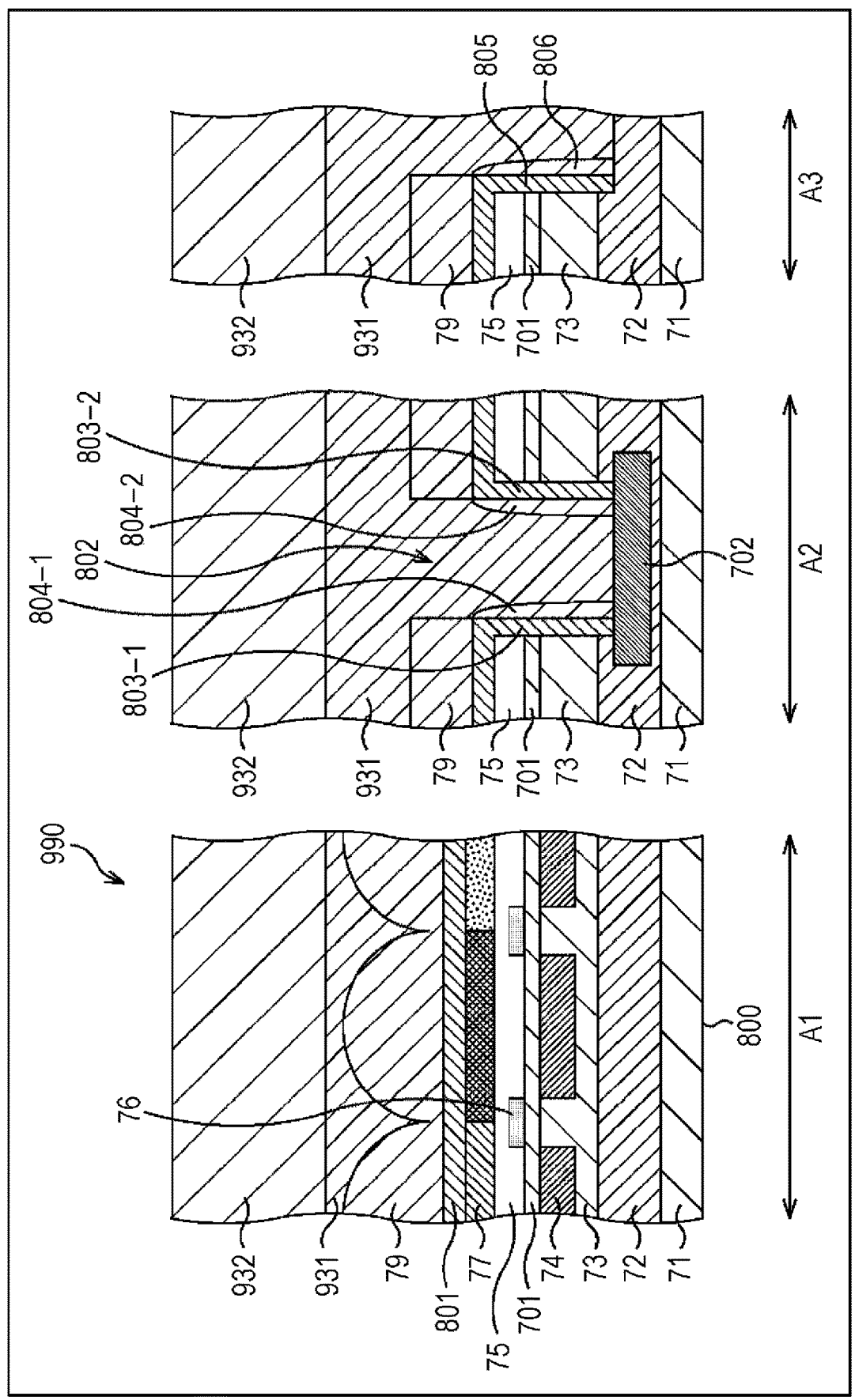
FIG. 93 is a diagram illustrating a configuration of a chip according to the seventh embodiment.

FIG. 93 is a cross-sectional view schematically illustrating an exemplary configuration of a semiconductor package 990 obtained by packaging the chip 800 illustrated in FIG. 75 by the CSP technique. In FIG. 93, parts corresponding to those of FIG. 75 are denoted by the same reference numerals, and a description thereof will be appropriately omitted.

In the semiconductor package 990, transparent seal resin 931 is formed on the surface of the chip 800, and a glass substrate 932 is stacked on the seal resin 931. Thus, the chip 800 is protected from an external environment.

A pad opening portion 802 is filled with the seal resin 931. In other words, the inside surrounded by a hydrophobic film 804 formed in the porous wall portion is filled with the seal resin 931. Further, a hydrophobic film 806 formed in the sidewall portion is also covered with the seal resin 931.

As the pad opening portion 802 is filled with the seal resin 931, for example, when external force is applied to the semiconductor package 990, the portion filled with the seal resin 931 can be expected to undertake a shock absorber, and thus tolerance to external pressure or the like can be improved.

Further, as the hydrophobic film 806 formed in the sidewall portion is covered with the seal resin 931, force applied to a film interface at the time of dicing can be mitigated, and a possibility that film peeling or a crack will occur at the time of dicing can be reduced. Furthermore, since film peeling or a crack does not occur, the moisture-proof performance of the chip can be improved.

Further, when moisture intrudes into the seal resin 931, a component of an adhesive included in the seal resin 931 is likely to melt into the intruded moisture, and thus the quality of the chip 800 may deteriorate. However, since intrusion of moisture into the surface of a photodiode 74 and a color filter layer 77 of the chip 800 is prevented by the functions of passivation films 801, 803, and 805 as described above, deterioration in the quality of the chip 800 can be prevented.

Further, since there are the stacked film interfaces in the portion in which the pad opening portion is formed and the chip edge, moisture or the like is more likely to intrude to the portion in which the pad opening portion is formed and the chip edge than the surface of the chip. As the hydrophobic film as well as the passivation film is formed in the portions to cover the stacked film interface, even when moisture intrudes into the seal resin 931, since intrusion of moisture into the surface of the photodiode 74 and the color filter layer 77 of the chip 800 is prevented, a deterioration in the quality of the chip 800 can be prevented.

(7-30)-Th Embodiment

Figure 94:
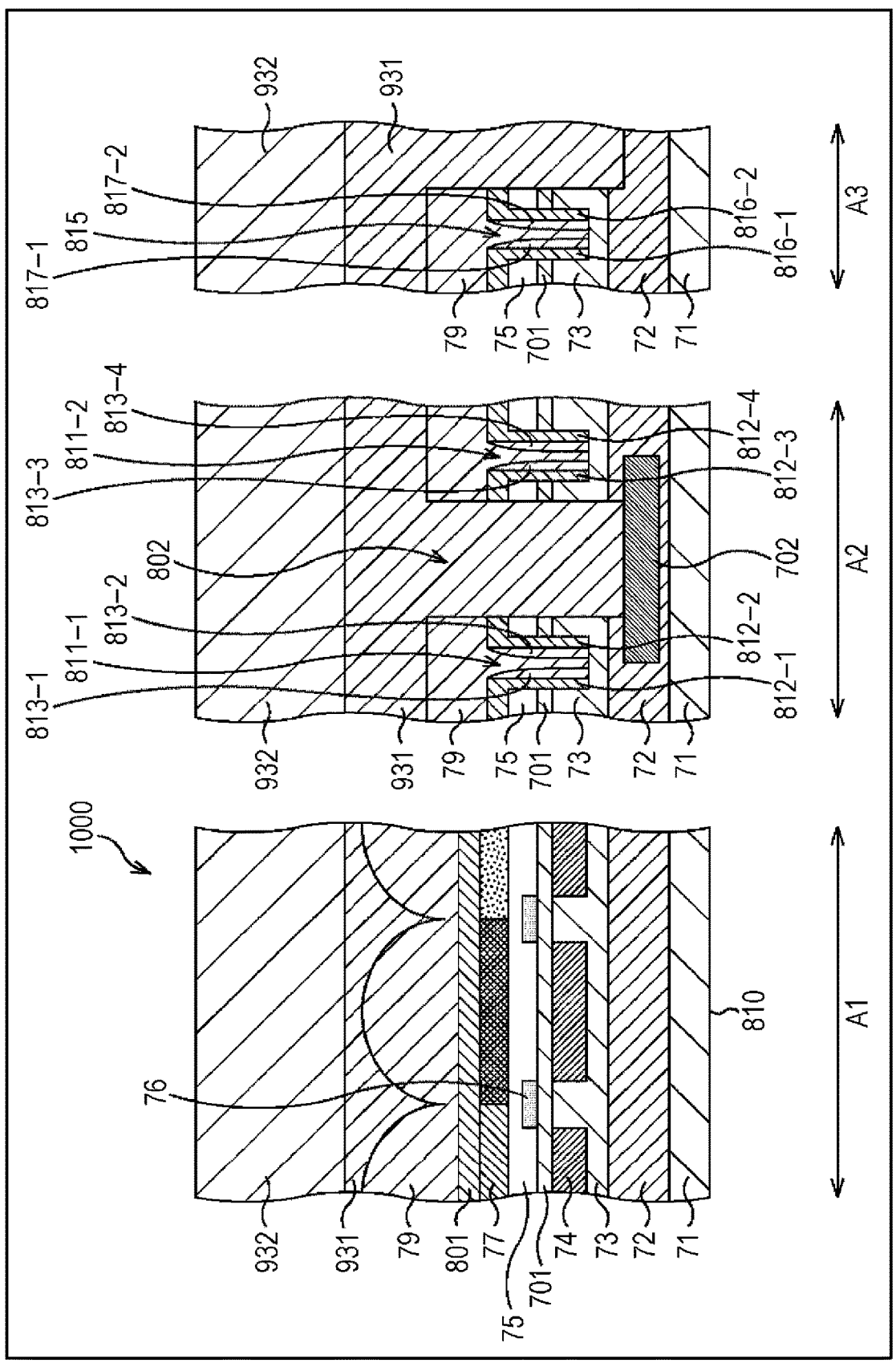
FIG. 94 is a diagram illustrating a configuration of a chip according to the seventh embodiment.

FIG. 94 is a cross-sectional view schematically illustrating an exemplary configuration of a semiconductor package 1000 obtained by packaging the chip 810 illustrated in FIG. 76 by the CSP technique. In FIG. 94, parts corresponding to those of FIG. 76 are denoted by the same reference numerals, and a description thereof will be appropriately omitted.

In the semiconductor package 1000, transparent seal resin 931 is formed on the surface of the chip 810, and a glass substrate 932 is stacked on the seal resin 931. Thus, the chip 810 is protected from an external environment.

Further, a pad opening portion 802, a groove 811-1, a groove 811-2, and a groove 815 are also filled with the seal resin 931. Furthermore, the chip edge of a scribe region A3 is also filled with the seal resin 931.

As the pad opening portion 802, the groove 811-1, the groove 811-2, and the groove 815 are filled with the seal resin 931, for example, when external force is applied to the semiconductor package 930, the portions filled with the seal resin 931 can be expected to undertake a shock absorber, and thus tolerance to external pressure or the like can be improved.

Further, as the scribe region A3 is also filled with the seal resin 931, force applied to a film interface at the time of dicing can be mitigated, and a possibility that film peeling or a crack will occur at the time of dicing can be reduced. Furthermore, since film peeling or a crack does not occur, the moisture-proof performance of the chip can be improved.

Further, when moisture intrudes into the seal resin 931, a component of an adhesive included in the seal resin 931 is likely to melt into the intruded moisture, and thus the quality of the chip 810 may deteriorate. However, since intrusion of moisture into the surface of a photodiode 74 and a color filter layer 77 of the chip 810 is prevented by the functions of passivation films 801, 812, and 816 as described above, deterioration in the quality of the chip 810 is prevented.

Further, since there are the stacked film interfaces in the pad opening portion 802 and the chip edge, moisture or the like is more likely to intrude into the pad opening portion 802 and the chip edge than the surface of the chip. As the groove and the hydrophobic film are formed in the pad opening portion 802 and the chip edge, and the stacked film interface is covered with the hydrophobic film, intrusion of moisture or impurities into the chip can be prevented.

Further, as the hydrophobic film is formed in the sidewall portion (the scribe region A3), force applied to each film interface at the time of dicing can be expected to be mitigated, and a possibility that film peeling or a crack will occur can be reduced.

Further, even when film peeling or a crack occurs, as the groove is formed, the occurrence of film peeling or a crack can be prevented by the groove, and a pad region A2 can be prevented from being influenced.

It is possible to reduce a possibility that film peeling or a crack will occur and reduce influence even when film peeling or a crack occurs, and thus the moisture-proof performance of the chip can be further improved.

(7-31)-St Embodiment

Figure 95:
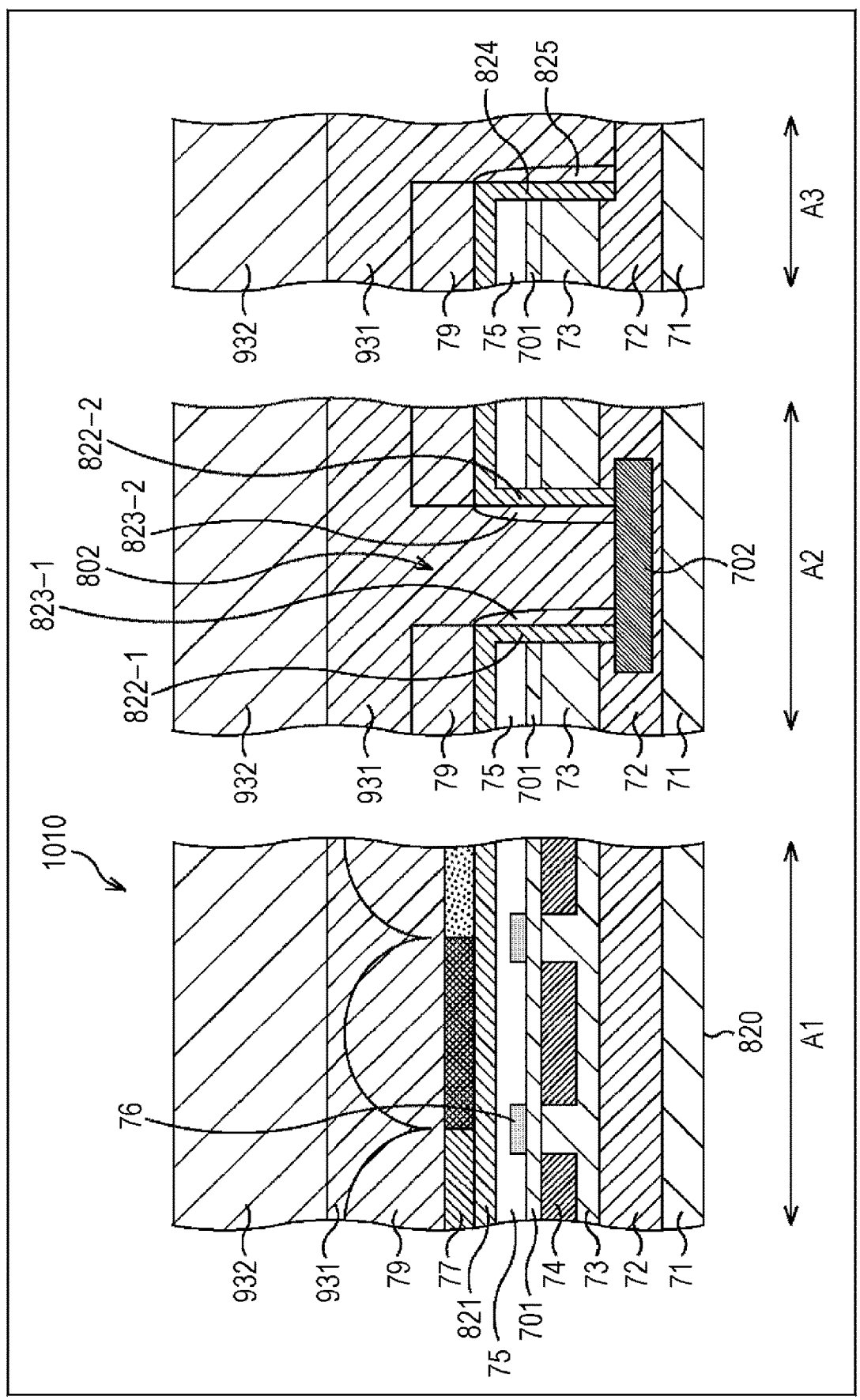
FIG. 95 is a diagram illustrating a configuration of a chip according to the seventh embodiment.

FIG. 95 is a cross-sectional view schematically illustrating an exemplary configuration of a semiconductor package 1010 obtained by packaging the chip 820 illustrated in FIG. 77 by the CSP technique. In FIG. 95, parts corresponding to those of FIG. 77 are denoted by the same reference numerals, and a description thereof will be appropriately omitted.

In the semiconductor package 1010, transparent seal resin 931 is formed on the surface of the chip 820, and a glass substrate 932 is stacked on the seal resin 931. Thus, the chip 820 is protected from an external environment.

A pad opening portion 802 is filled with the seal resin 931. In other words, the inside surrounded by a hydrophobic film 823 formed in the porous wall portion is filled with the seal resin 931. Further, a hydrophobic film 825 formed in the sidewall portion is also covered with the seal resin 931.

As the pad opening portion 802 is filled with the seal resin 931, for example, when external force is applied to the semiconductor package 1010, the portion filled with the seal resin 931 can be expected to undertake a shock absorber, and thus tolerance to external pressure or the like can be improved.

Further, as the hydrophobic film 825 formed in the sidewall portion and a microlens layer 79 are covered with the seal resin 931, force applied to a film interface at the time of dicing can be mitigated, and a possibility that film peeling or a crack will occur at the time of dicing can be reduced. Furthermore, since film peeling or a crack does not occur, the moisture-proof performance of the chip can be improved.

Further, when moisture intrudes into the seal resin 931, a component of an adhesive included in the seal resin 931 is likely to melt into the intruded moisture, and thus the quality of the chip 820 may deteriorate. However, since intrusion of moisture into the surface of a photodiode 74 of the chip 820 is prevented by the functions of passivation films 821, 822, and 824 as described above, deterioration in the quality of the chip 820 can be prevented.

Further, since there are the stacked film interfaces in the portion in which the pad opening portion is formed and the chip edge, moisture or the like is more likely to intrude to the portion in which the pad opening portion is formed and the chip edge than the surface of the chip. As the hydrophobic film as well as the passivation film is formed in the portions to cover the stacked film interface, even when moisture intrudes into the seal resin 931, since intrusion of moisture into the surface of the photodiode 74 of the chip 820 is prevented, deterioration in the quality of the chip 820 can be prevented.

(7-32)-Nd Embodiment

Figure 96:
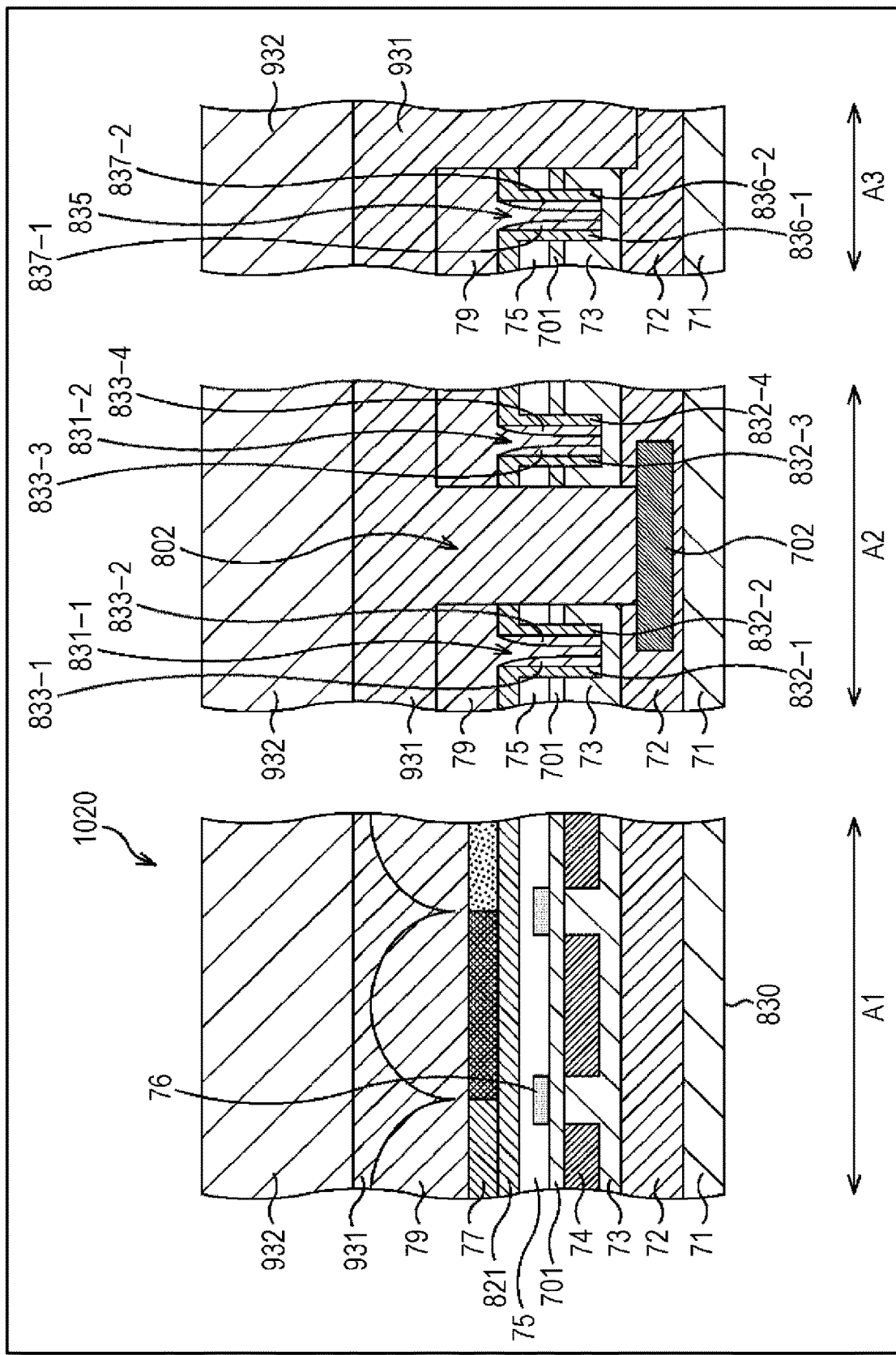
FIG. 96 is a diagram illustrating a configuration of a chip according to the seventh embodiment.

FIG. 96 is a cross-sectional view schematically illustrating an exemplary configuration of a semiconductor package 1020 obtained by packaging the chip 830 illustrated in FIG. 78 by the CSP technique. In FIG. 96, parts corresponding to those of FIG. 78 are denoted by the same reference numerals, and a description thereof will be appropriately omitted.

In the semiconductor package 1020, transparent seal resin 931 is formed on the surface of the chip 830, and a glass substrate 932 is stacked on the seal resin 931. Thus, the chip 830 is protected from an external environment.

Further, a pad opening portion 802, a groove 831-1, a groove 831-2, and a groove 835 are also filled with the seal resin 931. Furthermore, the chip edge of a scribe region A3 is also filled with the seal resin 931.

As the pad opening portion 802, the groove 831-1, the groove 831-2, and the groove 835 are filled with the seal resin 931, for example, when external force is applied to the semiconductor package 1020, the portions filled with the seal resin 931 can be expected to undertake a shock absorber, and thus tolerance to external pressure or the like can be improved.

Further, as the scribe region A3 is also filled with the seal resin 931, force applied to a film interface at the time of dicing can be mitigated, and a possibility that film peeling or a crack will occur at the time of dicing can be reduced. Furthermore, since film peeling or a crack does not occur, the moisture-proof performance of the chip can be improved.

Further, when moisture intrudes into the seal resin 931, a component of an adhesive included in the seal resin 931 is likely to melt into the intruded moisture, and thus the quality of the chip 830 may deteriorate. However, since intrusion of moisture into the surface of a photodiode 74 and a color filter layer 77 of the chip 830 is prevented by the functions of passivation films 821, 832, and 836 as described above, deterioration in the quality of the chip 830 is prevented.

Since there is a stacked film interface on the pad opening portion 802 and the chip edge, moisture is more likely to intrude into the pad opening portion 802 and the chip edge than the surface of the chip. As the groove and the hydrophobic film are formed in the pad opening portion 802 and the chip edge, and the stacked film interface is covered with the hydrophobic film, intrusion of moisture or impurities into the chip can be prevented.

Further, as the hydrophobic film is formed in the sidewall portion (the scribe region A3), force applied to each film interface at the time of dicing can be expected to be mitigated, and a possibility that film peeling or a crack will occur can be reduced.

Further, even when film peeling or a crack occurs, as the groove is formed, the occurrence of film peeling or a crack can be prevented by the groove, and the pad region A2 can be prevented from being influenced.

It is possible to reduce a possibility that film peeling or a crack will occur and reduce influence even when film peeling or a crack occurs, and thus the moisture-proof performance of the chip can be further improved.

(7-33)-Rd Embodiment

Figure 97:
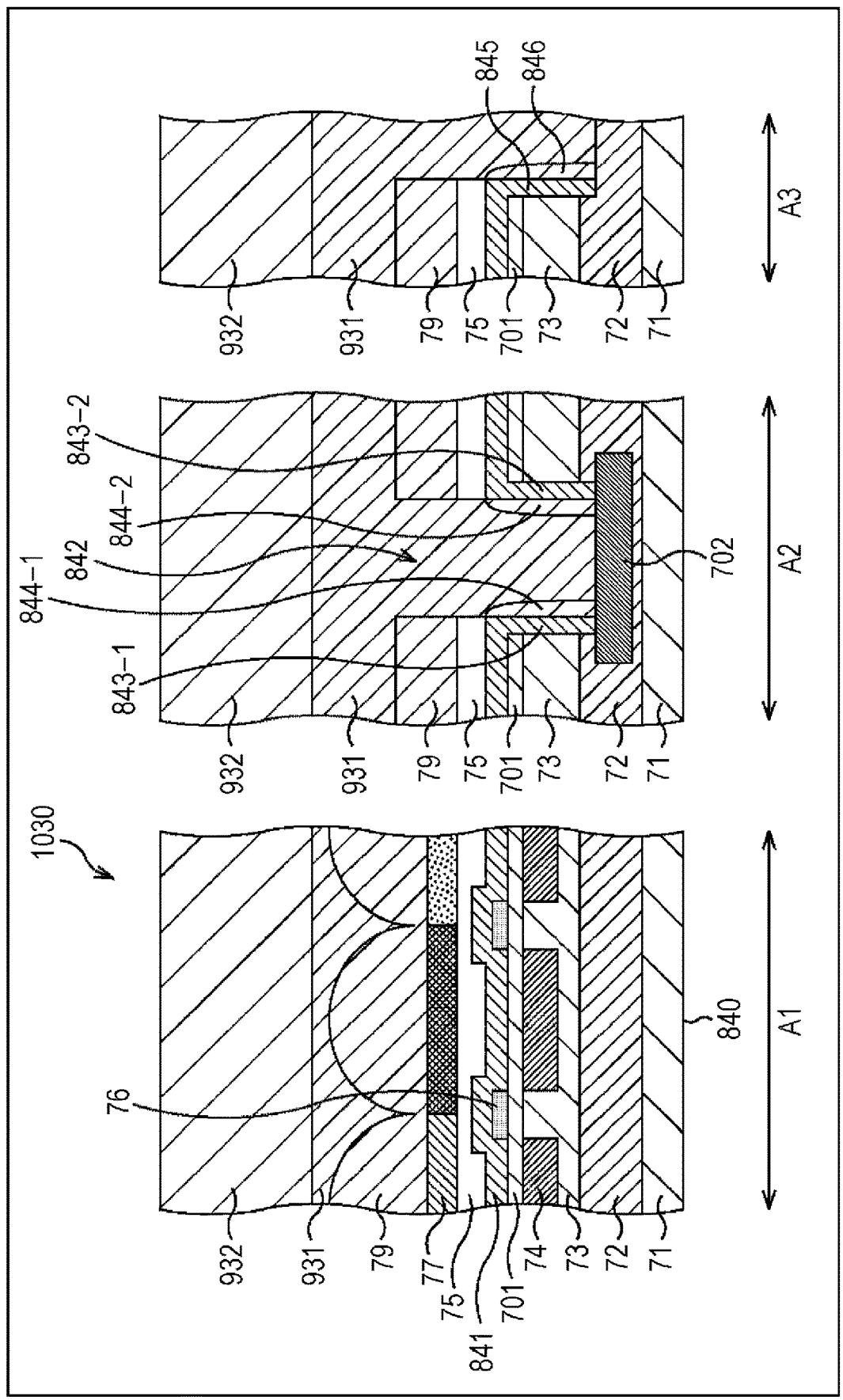
FIG. 97 is a diagram illustrating a configuration of a chip according to the seventh embodiment.

FIG. 97 is a cross-sectional view schematically illustrating an exemplary configuration of a semiconductor package 1030 obtained by packaging the chip 840 illustrated in FIG. 79 by the CSP technique. In FIG. 97, parts corresponding to those of FIG. 79 are denoted by the same reference numerals, and a description thereof will be appropriately omitted.

In the semiconductor package 1030, transparent seal resin 931 is formed on the surface of the chip 840, and a glass substrate 932 is stacked on the seal resin 931. Thus, the chip 840 is protected from an external environment.

A pad opening portion 842 is filled with the seal resin 931. In other words, the inside surrounded by a hydrophobic film 844 formed in the porous wall portion is filled with the seal resin 931. Further, a hydrophobic film 846 formed in the sidewall portion is also covered with the seal resin 931.

As the pad opening portion 842 is filled with the seal resin 931, for example, when external force is applied to the semiconductor package 1030, the portion filled with the seal resin 931 can be expected to undertake a shock absorber, and thus tolerance to external pressure or the like can be improved.

Further, as the hydrophobic film 846 formed in the sidewall portion, a planarization film 75, and a microlens layer 79 are covered with the seal resin 931, force applied to a film interface at the time of dicing can be mitigated, and a possibility that film peeling or a crack will occur at the time of dicing can be reduced. Furthermore, since film peeling or a crack does not occur, the moisture-proof performance of the chip can be improved.

Further, when moisture intrudes into the seal resin 931, a component of an adhesive included in the seal resin 931 is likely to melt into the intruded moisture, and thus the quality of the chip 840 may deteriorate. However, since intrusion of moisture into the surface of a photodiode 74 of the chip 840 is prevented by the functions of passivation films 841, 843, and 845 as described above, deterioration in the quality of the chip 840 can be prevented.

Further, since there are the stacked film interfaces in the portion in which the pad opening portion is formed and the chip edge, moisture or the like is more likely to intrude to the portion in which the pad opening portion is formed and the chip edge than the surface of the chip. As the hydrophobic film as well as the passivation film is formed in the portions to cover the stacked film interface, even when moisture intrudes into the seal resin 931, since intrusion of moisture into the surface of the photodiode 74 of the chip 840 is prevented, deterioration in the quality of the chip 840 can be prevented.

(7-34)-Th Embodiment

Figure 98:
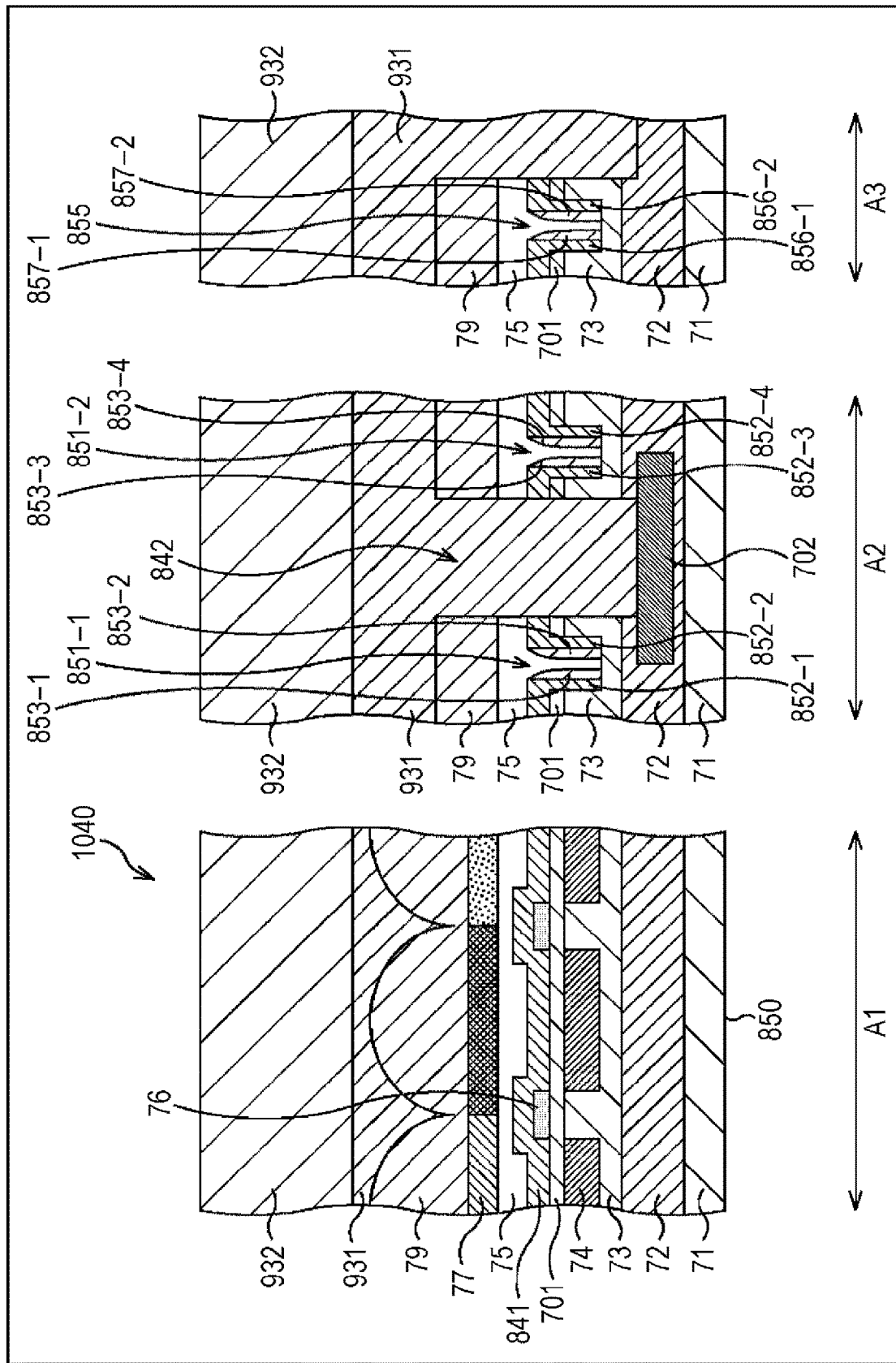
FIG. 98 is a diagram illustrating a configuration of a chip according to the seventh embodiment.

FIG. 98 is a cross-sectional view schematically illustrating an exemplary configuration of a semiconductor package 1040 obtained by packaging the chip 850 illustrated in FIG. 80 by the CSP technique. In FIG. 98, parts corresponding to those of FIG. 80 are denoted by the same reference numerals, and a description thereof will be appropriately omitted.

In the semiconductor package 1040, transparent seal resin 931 is formed on the surface of the chip 850, and a glass substrate 932 is stacked on the seal resin 931. Thus, the chip 850 is protected from an external environment.

Further, a pad opening portion 842, a groove 851-1, a groove 851-2, and a groove 855 are also filled with the seal resin 931. Furthermore, the chip edge of a scribe region A3 is also filled with the seal resin 931.

As the pad opening portion 842, the groove 851-1, the groove 851-2, and the groove 855 are filled with the seal resin 931, for example, when external force is applied to the semiconductor package 1040, the portions filled with the seal resin 931 can be expected to undertake a shock absorber, and thus tolerance to external pressure or the like can be improved.

Further, as the scribe region A3 is also filled with the seal resin 931, force applied to a film interface at the time of dicing can be mitigated, and a possibility that film peeling or a crack will occur at the time of dicing can be reduced. Furthermore, since film peeling or a crack does not occur, the moisture-proof performance of the chip can be improved.

Further, when moisture intrudes into the seal resin 931, a component of an adhesive included in the seal resin 931 is likely to melt into the intruded moisture, and thus the quality of the chip 850 may deteriorate. However, since intrusion of moisture into the surface of a photodiode 74 of the chip 850 is prevented by the functions of passivation films 821, 852, and 856 as described above, deterioration in the quality of the chip 850 is prevented.

Since there is a stacked film interface on the pad opening portion 842 and the chip edge, moisture is more likely to intrude into the pad opening portion 842 and the chip edge than the surface of the chip. As the groove and the hydrophobic film are formed in the pad opening portion 842 and the chip edge, and the stacked film interface is covered with the hydrophobic film, intrusion of moisture or impurities into the chip can be prevented.

Further, as the hydrophobic film is formed in the sidewall portion (the scribe region A3), force applied to each film interface at the time of dicing can be expected to be mitigated, and a possibility that film peeling or a crack will occur can be reduced.

Further, even when film peeling or a crack occurs, as the groove is formed, the occurrence of film peeling or a crack can be prevented by the groove, and a pad region A2 can be prevented from being influenced.

It is possible to reduce a possibility that film peeling or a crack will occur and reduce influence even when film peeling or a crack occurs, and thus the moisture-proof performance of the chip can be further improved.

(7-35)-Th Embodiment

Figure 99:
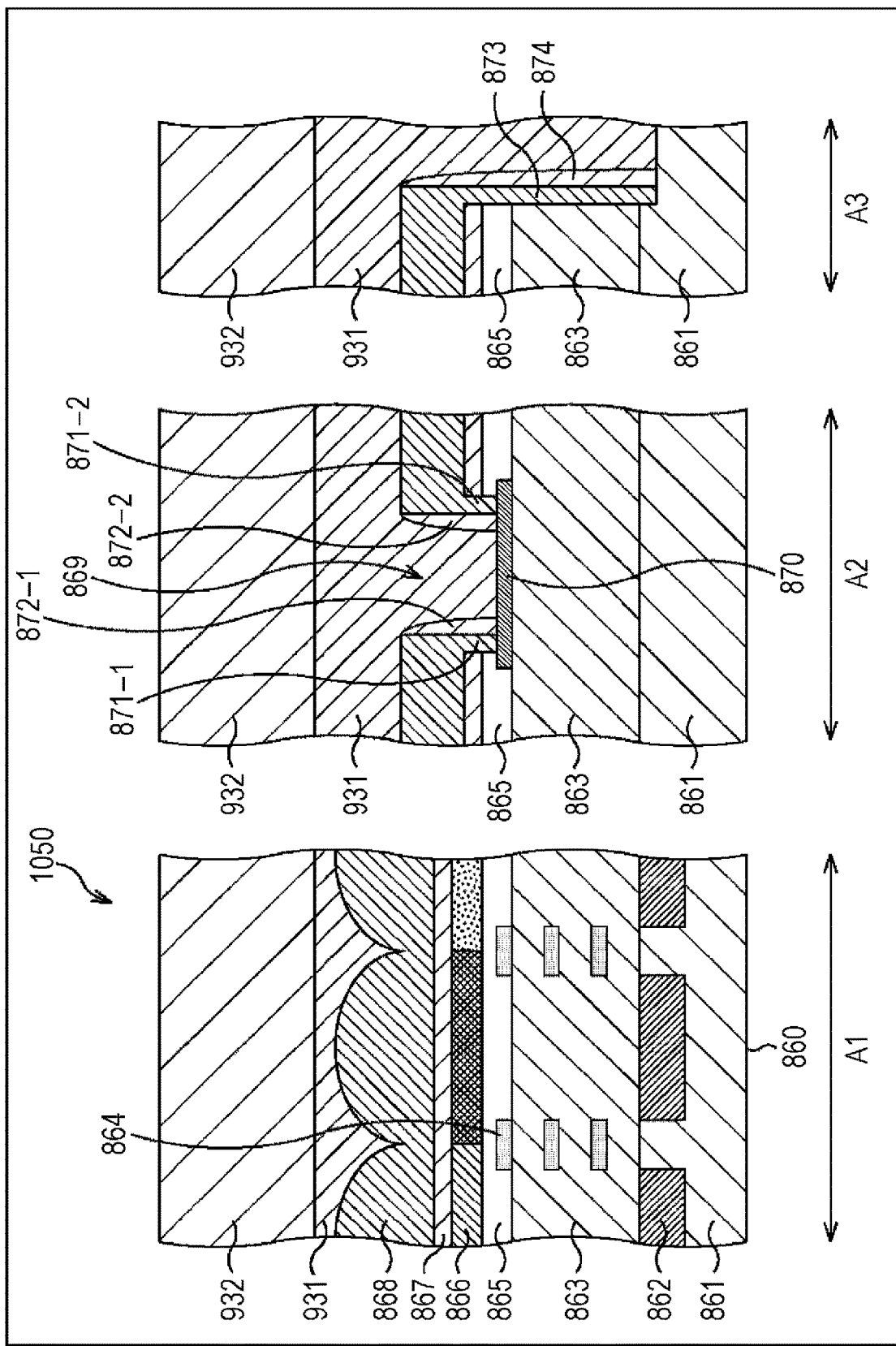
FIG. 99 is a diagram illustrating a configuration of a chip according to the seventh embodiment.

FIG. 99 is a cross-sectional view schematically illustrating an exemplary configuration of a semiconductor package 1050 obtained by packaging the chip 860 illustrated in FIG. 81 by the CSP technique. In FIG. 99, parts corresponding to those of FIG. 81 are denoted by the same reference numerals, and a description thereof will be appropriately omitted.

In the semiconductor package 1050, transparent seal resin 931 is formed on the surface of the chip 860, and a glass substrate 932 is stacked on the seal resin 931. Thus, the chip 860 is protected from an external environment.

A pad opening portion 869 is filled with the seal resin 931. In other words, the inside surrounded by a hydrophobic film 872 formed in the porous wall portion is filled with the seal resin 931. Further, a hydrophobic film 874 formed in the sidewall portion is also covered with the seal resin 931.

As the pad opening portion 869 is filled with the seal resin 931, for example, when external force is applied to the semiconductor package 1050, the portion filled with the seal resin 931 can be expected to undertake a shock absorber, and thus tolerance to external pressure or the like can be improved.

Further, as the hydrophobic film 874 formed in the sidewall portions covered with the seal resin 931, force applied to a film interface at the time of dicing can be mitigated, and a possibility that film peeling or a crack will occur at the time of dicing can be reduced. Furthermore, since film peeling or a crack does not occur, the moisture-proof performance of the chip can be improved.

Further, when moisture intrudes into the seal resin 931, a component of an adhesive included in the seal resin 931 is likely to melt into the intruded moisture, and thus the quality of the chip 860 may deteriorate. However, since intrusion of moisture into the surface of a photodiode 862 of the chip 860 is prevented by the functions of microlens passivation films 868, 871, and 873 as described above, deterioration in the quality of the chip 860 can be prevented.

Further, since there are the stacked film interfaces in the portion in which the pad opening portion is formed and the chip edge, moisture or the like is more likely to intrude to the portion in which the pad opening portion is formed and the chip edge than the surface of the chip. As the hydrophobic film as well as the passivation film is formed in the portions to cover the stacked film interface, even when moisture intrudes into the seal resin 931, since intrusion of moisture into the surface of the photodiode 862 of the chip 860 is prevented, deterioration in the quality of the chip 860 can be prevented.

(7-36)-Th Embodiment

Figure 100:
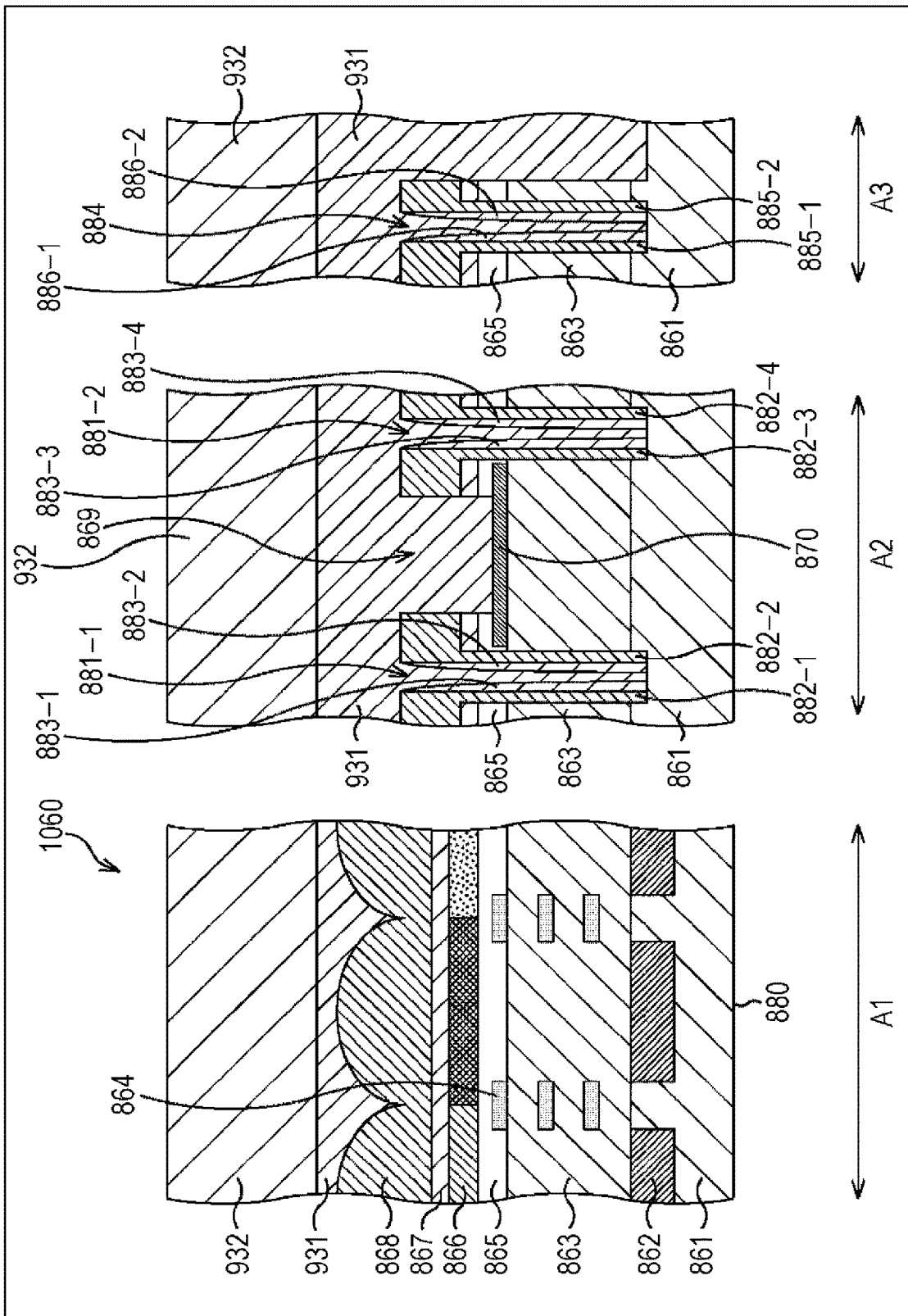
FIG. 100 is a diagram illustrating a configuration of a chip according to the seventh embodiment.

FIG. 100 is a cross-sectional view schematically illustrating an exemplary configuration of a semiconductor package 1060 obtained by packaging the chip 880 illustrated in FIG. 82 by the CSP technique. In FIG. 100, parts corresponding to those of FIG. 82 are denoted by the same reference numerals, and a description thereof will be appropriately omitted.

In the semiconductor package 1060, transparent seal resin 931 is formed on the surface of the chip 880, and a glass substrate 932 is stacked on the seal resin 931. Thus, the chip 880 is protected from an external environment.

Further, a pad opening portion 869, a groove 881-1, a groove 881-2, and a groove 884 are also filled with the seal resin 931. Furthermore, the chip edge of a scribe region A3 is also filled with the seal resin 931.

As the pad opening portion 869, the groove 881-1, the groove 881-2, and the groove 884 are filled with the seal resin 931, for example, when external force is applied to the semiconductor package 1060, the portions filled with the seal resin 931 can be expected to undertake a shock absorber, and thus tolerance to external pressure or the like can be improved.

Further, as the scribe region A3 is also filled with the seal resin 931, force applied to a film interface at the time of dicing can be mitigated, and a possibility that film peeling or a crack will occur at the time of dicing can be reduced. Furthermore, since film peeling or a crack does not occur, the moisture-proof performance of the chip can be improved.

Further, when moisture intrudes into the seal resin 931, a component of an adhesive included in the seal resin 931 is likely to melt into the intruded moisture, and thus the quality of the chip 880 may deteriorate. However, since intrusion of moisture into the surface of a photodiode 862 of the chip 880 is prevented by the functions of microlens passivation films 868, 882, and 885 as described above, deterioration in the quality of the chip 880 is prevented.

Since there is a stacked film interface on the pad opening portion 842 and the chip edge, moisture is more likely to intrude into the pad opening portion 842 and the chip edge than the surface of the chip. As the groove and the hydrophobic film are formed in the pad opening portion 842 and the chip edge, and the stacked film interface is covered with the hydrophobic film, intrusion of moisture or impurities into the chip can be prevented.

Further, as the hydrophobic film is formed in the sidewall portion (the scribe region A3), force applied to each film interface at the time of dicing can be expected to be mitigated, and a possibility that film peeling or a crack will occur can be reduced.

Further, even when film peeling or a crack occurs, as the groove is formed, the occurrence of film peeling or a crack can be prevented by the groove, and a pad region A2 can be prevented from being influenced.

It is possible to reduce a possibility that film peeling or a crack will occur and reduce influence even when film peeling or a crack occurs, and thus the moisture-proof performance of the chip can be further improved.

(7-37)-Th Embodiment

Figure 101:
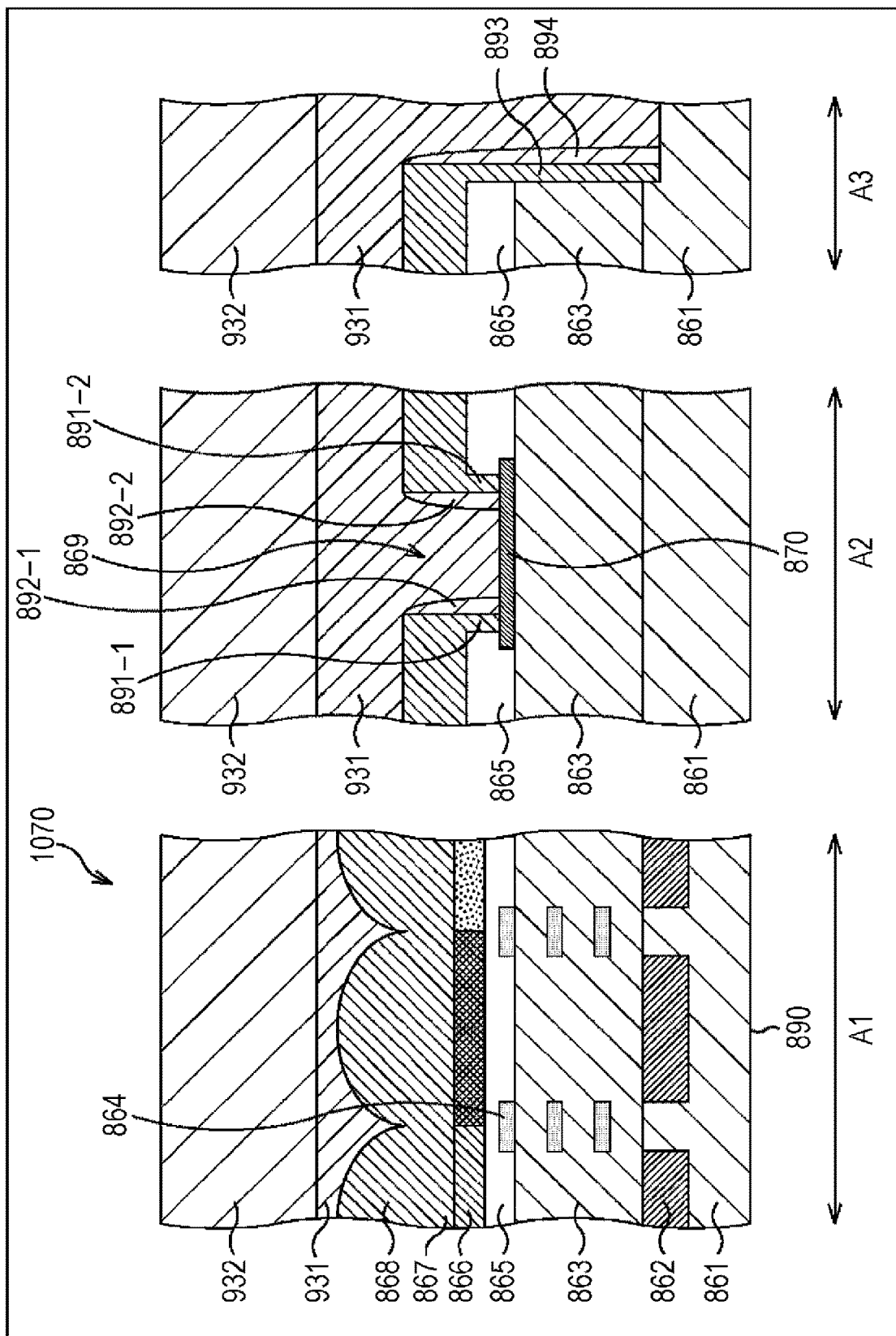
FIG. 101 is a diagram illustrating a configuration of a chip according to the seventh embodiment.

FIG. 101 is a cross-sectional view schematically illustrating an exemplary configuration of a semiconductor package 1070 obtained by packaging the chip 890 illustrated in FIG. 83 by the CSP technique. In FIG. 101, parts corresponding to those of FIG. 83 are denoted by the same reference numerals, and a description thereof will be appropriately omitted.

In the semiconductor package 1070, transparent seal resin 931 is formed on the surface of the chip 890, and a glass substrate 932 is stacked on the seal resin 931. Thus, the chip 890 is protected from an external environment.

A pad opening portion 869 is filled with the seal resin 931. In other words, the inside surrounded by a hydrophobic film 892 formed in the porous wall portion is filled with the seal resin 931. Further, a hydrophobic film 894 formed in the sidewall portion is also covered with the seal resin 931.

As the pad opening portion 869 is filled with the seal resin 931, for example, when external force is applied to the semiconductor package 1070, the portion filled with the seal resin 931 can be expected to undertake a shock absorber, and thus tolerance to external pressure or the like can be improved.

Further, as the hydrophobic film 894 formed in the sidewall portion is covered with the seal resin 931, force applied to a film interface at the time of dicing can be mitigated, and a possibility that film peeling or a crack will occur at the time of dicing can be reduced. Furthermore, since film peeling or a crack does not occur, the moisture-proof performance of the chip can be improved.

Further, when moisture intrudes into the seal resin 931, a component of an adhesive included in the seal resin 931 is likely to melt into the intruded moisture, and thus the quality of the chip 890 may deteriorate. However, since intrusion of moisture into the surface of a photodiode 862 of the chip 890 is prevented by the functions of microlens passivation film 868, 891, and 893 as described above, deterioration in the quality of the chip 890 can be prevented.

Further, since there are the stacked film interfaces in the portion in which the pad opening portion is formed and the chip edge, moisture or the like is more likely to intrude to the portion in which the pad opening portion is formed and the chip edge than the surface of the chip. As the hydrophobic film as well as the passivation film is formed in the portions to cover the stacked film interface, even when moisture intrudes into the seal resin 931, since intrusion of moisture into the surface of the photodiode 862 of the chip 890 is prevented, deterioration in the quality of the chip 890 can be prevented.

(7-38)-Th Embodiment

Figure 102:
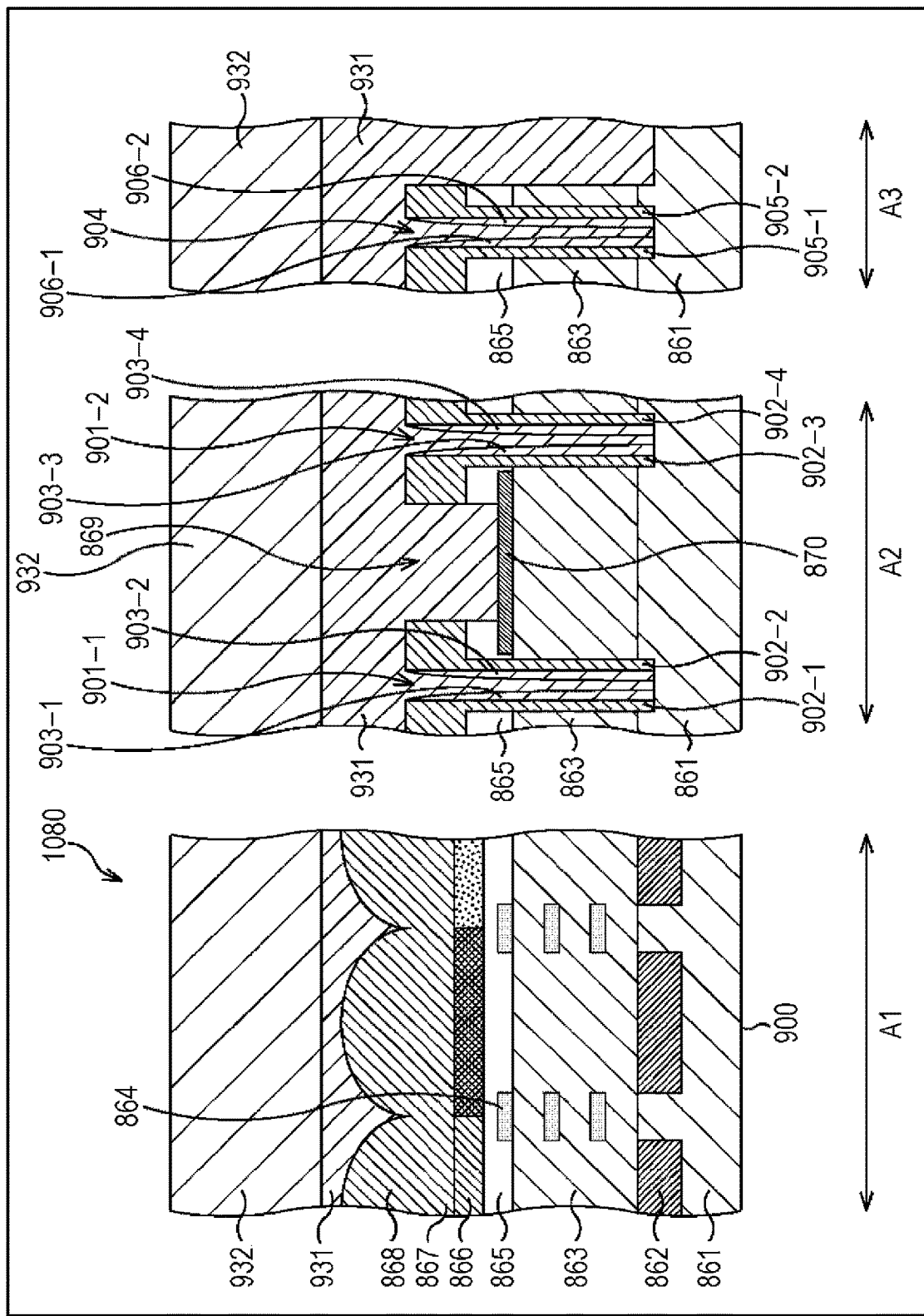
FIG. 102 is a diagram illustrating a configuration of a chip according to the seventh embodiment.

FIG. 102 is a cross-sectional view schematically illustrating an exemplary configuration of a semiconductor package 1080 obtained by packaging the chip 900 illustrated in FIG. 84 by the CSP technique. In FIG. 102, parts corresponding to those of FIG. 84 are denoted by the same reference numerals, and a description thereof will be appropriately omitted.

In the semiconductor package 1080, transparent seal resin 931 is formed on the surface of the chip 900, and a glass substrate 932 is stacked on the seal resin 931. Thus, the chip 900 is protected from an external environment.

Further, a pad opening portion 869, a groove 901-1, a groove 901-2, and a groove 904 are also filled with the seal resin 931. Furthermore, the chip edge of a scribe region A3 is also filled with the seal resin 931.

As the pad opening portion 869, the groove 901-1, the groove 901-2, and the groove 904 are filled with the seal resin 931, for example, when external force is applied to the semiconductor package 1080, the portions filled with the seal resin 931 can be expected to undertake a shock absorber, and thus tolerance to external pressure or the like can be improved.

Further, as the scribe region A3 is also filled with the seal resin 931, force applied to a film interface at the time of dicing can be mitigated, and a possibility that film peeling or a crack will occur at the time of dicing can be reduced. Furthermore, since film peeling or a crack does not occur, the moisture-proof performance of the chip can be improved.

Further, when moisture intrudes into the seal resin 931, a component of an adhesive included in the seal resin 931 is likely to melt into the intruded moisture, and thus the quality of the chip 900 may deteriorate. However, since intrusion of moisture into the surface of a photodiode 862 of the chip 900 is prevented by the functions of microlens passivation films 868, 902, and 905 as described above, deterioration in the quality of the chip 900 is prevented.

Since there is a stacked film interface on the pad opening portion 869 and the chip edge, moisture is more likely to intrude into the pad opening portion 869 and the chip edge than the surface of the chip. As the groove and the hydrophobic film are formed in the pad opening portion 869 and the chip edge, and the stacked film interface is covered with the hydrophobic film, intrusion of moisture or impurities into the chip can be prevented.

Further, as the hydrophobic film is formed in the sidewall portion (the scribe region A3), force applied to each film interface at the time of dicing can be expected to be mitigated, and a possibility that film peeling or a crack will occur can be reduced.

Further, even when film peeling or a crack occurs, as the groove is formed, the occurrence of film peeling or a crack can be prevented by the groove, and a pad region A2 can be prevented from being influenced.

It is possible to reduce a possibility that film peeling or a crack will occur and reduce influence even when film peeling or a crack occurs, and thus the moisture-proof performance of the chip can be further improved.

(7-39)-Th Embodiment

Figure 103:
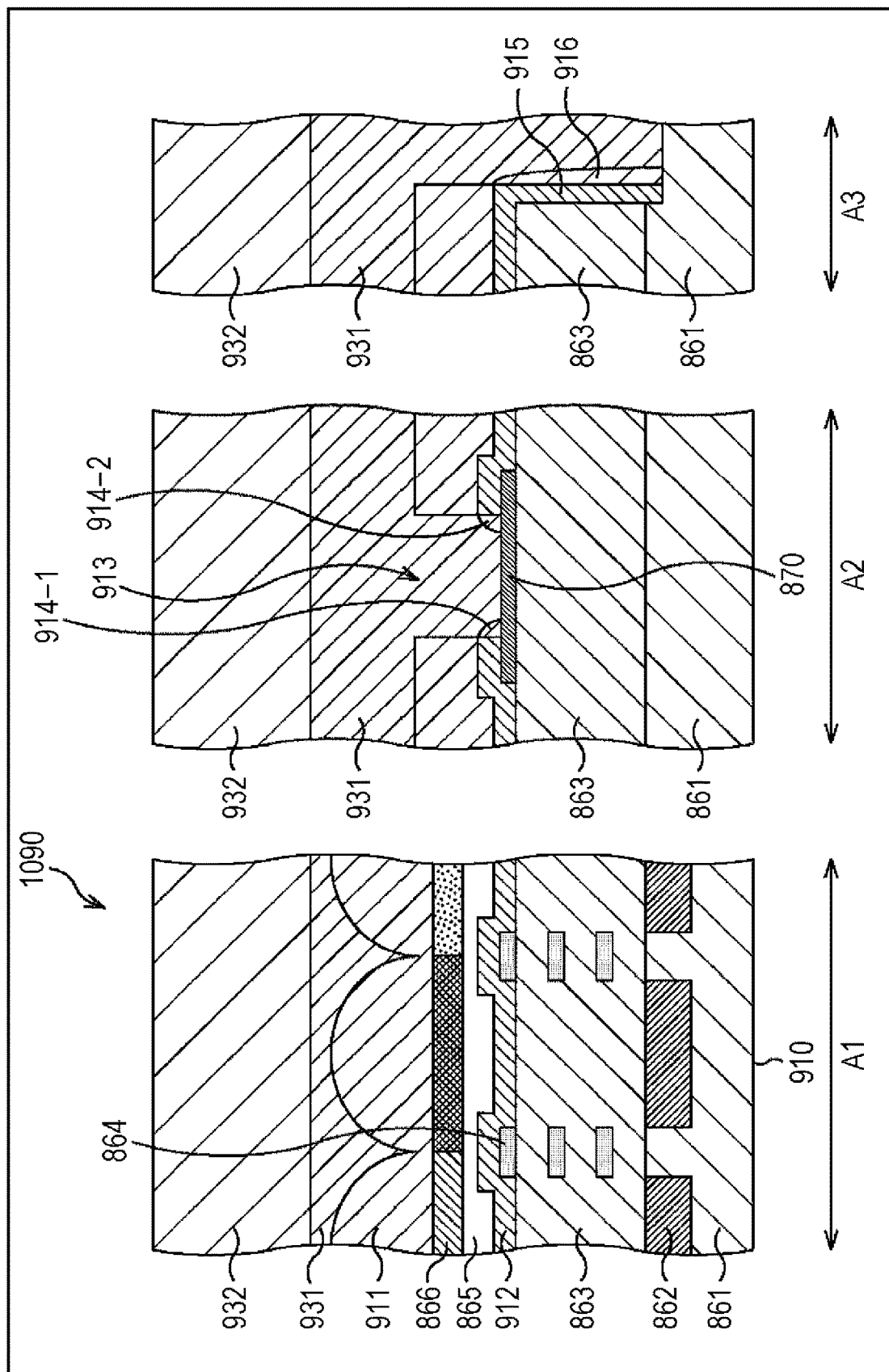
FIG. 103 is a diagram illustrating a configuration of a chip according to the seventh embodiment.

FIG. 103 is a cross-sectional view schematically illustrating an exemplary configuration of a semiconductor package 1090 obtained by packaging the chip 910 illustrated in FIG. 85 by the CSP technique. In FIG. 103, parts corresponding to those of FIG. 85 are denoted by the same reference numerals, and a description thereof will be appropriately omitted.

In the semiconductor package 1090, transparent seal resin 931 is formed on the surface of the chip 910, and a glass substrate 932 is stacked on the seal resin 931. Thus, the chip 910 is protected from an external environment.

The pad opening portion 913 is filled with the seal resin 931. In other words, the inside surrounded by a hydrophobic film 914 formed in the porous wall portion is filled with the seal resin 931. Further, a hydrophobic film 916 formed in the sidewall portion is also covered with the seal resin 931.

As the pad opening portion 913 is filled with the seal resin 931, for example, when external force is applied to the semiconductor package 1090, the portion filled with the seal resin 931 can be expected to undertake a shock absorber, and thus tolerance to external pressure or the like can be improved.

As the hydrophobic film 916 formed in the sidewall portion and a microlens layer 911 are filled with the seal resin 931, force applied to a film interface at the time of dicing can be mitigated, and a possibility that film peeling or a crack will occur at the time of dicing can be reduced. Furthermore, since film peeling or a crack does not occur, the moisture-proof performance of the chip can be improved.

Further, when moisture intrudes into the seal resin 931, a component of an adhesive included in the seal resin 931 is likely to melt into the intruded moisture, and thus the quality of the chip 910 may deteriorate. However, since intrusion of moisture into the surface of a photodiode 862 of the chip 910 is prevented by the functions of passivation films 912 and 915 as described above, deterioration in the quality of the chip 910 can be prevented.

Further, since there are the stacked film interfaces in the portion in which the pad opening portion is formed and the chip edge, moisture or the like is more likely to intrude to the portion in which the pad opening portion is formed and the chip edge than the surface of the chip. As the hydrophobic film as well as the passivation film is formed in the portions to cover the stacked film interface, even when moisture intrudes into the seal resin 931, since intrusion of moisture into the surface of the photodiode 862 of the chip 910 is prevented, deterioration in the quality of the chip 910 can be prevented.

(7-40)-Th Embodiment

Figure 104:
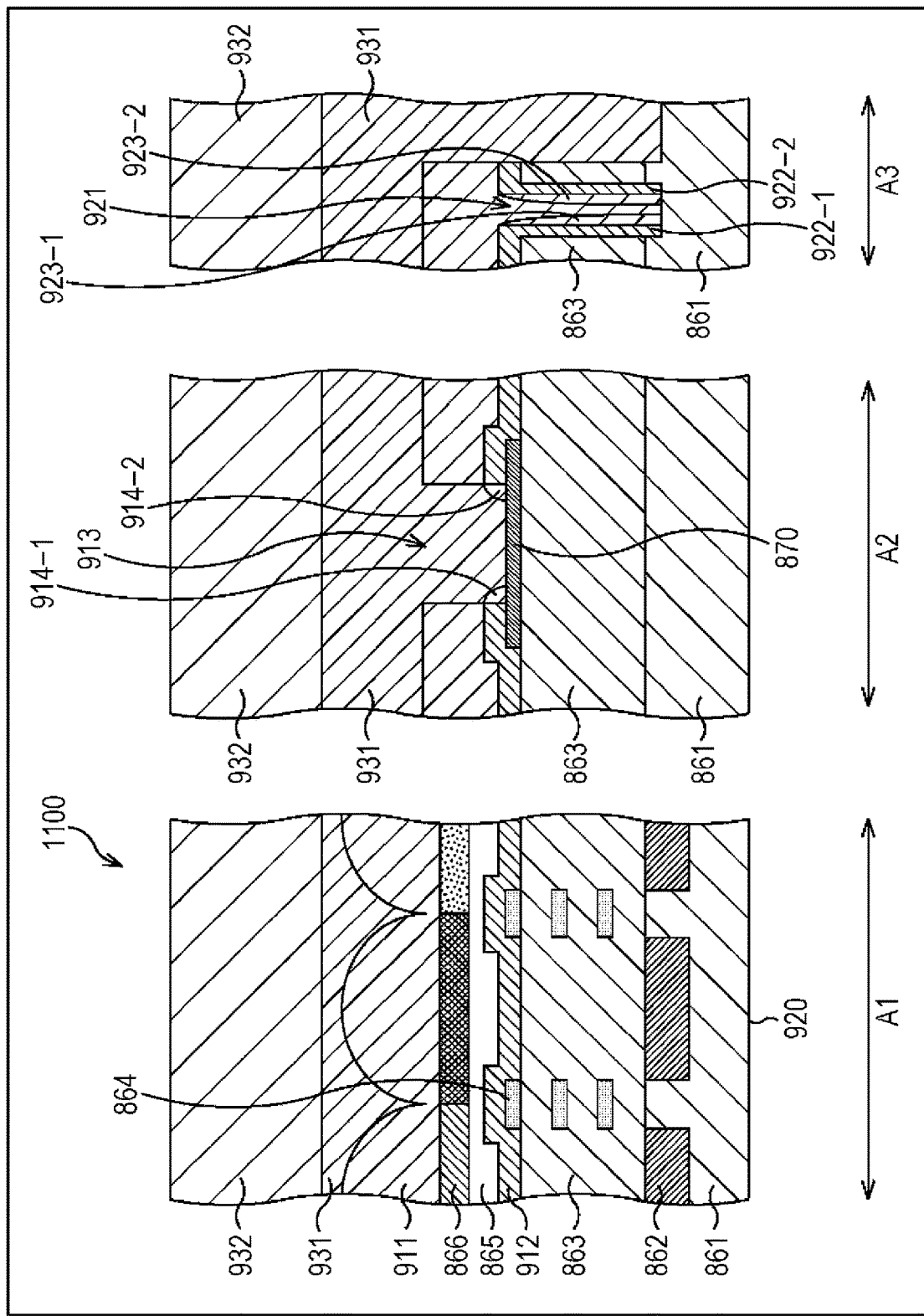
FIG. 104 is a diagram illustrating a configuration of a chip according to the seventh embodiment.

FIG. 104 is a cross-sectional view schematically illustrating an exemplary configuration of a semiconductor package 1100 obtained by packaging the chip 920 illustrated in FIG. 86 by the CSP technique. In FIG. 104, parts corresponding to those of FIG. 86 are denoted by the same reference numerals, and a description thereof will be appropriately omitted.

In the semiconductor package 1100, transparent seal resin 931 is formed on the surface of the chip 920, and a glass substrate 932 is stacked on the seal resin 931. Thus, the chip 920 is protected from an external environment.

Further, a pad opening portion 913 and a groove 921 are also filled with the seal resin 931. Furthermore, the chip edge of a scribe region A3 is also filled with the seal resin 931.

As the pad opening portion 913 and the groove 921 are filled with the seal resin 931, for example, when external force is applied to the semiconductor package 1100, the portions filled with the seal resin 931 can be expected to undertake a shock absorber, and thus tolerance to external pressure or the like can be improved.

Further, as the scribe region A3 is also filled with the seal resin 931, force applied to a film interface at the time of dicing can be mitigated, and a possibility that film peeling or a crack will occur at the time of dicing can be reduced. Furthermore, since film peeling or a crack does not occur, the moisture-proof performance of the chip can be improved.

Further, when moisture intrudes into the seal resin 931, a component of an adhesive included in the seal resin 931 is likely to melt into the intruded moisture, and thus the quality of the chip 920 may deteriorate. However, since intrusion of moisture into the surface of a photodiode 862 of the chip 920 is prevented by the functions of passivation films 912 and 922 as described above, deterioration in the quality of the chip 920 is prevented.

Since there is a stacked film interface on the pad opening portion 913 and the chip edge, moisture is more likely to intrude into the pad opening portion 913 and the chip edge than the surface of the chip. As the groove and the hydrophobic film are formed in the pad opening portion 913 and the chip edge, and the stacked film interface is covered with the hydrophobic film, intrusion of moisture or impurities into the chip can be prevented.

Further, as the hydrophobic film is formed in the sidewall portion (the scribe region A3), force applied to each film interface at the time of dicing can be expected to be mitigated, and a possibility that film peeling or a crack will occur can be reduced.

Further, even when film peeling or a crack occurs, as the groove is formed, the occurrence of film peeling or a crack can be prevented by the groove, and a pad region A2 can be prevented from being influenced.

It is possible to reduce a possibility that film peeling or a crack will occur and reduce influence even when film peeling or a crack occurs, and thus the moisture-proof performance of the chip can be further improved.

Eighth Embodiment

Figure 105:
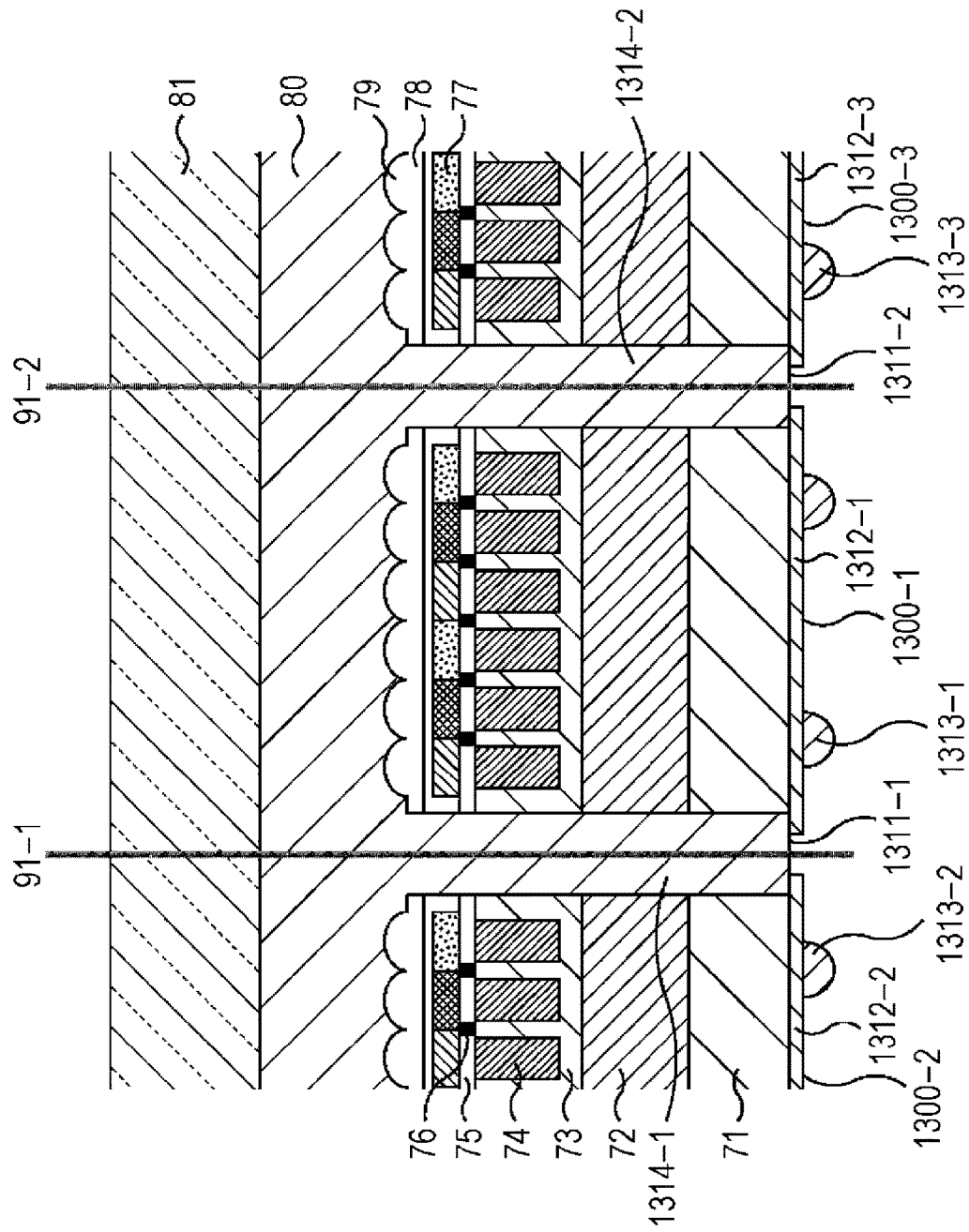
FIG. 105 is a diagram illustrating a configuration of a chip according to an eighth embodiment.

FIG. 105 illustrates a configuration of a chip according to an eighth embodiment. FIG. 105 illustrates a wafer that includes a plurality of chips (3 chips in FIG. 105) and is not diced yet, similarly to FIG. 2.

Here, a chip positioned at the center is referred to as a "chip 1300-1," a chip positioned at the left is referred to as a "chip 1300-2," and a chip positioned at the right is referred to as a "chip 1300-3." In the following description, when the chips 1300-1 to 1300-3 need not be distinguished from one another, the chips are referred to as simply a "chip 1300."

Each chip 1300 has the same configuration as the chip 70 described above with reference to FIGS. 2 and 3. In other words, the chip 1300 is configured such that an interconnection layer 72 is arranged on a support substrate 71, and a silicon substrate 73 is arranged on the interconnection layer 72. In the silicon substrate 73, a plurality of photodiodes 74 (optical elements) serving as photoelectric conversion units of pixels are formed at certain intervals.

The planarization film 75 is formed on the silicon substrate 73, and a light shielding film 76 for preventing light from leaking into a neighboring pixel is formed in the planarization film 75 corresponding to a position between the adjacent photodiodes 74. A color filter layer 77 is formed on the planarization film 75. A planarization film 78 is formed on the color filter layer 77. A microlens layer 79 is formed on the planarization film 78. A cover glass 81 is bonded onto the microlens layer 79 through an adhesive layer 80.

A solder resist 1312 and a connection terminal 1313 for a connection with an external circuit are formed below the support substrate 71. Further, a through electrode such as a through silicon via (TSV) is formed, but illustration thereof is omitted in FIG. 105.

In the wafer illustrated in FIG. 105, a groove 1311 is formed between the chips 1300. The groove 1311-1 is formed between the chip 1300-1 and the chip 1300-2, and the groove 1311-2 is formed between the chip 1300-1 and the chip 1300-3.

There is a scribe section 91-1 between the chip 1300-1 and the chip 1300-2, and the groove 1311-1 is formed in the scribe section 91-1. Similarly, there is a scribe section 91-2 between the chip 1300-1 and the chip 1300-3, and the groove 1311-2 is formed in the scribe section 91-2.

In the chip 1300 illustrated in FIG. 105, the groove 1311 is formed such that the cover glass 81, the adhesive layer 80, the microlens layer 79, the planarization film 78, the color filter layer 77, the planarization film 75, the silicon substrate 73, the interconnection layer 72, and the support substrate 71 are excavated.

The groove 1311 is filled with an adhesive layer 1314 formed of the same material as the adhesive layer 80. When resin is used as an adhesive of the adhesive layer 80, the groove 1311 is filled with resin as well.

The adhesive layer 1314-1 extending from the adhesive layer 80 is formed on the side surfaces of the microlens layer 79, the planarization film 78, the color filter layer 77, the planarization film 75, the silicon substrate 73, the interconnection layer 72, and the support substrate 71 at the chip 1300-1 side and the chip 1300-2 side of the groove 1311-1.

The adhesive layer 1314-2 extending from the adhesive layer 80 is formed on the side surfaces of the microlens layer 79, the planarization film 78, the color filter layer 77, the planarization film 75, the silicon substrate 73, the interconnection layer 72, and the support substrate 71 at the chip 1300-1 side and the chip 1300-3 side of the groove 1311-2. As described above, when the adhesive layer 80 is formed in the horizontal direction, the adhesive layer 1314 is formed in the vertical direction.

Figure 106:
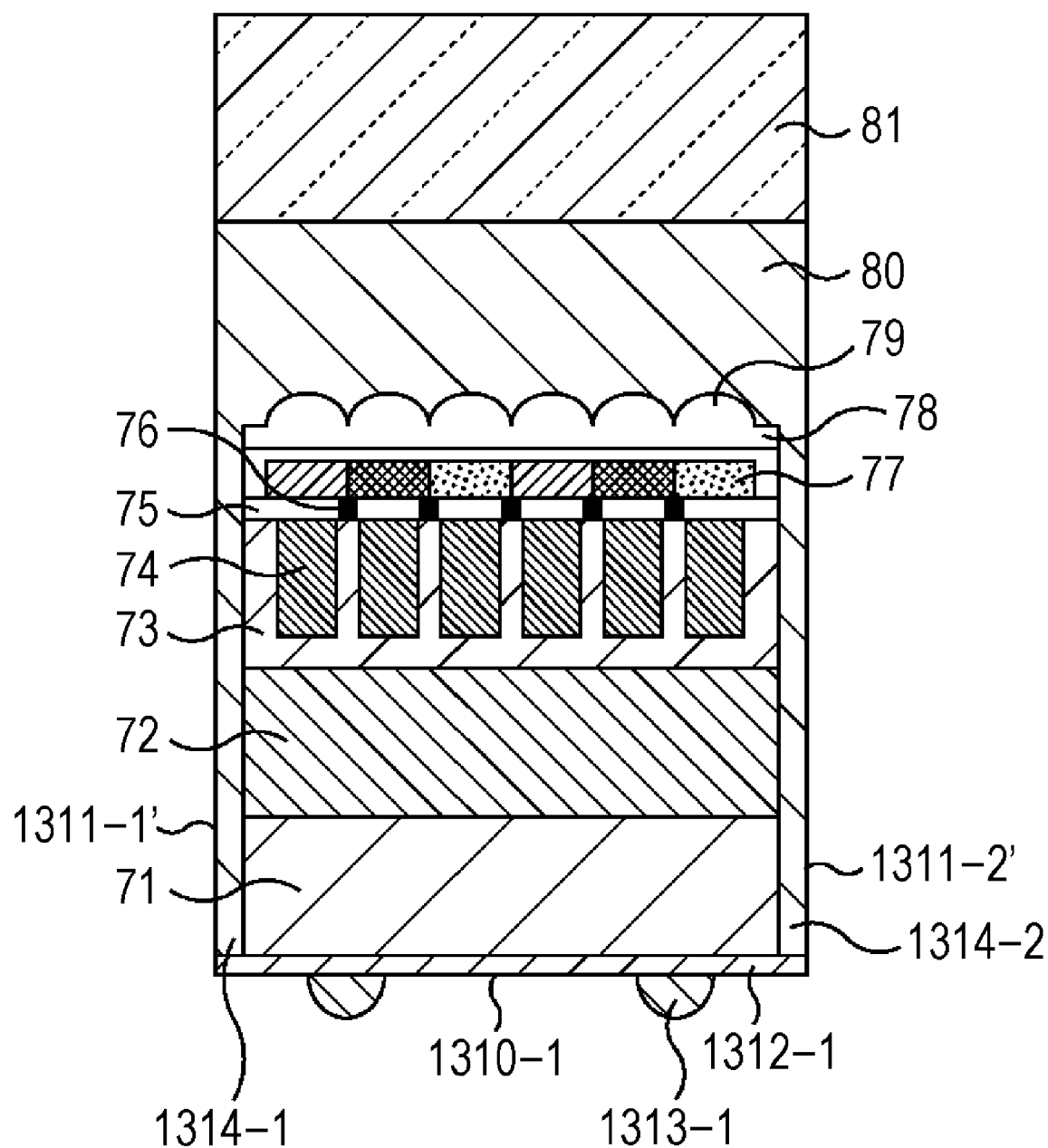
FIG. 106 is a diagram illustrating a configuration of a chip according to the eighth embodiment.

When the wafer in which the groove 1311 is formed between the chips 1300 is diced along the scribe section 91, the chip 1300-1 illustrated in FIG. 106 is cut out. In the chip 1300-1 illustrated in FIG. 106, the cross-sectional surfaces of the microlens layer 79, the planarization film 78, the color filter layer 77, the planarization film 75, the silicon substrate 73, the interconnection layer 72, and the support substrate 71 are covered with the film in which the adhesive layer 1314 is stacked and thus not exposed on the surface.

As described above, the diced chip 1300-1 has a structure in which the stacked layers of the chip 1300-1 are covered with the adhesive layer 1314-1 formed in the groove 1311-1' (a dash is added to the groove after dicing in order to be distinguished from the groove 1311-1 before dicing illustrated in FIG. 105).

Further, the diced chip 1300-1 has a structure in which the stacked layers of the chip 1300-1 are covered with the adhesive layer 1314-2 formed in the groove 1311-2'.

As described above, both ends of the chip 1300-1 are covered with the adhesive layer 1314. Thus, it is possible to prevent moisture from intruding into the chip 1300-1 from the side of the chip 1300-1.

Further, the solder resist 1312-1 is formed below the chip 1300-1, and thus it is possible to prevent moisture from intruding into the chip 1300-1 from the bottom. Instead of the solder resist 1312-1, an oxide film may be used, or an oxide film may be further stacked on the solder resist 1312-1.

Since the diced chip 1300-1 is configured such that the groove 1311-1' and the groove 1311-2' remain as described above, a width of the groove 1311-1 and the groove 1311-2 between the chips 1300 before dicing is preferably larger than a width of a blade used in the dicing process.

As the groove 1311 is formed, and the adhesive layer 1314 is formed in the groove 1311 as described above, the moisture-proof performance can be further improved.

<Manufacturing of Chip According to Eighth Embodiment>

Figure 107:
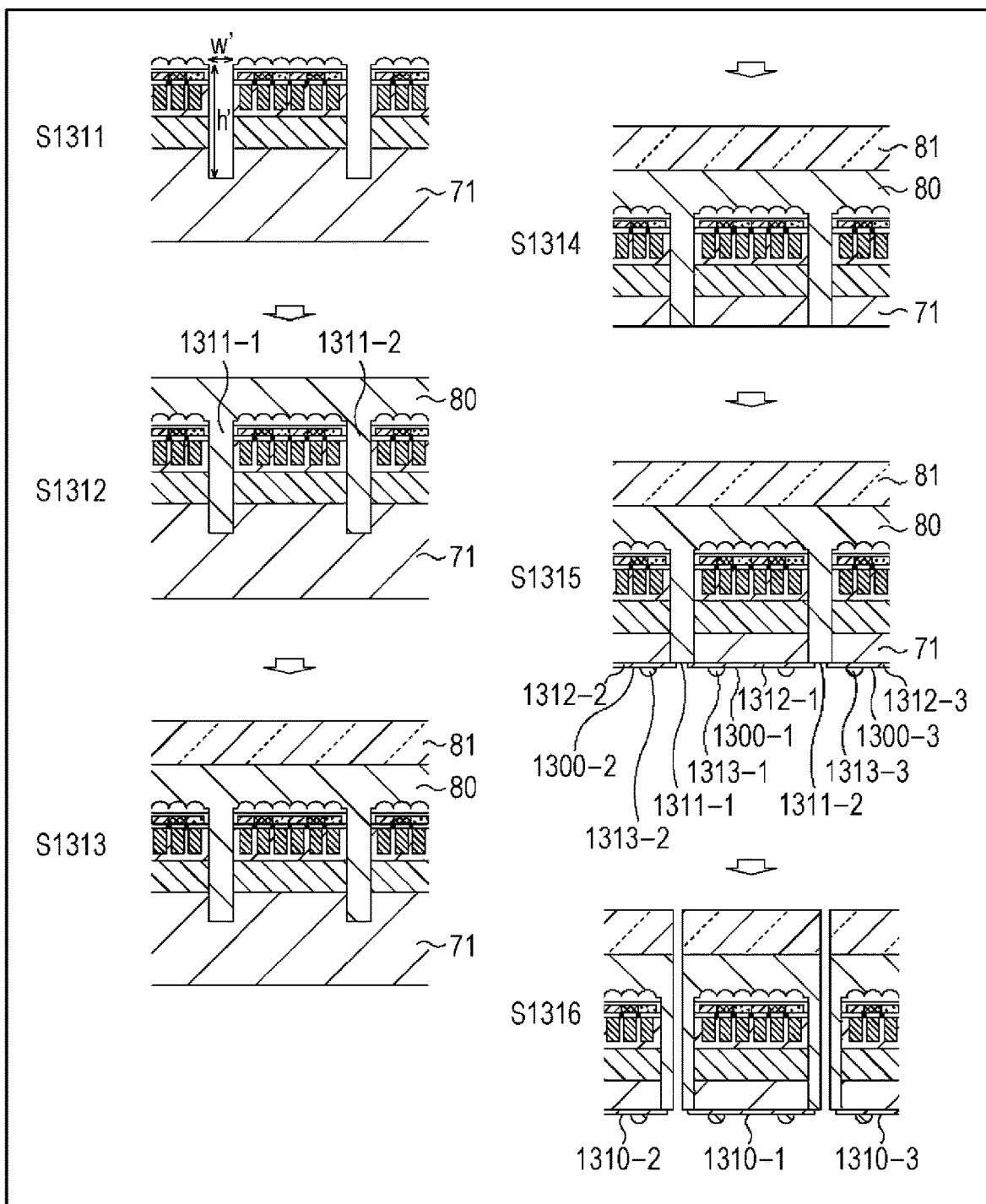
FIG. 107 is a diagram for describing a process of manufacturing a chip according to the eighth embodiment.

A process of manufacturing a chip (wafer) having such a groove will be described. FIG. 107 is a diagram for describing a process of manufacturing a chip prior to dicing.

The manufacturing process described with reference to FIG. 107 will focus on manufacturing of a groove serving as one of characteristic components of the present technology, and a manufacturing method of a related art can be applied to manufacturing of other parts such as forming of layers, and thus a description thereof will be appropriately omitted.

In step S1311, a semiconductor wafer in which a photodiode 74 and the like are formed is prepared. The semiconductor wafer is configured such that a support substrate 71, an interconnection layer 72, a silicon substrate 73, a planarization film 75, a color filter layer 77, a planarization film 78, and a microlens layer 79 are stacked, the photodiode 74 is formed in the silicon substrate 73, and the light shielding film 76 is formed in the planarization film 75.

In step S1311, a groove 1311-1 and a groove 1311-2 are formed in the semiconductor wafer. The groove 1311 is formed in the scribe section 91 as described above. For example, the groove 1311 is formed by performing dry etching after patterning. Alternatively, the groove 1311 may be formed by wet etching or a technique same as dicing.

The formed groove 1311 is formed to have a width w' larger than a width of a blade used in the dicing process. Further, the formed groove 1311 has a depth h' exposing the adhesive layer 1314 filling the groove 1311 when the support substrate 71 is thinned in a subsequent process.

In step S1312, an adhesive layer 80 is formed. When the adhesive layer 80 is formed, the groove 1311 is also filled with the same material as a material for forming the adhesive layer 80, for example, resin. The material filling the groove 1311 is the adhesive layer 1314. The adhesive layer 80 is formed using a technique such as a coating technique or a lamination technique.

In step S1313, the semiconductor wafer is bonded to the cover glass 81. When the bonding is performed, in order to prevent bubbles from coming into the bonding surface, a vacuum bonding machine is preferably used. Further, since the bonding is performed in a wafer level, there is no big influence, and a chip size package (CSP) process which will be described later is not influenced.

In step S1314, the support substrate 71 is thinned. The thinning of the support substrate 71 is performed up to the bottom portion of the adhesive layer 1314 (a front end of the convex portion of the adhesive layer 1314) such that the bottom surface of the support substrate 71 is on the same plane as the bottom surface of the adhesive layer 1314.

In step S1315, a CSP process is performed. In order to open an interconnection portion of a multi-layer interconnection (not illustrated) formed in the semiconductor wafer surface, a through hole is formed by etching, an insulating film such as a silicon oxide film is formed, the insulating film in the through hole is etched and opened, a through electrode is formed in the through hole, for example, by Cu plating, and an interconnection is formed on a surface (a back surface) of a side opposite to a translucent substrate of the semiconductor wafer.

In step S1316, dicing is performed along the scribe section 91, and thus the chip is diced.

As the groove 1311 is formed, and the adhesive layer 1314 is formed in the groove 1311 as described above, the moisture-proof performance can be further improved.

Further, as the groove 1311 is formed, the adhesive layer 1314 is stacked in the groove 1311, and dicing is performed along the adhesive layer 1314, force applied to an interface between films at the time of dicing can be mitigated, and a possibility that film peeling or a crack will occur can be reduced.

Since a possibility that film peeling or a crack will occur can be reduced, the moisture-proof performance of the chip can be further improved.

The examples in which the present technology is applied to CMOS image sensors have been described above, but, for example, the present technology can be applied even to other types of solid state imaging devices such as CCD image sensors.

Further, the examples in which the passivation film and the microlens passivation film are formed of SiN have been described above, other transparent materials that satisfy requirements such as electric characteristics, optical characteristics, and durability and have a waterproofing property can be used.

Further, the present technology can be applied even when a chip is packaged by a method other than the CSP.

A chip may be configured such that the first embodiment to the seventh embodiment are combined.

<Electronic Device>

The present technology is not limited to the application to the imaging device, and can be applied to general electronic devices in which an imaging device is used as an image acquiring unit (a photoelectric conversion unit) such as imaging devices such as digital still cameras or video cameras, mobile terminal devices with an imaging function such as mobile telephones, and copy machines in which an imaging device is used as an image reading unit. Further, there are cases in which a module-like configuration mounted in an electronic device, that is, a camera module is used as an imaging device.

FIG. 105 is a block diagram illustrating an exemplary configuration of an imaging device serving as an exemplary electronic device of the present technology. An imaging device 2000 of the present technology includes an optical unit including a lens group 2001, a solid-state image sensor 2002, a DSP circuit 2003 serving as a camera signal processing unit, a frame memory 2004, a display unit 2005, a recording unit 2006, an operating unit 2007, a power source unit 2008, and the like as illustrated in FIG. 105.

The DSP circuit 2003, the frame memory 2004, the display unit 2005, the recording unit 2006, the operating unit 2007, and the power source unit 2008 are connected with one another via a bus line 2009.

The lens group 2001 receives incident light (image light) from a subject, and forms an image on an imaging plane of the solid-state image sensor 2002. The solid-state image sensor 2002 converts a quantity of light of the incident light formed on the imaging plane by the lens group 2001 into an electric signal in units of pixels, and outputs the electric signal as a pixel signal. The image sensors according to any one of the above embodiments can be used as the solid-state image sensor 2002.

The display unit 2005 includes a panel display device such as a liquid crystal display (LCD) device or an organic electro luminescence (EL) display device, and displays a moving image or a still image imaged by the solid-state image sensor 2002. The recording unit 2006 records the moving image or the still image imaged by the solid-state image sensor 2002 on a recording medium such as a digital versatile disk (DVD).

The operating unit 2007 issues an operation command on various functions of the present imaging device according to an operation performed by the user. The power source unit 2008 appropriately supplies various kinds of power serving as operation power of the DSP circuit 2003, the frame memory 2004, the display unit 2005, the recording unit 2006, and the operating unit 2007 to the supply targets.

The imaging device 2000 is applied to camera modules for video cameras, digital still cameras, and mobile devices such as mobile telephones. In the imaging device 2000, the solid-state image sensor according to any one of the above embodiments can be used as the solid-state image sensor 2002.

The effects described in this specification are just examples and not limited, and any other effect may be obtained.

Further, an embodiment of the present technology is not limited to the above embodiments, and various changes can be made within the scope not departing from the gist of the present technology.

The present technology may have the following configurations.

(1)

An image sensor, including:

a substrate; a plurality of layers stacked on the substrate; the plurality of layers including a photodiode layer having a plurality of photodiodes formed on a surface of the photodiode layer; the plurality of layers including at least one layer having a groove formed such that a portion of the at least one layer is excavated; and a transparent resin layer formed above the photodiode layer and formed in the groove.

(2)

The image sensor according to any of the above, where the groove has a width that is larger than a scribing blade width.

(3)

The image sensor according to any of the above, where the groove includes a portion of the photodiode layer such that the portion of the photodiode layer is excavated.

(4)

The image sensor according to any of the above, where the groove includes a portion of the substrate such that the portion of the substrate is excavated.

(5)

The image sensor according to any of the above, further including a passivation film formed in the groove.

(6)

The image sensor according to any of the above, further including a microlens layer formed above the photodiode layer, where the passivation film is formed on the microlens layer.

(7)

The image sensor according to any of the above, further including a rib formed in the transparent resin layer.

(8)
The image sensor according to any of the above, further including a passivation film formed in the groove and the rib.

(9)
The image sensor according to any of the above, further including a first and a second through electrode, where the first and the second through electrode each have a sidewall protecting portion, and where the groove includes at least a portion of the sidewall protecting portions.

(10)
The image sensor according to any of the above, further including a material of the second through electrode that fills the groove.

(11)
The image sensor according to any of the above, further including: a transparent resin layer formed above the photodiode layer; a transparent member formed on the transparent resin layer; a moisture resistant film formed in the groove; where the groove includes an excavated portion of the transparent member layer.

(12)
The image sensor according to any of the above, further including: a transparent resin layer formed above the photodiode layer; and a transparent member formed on the transparent resin layer; where the groove extends to a bottom surface of the substrate, the transparent member covers a side surface of the groove, and the transparent resin layer is formed between the transparent member and a side surface of the substrate.

(13)
The image sensor according to any of the above, further including a hydrophobic film formed in the groove.

(14)
An image sensor, including:
a plurality of layers that are stacked; the plurality of layers including a photodiode layer having a plurality of photodiodes formed on a surface of the photodiode layer;
a transparent resin layer formed above the photodiode layer; a rib formed in the transparent resin layer; and
a moisture resistant film formed between a bottom surface of the rib and the transparent resin.

(15)
The image sensor according to any of the above, further including a transparent member formed on the transparent resin layer, where the moisture resistant film is formed between the transparent member and the transparent resin layer.

(16)
The image sensor according to any of the above, where the moisture resistant film includes a plurality of films having different refractive indices that are stacked.

(17)
The image sensor according to any of the above, where the rib is a material absorbing certain light.

(18)
An imaging device including an image sensor and support circuits, the image sensor including:
a substrate; a plurality of layers stacked on the substrate; the plurality of layers including a photodiode layer having a plurality of photodiodes formed on a surface of the photodiode layer; the plurality of layers including at least one layer having a groove formed such that a portion of the at least one layer is excavated; and a transparent resin layer formed above the photodiode layer and formed in the groove.

(19)
The imaging device according to any of the above, where the groove has a width that is larger than a scribing blade width.

(20)
A method, including:
forming a plurality of layers stacked on a substrate, the plurality of layers including a photodiode layer having a plurality of photodiodes formed on a surface of the photodiode layer; forming a groove in at least one layer in the plurality of layers, the groove being formed such that the at least one layer is excavated; and a transparent resin layer formed above the photodiode layer and formed in the groove.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

71 Support substrate
72 Interconnection layer
73 Silicon substrate
74 Photodiode
75 Planarization film
76 Light shielding film
77 Color filter layer
78 Planarization film
79 Microlens layer
80 Adhesive layer
81 Cover glass
100 Chip

What is claimed is:

1. An image sensor, comprising:
a substrate;
a plurality of layers stacked on the substrate, the plurality of layers including:
a photodiode layer including a plurality of photodiodes formed therein; and
at least one layer having a groove formed therein such that a portion of the at least one layer is excavated, wherein the groove forms a pad opening portion;
an adhesive layer formed above the photodiode layer;
a cover glass above the plurality of photodiodes and on the adhesive layer; and
a hydrophobic film formed in the pad opening portion.

2. The image sensor according to claim 1, wherein the adhesive layer is formed above the groove in a planar view.

3. The image sensor according to claim 1, wherein the plurality of layers further includes an interconnection layer disposed below the photodiode layer.

4. The image sensor according to claim 1, further comprising a passivation film formed in the groove.

5. The image sensor according to claim 1, wherein a passivation film covers an inner wall of the pad opening portion.

6. The image sensor according to claim 1, wherein the groove includes a portion of the photodiode layer such that the portion of the photodiode layer is excavated.

7. The image sensor according to claim 1, wherein the adhesive layer is further formed in the groove.

8. The image sensor according to claim 1, wherein
the plurality of layers further includes a planarization film formed above the photodiode layer; and
the groove is formed such that a portion of the planarization film is excavated.

9. The image sensor according to claim 8, wherein
the plurality of layers further includes a color filter layer formed above the planarization film; and
the groove is formed such that a portion of the color filter layer is excavated.

10. An image sensor, comprising:
a substrate;
a plurality of layers stacked on the substrate, the plurality of layers including:
  a photodiode layer including a plurality of photodiodes formed therein; and
  at least one layer having a groove formed therein such that a portion of the at least one layer is excavated;
an adhesive layer formed above the photodiode layer; and
a cover glass above the plurality of photodiodes and on the adhesive layer,
wherein the groove forms a pad opening portion, and
wherein a passivation film comes into contact with a top surface of an electrode pad formed at a bottom of the pad opening portion.

11. The image sensor according to claim 10, wherein the plurality of layers further includes an interconnection layer disposed below the photodiode layer.

12. The image sensor according to claim 10, wherein the groove includes a portion of the photodiode layer such that the portion of the photodiode layer is excavated.

13. An image sensor, comprising:
a substrate;
a plurality of layers stacked on the substrate, the plurality of layers including:
  a photodiode layer including a plurality of photodiodes formed therein; and
  at least one layer having a groove formed therein such that a portion of the at least one layer is excavated;
an adhesive layer formed above the photodiode layer; and
a cover glass above the plurality of photodiodes and on the adhesive layer,
wherein the plurality of layers further includes an interconnection layer disposed below the photodiode layer, and
wherein the groove is formed such that a portion of the interconnection layer is excavated.

14. The image sensor according to claim 13, wherein the adhesive layer is formed above the groove in a planar view.

15. The image sensor according to claim 13, further comprising a passivation film formed in the groove.

16. The image sensor according to claim 13, wherein the groove forms a pad opening portion, and wherein a passivation film covers an inner wall of the pad opening portion.

17. The image sensor according to claim 13, wherein the groove includes a portion of the photodiode layer such that the portion of the photodiode layer is excavated.

18. The image sensor according to claim 13, wherein the adhesive layer is further formed in the groove.

19. The image sensor according to claim 13, wherein
the plurality of layers further includes a planarization film formed above the photodiode layer; and
the groove is formed such that a portion of the planarization film is excavated.

20. The image sensor according to claim 19, wherein
the plurality of layers further includes a color filter layer formed above the planarization film; and
the groove is formed such that a portion of the color filter layer is excavated.

* * * * *